United States Patent
Koo et al.

(10) Patent No.: US 12,089,428 B2
(45) Date of Patent: *Sep. 10, 2024

(54) ORGANIC LIGHT-EMITTING DEVICE

(71) Applicant: Samsung Electronics Co., Ltd., Suwon-si (KR)

(72) Inventors: Hyun Koo, Seongnam-si (KR); Seungyeon Kwak, Seoul (KR); Sangdong Kim, Suwon-si (KR); Sungjun Kim, Seongnam-si (KR); Jiwhan Kim, Seoul (KR); Sunghun Lee, Hwaseong-si (KR); Jungin Lee, Seoul (KR); Seokhwan Hong, Seoul (KR); Kyuyoung Hwang, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 327 days.

This patent is subject to a terminal disclaimer.

(21) Appl. No.: 16/023,394

(22) Filed: Jun. 29, 2018

(65) Prior Publication Data

US 2019/0006608 A1    Jan. 3, 2019

(30) Foreign Application Priority Data

Jul. 3, 2017    (KR) .......................... 10-2017-0084409

(51) Int. Cl.
*H10K 50/11* (2023.01)
*C07F 15/00* (2006.01)
(Continued)

(52) U.S. Cl.
CPC .......... *H10K 50/11* (2023.02); *C07F 15/0086* (2013.01); *C09K 11/06* (2013.01);
(Continued)

(58) Field of Classification Search
CPC . H01L 51/0059; H01L 51/006; C07D 307/91; C07D 333/76; H10K 85/346;
(Continued)

(56) References Cited

U.S. PATENT DOCUMENTS 5,707,745 A * 1/1998 Forrest ................... C09K 11/06
                                                    428/432
7,074,500 B2   7/2006 Pfeiffer et al.
(Continued)

FOREIGN PATENT DOCUMENTS

CN       103247761 A    8/2013
EP         3450441 A    3/2019
(Continued)

OTHER PUBLICATIONS

Extended European Search Report issued by the European Patent Office dated Nov. 29, 2018, in the examination of the European Patent Application No. 18180938.5-1211.

(Continued)

*Primary Examiner* — Jennifer A Boyd
*Assistant Examiner* — Rachel Simbana
(74) *Attorney, Agent, or Firm* — CANTOR COLBURN LLP

(57) ABSTRACT

An organic light-emitting device including a first electrode, a second electrode facing the first electrode, and an organic layer disposed between the first electrode and the second electrode, wherein the organic layer includes an emission layer and an intermediate layer disposed between the first electrode and the emission layer, wherein the intermediate layer directly contacts the emission layer, and wherein the intermediate layer includes a first hole transport material, wherein the emission layer includes a host and a dopant, wherein the dopant is an organometallic compound, provided that the dopant does not comprise iridium, and
(Continued)

wherein the organic light-emitting device satisfies certain parameters described in the specification.

16 Claims, 4 Drawing Sheets

(51) Int. Cl.
| | |
|---|---|
| *C09K 11/06* | (2006.01) |
| *H10K 50/13* | (2023.01) |
| *H10K 50/15* | (2023.01) |
| *H10K 50/155* | (2023.01) |
| *H10K 85/30* | (2023.01) |
| *H10K 101/00* | (2023.01) |
| *H10K 101/10* | (2023.01) |
| *H10K 101/30* | (2023.01) |
| *H10K 101/40* | (2023.01) |

(52) U.S. Cl.
CPC ......... *H10K 50/131* (2023.02); *H10K 50/155* (2023.02); *H10K 50/156* (2023.02); *H10K 85/346* (2023.02); *C09K 2211/1044* (2013.01); *C09K 2211/185* (2013.01); *H10K 2101/10* (2023.02); *H10K 2101/30* (2023.02); *H10K 2101/40* (2023.02); *H10K 2101/90* (2023.02)

(58) Field of Classification Search
CPC ......... C07F 15/0086; C09K 2211/1044; C09K 2211/185
See application file for complete search history.

(56) References Cited

U.S. PATENT DOCUMENTS

| | | | |
|---|---|---|---|
| 9,153,790 | B2 | 10/2015 | Kuma et al. |
| 9,356,242 | B2 | 5/2016 | Kaiser et al. |
| 9,385,335 | B2 | 7/2016 | Pflumm et al. |
| 10,050,212 | B2 | 8/2018 | Cho et al. |
| 10,937,973 | B2 | 3/2021 | Lee et al. |
| 2004/0062949 | A1 | 4/2004 | Pfeiffer et al. |
| 2006/0060842 | A1 | 3/2006 | Sano et al. |
| 2011/0114889 | A1 | 5/2011 | Buesing et al. |
| 2013/0158268 | A1 | 6/2013 | Molt et al. |
| 2013/0207082 | A1 | 8/2013 | Cho et al. |
| 2014/0014940 | A1 | 1/2014 | Pflumm et al. |
| 2014/0319472 | A1* | 10/2014 | Cho ............... H01L 51/0061 257/40 |
| 2015/0090984 | A1 | 4/2015 | Kang et al. |
| 2015/0280136 | A1 | 10/2015 | Ryu et al. |
| 2016/0093814 | A1 | 3/2016 | Hwang et al. |
| 2016/0126477 | A1 | 5/2016 | Kim et al. |
| 2016/0240800 | A1* | 8/2016 | Ma ................... C07F 15/0033 |
| 2016/0268522 | A1* | 9/2016 | Hwang ............. H01L 51/0061 |
| 2016/0315273 | A1* | 10/2016 | Kawabe ............... H10K 85/40 |
| 2016/0372666 | A1* | 12/2016 | Ryu ................... C07D 209/86 |
| 2017/0062734 | A1 | 3/2017 | Suzuki et al. |
| 2017/0141342 | A1 | 5/2017 | Lee et al. |
| 2017/0179410 | A1 | 6/2017 | Xia et al. |
| 2017/0373255 | A1* | 12/2017 | Lee ..................... H01L 51/0058 |
| 2018/0013078 | A1 | 1/2018 | Lee et al. |
| 2018/0358562 | A1 | 12/2018 | Takita et al. |
| 2019/0036045 | A1 | 1/2019 | Hwang et al. |
| 2020/0006676 | A1 | 1/2020 | Kwak et al. |
| 2020/0115406 | A1 | 4/2020 | Yi et al. |

FOREIGN PATENT DOCUMENTS

| | | | | |
|---|---|---|---|---|
| JP | 2002-175887 | A | 6/2002 | |
| JP | 2011529614 | A | 12/2011 | |
| JP | 2014513418 | A | 5/2014 | |
| JP | 2015227374 | A | 12/2015 | |
| JP | 2016069379 | A | 5/2016 | |
| JP | 2016-225497 | A | 12/2016 | |
| JP | 2017076780 | A | 4/2017 | |
| JP | 2020037550 | A | 3/2020 | |
| KR | 10-0918988 | B1 | 9/2009 | |
| KR | 10-2012-0024624 | A | 3/2012 | |
| KR | 10-2014-0027218 | A | 3/2014 | |
| KR | 10-2015-0042603 | A | 4/2015 | |
| KR | 10-2016-0013790 | A | 2/2016 | |
| KR | 10-2016-0024625 | A | 3/2016 | |
| KR | 10-2016-0051134 | A | 5/2016 | |
| KR | 10-2016-0051142 | A | 5/2016 | |
| KR | 1020160068683 | A | 6/2016 | |
| KR | 2016091198 | A * | 8/2016 | ............ C07D 209/82 |
| WO | 2012-136295 | A1 | 10/2012 | |
| WO | 2013-050101 | A1 | 4/2013 | |
| WO | 2014-104514 | A1 | 7/2014 | |
| WO | 2015-174640 | A1 | 11/2015 | |
| WO | WO-2016089165 | A2 * | 6/2016 | |
| WO | 2017103732 | A1 | 6/2017 | |

OTHER PUBLICATIONS

Bin Wang et al., "Strongly phosphorescent platinum(II) complexes supported by tetradentate benzazole-containing ligands," Journal of Materials Chemistry C, The Royal Society of Chemistry, Jul. 17, 2015, pp. 8212-8218, vol. 3.

JP OA issued Feb. 1, 2022 of JP Patent Application No. 2018-125086.

Abe Thick et al., "A Deuterium Compound for Electronic Devices, Organic Square," Jun. 2011, (36), 2, 3, 20 pp.

English Translation of Office Action dated Feb. 8, 2022, issued in corresponding JP Patent Application No. 2019-000573, 6 pp.

Extended European search report issued by the European Patent Office on Apr. 17, 2019 in the examination of the European Patent Application No. 19150173.3, which corresponds to above U.S. Application.

Office Action dated Feb. 8, 2022, issued in corresponding JP Patent Application No. 2019-000573, 6 pp.

Partial English Translation of Abe Thick et al., "A Deuterium Compound for Electronic Devices, Organic Square," Jun. 2011, (36), 2, 3, 1 pg.

Sugiyama, Yoko et al., "Synthesis and evaluation of deuterated OLED materials," Taiyo Nissan Giho, 2013, No. 32, pp. 5-8.

* cited by examiner

ORGANIC LIGHT-EMITTING DEVICE

CROSS-REFERENCE TO RELATED APPLICATION

This application claims priority to Korean Patent Application No. 10-2017-0084409, filed on Jul. 3, 2017, in the Korean Intellectual Property Office, and all the benefits accruing therefrom under 35 U.S.C. § 119, the content of which is incorporated herein in its entirety by reference.

BACKGROUND

1. Field

One or more embodiments relate to an organic light-emitting device.

2. Description of the Related Art

Organic light-emitting devices (OLEDs) are self-emission devices, which have superior characteristics in terms of a viewing angle, a response time, a brightness, a driving voltage, and a response speed, and which produce full-color images.

In an example, an organic light-emitting device includes an anode, a cathode, and an organic layer that is disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Various types of organic light emitting devices are known. However, there still remains a need in OLEDs having low driving voltage, high efficiency, high brightness, and long lifespan.

SUMMARY

Aspects of the present disclosure provide an organic light-emitting device that satisfies certain parameters, includes an iridium-free organometallic compound, and has high luminescent efficiency and a long lifespan.

Additional aspects will be set forth in part in the description which follows and, in part, will be apparent from the description, or may be learned by practice of the presented embodiments.

An aspect provides an organic light-emitting device including:
a first electrode;
a second electrode facing the first electrode; and
an organic layer disposed between the first electrode and the second electrode,
wherein the organic layer includes an emission layer, and an intermediate layer disposed between the first electrode and the emission layer,
the intermediate layer directly contacts the emission layer and includes a first hole transport material,
the emission layer includes a host and a dopant,
the dopant is an organometallic compound, provided that the dopant does not include iridium, and
the organic light-emitting device satisfies a condition of HOMO(h1)−HOMO(host)<0 electron volts,
wherein HOMO(h1) indicates the highest occupied molecular orbital (HOMO) energy level (expressed in electron volts) of the first hole transport material,
i) when the host consists of a single host, the HOMO (host) indicates a HOMO energy level (expressed in electron volts) of the single host and ii) when the host is a mixture of two or more different hosts, the HOMO(host) indicates the highest energy level among HOMO energy levels (expressed in electron volts) of the two or more different hosts, and
HOMO(h1) and HOMO(host) are measured by using a photoelectron spectrometer (e.g., AC3 manufactured by RIKEN KEIKI Co., Ltd) in an ambient atmosphere.

The organic light-emitting device may satisfy a condition of HOMO(dopant)−HOMO(host)<0.40 electron volts,
wherein HOMO(dopant) is a HOMO energy level (expressed in electron volts) of the dopant included in the emission layer, and
HOMO(dopant) may be measured by using a photoelectron spectrometer in an ambient atmosphere.

The organic light-emitting device may further include a hole transport region disposed between the first electrode and the intermediate layer,
the hole transport region may include a second hole transport material, and
the organic light-emitting device may satisfy a condition of HOMO(h1)−HOMO(h2)<0 electron volts,
wherein HOMO(h2) is a HOMO energy level of the second hole transport material, and HOMO(h2) may be measured by using a photoelectron spectrometer.

Another aspect provides an organic light-emitting device including:
a first electrode;
a second electrode facing the first electrode;
light-emitting units in the number of m, stacked between the first electrode and the second electrode and including at least one emission layer; and
charge-generation layers in the number of m−1, disposed between two neighboring light-emitting units selected from the light-emitting units in the number of m and including an n-type charge-generation layer and a p-type charge-generation layer,
wherein m is an integer greater than or equal to 2,
a maximum emission wavelength of light emitted by at least one of the light-emitting units in the number of m is different from a maximum emission wavelength of light emitted by at least one of the other light-emitting units,
at least one of the light-emitting units in the number of m includes at least one intermediate layer that is located at a side closer to the first electrode, directly contacts the emission layer, and includes a first hole transport material,
the emission layer includes a host and a dopant,
the dopant is an organometallic compound, provided that the dopant does not include iridium, and
the organic light-emitting device satisfies a condition of HOMO(h1)−HOMO(host)<0 electron volts,
wherein HOMO(h1) indicates a HOMO energy level (expressed in electron volts) of the first hole transport material,
i) when the host consists of a single host, the HOMO (host) indicates a HOMO energy level (expressed in electron volts) of the single host and ii) when the host is a mixture of two or more different hosts, the HOMO(host) indicates the highest energy level among HOMO energy levels (expressed in electron volts) of the two or more different hosts, and HOMO(h1) and HOMO(host) are measured by a photoelectron spectrometer (e.g., AC3, manufactured by RIKEN KEIKI Co., Ltd) in an ambient atmosphere.

Another aspect provides an organic light-emitting device including:

a first electrode;

a second electrode facing the first electrode; and emission layers in the number of m, stacked between the first electrode and the second electrode, wherein m is an integer greater than or equal to 2, a maximum emission wavelength of light emitted by at least one of the emission layers in the number of m is different from a maximum emission wavelength of light emitted by at least one of the other emission layers, at least one intermediate layer that directly contacts at least one of the emission layers and includes a first hole transport material is disposed between the emission layers in the number of m and the first electrode, the emission layers each include a host and a dopant, the dopant is an organometallic compound, provided that the dopant does not include iridium, and the organic light-emitting device satisfies a condition of HOMO(h1)−HOMO(host)<0 electron volts, wherein HOMO(h1) indicates a HOMO energy level (expressed in electron volts) of the first hole transport material, i) when the host consists of a single host, the HOMO (host) indicates a HOMO energy level (expressed in electron volts) of the single host and ii) when the host is a mixture of two or more different hosts, the HOMO(host) indicates the highest energy level among HOMO energy levels (expressed in electron volts) of the two or more different hosts, and HOMO(h1) and HOMO(host) are measured by a photoelectron spectrometer (e.g., AC3 manufactured by RIKEN KEIKI Co., Ltd) in an ambient atmosphere.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
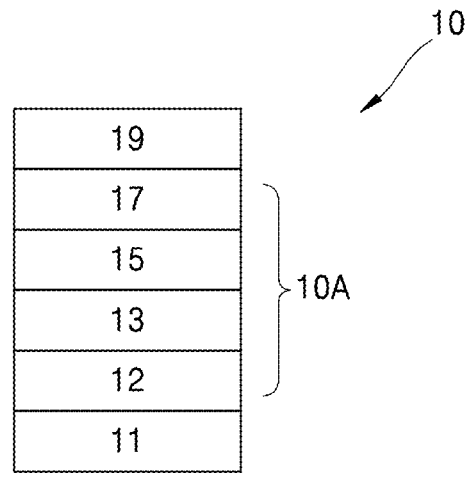
FIG. 1 is a schematic view of an organic light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Figure 2:
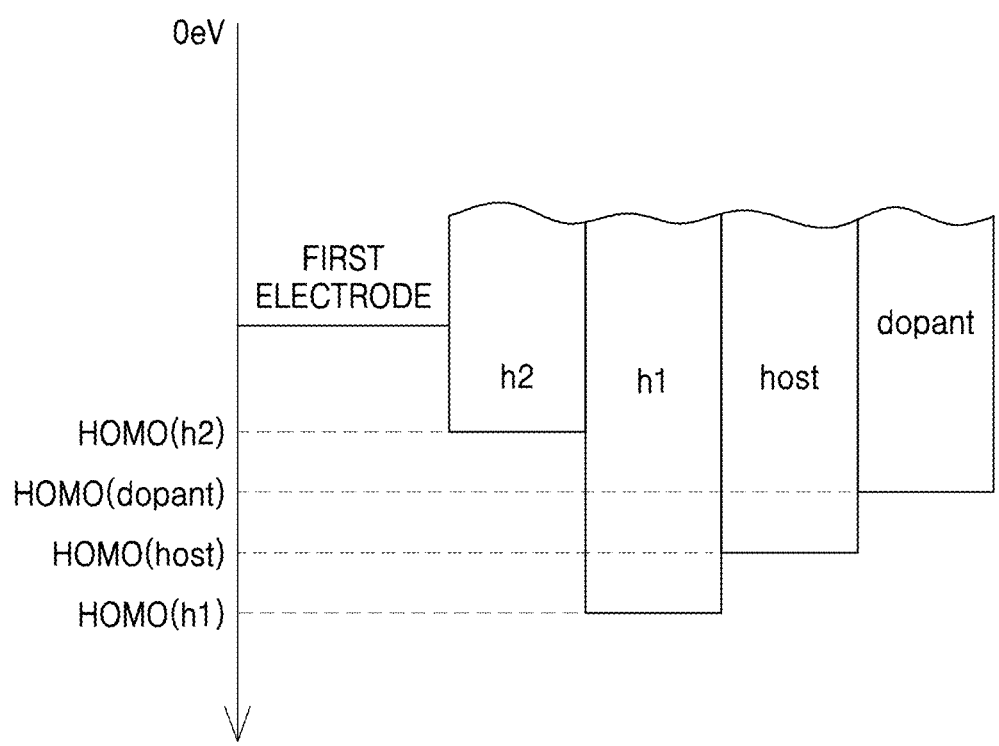
FIG. 2 is a diagram showing HOMO(h2), HOMO(h1), HOMO(host), and HOMO(dopant) of an organic light-emitting device.

Description of FIGS. 1 and 2

In FIG. 1, an organic light-emitting device 10 includes a first electrode 11, a second electrode 19 facing the first electrode 11, and an organic layer 10A disposed between the first electrode 11 and the second electrode 19.

In FIG. 1, a substrate may be additionally disposed under the first electrode 11 or above the second electrode 19. The substrate may be a glass substrate or a plastic substrate, each having excellent mechanical strength, thermal stability, transparency, surface smoothness, ease of handling, and water resistance.

First Electrode 11

The first electrode 11 may be formed by depositing or sputtering a material for forming the first electrode 11 on the substrate. When the first electrode 11 is an anode, the material for forming a first electrode may be selected from materials with a high work function to facilitate hole injection.

The first electrode 11 may be a reflective electrode, a semi-transmissive electrode, or a transmissive electrode. When the first electrode 11 is a transmissive electrode, a material for forming a first electrode may be selected from indium tin oxide (ITO), indium zinc oxide (IZO), tin oxide ($SnO_2$), zinc oxide (ZnO), and any combinations thereof, but embodiments of the present disclosure are not limited thereto. When the first electrode 110 is a semi-transmissive electrode or a reflective electrode, as a material for forming the first electrode 110, magnesium (Mg), silver (Ag), aluminum (Al), aluminum-lithium (Al—Li), calcium (Ca), magnesium-indium (Mg—In), magnesium-silver (Mg—Ag), or any combination thereof may be used. However, the material for forming the first electrode 110 is not limited thereto.

The first electrode 11 may have a single-layered structure, or a multi-layered structure including two or more layers.

HOMO Energy Levels of Hole Transport Region 12, Intermediate Layer 13, and Emission Layer 15

The organic layer 10A may include an emission layer 15, and an intermediate layer 13 disposed between the first electrode 11 and the emission layer 15. The intermediate layer 13 directly contacts the emission layer 15. That is, no layer is disposed between the intermediate layer 13 and the emission layer 15.

The intermediate layer 13 may include a first hole transport material, and the emission layer 15 may include a host and a dopant.

The dopant is an organometallic compound, and the dopant does not include iridium. That is, the dopant is an iridium-free organometallic compound.

The organic light-emitting device 10 may satisfy a condition of HOMO($h1$)−HOMO(host)<0 electron volts (eV). HOMO($h1$) indicates the highest occupied molecular orbital (HOMO) energy level (eV) of the first hole transport material included in the intermediate layer 13, i) when the host consists of a single host, the HOMO(host) indicates a HOMO energy level (eV) of the single host and ii) when the host is a mixture of two or more different hosts, the HOMO (host) indicates the highest energy level among HOMO energy levels (eV) of the two or more different hosts. HOMO($h1$) and HOMO(host) are respectively measured with respect to the first hole transport material and the host by using a photoelectron spectrometer in an ambient atmosphere.

Since the organic light-emitting device 10 satisfies the condition of HOMO($h1$)−HOMO(host)<0 eV, holes moved to the emission layer 15 may be easily trapped into the emission layer 15. Therefore, since the hole injection into the emission layer 15 is facilitated, reduction of a driving voltage, prevention of interfacial degradation between the intermediate layer 13 and the emission layer 15, prevention of luminance reduction according to a driving time (long lifespan), and a high external quantum efficiency, and the like for the organic light-emitting device 10 may be achieved.

In an embodiment, the organic light-emitting device 10 may satisfy a condition of:

$-0.4$ eV≤HOMO($h1$)−HOMO(host)<0 eV;

$-0.3$ eV≤HOMO($h1$)−HOMO(host)<0 eV;

$-0.2$ eV≤HOMO($h1$)−HOMO(host)<0 eV;

$-0.11$ eV≤HOMO($h1$)−HOMO(host)<0 eV;

$-0.08$ eV≤HOMO($h1$)−HOMO(host)<0 eV; or $-0.01$ eV≤HOMO($h1$)−HOMO(host)<0 eV, but embodiments of the present disclosure are not limited thereto.

In an embodiment, the organic light-emitting device 10 may satisfy a condition of:

HOMO(dopant)−HOMO(host)<0.40 eV;

HOMO(dopant)−HOMO(host)<0.35 eV; or

HOMO(dopant)−HOMO(host)<0.30 eV.

HOMO(dopant) is a HOMO energy level (eV) of the dopant included in the emission layer 15, and HOMO (dopant) is measured by using a photoelectron spectrometer in an ambient atmosphere.

Since the organic light-emitting device 10 satisfies the condition of HOMO(dopant)−HOMO(host)<0.40 eV, the dopant included in the emission layer 15 may act as a shallow trapping site with respect to the hole injected into the emission layer 15. Thus, retardation of hole hopping transport in the emission layer 15 may be substantially prevented. Consequently, the luminescent efficiency and lifespan of the organic light-emitting device 10 may be improved.

In an embodiment, the organic light-emitting device 10 may satisfy a condition of:

0 eV<HOMO(dopant)−HOMO(host)≤0.30 eV;

0 eV<HOMO(dopant)−HOMO(host)≤0.25 eV;

0 eV<HOMO(dopant)−HOMO(host)≤0.21 eV;

0 eV<HOMO(dopant)−HOMO(host)≤0.17 eV; or 0 eV<HOMO(dopant)−HOMO(host)≤0.14 eV, but embodiments of the present disclosure are not limited thereto.

The organic light-emitting device 10 may further include a hole transport region 12 disposed between the first electrode 11 and the intermediate layer 13, and the hole transport region 12 may include a second hole transport material and satisfy a condition of HOMO(h1)−HOMO(h2)<0 eV. HOMO(h2) is a HOMO energy level of the second hole transport material, and HOMO(h2) is measured by using a photoelectron spectrometer.

The hole transport region 12 may have a single-layered structure or a multi-layered structure. For example, the hole transport region 12 may have a structure of hole injection layer, hole transport layer, hole injection layer/hole transport layer, or hole injection layer/first hole transport layer/second hole transport layer, but embodiments of the present disclosure are not limited thereto.

Since the organic light-emitting device 10 satisfies the condition of HOMO(h1)−HOMO(h2)<0 eV, hole injection and transport from the hole transport region 12 to the intermediate layer 13 may be facilitated.

FIG. 2 is a diagram showing HOMO(h2), HOMO(h1), HOMO(host), and HOMO(dopant) of the organic light-emitting device 10.

Referring to FIG. 2, the organic light-emitting device 10 may further satisfy at least one of the following conditions, in addition to the condition of HOMO(h1)−HOMO(host)<0 eV:

HOMO($h$1)<HOMO($h$2)

HOMO($h$1)<HOMO(host)<HOMO($h$2)

HOMO($h$1)<HOMO(dopant)<HOMO($h$2)

HOMO($h$1)<HOMO(host)<HOMO(dopant)<HOMO($h$2)

HOMO($h$1)<HOMO(dopant)

HOMO($h$1)<HOMO(host)<HOMO(dopant)

HOMO(host)<HOMO(dopant)

HOMO(h2), HOMO(h1), HOMO(host), and HOMO(dopant) of FIG. 2 are actual measurement values measured by using a photoelectron spectrometer in an ambient atmosphere and are negative values.

Dopant in Emission Layer 15

The dopant in the emission layer 15 may be a phosphorescent compound. Thus, the organic light-emitting device 10 is quite different from an organic light-emitting device that emits fluorescence through a fluorescence mechanism.

In one or more embodiments, the dopant may be an organometallic compound including platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), rhodium (Rh), palladium (Pd), silver (Ag), or gold (Au). For example, the dopant may be an organometallic compound including platinum (Pt) or palladium (Pd), but embodiments of the present disclosure are not limited thereto.

In one or more embodiments, the dopant may include a metal M and an organic ligand, and the metal M and the organic ligand may form one, two, or three cyclometallated rings. The metal M may be platinum (Pt), osmium (Os), titanium (Ti), zirconium (Zr), hafnium (Hf), europium (Eu), terbium (Tb), thulium (Tm), rhodium (Rh), ruthenium (Ru), rhenium (Re), beryllium (Be), magnesium (Mg), aluminum (Al), calcium (Ca), manganese (Mn), cobalt (Co), copper (Cu), zinc (Zn), gallium (Ga), germanium (Ge), rhodium (Rh), palladium (Pd), silver (Ag), or gold (Au).

In one or more embodiments, the dopant may include a metal M and a tetradentate organic ligand capable of forming three or four (for example, three) cyclometallated rings with the metal M. The metal M is the same as described above. The tetradentate organic ligand may include, for example, a benzimidazole group and a pyridine group, but embodiments of the present disclosure are not limited thereto.

In one or more embodiments, the dopant may include a metal M and at least one of ligands represented by Formulae 1-1 to 1-4:

Formula 1-1

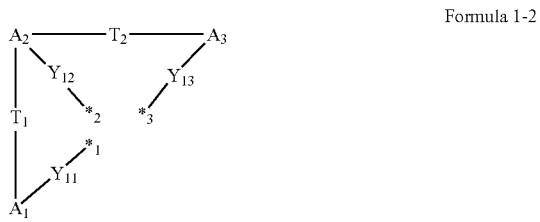

Formula 1-2

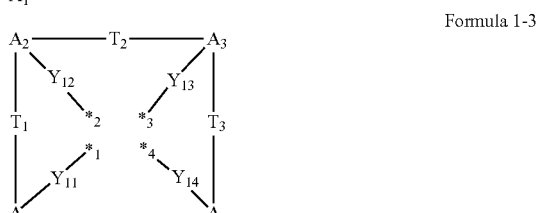

Formula 1-3

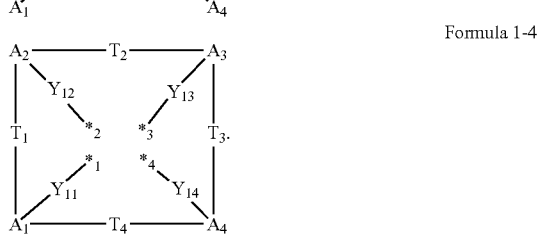

Formula 1-4

In Formulae 1-1 to 1-4, $A_1$ to $A_4$ may each independently be selected from a substituted or unsubstituted $C_5$-$C_{30}$ carbocyclic group, a substituted or unsubstituted $C_1$-$C_{30}$ heterocyclic group, and a non-cyclic group, $Y_{11}$ to $Y_{14}$ may each independently be a chemical bond, O, S, N(R$_{91}$), B(R$_{91}$), P(R$_{91}$), or C(R$_{91}$)(R$_{92}$), $T_1$ to $T_4$ may each independently be selected from a single bond, a double bond, *—N(R$_{93}$)—*', *—B(R$_{93}$)—*', *—P(R$_{93}$)—*', *—C(R$_{93}$)(R$_{94}$)—*', *—Si(R$_{93}$)(R$_{94}$)—*', *—Ge(R$_{93}$)(R$_{94}$)—*', *—S—*', *—Se—*', *—O—*', *—C(=O)—*', *—S(=O)—*', *—S(=O)$_2$—*', *—C(R$_{93}$)=*', *—C(R$_{93}$)—*', *—C(R$_{93}$)=C(R$_{94}$)—*', *—C(=S)—*', and *—C≡C—*', a substituent of the substituted $C_5$-$C_{30}$ carbocyclic group, a substituent of the substituted $C_1$-$C_{30}$ heterocyclic group, and R$_{91}$ to R$_{94}$ may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —B(Q$_6$)(Q$_7$), and —P(=O)(Q$_8$)(Q$_9$), and

*$_1$, *$_2$, *$_3$, and *$_4$ each indicate a binding site to M of the dopant.

For example, the dopant may include a ligand represented by Formula 1-3, and one of $A_1$ to $A_4$ in Formula 1-3 may be a substituted or unsubstituted benzimidazole group and at least one of the remainder of $A_1$ to $A_4$ may be a substituted or unsubstituted pyridine group, but embodiments of the present disclosure are not limited thereto.

In one or more embodiments, the dopant may be an organometallic compound represented by Formula 1A:

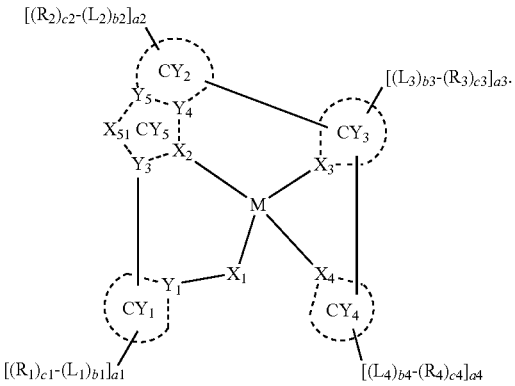

Formula 1A

In Formula 1A,

M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ may be O or S, and a bond between $X_1$ and M may be a covalent bond, $X_2$ to $X_4$ may each independently be C or N, one bond selected from a bond between $X_2$ and M, a bond between $X_3$ and M, and a bond between $X_4$ and M may be a covalent bond, and the others thereof may each be a coordinate bond, $Y_1$ and $Y_3$ to $Y_5$ may each independently be C or N, a bond between $X_2$ and $Y_3$, a bond between $X_2$ and $Y_4$, a bond between $Y_4$ and $Y_5$, a bond between $Y_5$ and $X_{51}$, and a bond between $X_{51}$ and $Y_3$ may each be a chemical bond, $CY_1$ to $CY_5$ may each independently be a $C_5$-$C_{30}$ carbocyclic group or a $C_1$-$C_{30}$ heterocyclic group, and $CY_4$ is not a benzimidazole group, a cyclometallated ring formed by $CY_5$, $CY_2$, $CY_3$, and M may be a 6-membered ring, $X_{51}$ may be selected from O, S, N-[(L$_7$)$_{b7}$-(R$_7$)$_{c7}$], C(R$_7$)(R$_8$), Si(R$_7$)(R$_8$), Ge(R$_7$)(R$_8$), C(=O), N, C(R$_7$), Si(R$_7$), and Ge(R$_7$), $R_7$ and $R_8$ may optionally be linked via a first linking group to form a substituted or unsubstituted $C_5$-$C_{30}$ carbocyclic group or a substituted or unsubstituted $C_1$-$C_{30}$ heterocyclic group, $L_1$ to $L_4$ and $L_7$ may each independently be a substituted or unsubstituted $C_5$-$C_{30}$ carbocyclic group or a substituted or unsubstituted $C_1$-$C_{30}$ heterocyclic group, b1 to b4 and b7 may each independently be an integer from 0 to 5, $R_1$ to $R_4$, $R_7$, and $R_8$ may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —B(Q$_6$)(Q$_7$), and —P(=O)(Q$_8$)(Q$_9$), c1 to c4 may each independently be an integer from 1 to 5, a1 to a4 may each independently be 0, 1, 2, 3, 4, or 5, two of a plurality of neighboring groups $R_1$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_3$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, and two or more groups selected from $R_1$ to $R_4$ may optionally be linked to form a substituted or unsubstituted $C_5$-$C_{30}$ carbocyclic group or a substituted or unsubstituted $C_1$-$C_{30}$ heterocyclic group.

A $C_5$-$C_{30}$ carbocyclic group, a $C_1$-$C_{30}$ heterocyclic group, and a $CY_1$ to $CY_4$ in Formulae 1-1 to 1-4 and 1A may each independently be a) a 6-membered ring, b) a condensed ring with two or more 6-membered rings, or c) a condensed ring with at least one 6-membered ring and one 5-membered ring; the 6-membered ring may be selected from a cyclohexane group, a cyclohexene group, an adamantane group, a norbornane group, a norbornene group, a benzene group, a pyridine group, a pyrimidine group, a pyrazine group, a pyridazine group, and a triazine group; and the 5-membered ring may be selected from a cyclopentane group, a cyclopentene group, a cyclopentadiene group, a furan group, a thiophene group, a silole group, a pyrrole group, a pyrazole group, an imidazole group, a triazole group, an oxazole group, an isoxazole group, a thiazole group, an isothiazole group, an oxadiazole group, and a thiadiazole group.

A non-cyclic group in Formulae 1-1 to 1-4 may be *—C(=O)—*', *—S—C(=O)—*', *—O—C(=S)—*', or *—S—C(=S)—*', but embodiments of the present disclosure are not limited thereto.

A substituent of the substituted $C_5$-$C_{30}$ carbocyclic group, a substituent of the substituted $C_1$-$C_{30}$ heterocyclic group, $R_{91}$ to $R_{94}$, $R_1$ to $R_4$, $R_7$, and $R_8$ in Formulae 1-1 to 1-4 and 1A may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —Si($Q_{33}$)($Q_{34}$)($Q_{35}$); and —N($Q_1$)($Q_2$), —Si($Q_3$)($Q_4$)($Q_5$), —B($Q_6$)($Q_7$), and —P(=O)($Q_8$)($Q_9$), and $Q_1$ to $Q_9$ and $Q_{33}$ to $Q_{35}$ may each independently be selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments of the present disclosure are not limited thereto.

In one or more embodiments, the dopant is an organometallic compound represented by Formula 1A, provided that, in Formula 1A, $X_2$ and $X_3$ are each independently C or N, $X_4$ may be N, and when i) M is Pt, ii) $X_1$ is O, iii) $X_2$ and $X_4$ are each N, $X_3$ is C, a bond between $X_2$ and M and a bond between $X_4$ and M are each a coordinate bond, and a bond between $X_3$ and M is a covalent bond, iv) $Y_1$ to $Y_5$ are each C, v) a bond between $Y_5$ and $X_{51}$ and a bond between $Y_3$ and $X_{51}$ are each a single bond, vi) $CY_1$, $CY_2$, and $CY_3$ are each a benzene group, and $CY_4$ is a pyridine group, vii) $X_{51}$ is O, S, or N-[($L_7$)$_{b7}$-($R_7$)$_{c7}$], and viii) b7 is 0, c7 is 1, and $R_7$ is a substituted or unsubstituted $C_1$-$C_{60}$ alkyl group, a1 to a4 may each independently be 1, 2, 3, 4, or 5, and at least one of $R_1$ to $R_4$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In one or more embodiments, the dopant may be represented by Formula 1A-1:

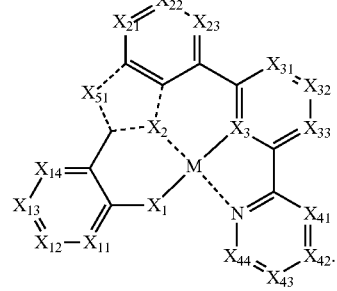

Formula 1A-1

In Formula 1A-1,

M, $X_1$ to $X_3$, and $X_{51}$ are each independently the same as described herein, $X_{11}$ may be N or C-[($L_{11}$)$_{b11}$-($R_{11}$)$_{c11}$], $X_{12}$ may be N or C-[($L_{12}$)$_{b12}$-($R_{12}$)$_{c12}$], $X_{13}$ may be N or C-[($L_{13}$)$_{b13}$-($R_{13}$)$_{c13}$], and $X_{14}$ may be N or C-[($L_{14}$)$_{b14}$-($R_{14}$)$_{c14}$], $L_{11}$ to $L_{14}$, b11 to b14, $R_{11}$ to $R_{14}$, and c11 to c14 are each independently the same as described in connection with Li, b1, $R_1$, and c1, $X_{21}$ may be N or C-[($L_{21}$)$_{b21}$-($R_{21}$)$_{c21}$], $X_{22}$ may be N or C-[($L_{22}$)$_{b22}$-($R_{22}$)$_{c22}$], and $X_{23}$ may be N or C-[($L_{23}$)$_{b23}$-($R_{23}$)$_{c23}$], $L_{21}$ to $L_{23}$, b21 to b23, $R_{21}$ to $R_{23}$, and c21 to c23 are each independently the same as described in connection with $L_2$, b2, $R_2$, and c2, $X_{31}$ may be N or C-[($L_{31}$)$_{b31}$-($R_{31}$)$_{c31}$], $X_{32}$ may be N or C-[($L_{32}$)$_{b32}$-($R_{32}$)$_{c32}$], and $X_{33}$ may be N or C-[($L_{33}$)$_{b33}$-($R_{33}$)$_{c33}$], $L_{31}$ to $L_{33}$, b31 to b33, $R_{31}$ to $R_{33}$, and c31 to c33 are each independently the same as described in connection with $L_3$, b3, $R_3$, and c3, $X_{41}$ may be N or C-[($L_{41}$)$_{b41}$-($R_{41}$)$_{c41}$], $X_{42}$ may be N or C-[($L_{42}$)$_{b42}$-($R_{42}$)$_{c42}$], $X_{43}$ may be N or C-[($L_{43}$)$_{b43}$-($R_{43}$)$_{c43}$], and $X_{44}$ may be N or C-[($L_{44}$)$_{b44}$-($R_{44}$)$_{c44}$], $L_{41}$ to $L_{44}$, b41 to b44, $R_{41}$ to $R_{44}$, and c41 to c44 are each independently the same as described in connection with $L_4$, b4, $R_4$, and c4, two of $R_{11}$ to $R_{14}$ may optionally be linked to form a substituted or unsubstituted $C_5$-$C_{30}$ carbocyclic group or a substituted or unsubstituted $C_1$-$C_{30}$ heterocyclic group, two of $R_{21}$ to $R_{23}$ may optionally be linked to form a substituted or unsubstituted $C_5$-$C_{30}$ carbocyclic group or a substituted or unsubstituted $C_1$-$C_{30}$ heterocyclic group, two of $R_{31}$ to $R_{33}$ may optionally be linked to form a substituted or unsubstituted $C_5$-$C_{30}$ carbocyclic group or a substituted or unsubstituted $C_1$-$C_{30}$ heterocyclic group, and two of $R_{41}$ to $R_{44}$ may optionally be linked to form a substituted or unsubstituted $C_5$-$C_{30}$ carbocyclic group or a substituted or unsubstituted $C_1$-$C_{30}$ heterocyclic group.

For example, the dopant may be one of Compounds 1-1 to 1-88, 2-1 to 2-47, and 3-1 to 3-582, but embodiments of the present disclosure are not limited thereto:

| 15 | 16 |
|---|---|
| 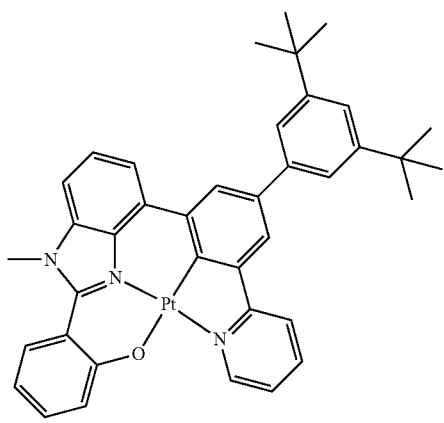 1-1 | 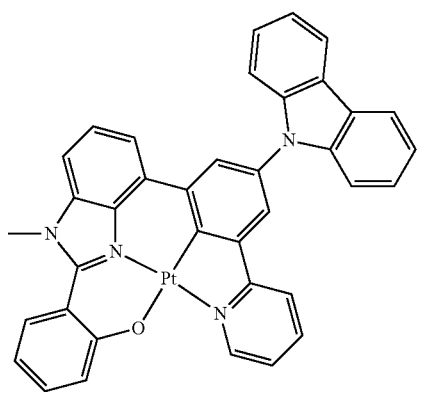 1-2 |
| 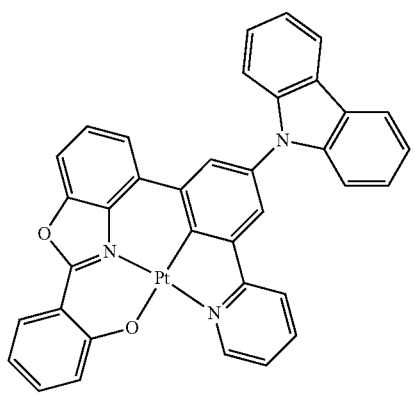 1-3 | 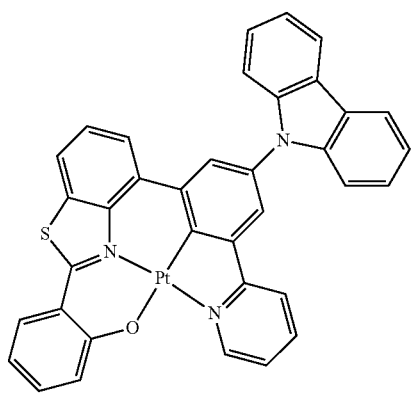 1-4 |
| 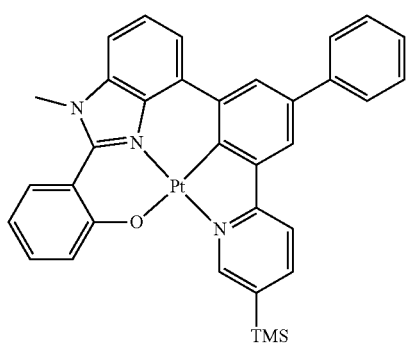 1-5 | 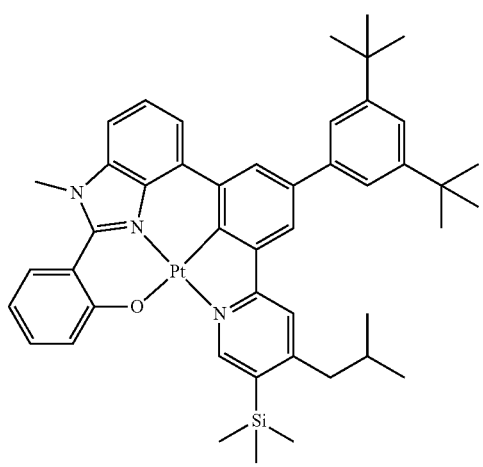 1-6 |
| 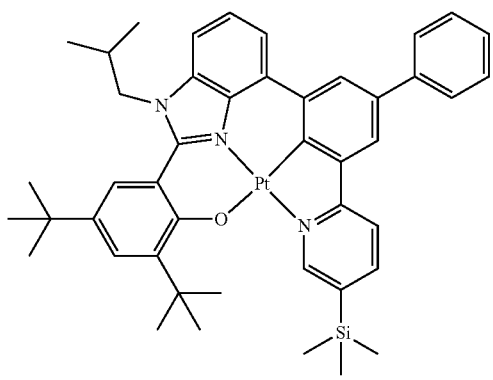 1-7 | 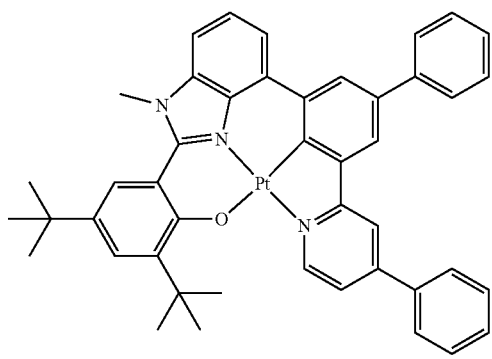 1-8 |

-continued
1-9
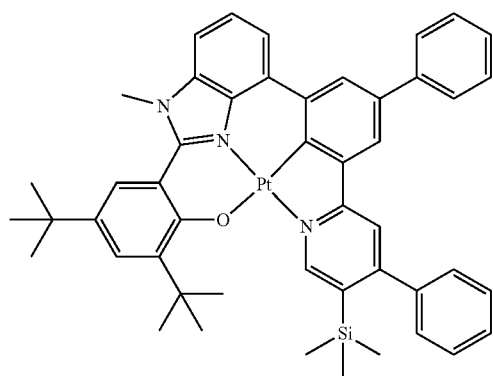
1-10
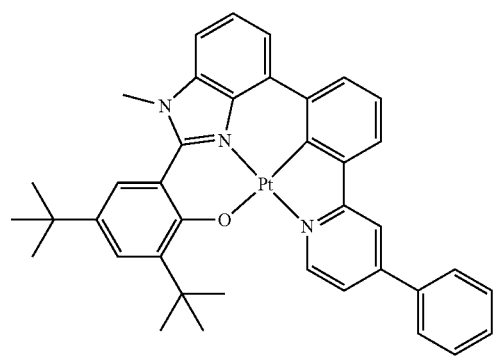
1-11
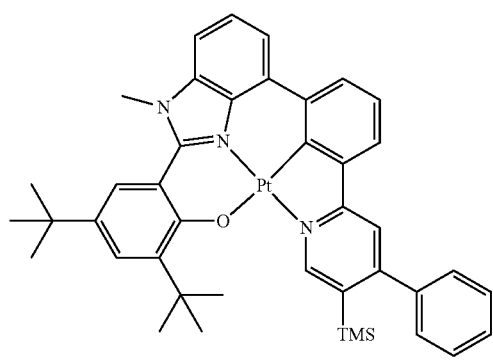
1-12
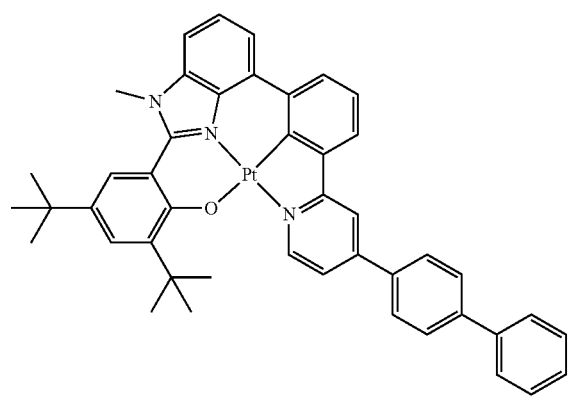
1-13
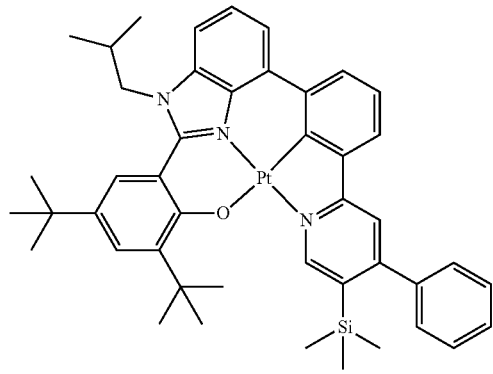
1-14
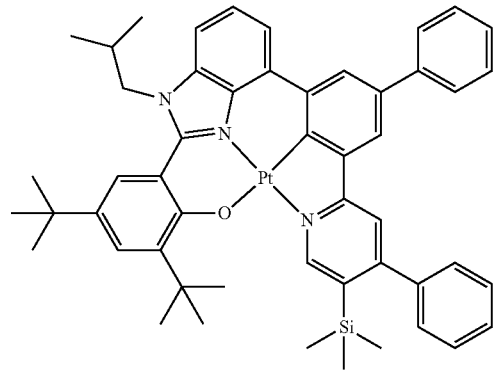
1-15
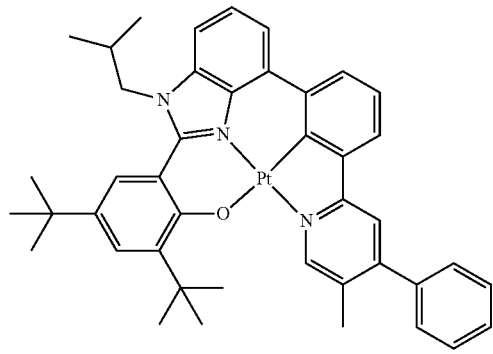
1-16
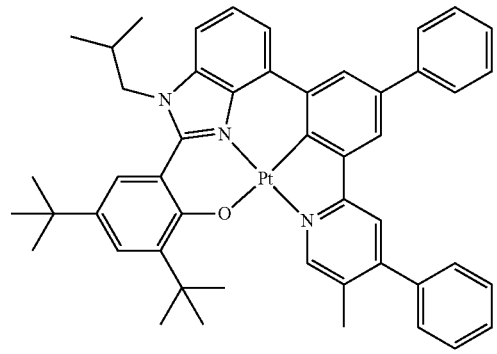

-continued
1-17
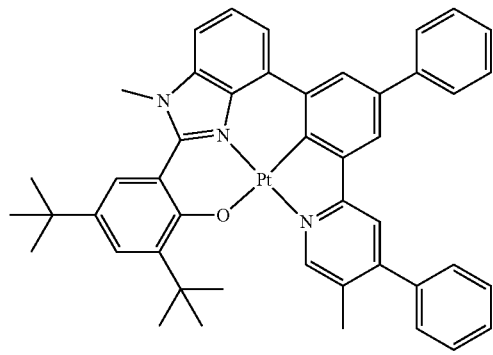
1-18
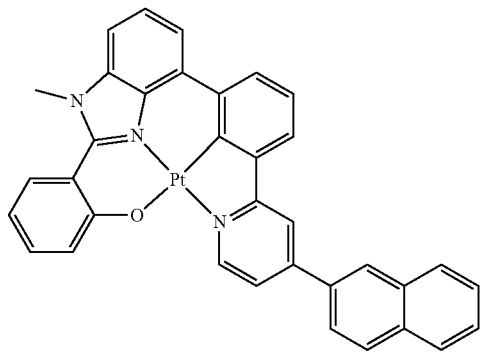
1-19
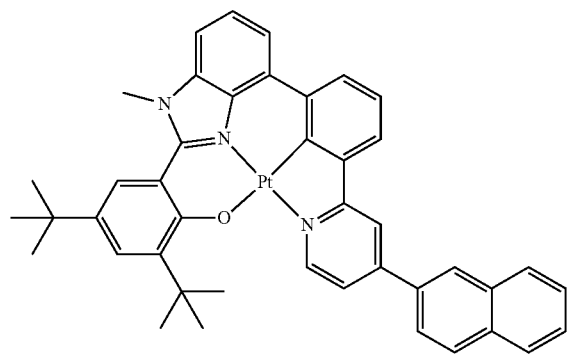
1-20
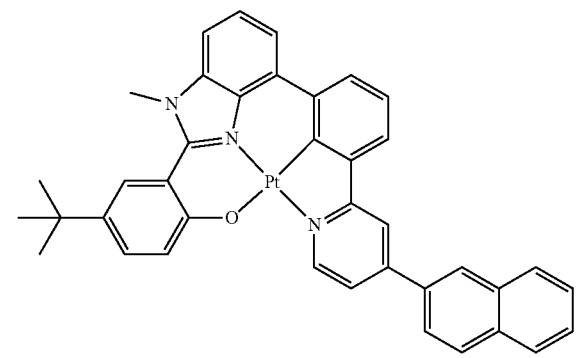
1-21
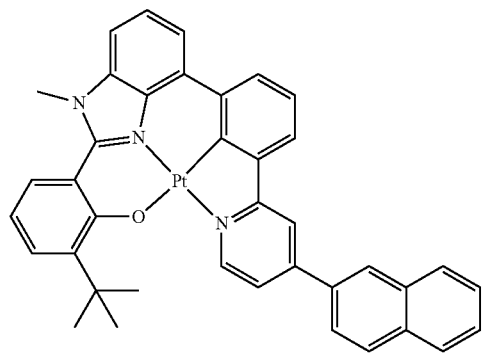
1-22
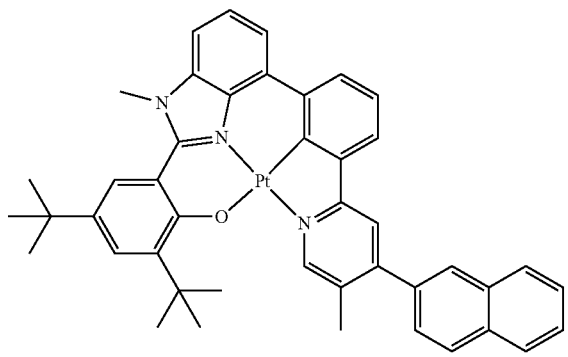
1-23
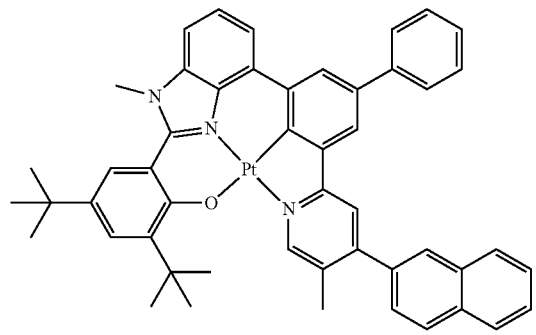
1-24
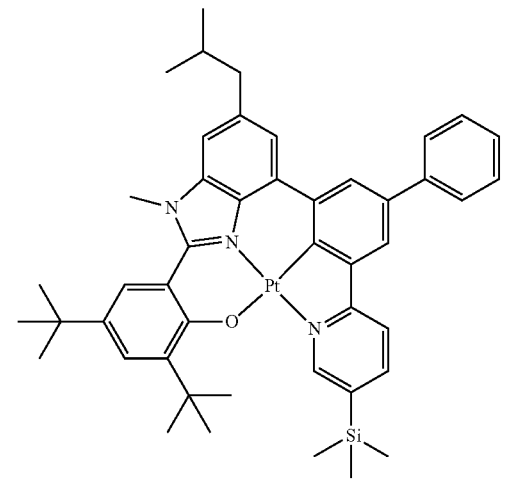

1-25
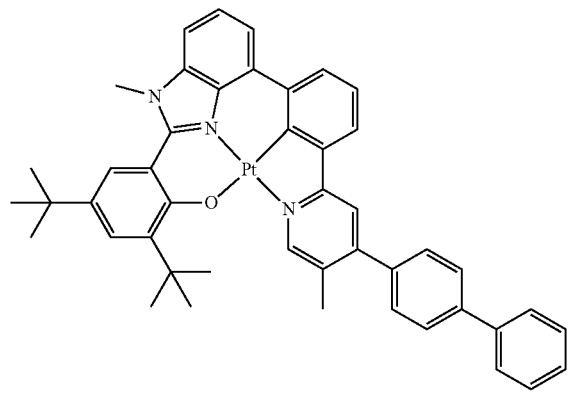
1-26
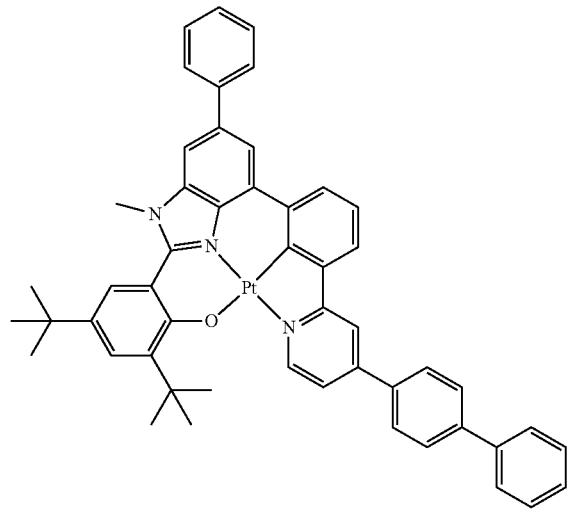
1-27
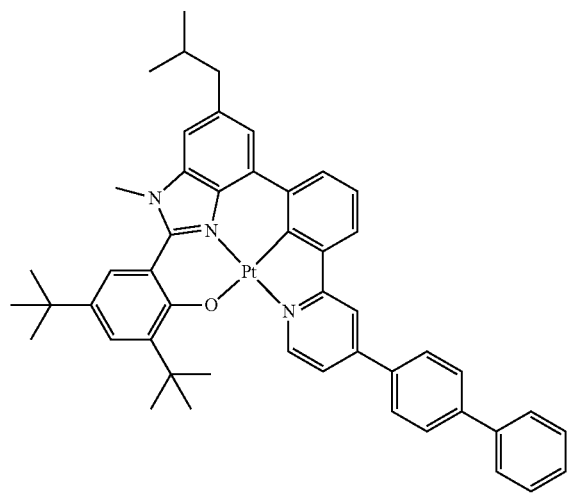
1-28
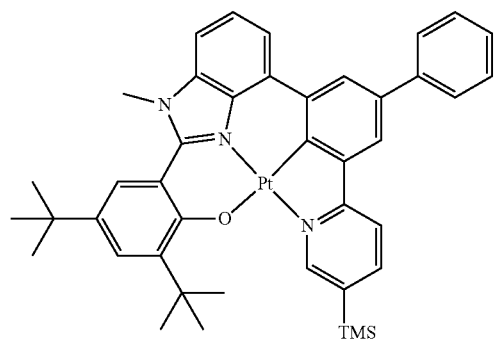
1-29
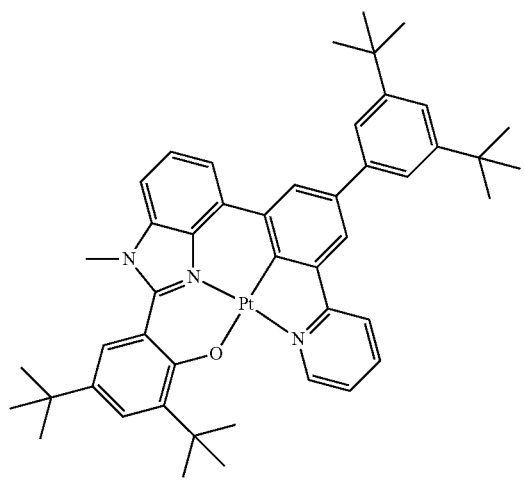
1-30
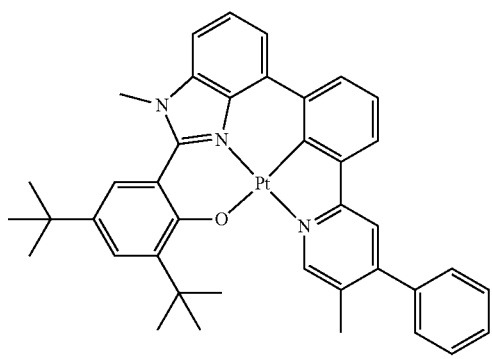

-continued
1-31
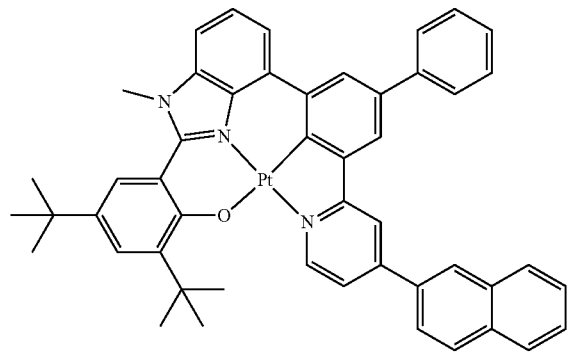
1-32
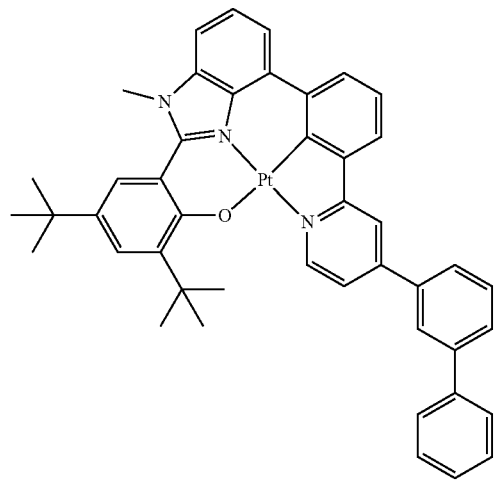
1-33
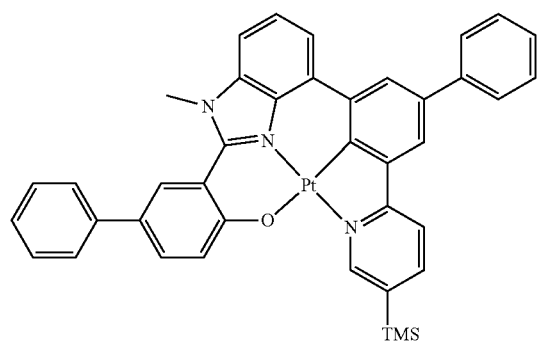
1-34
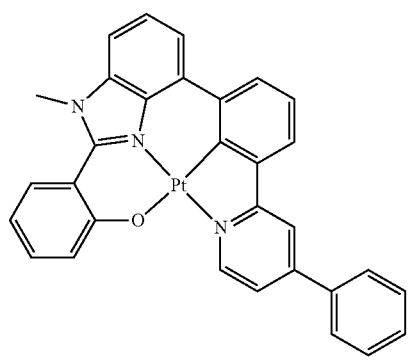
1-35
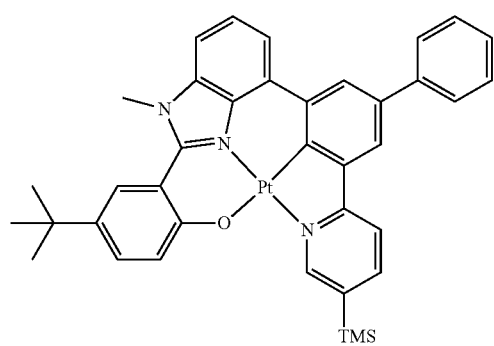
1-36
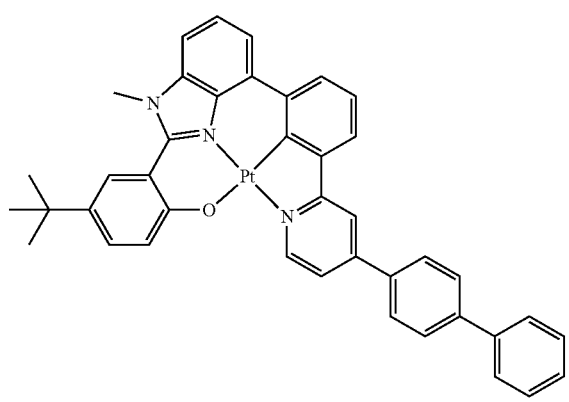

-continued
1-37
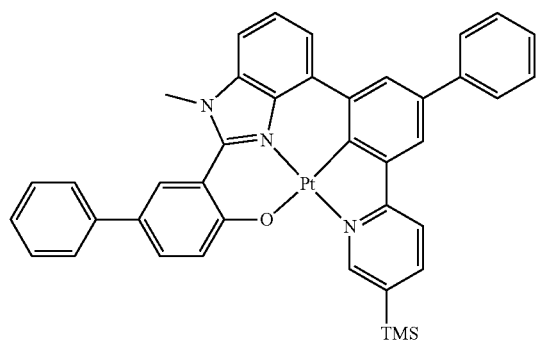
1-38
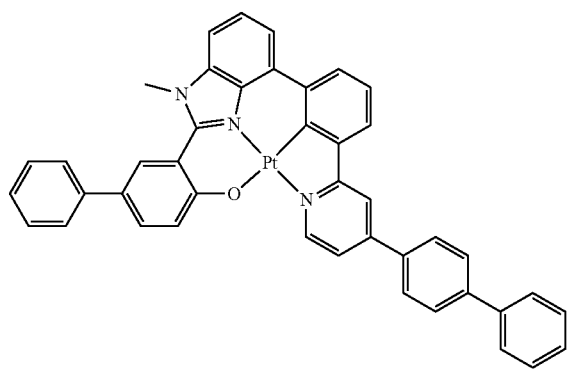
1-39
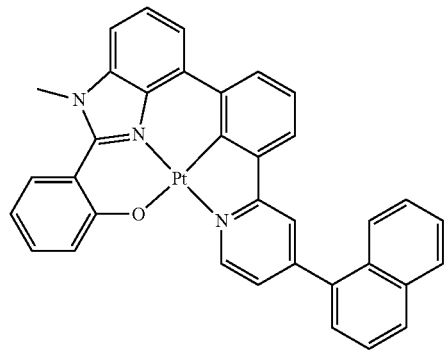
1-40
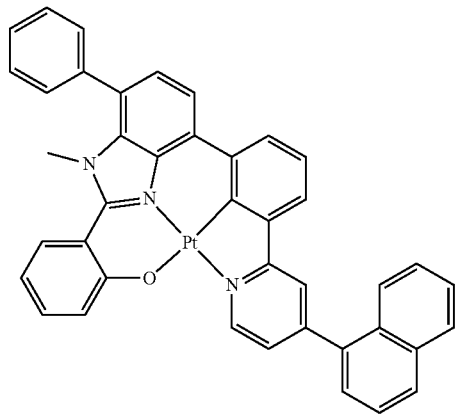
1-41
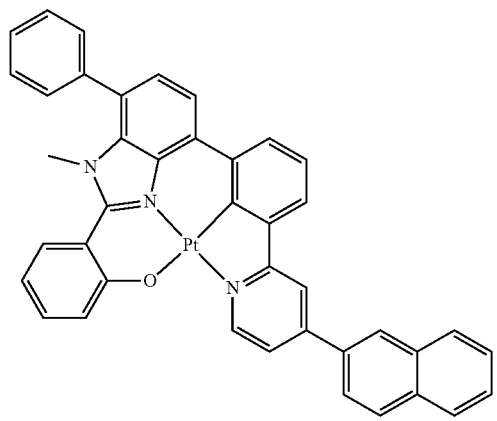
1-42
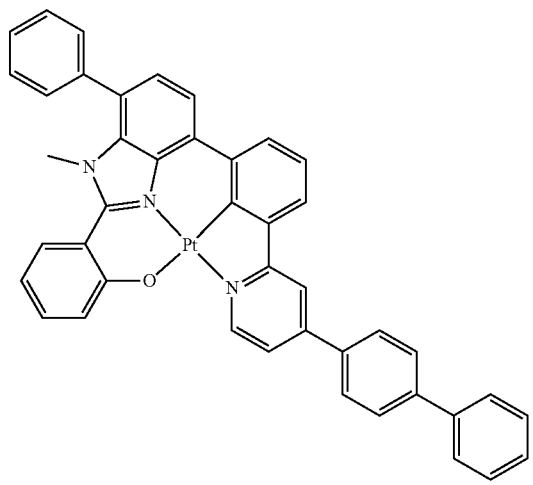

-continued
1-43
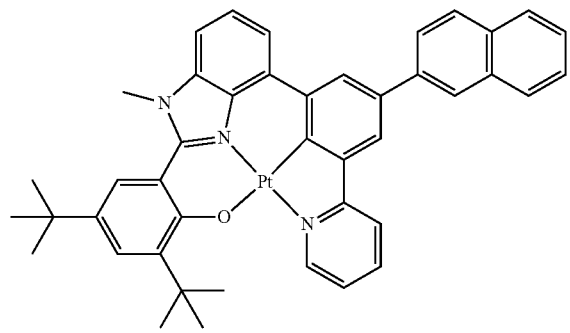
1-44
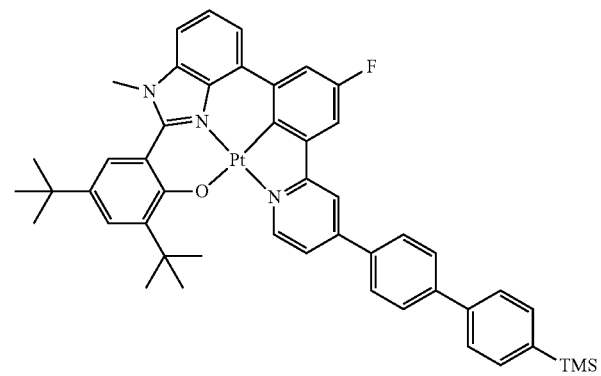
1-45
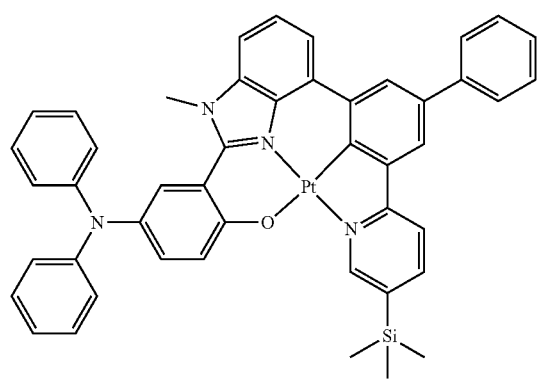
1-46
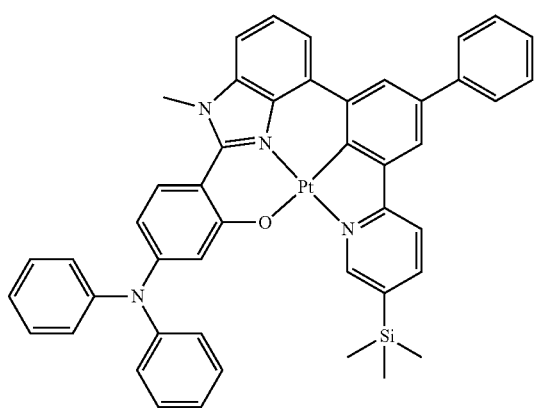
1-47
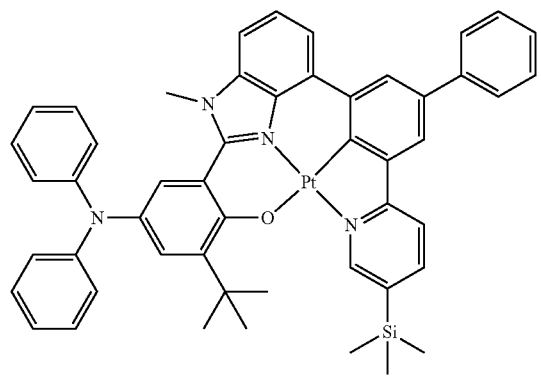
1-48
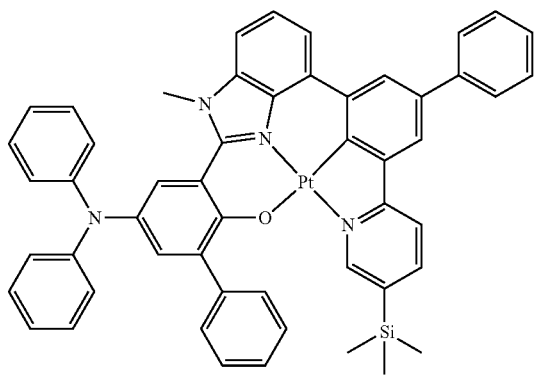
1-49
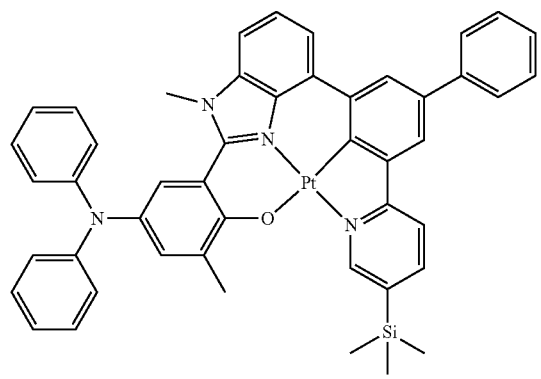
1-50
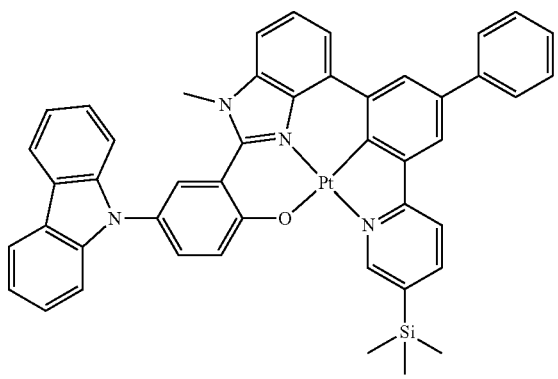

-continued
1-51
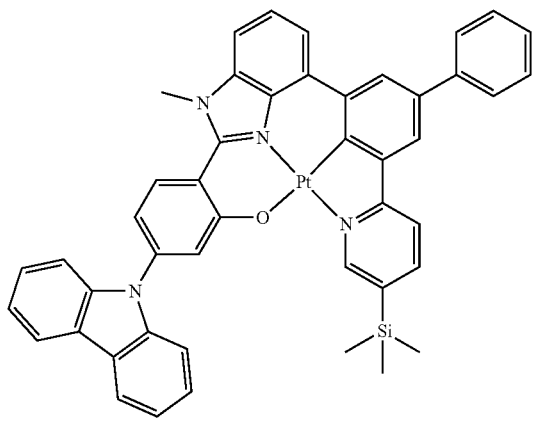
1-52
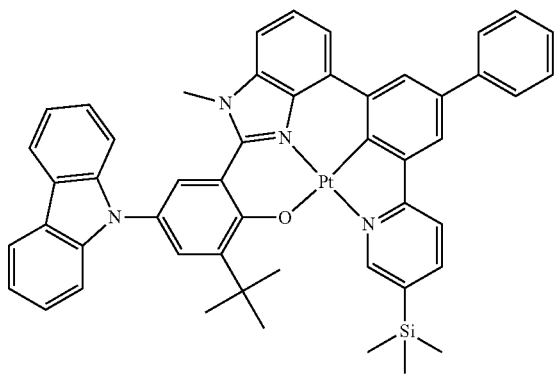
1-53
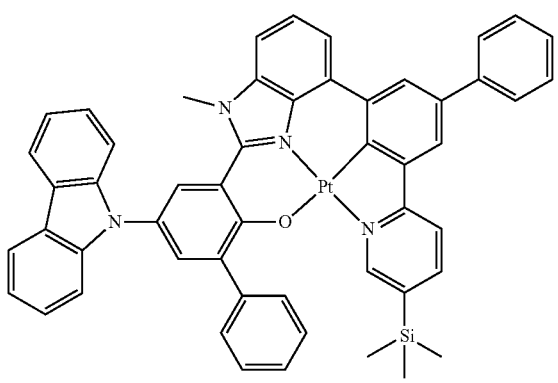
1-54
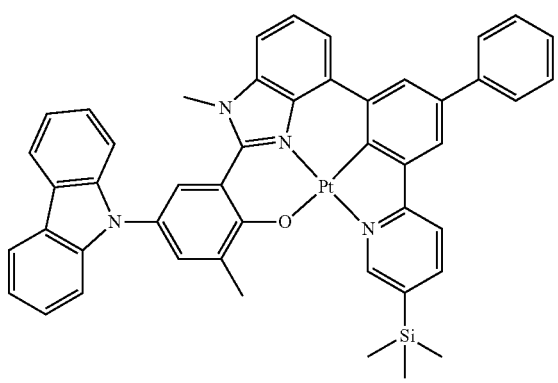
1-55
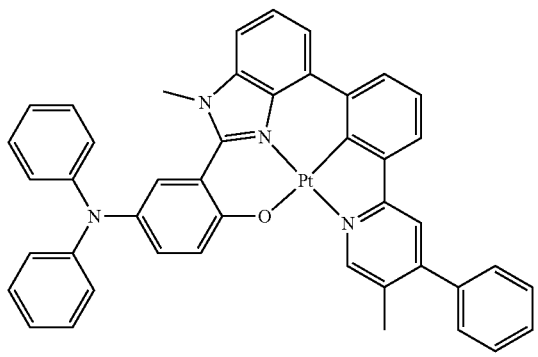
1-56
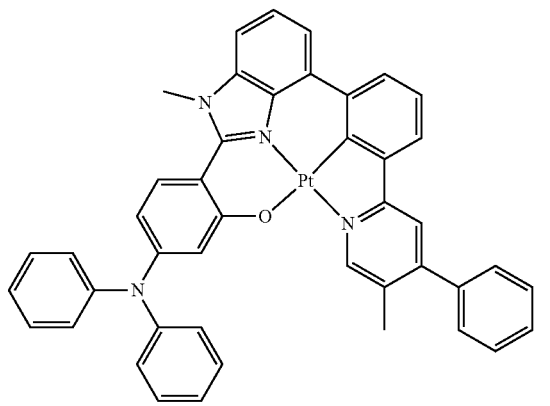
1-57
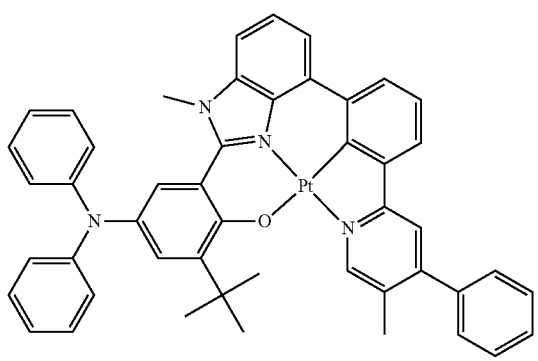
1-58
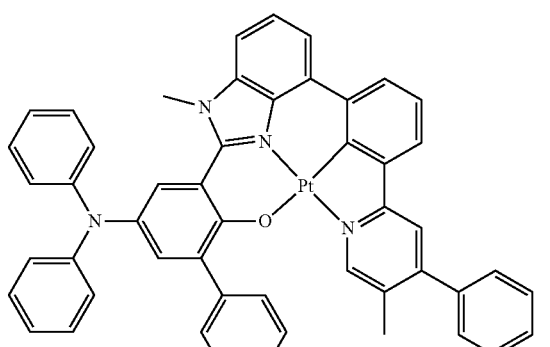

-continued
1-59
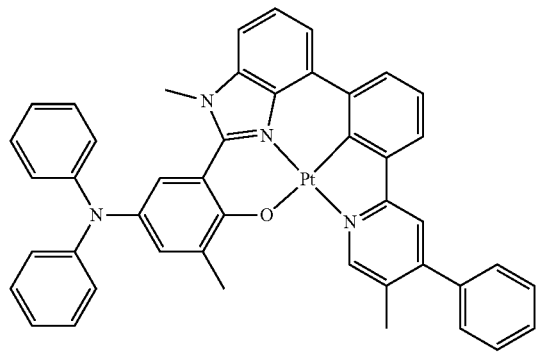
1-60
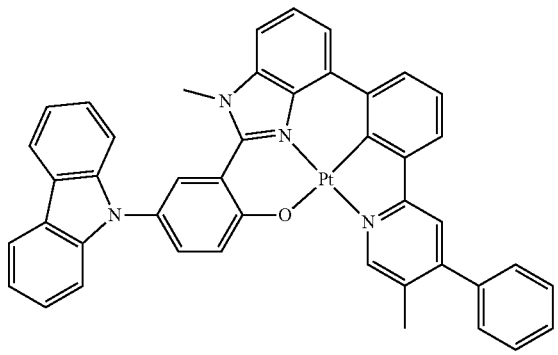
1-61
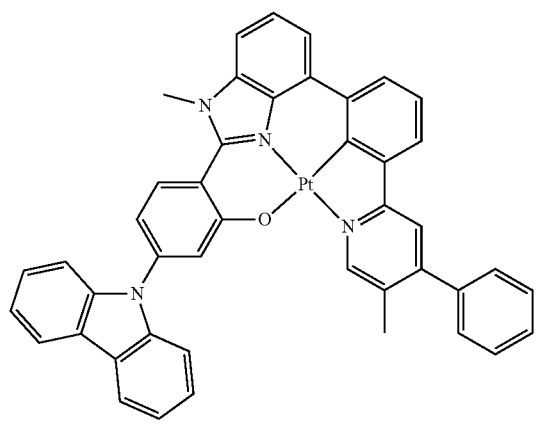
1-62
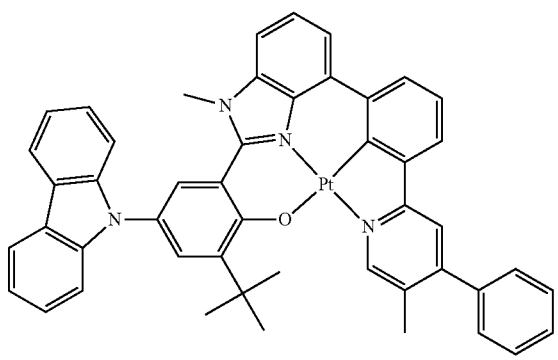
1-63
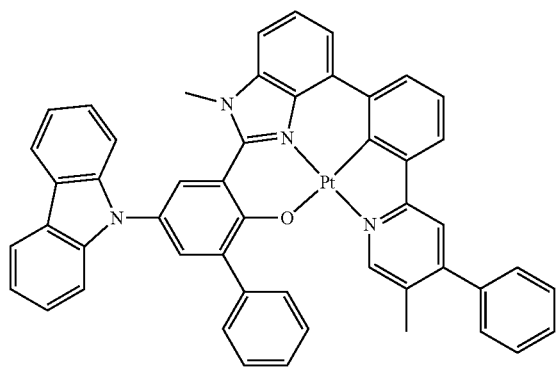
1-64
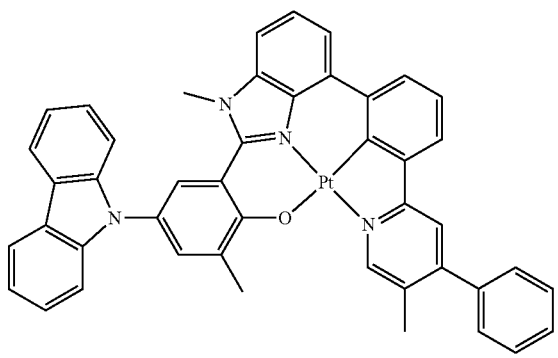
1-65
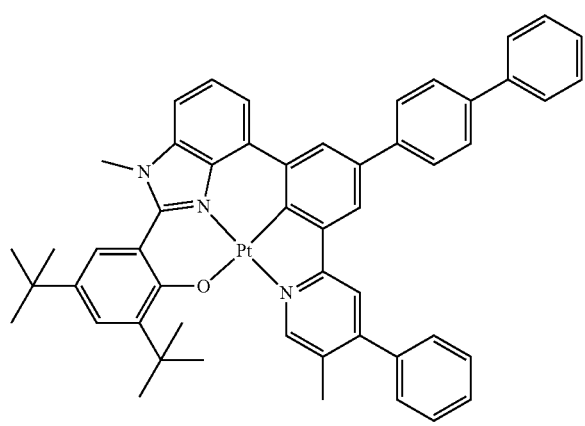
1-66
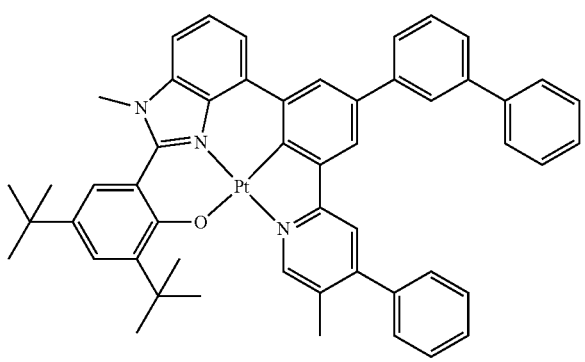

-continued
1-67
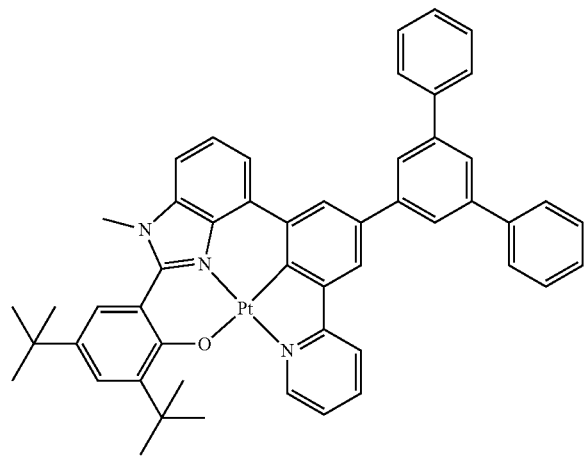
1-68
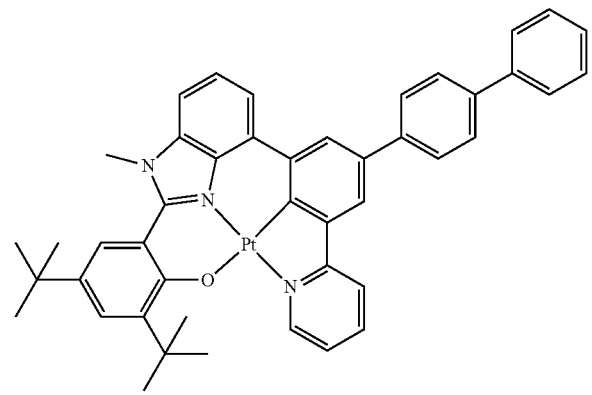
1-69
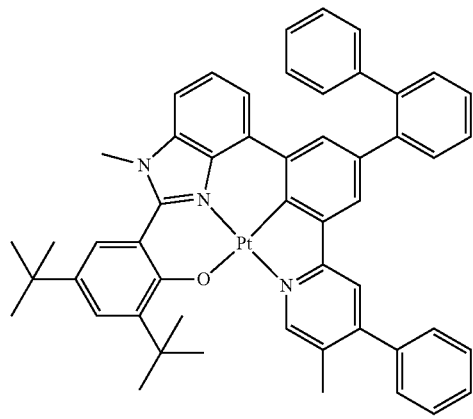
1-70
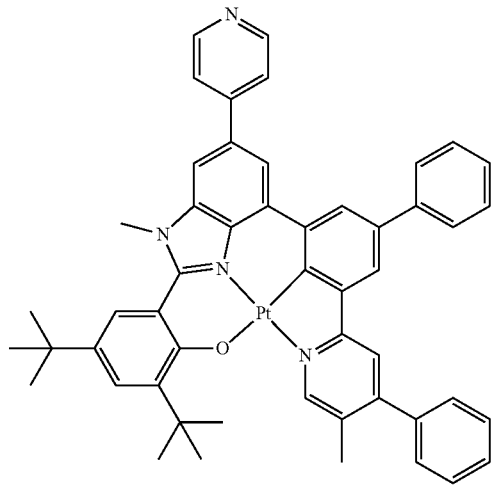
1-71
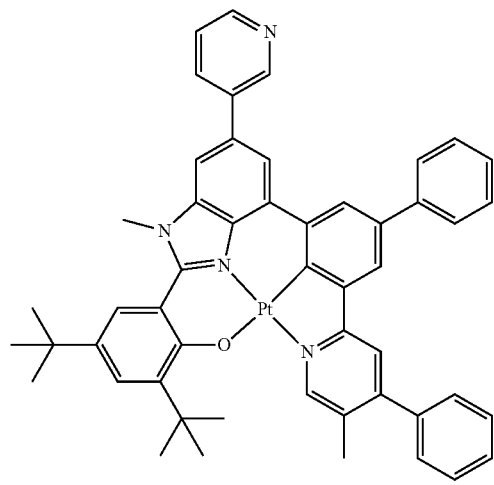
1-72
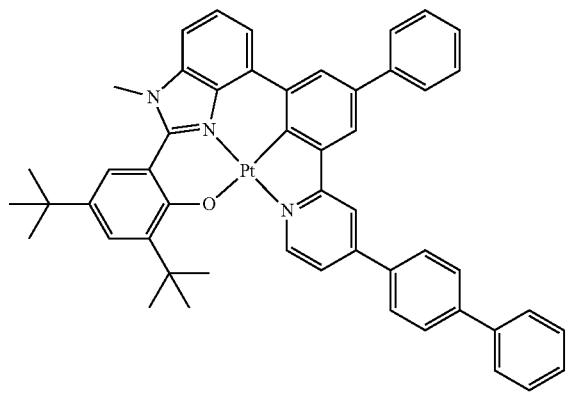

-continued
1-73
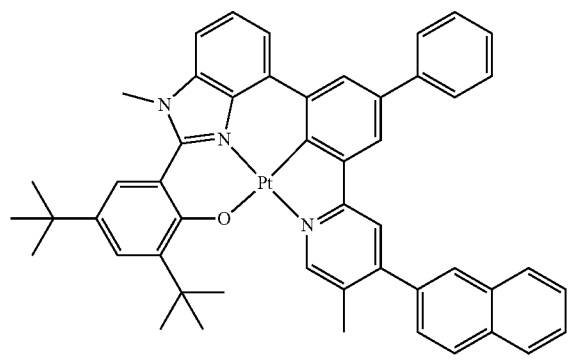
1-74
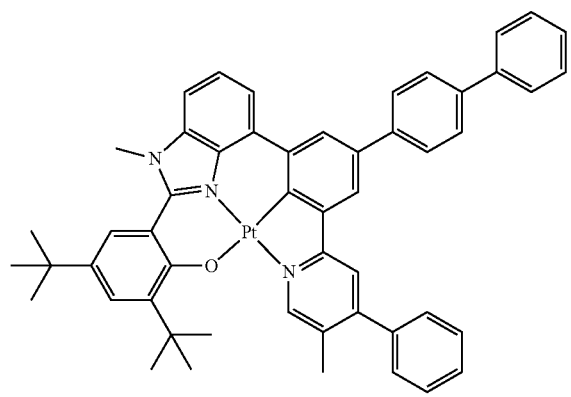
1-75
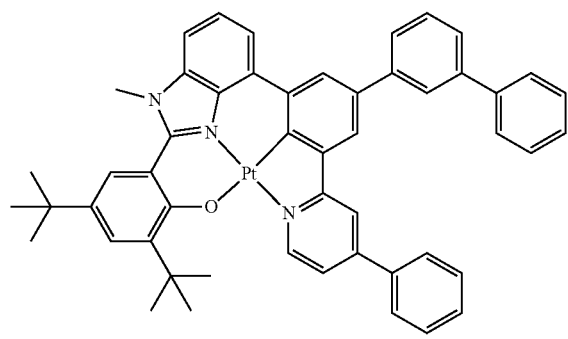
1-76
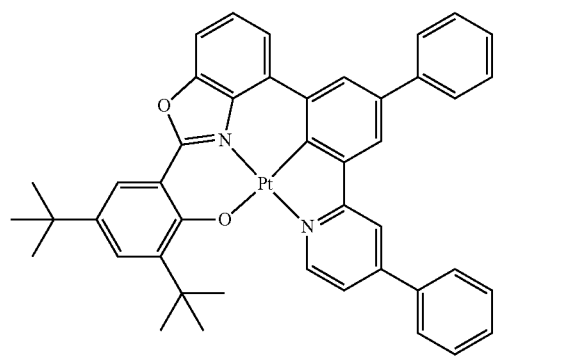
1-77
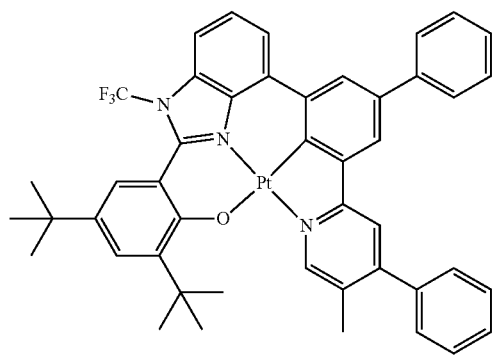
1-78
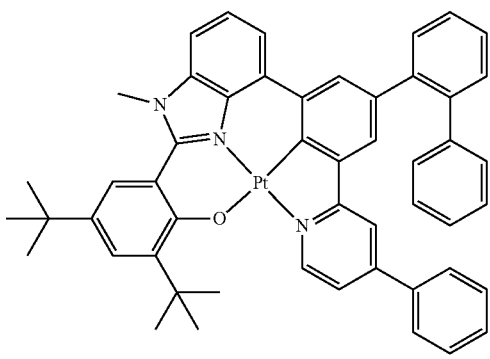
1-79
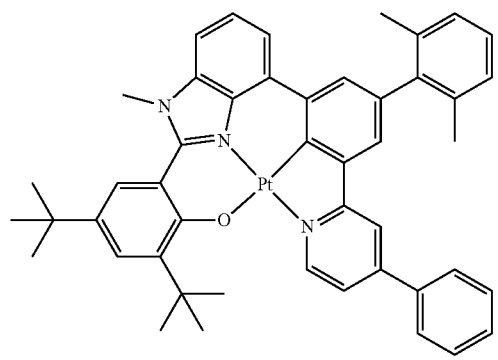
1-80
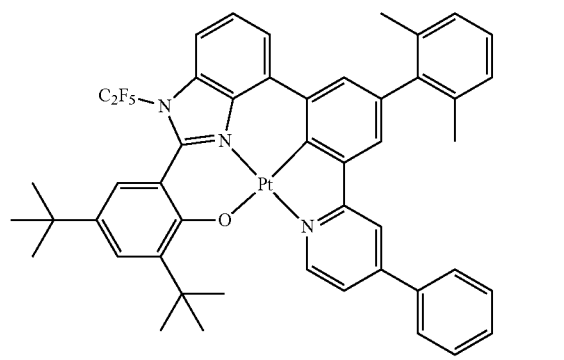

-continued
1-81
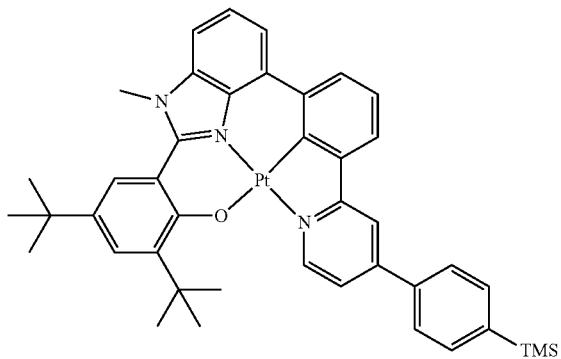
1-82
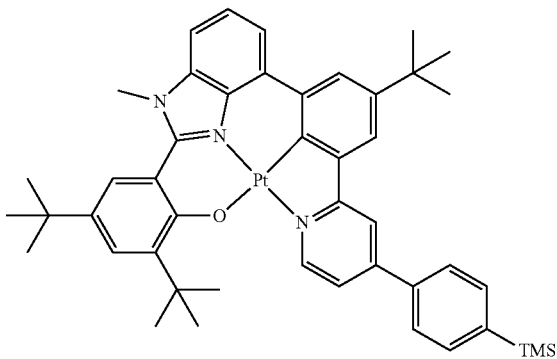
1-83
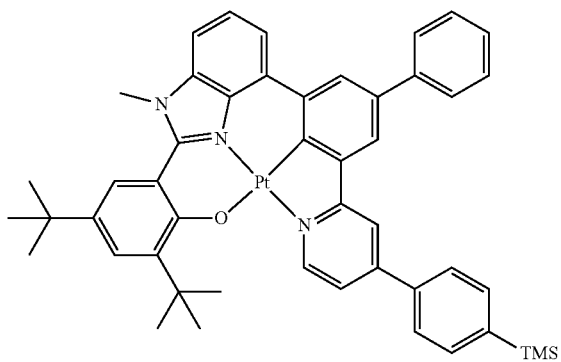
1-84
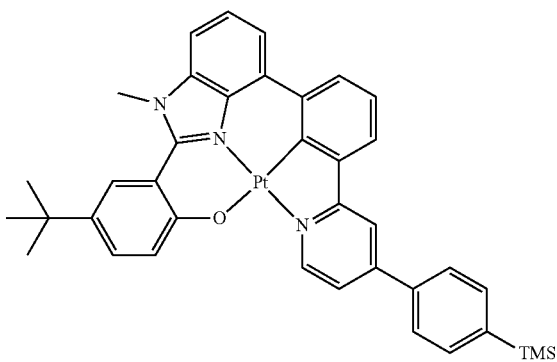
1-85
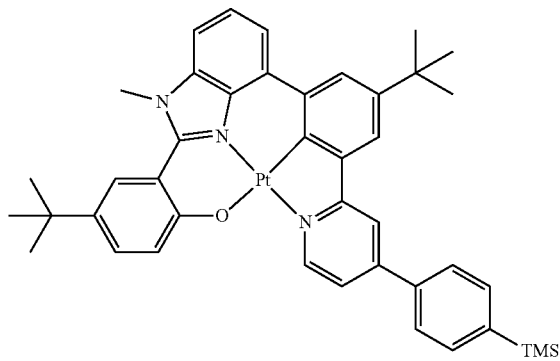
1-86
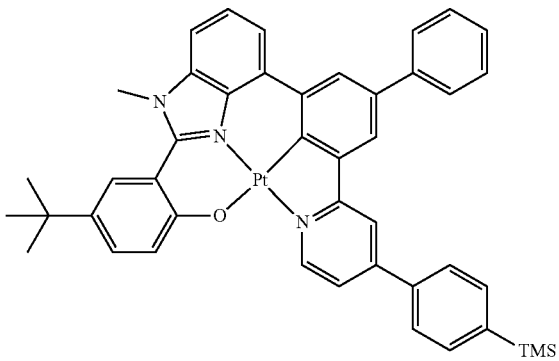
1-87
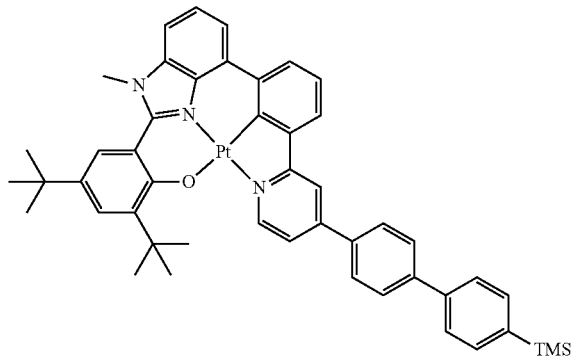
1-88
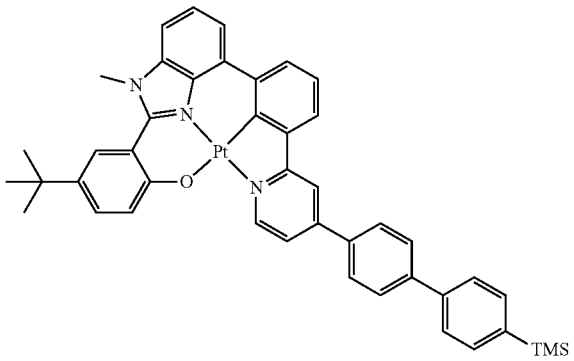

-continued
| | |
|---|---|
| 2-1 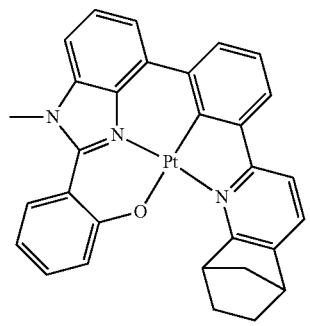 | 2-2 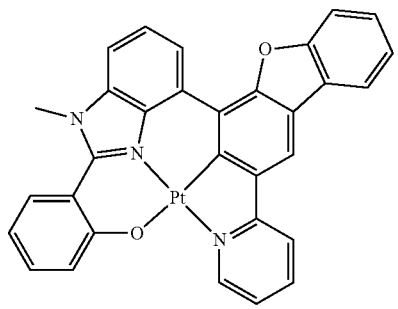 |
| 2-3 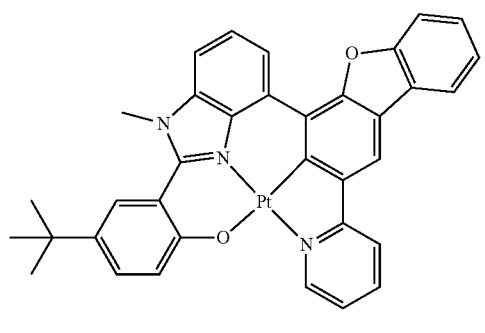 | 2-4 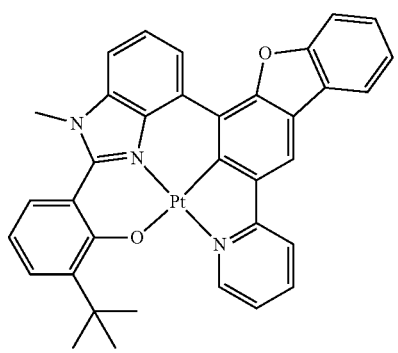 |
| 2-5 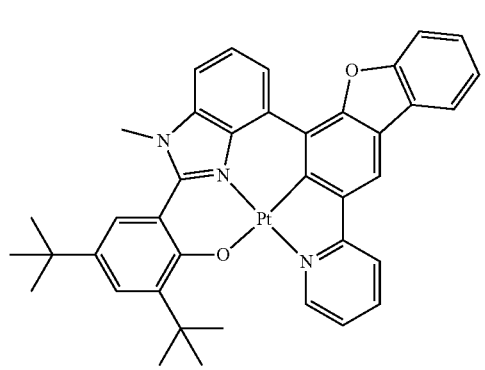 | 2-6 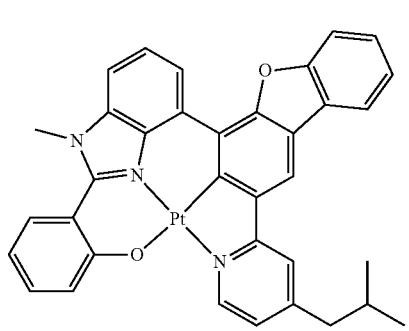 |
| 2-7 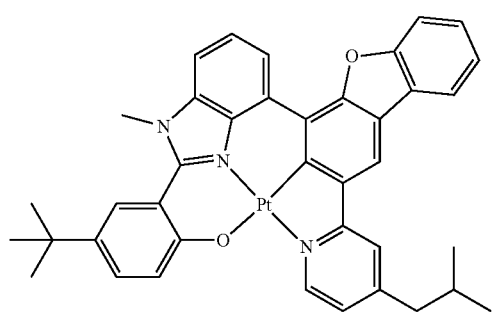 | 2-8 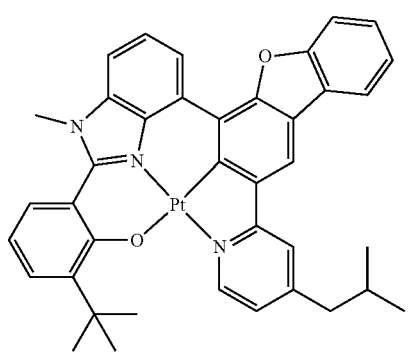 |

-continued
2-9
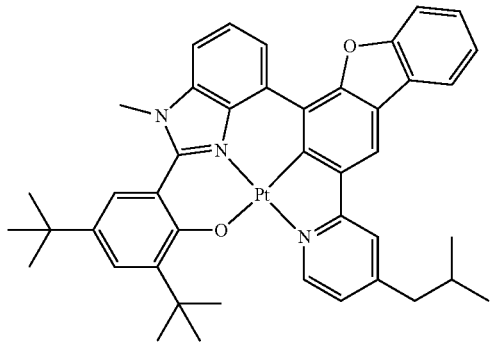
2-10
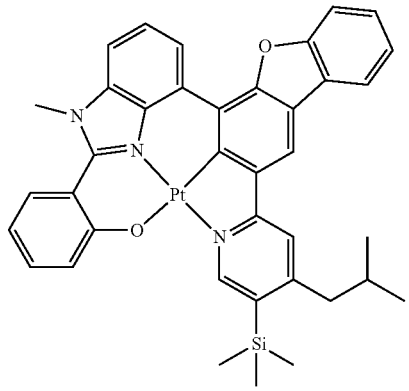
2-11
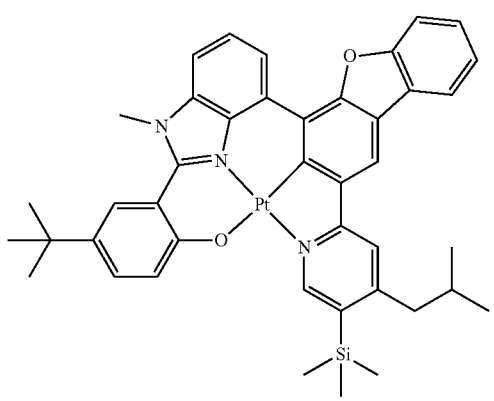
2-12
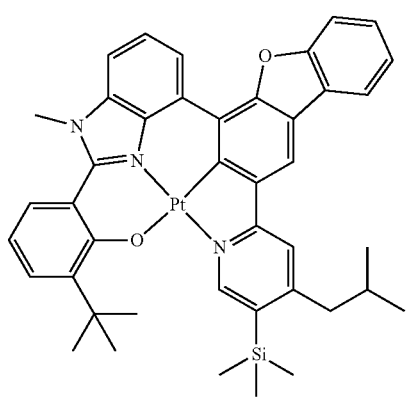
2-13
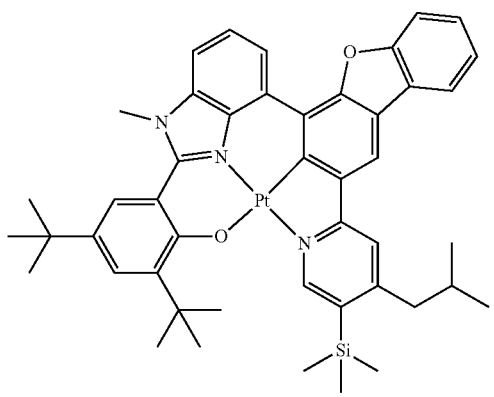
2-14
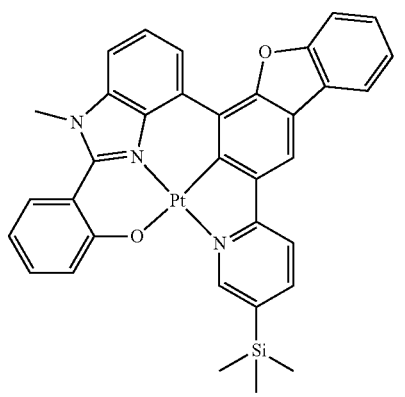
2-15
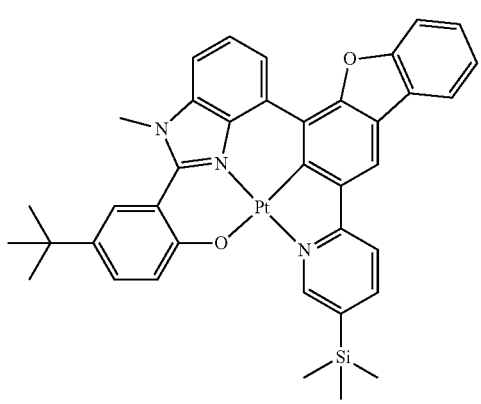
2-16
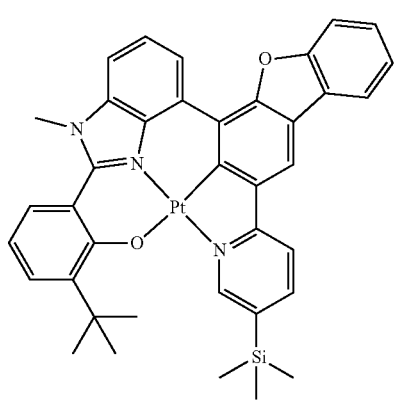

-continued
2-17
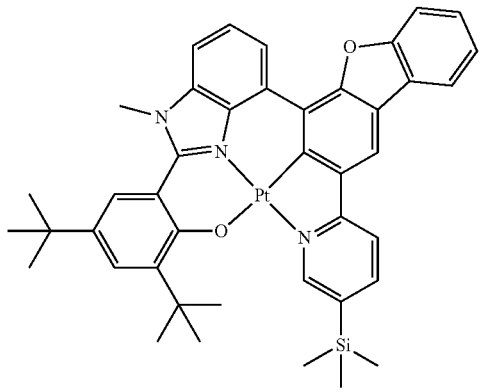
2-18
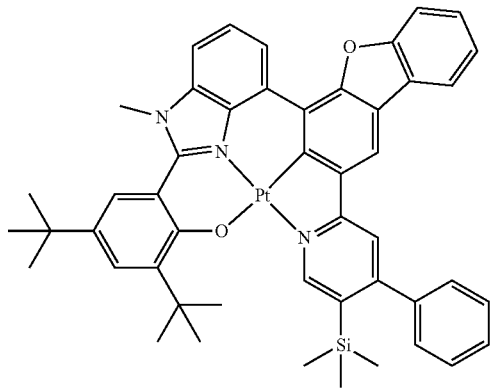
2-19
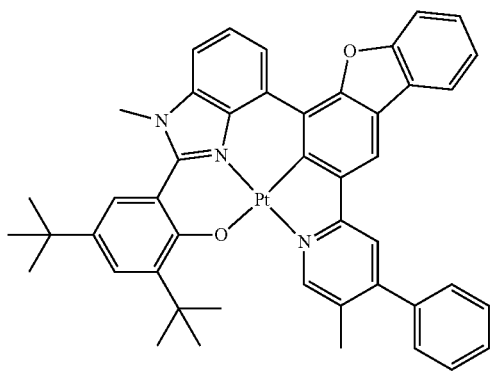
2-20
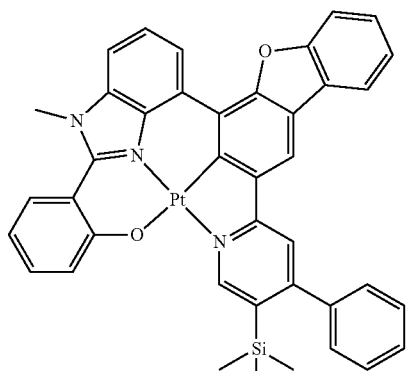
2-21
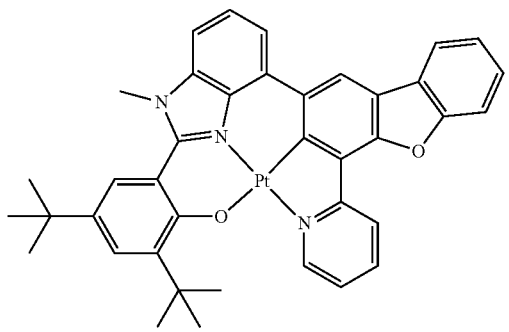
2-22
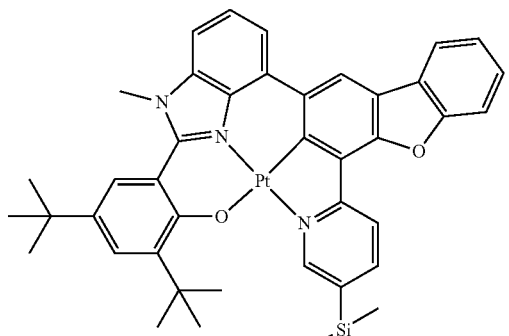
2-23
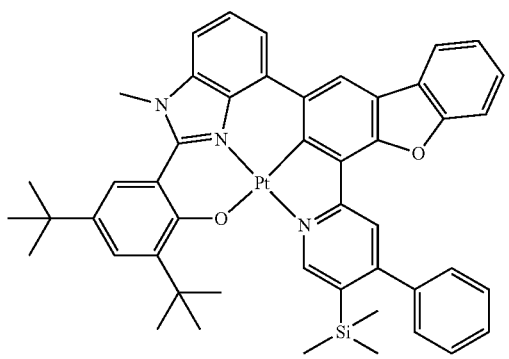
2-24
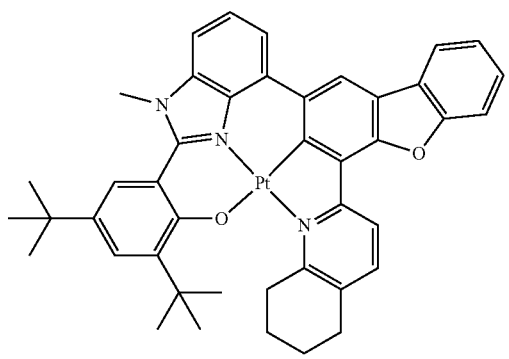

-continued
| | |
|---|---|
| 2-25 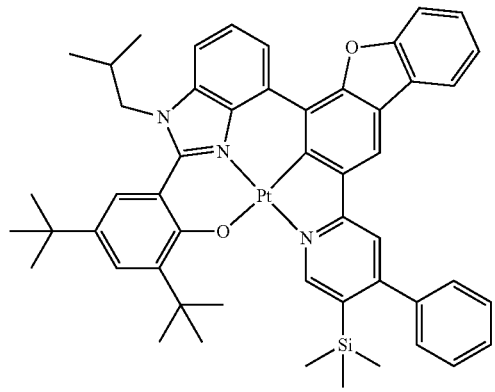 | 2-26 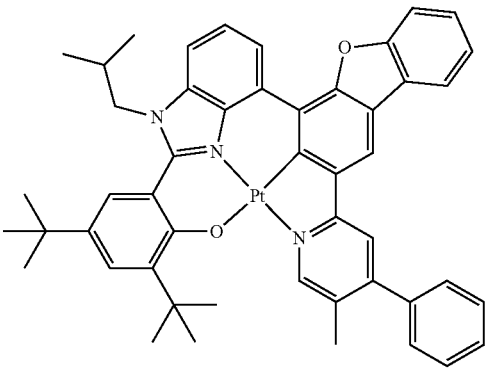 |
| 2-27 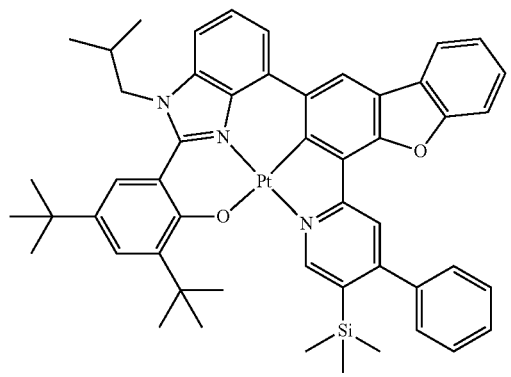 | 2-28 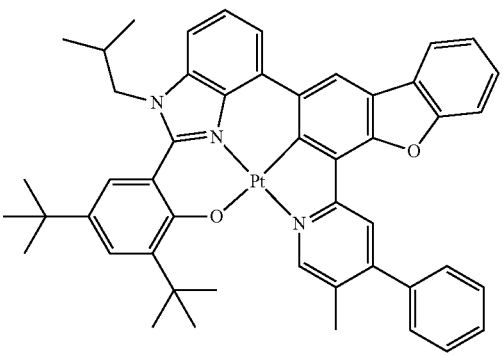 |
| 2-29 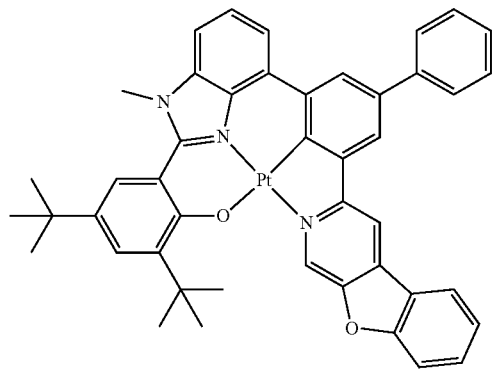 | 2-30 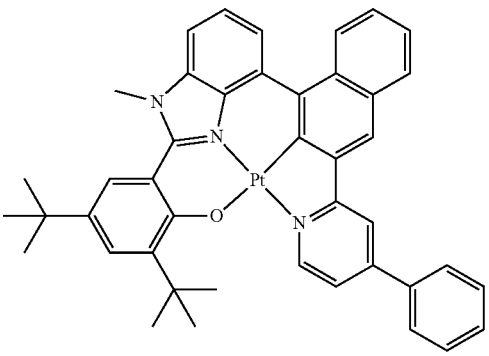 |
| 2-31 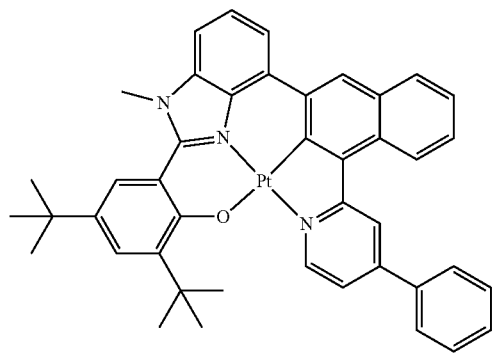 | 2-32 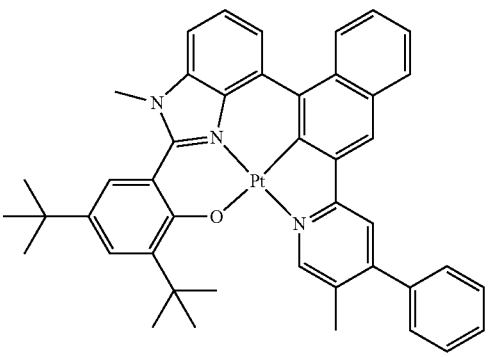 |

-continued
2-33
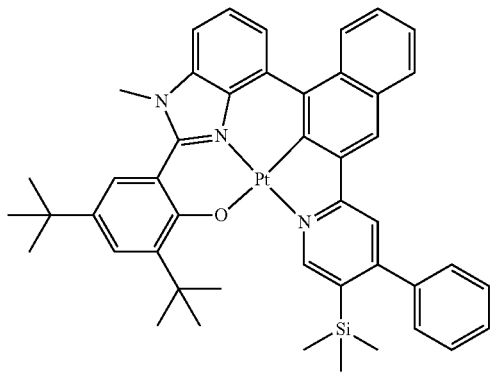
2-34
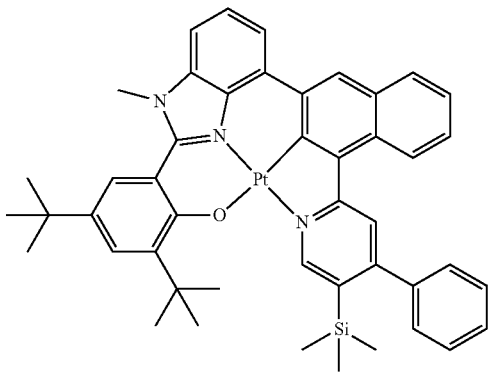
2-35
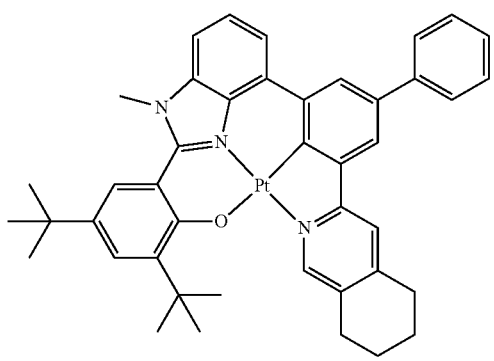
2-36
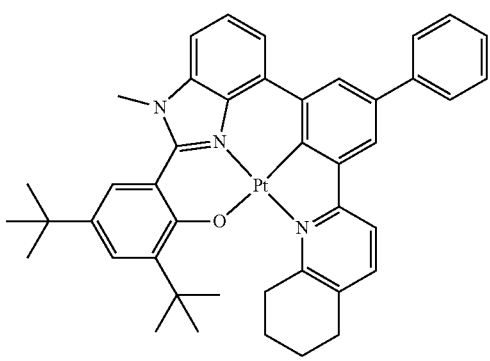
2-37
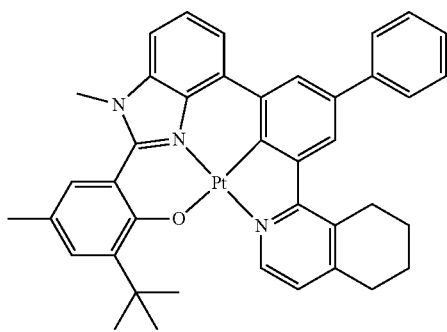
2-38
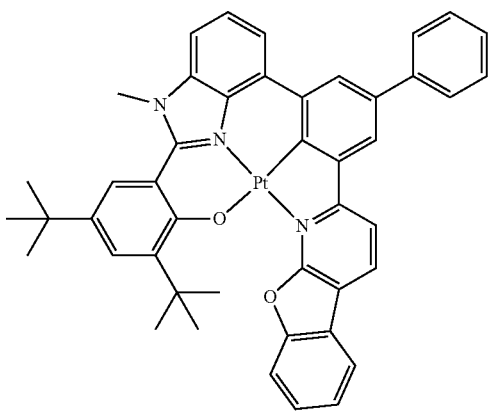
2-39
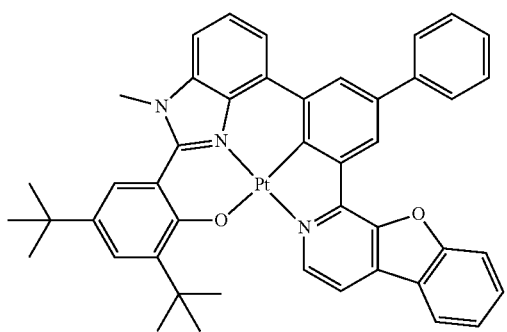
2-40
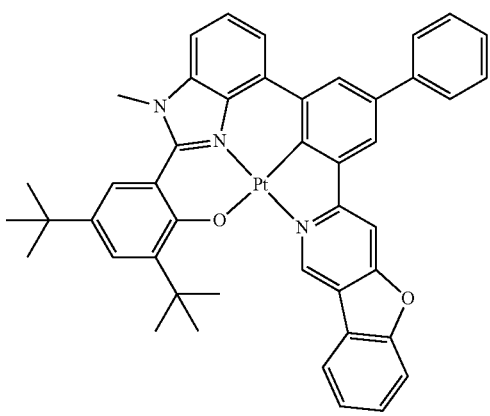

-continued
2-41
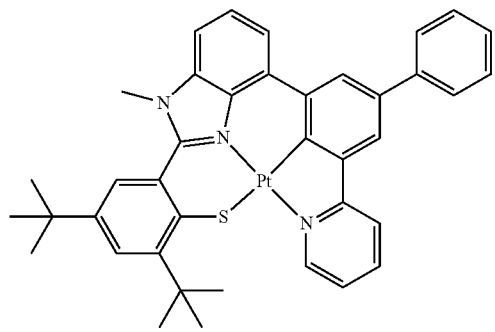
2-42
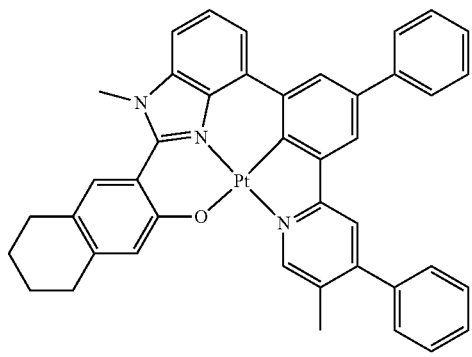
2-43
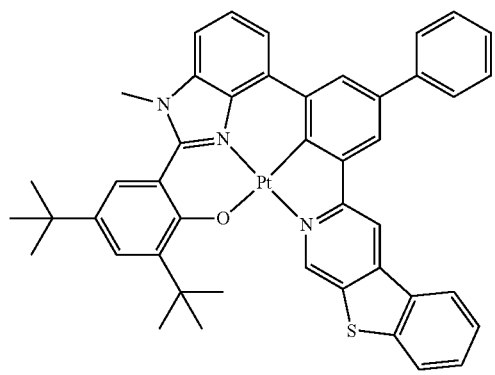
2-44
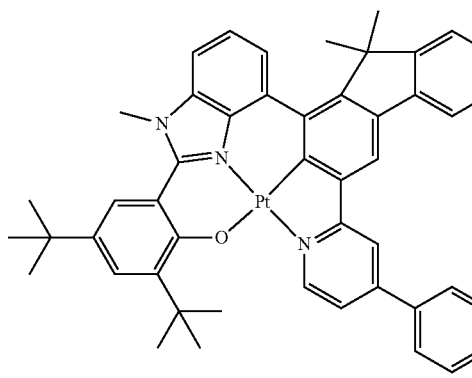
2-45
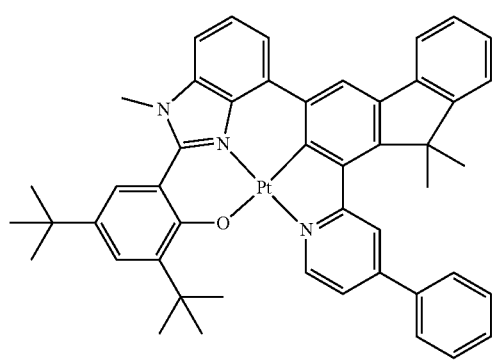
2-46
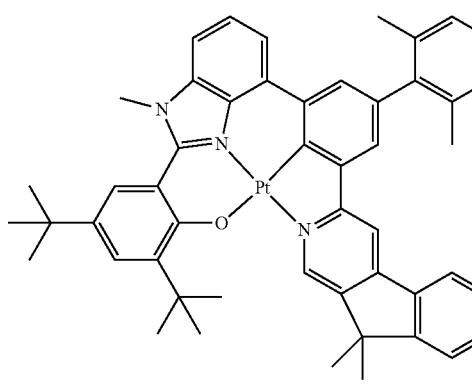
2-47
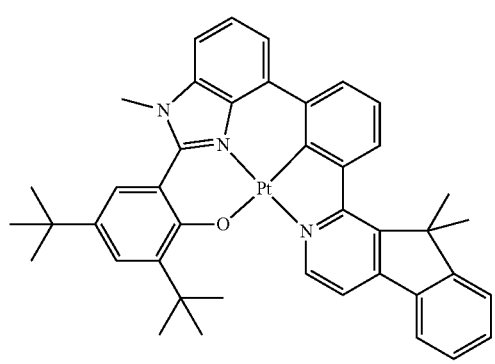

-continued
3-1
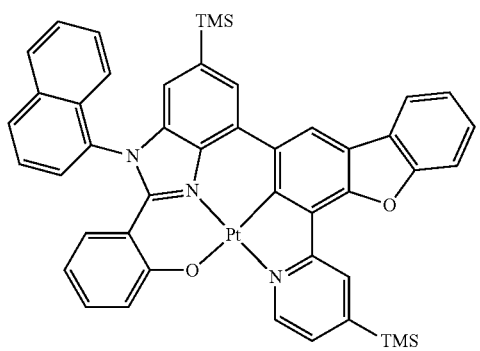
3-2
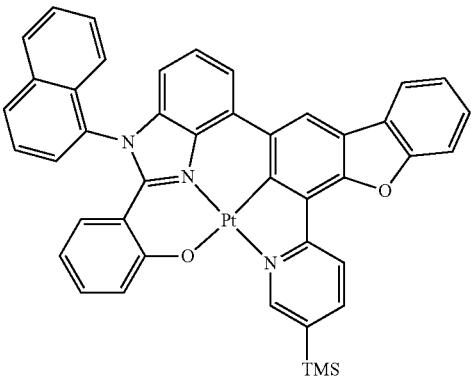
3-3
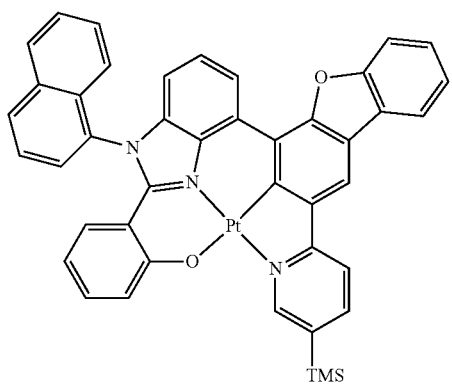
3-4
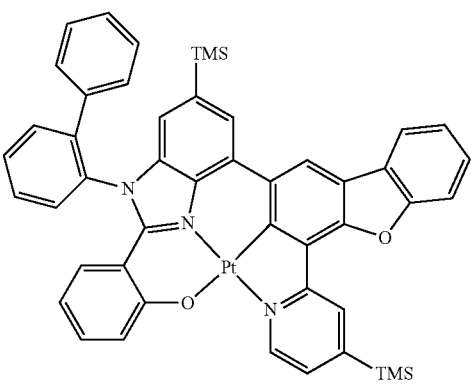
3-5
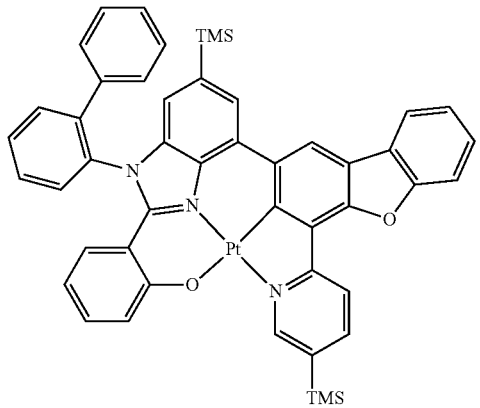
3-6
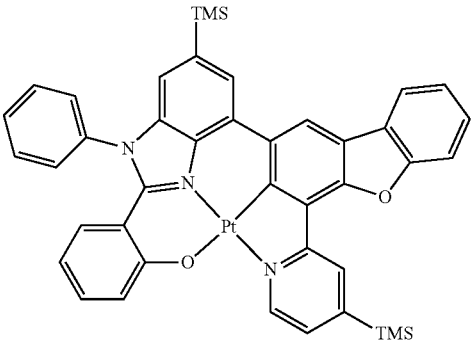
3-7
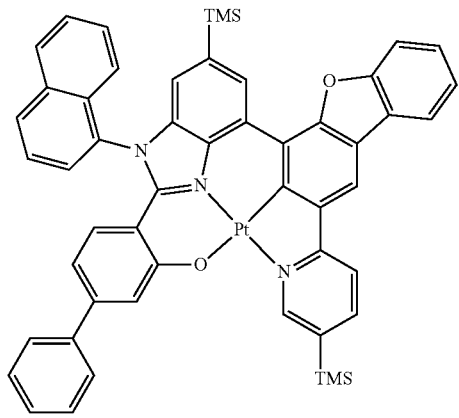
3-8
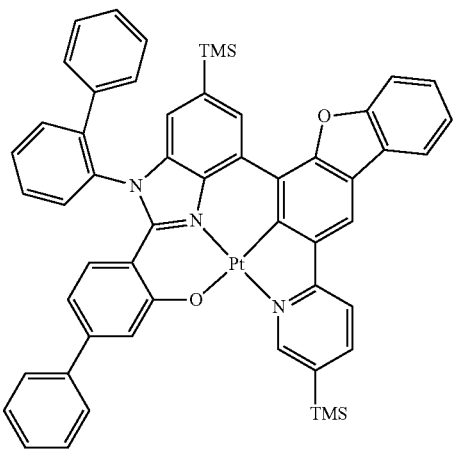

-continued
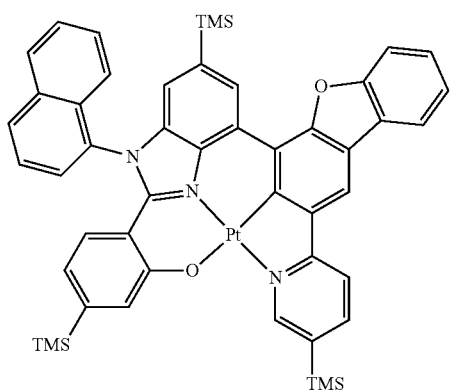
3-9
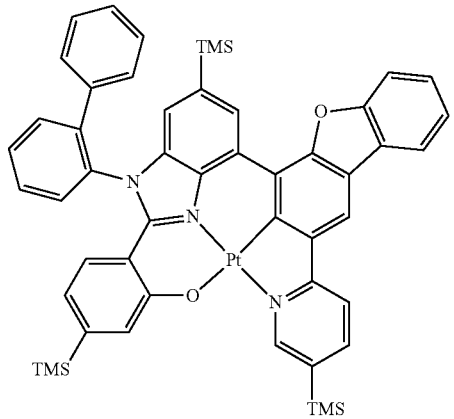
3-10
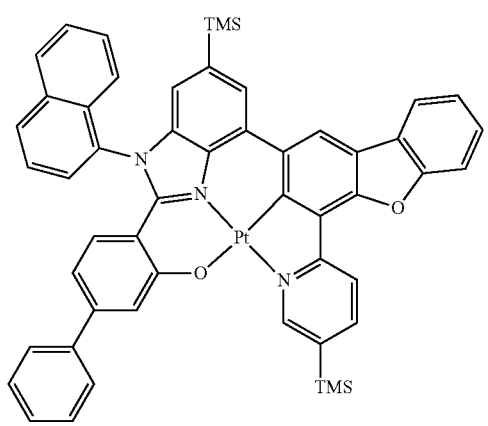
3-11
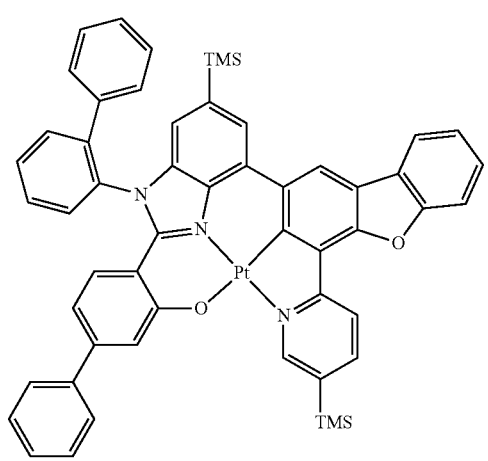
3-12
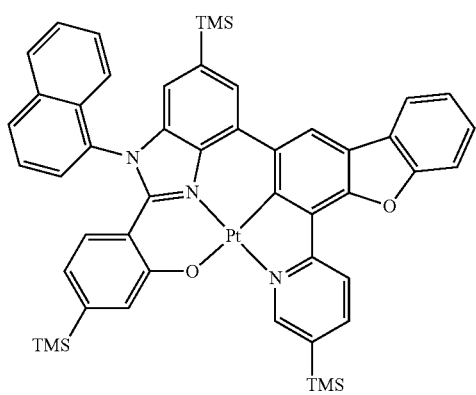
3-13
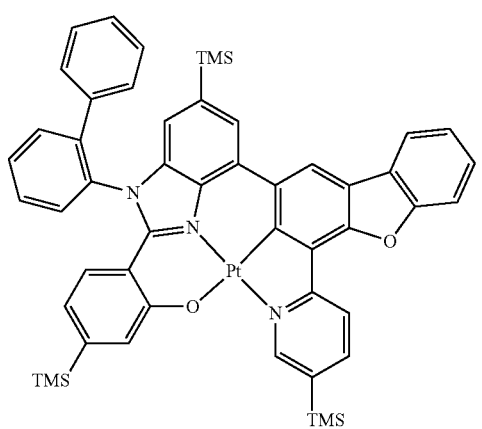
3-14

-continued
3-15
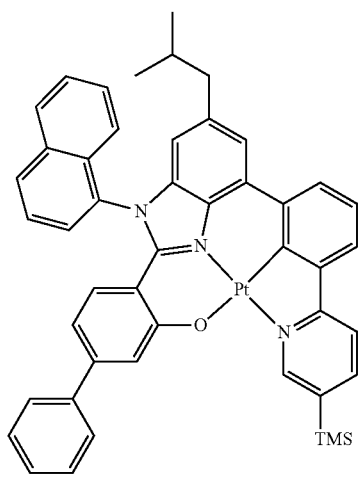
3-16
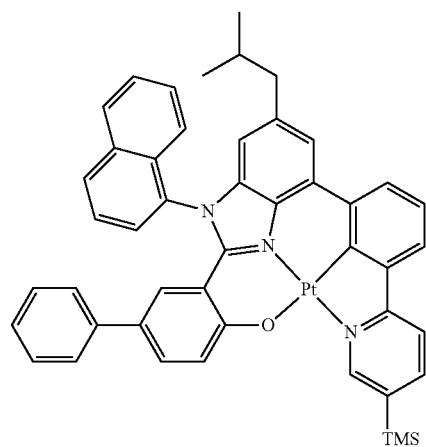
3-17
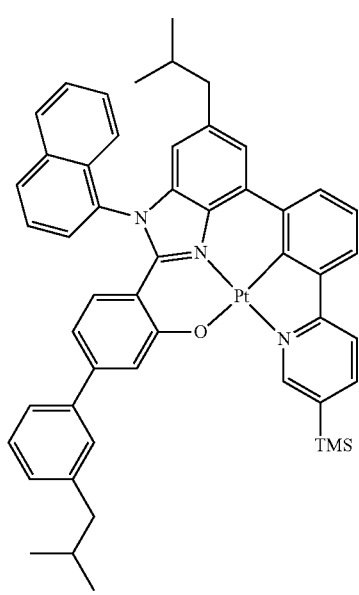
3-18
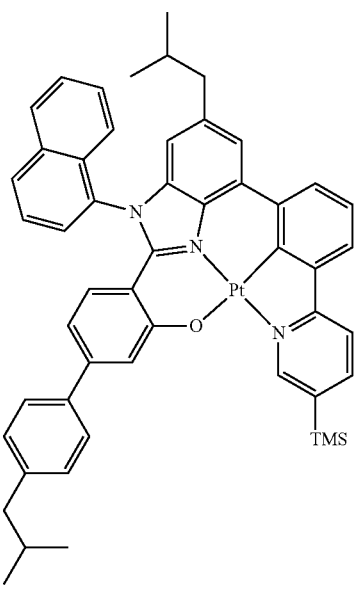
3-19
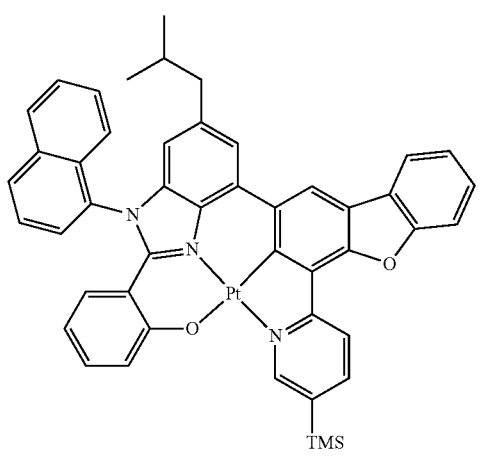
3-20
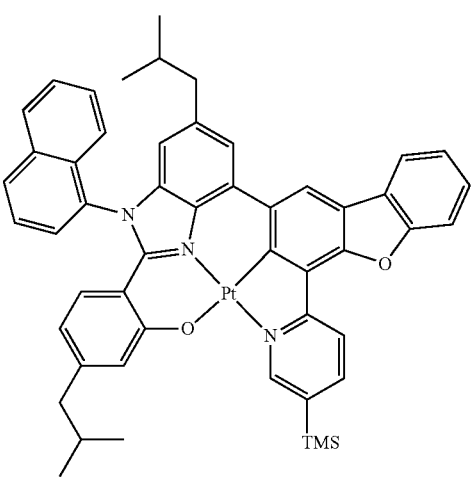

-continued
3-21
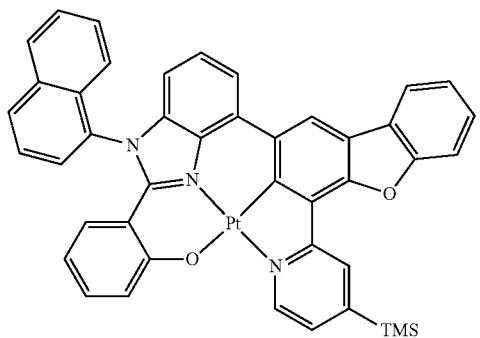
3-22
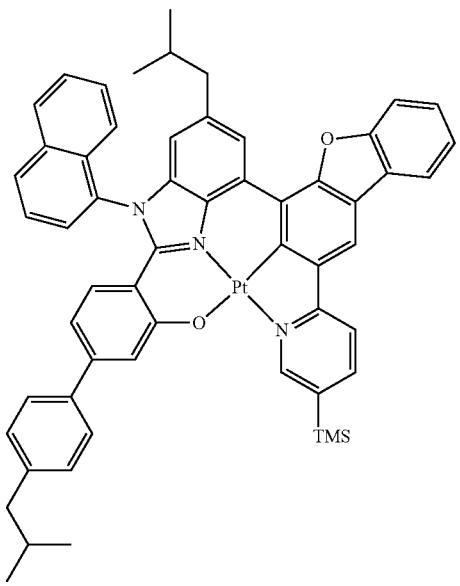
3-23
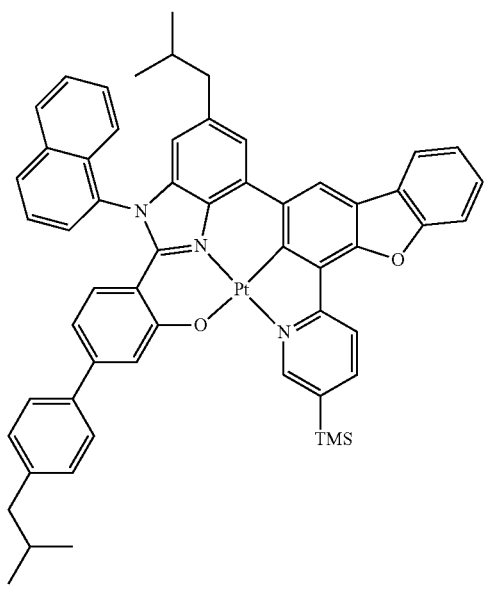
3-24
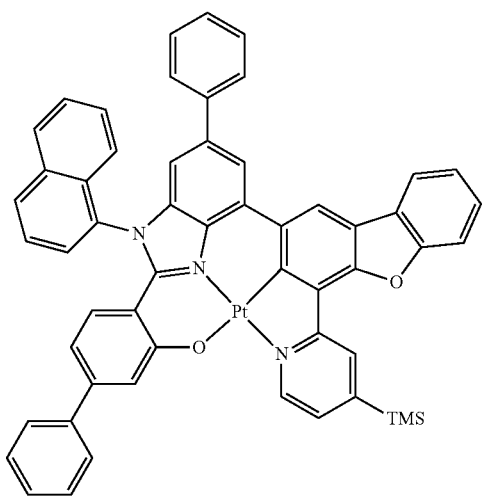
3-25
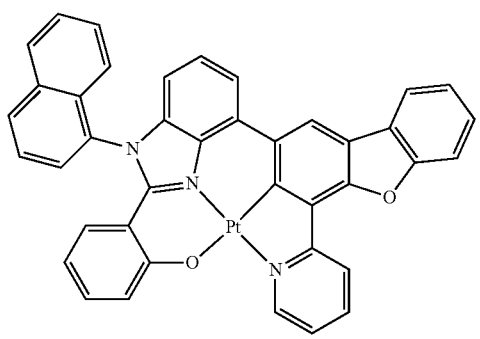
3-26
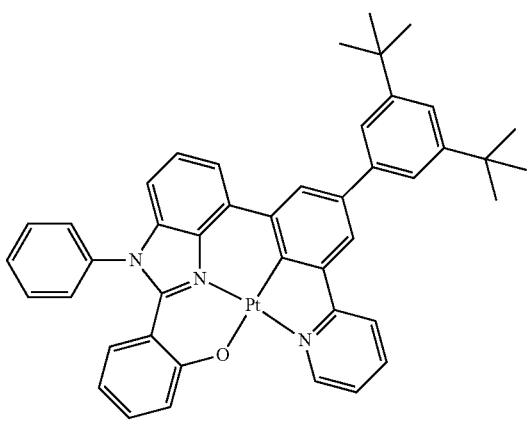

-continued
3-27
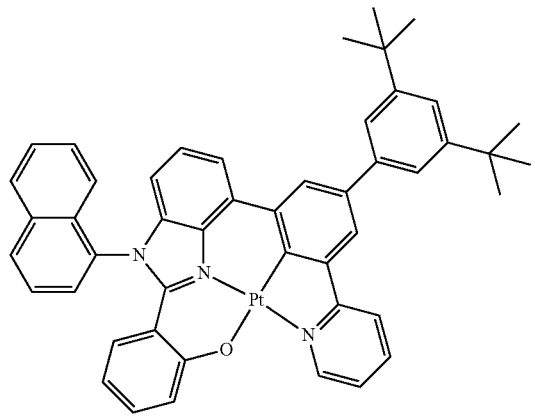
3-28
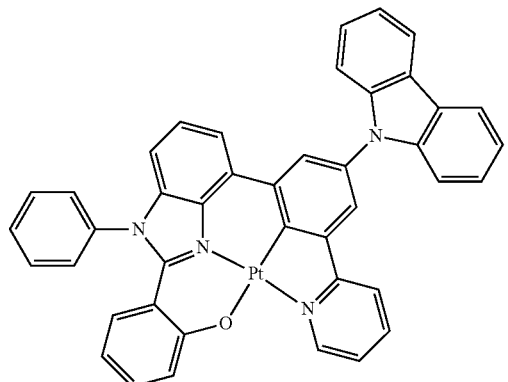
3-29
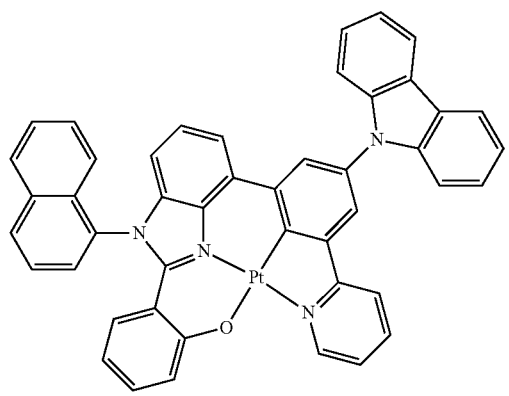
3-30
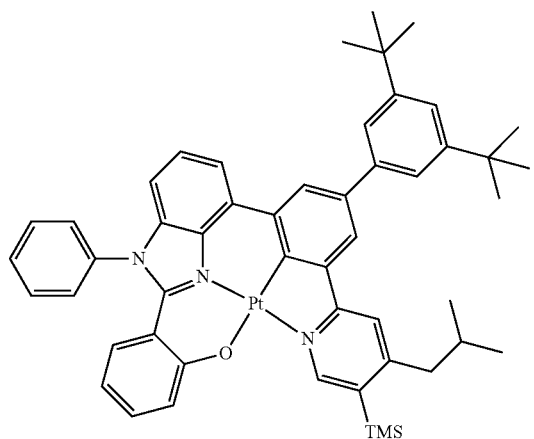
3-31
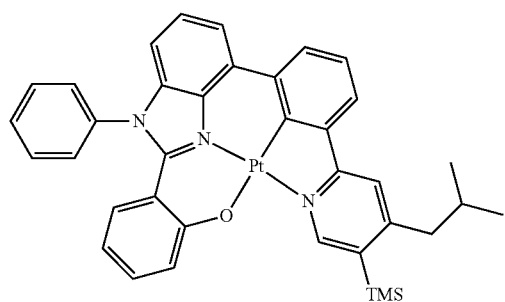
3-32
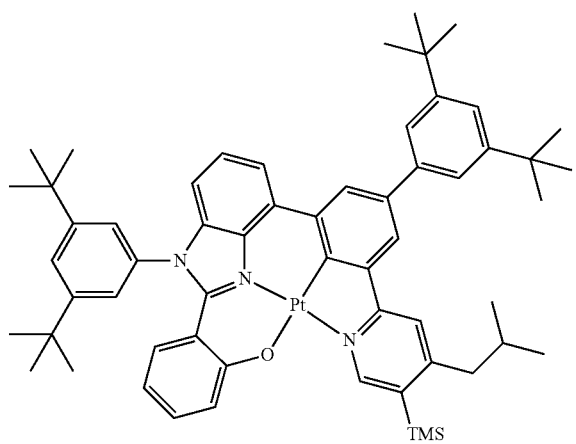

-continued
3-33
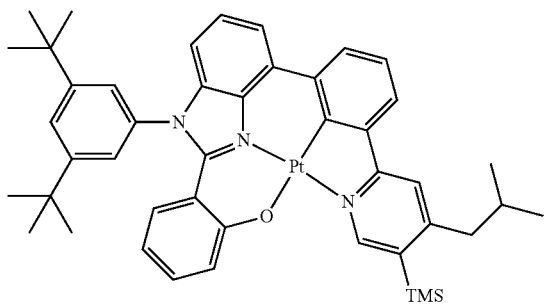
3-34
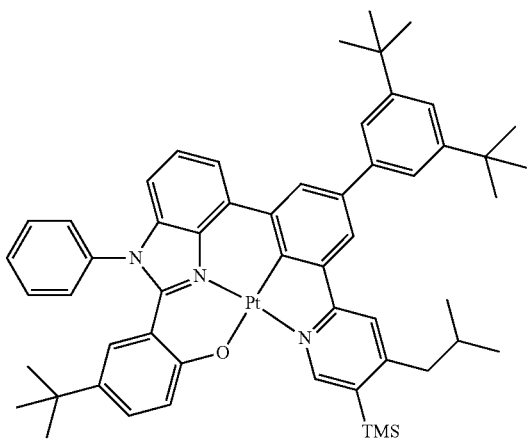
3-35
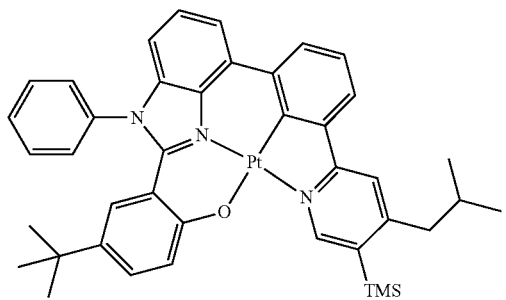
3-36
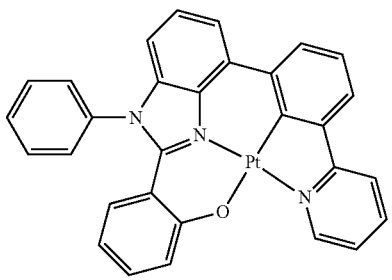
3-37
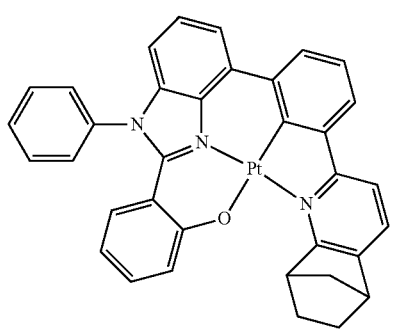
3-38
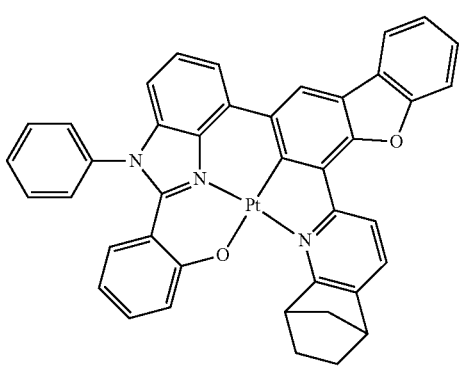
3-39
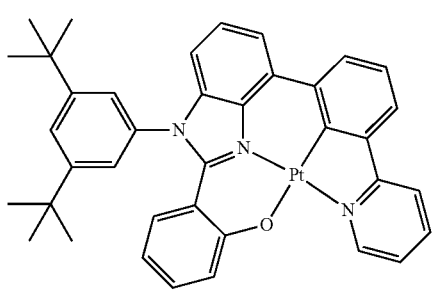
3-40
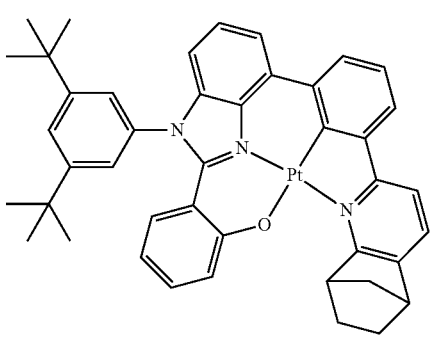

-continued
3-41
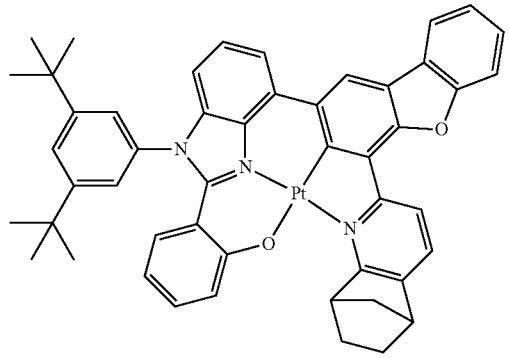
3-42
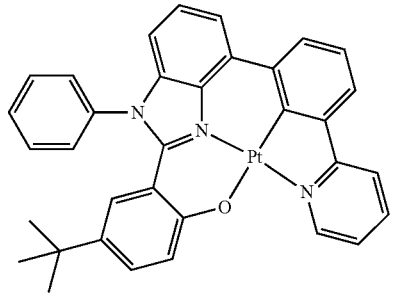
3-43
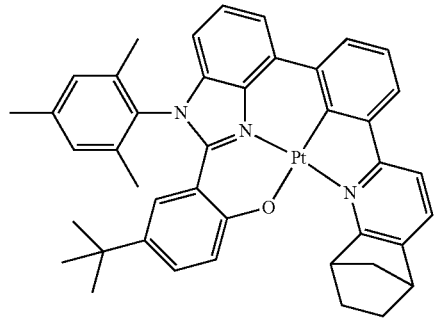
3-44
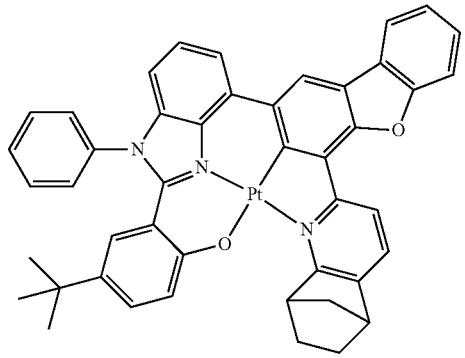
3-45
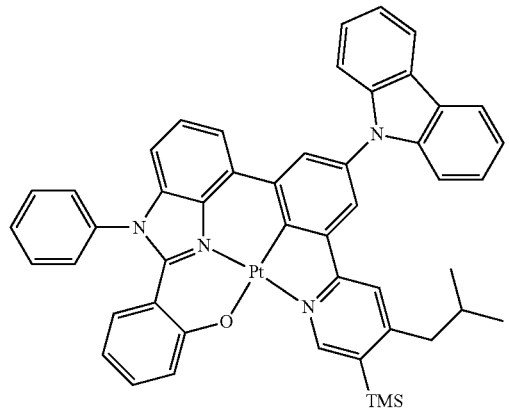
3-46
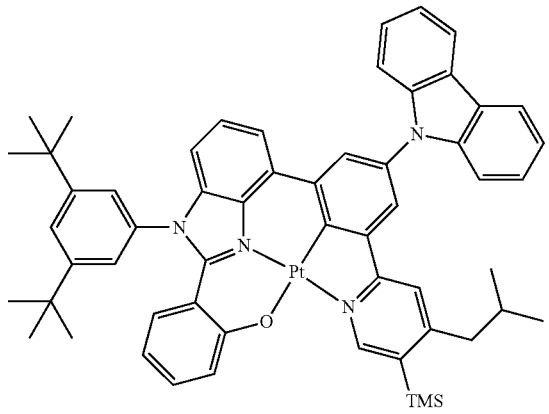
3-47
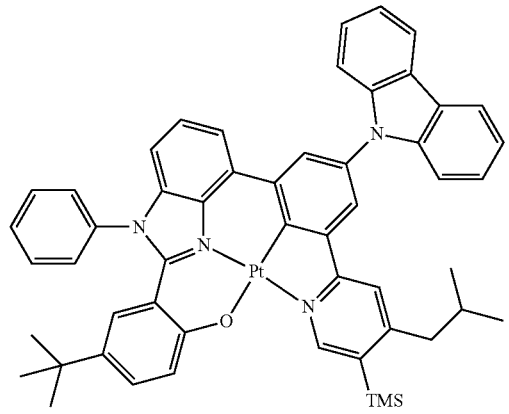
3-48
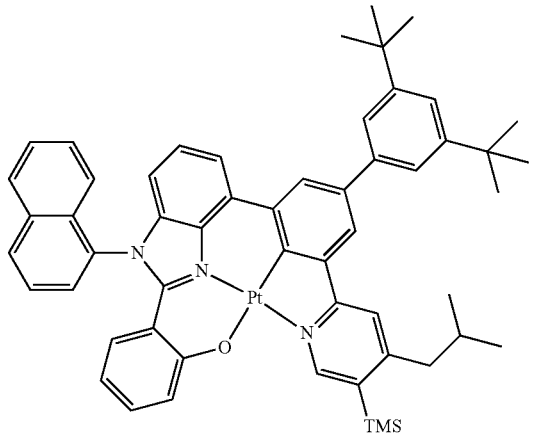

-continued
| 3-49 | 3-50 |
|---|---|
| 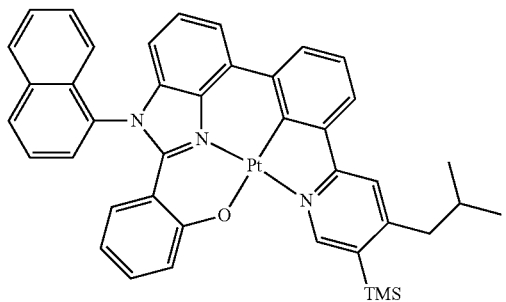 | 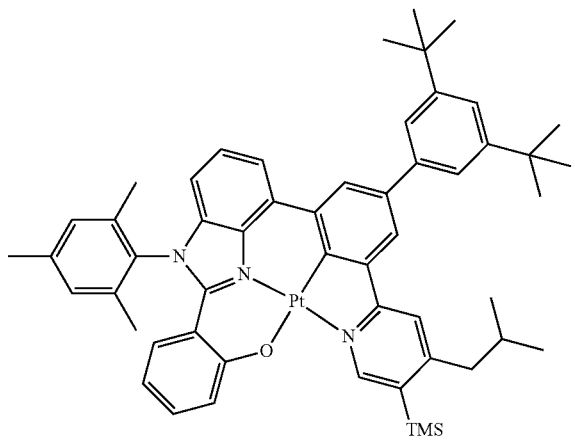 |
| 3-51 | 3-52 |
| 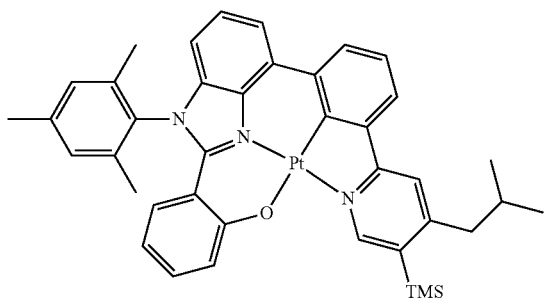 | 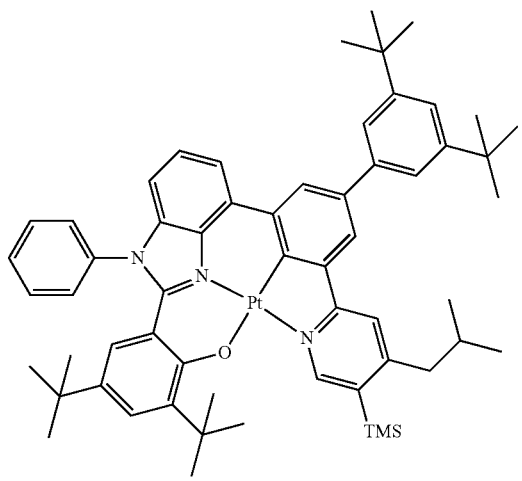 |
| 3-53 | 3-54 |
| 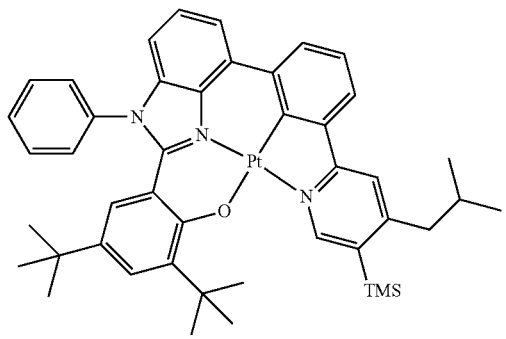 | 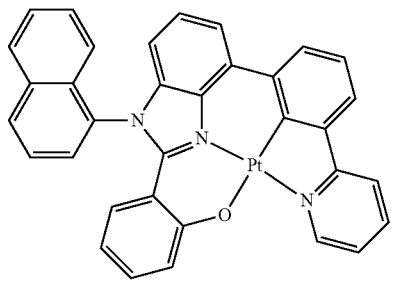 |
| 3-55 | 3-56 |
| 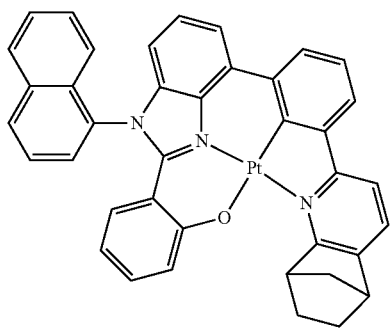 | 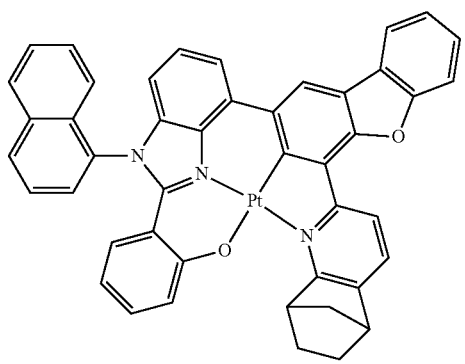 |

-continued
3-57
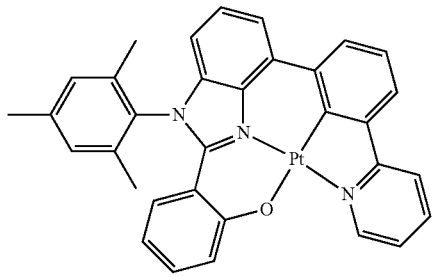
3-58
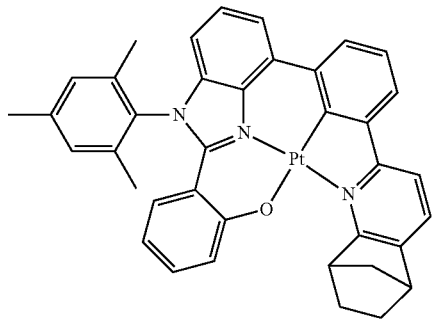
3-59
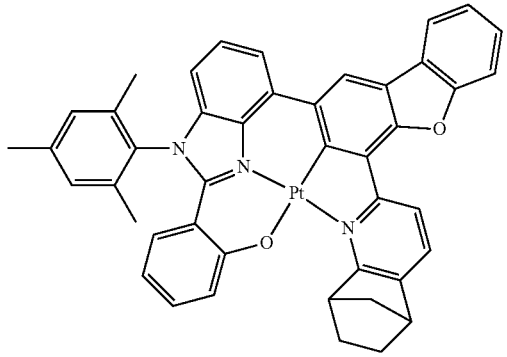
3-60
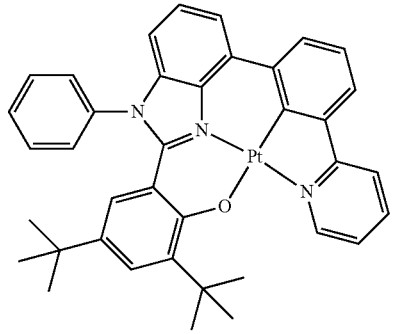
3-61
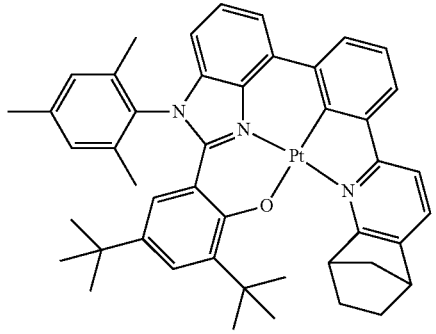
3-62
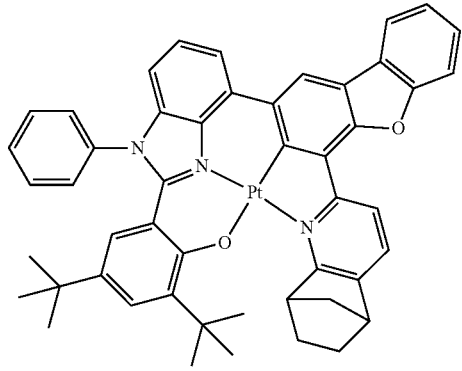
3-63
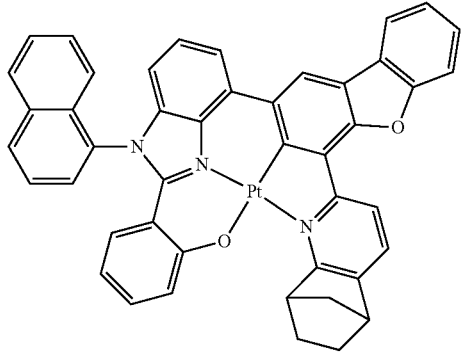
3-64
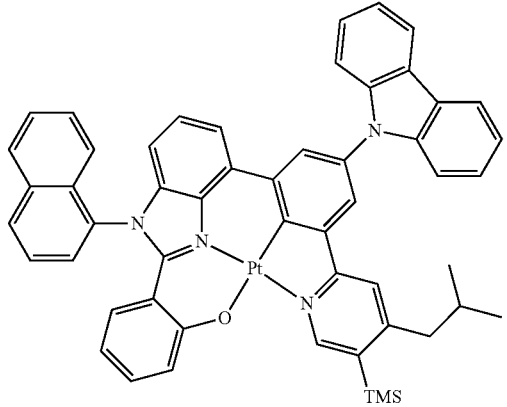

-continued
3-65
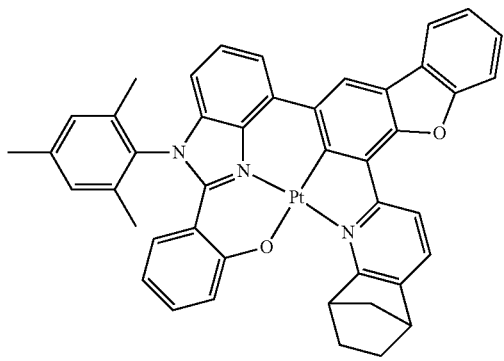
3-66
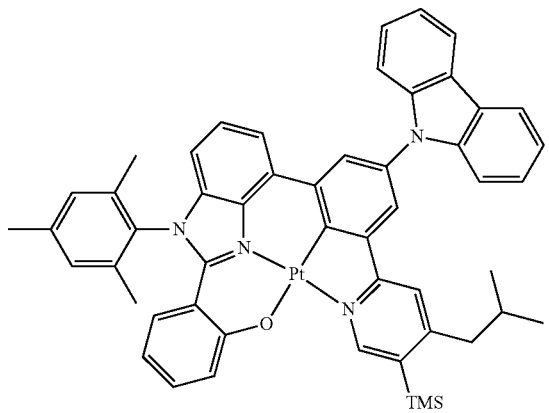
3-67
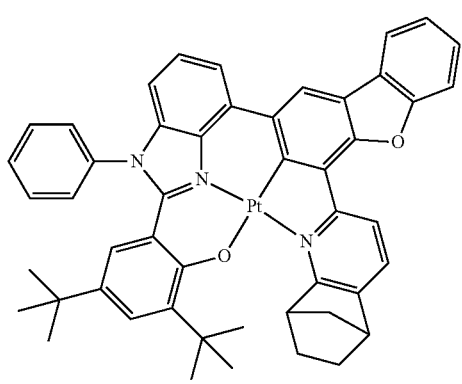
3-68
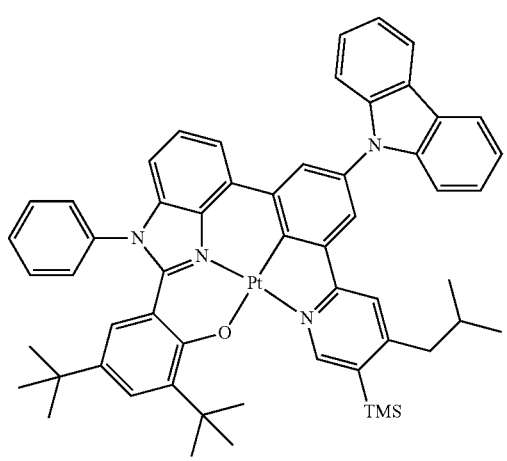
3-69
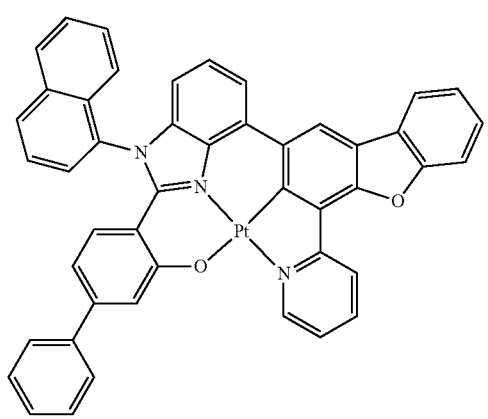
3-70
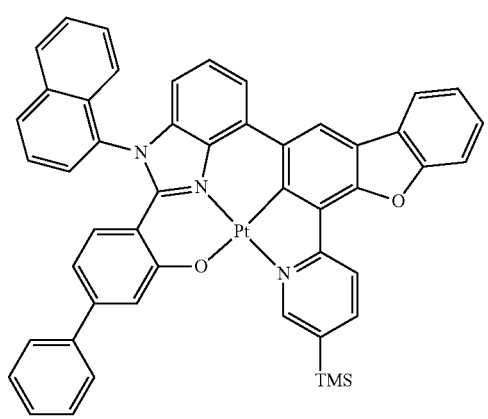

-continued
3-71
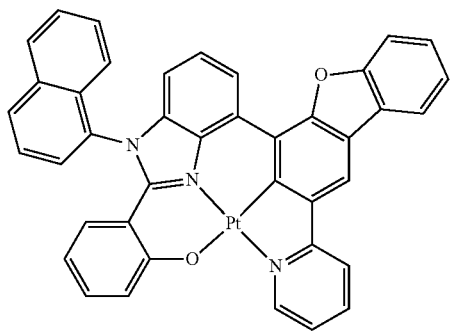
3-72
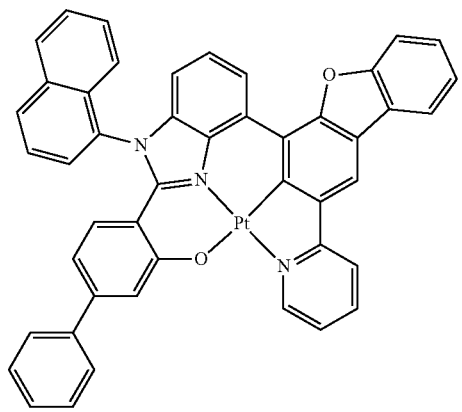
3-73
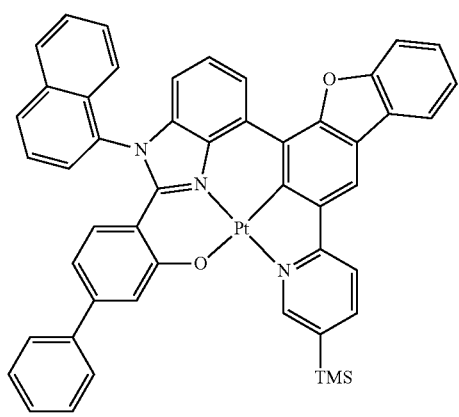
3-74
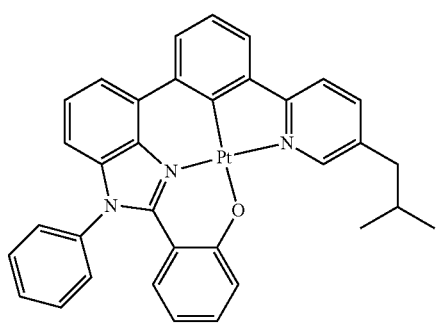
3-75
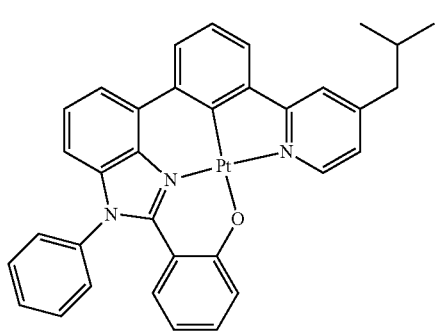
3-76
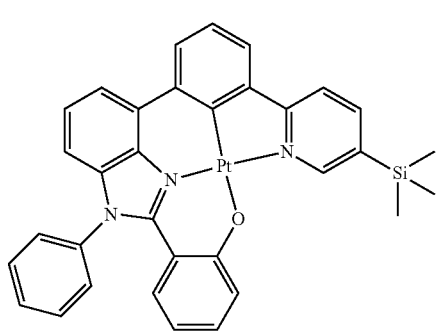
3-77
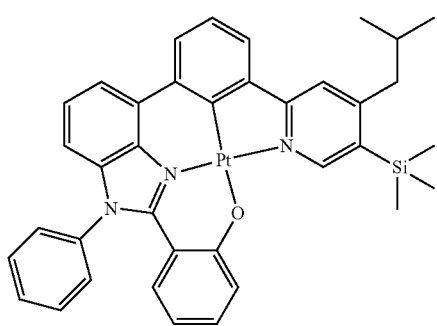
3-78
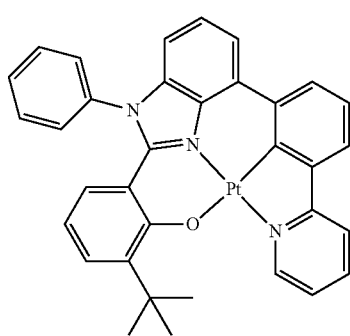

-continued
3-79
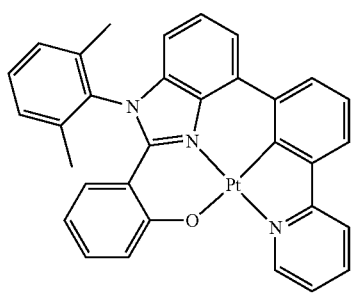
3-80
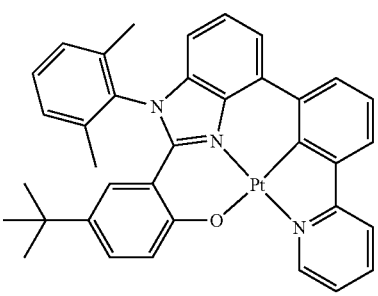
3-81
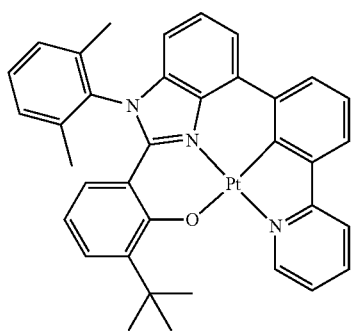
3-82
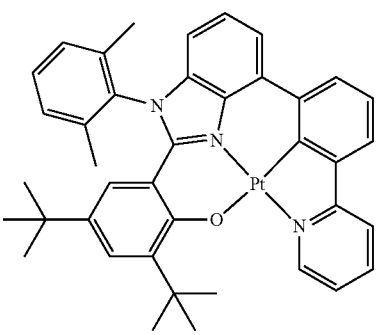
3-83
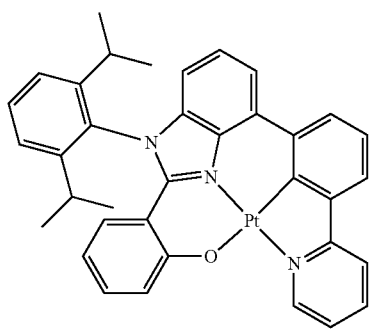
3-84
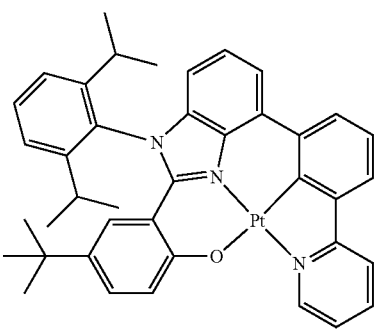
3-85
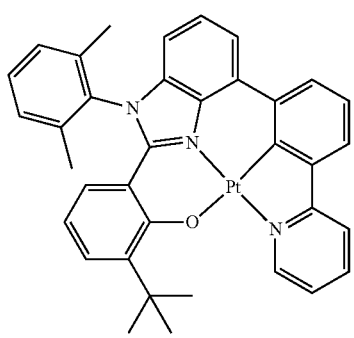
3-86
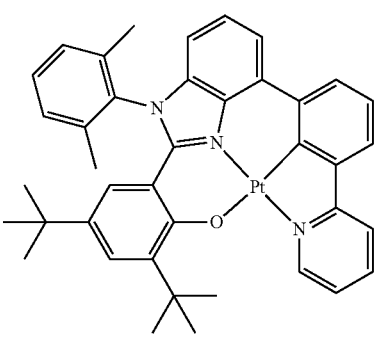
3-87
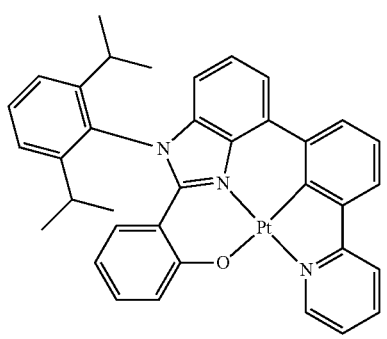
3-88
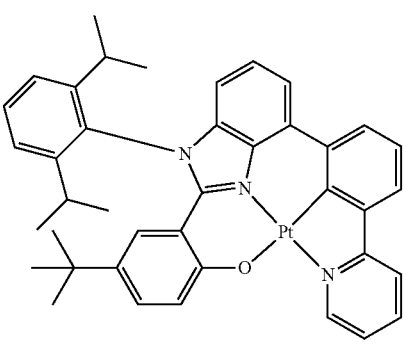

-continued
3-89
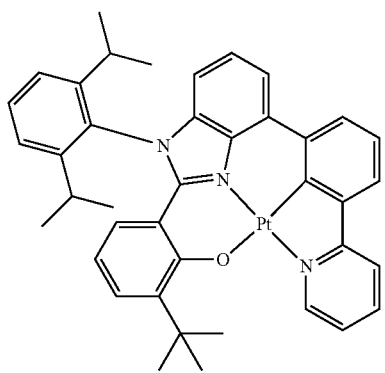
3-90
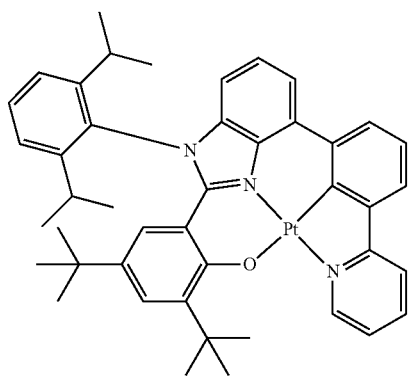
3-91
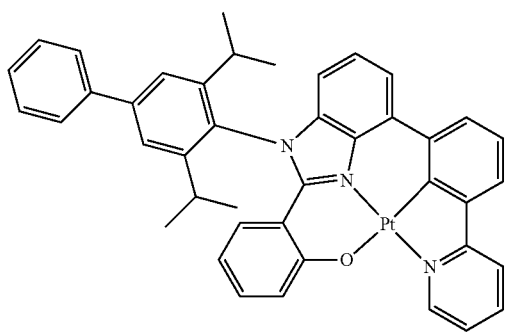
3-92
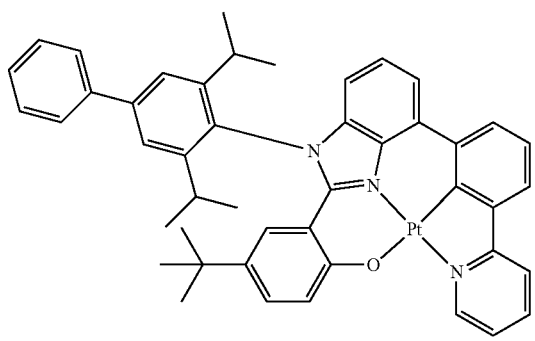
3-93
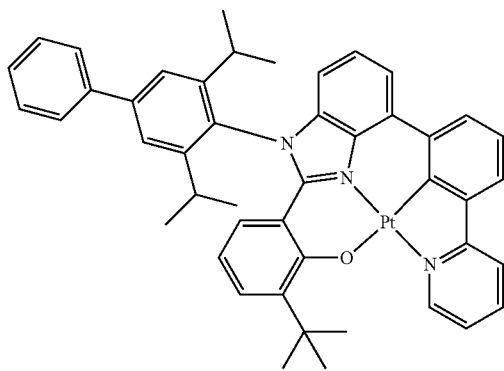
3-94
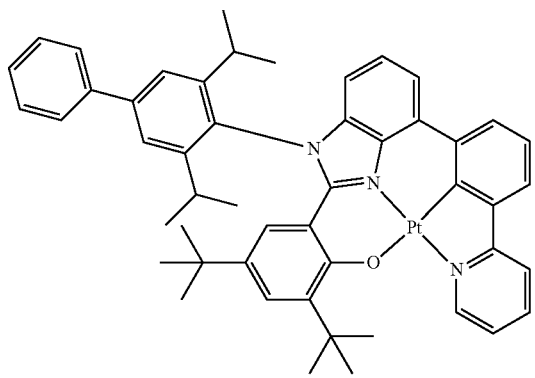
3-95
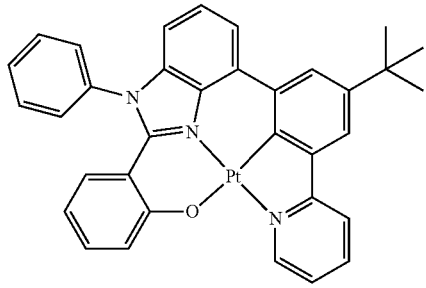
3-96
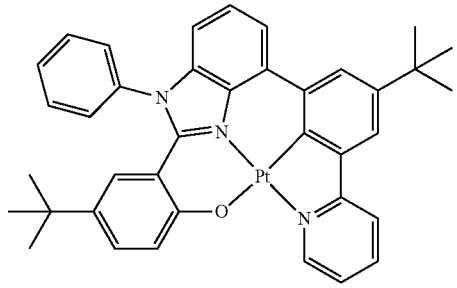

-continued
3-97
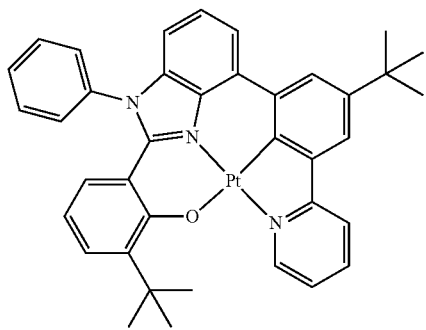
3-98
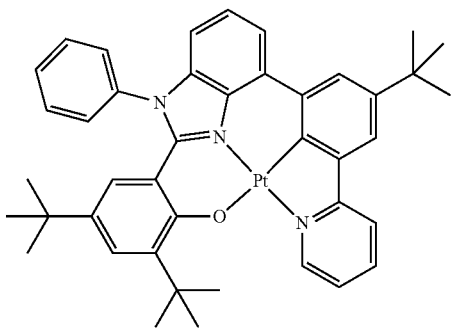
3-99
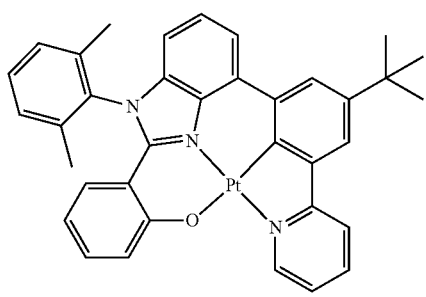
3-100
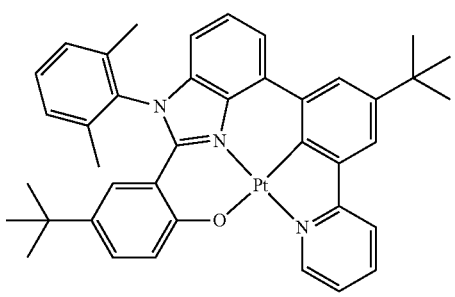
3-101
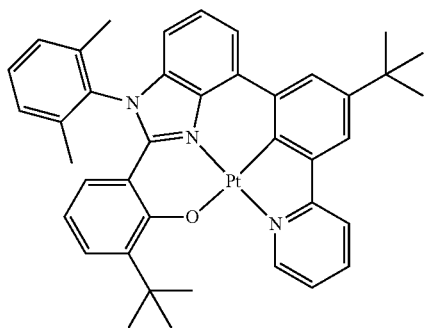
3-102
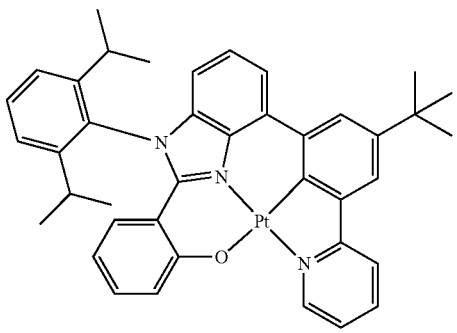
3-103
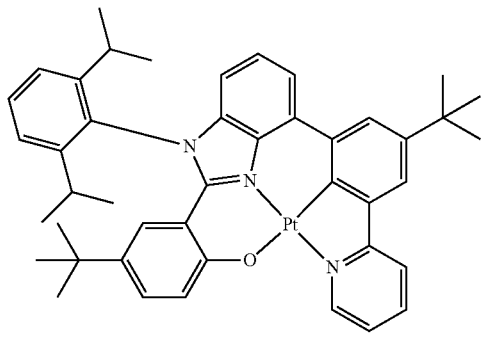
3-104
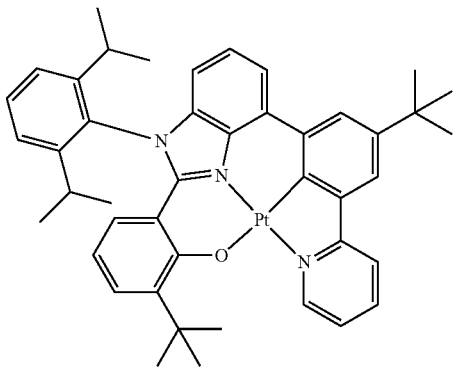

-continued
3-105
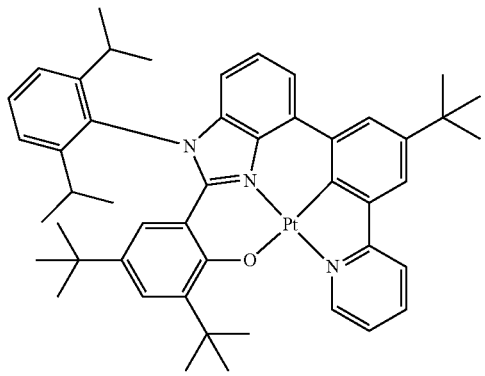
3-106
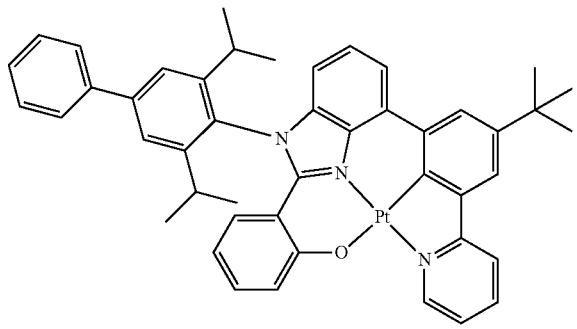
3-107
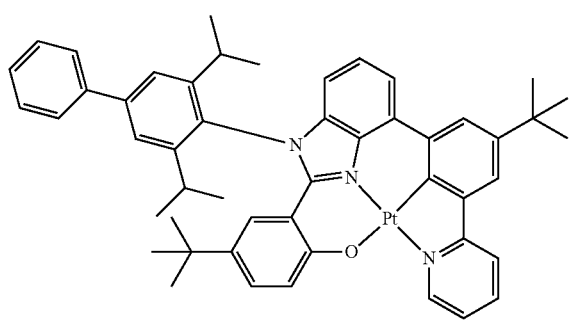
3-108
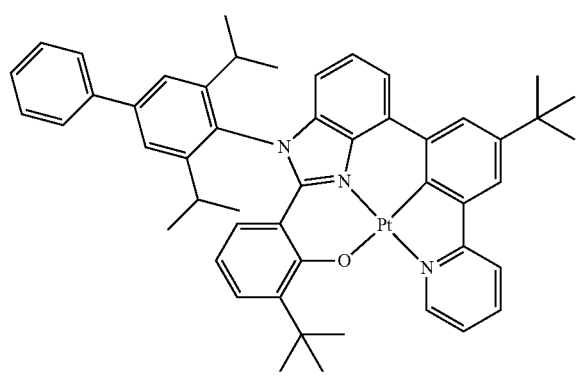
3-109
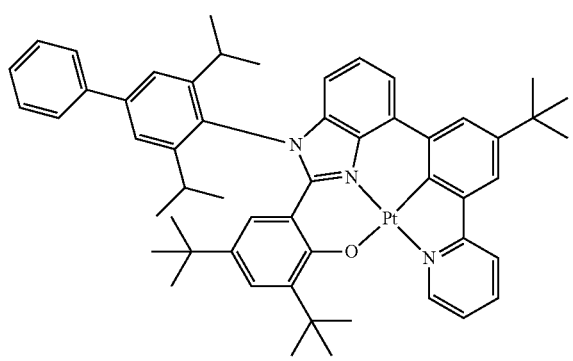
3-110
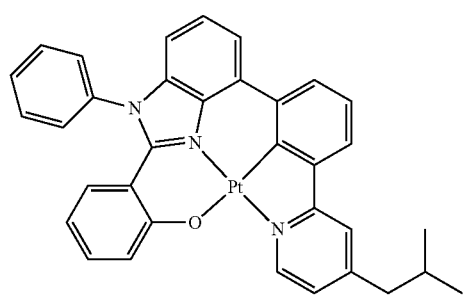
3-111
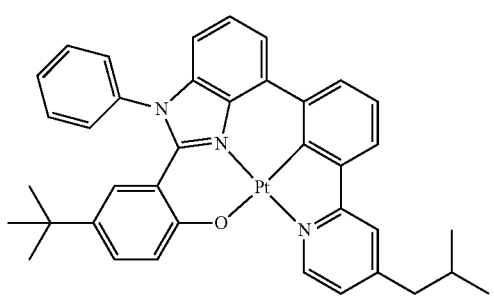
3-112
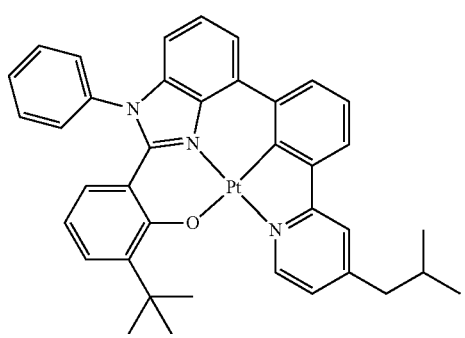

-continued
3-113
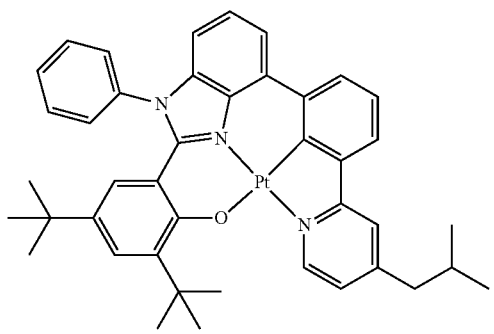
3-114
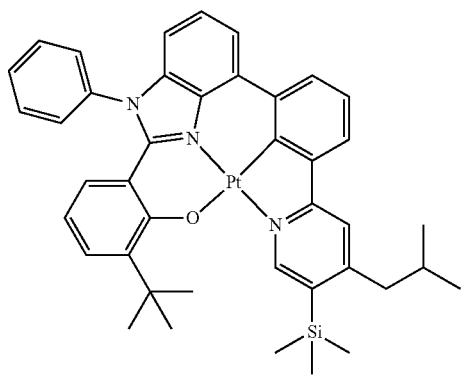
3-115
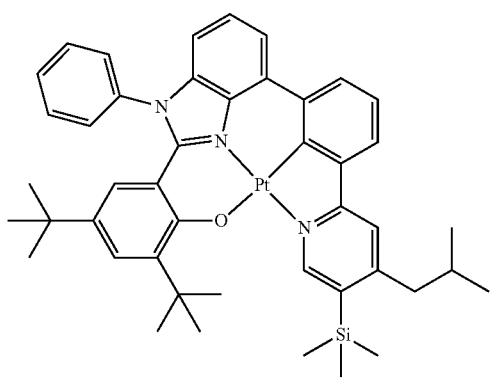
3-116
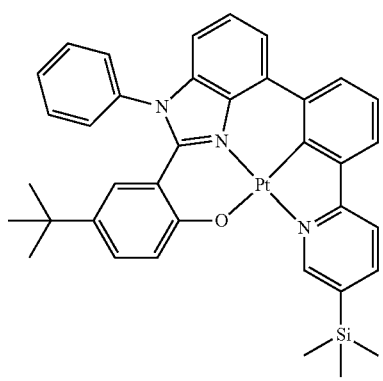
3-117
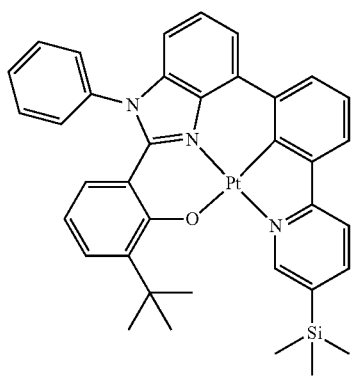
3-118
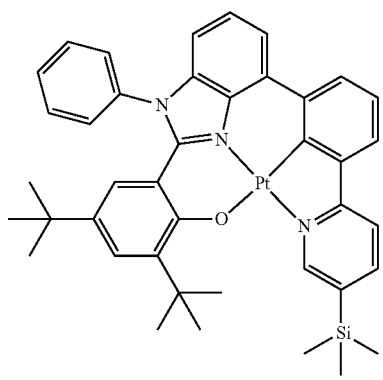
3-119
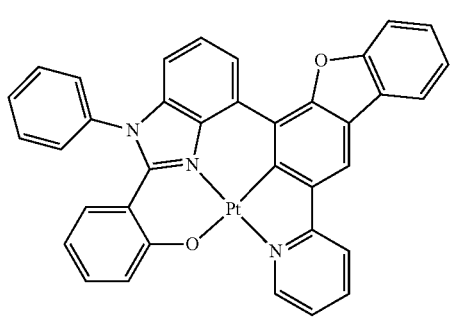
3-120
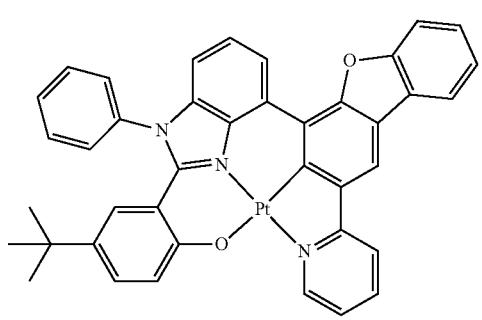

-continued
3-121
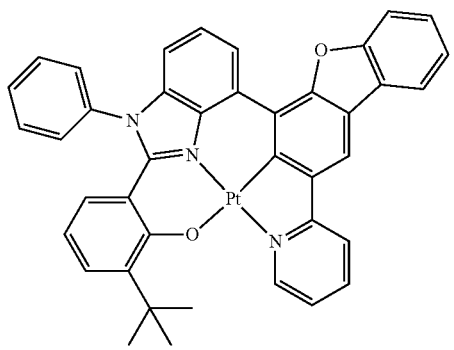
3-122
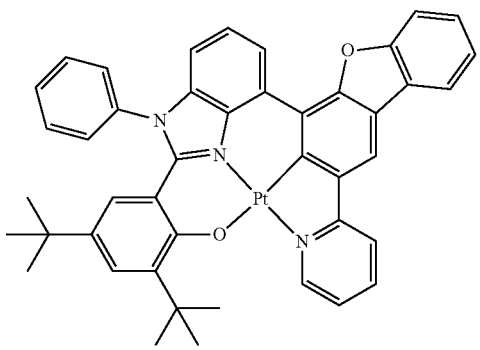
3-123
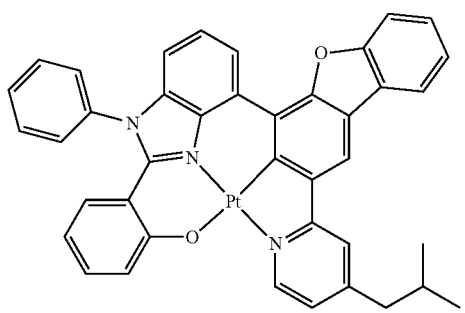
3-124
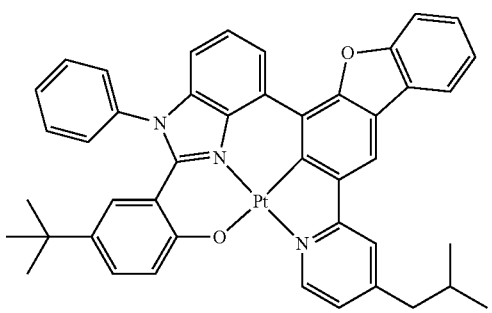
3-125
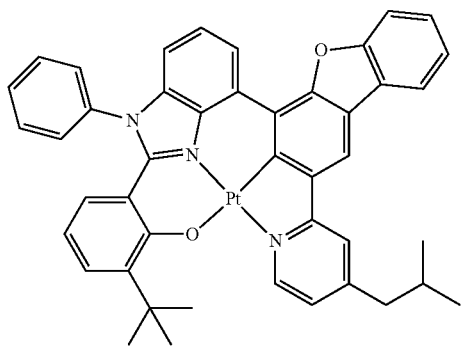
3-126
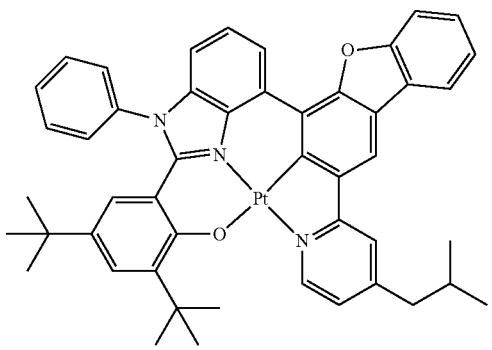
3-127
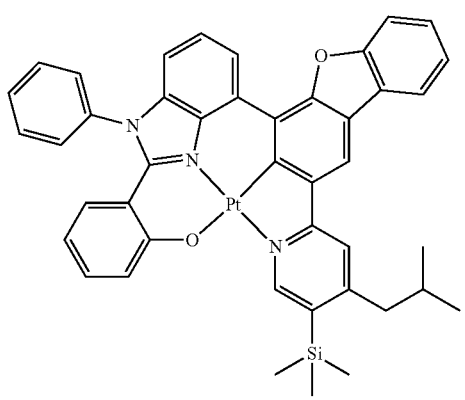
3-128
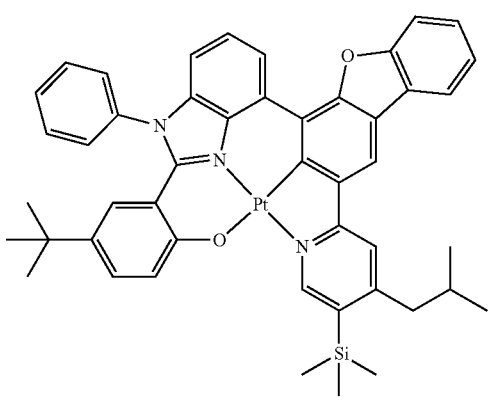

-continued
| 3-129 | 3-130 |
|---|---|
| 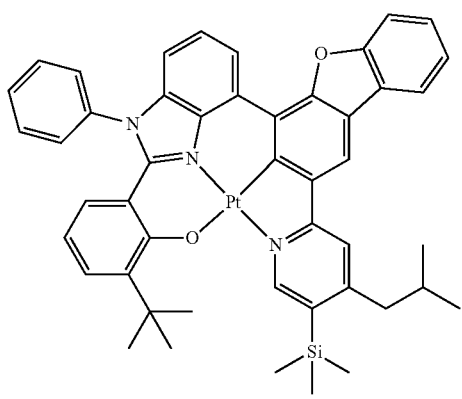 | 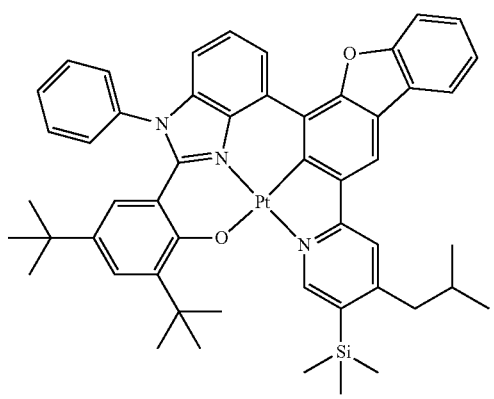 |
| 3-131 | 3-132 |
| 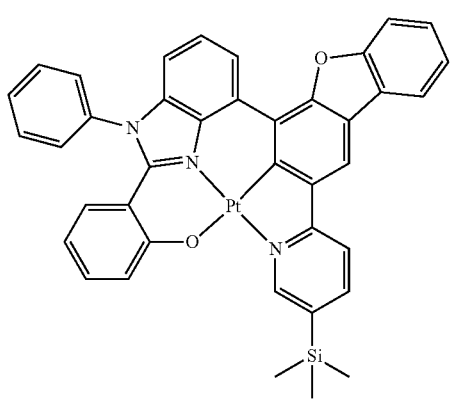 | 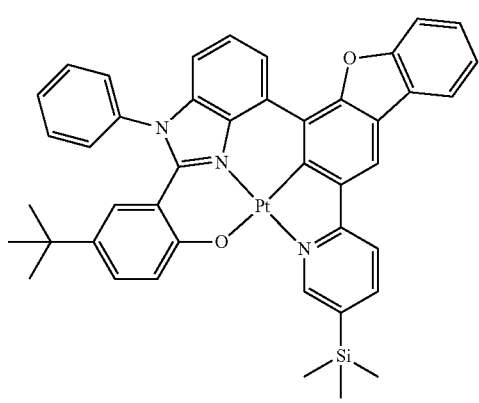 |
| 3-133 | 3-134 |
| 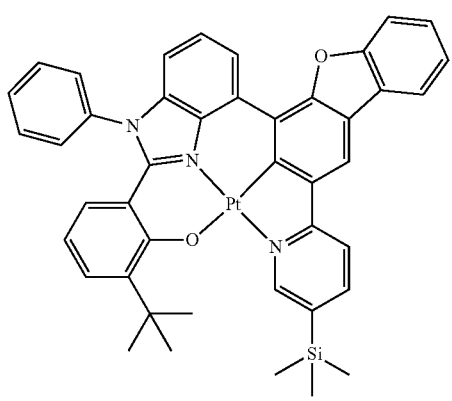 | 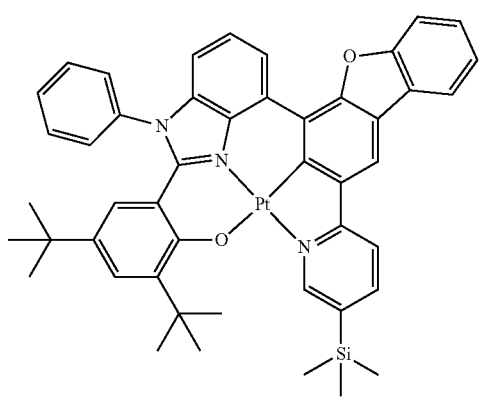 |
| 3-135 | 3-136 |
| 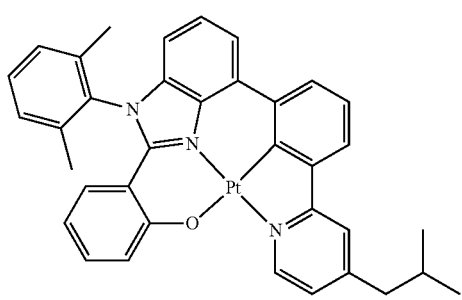 | 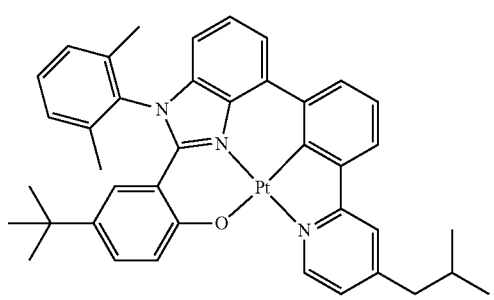 |

-continued
3-137
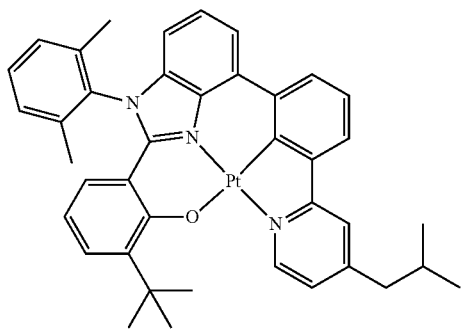
3-138
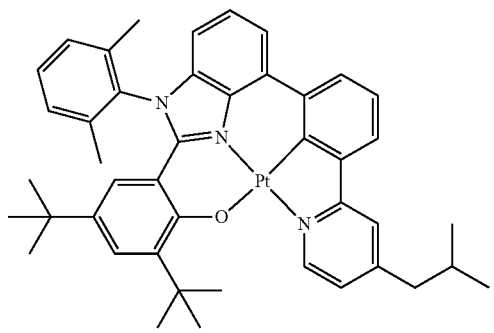
3-139
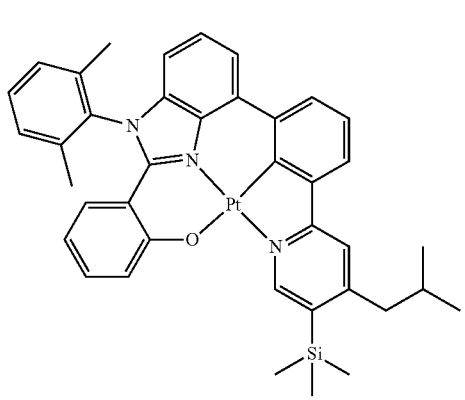
3-140
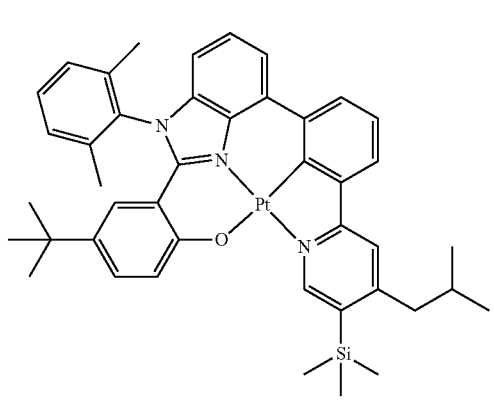
3-141
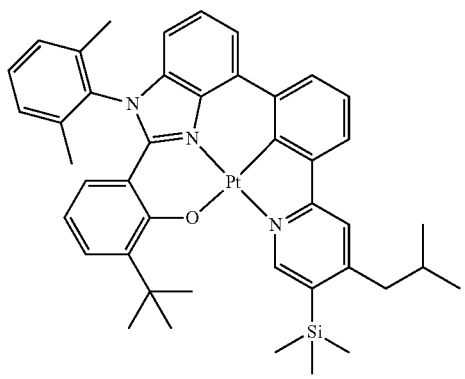
3-142
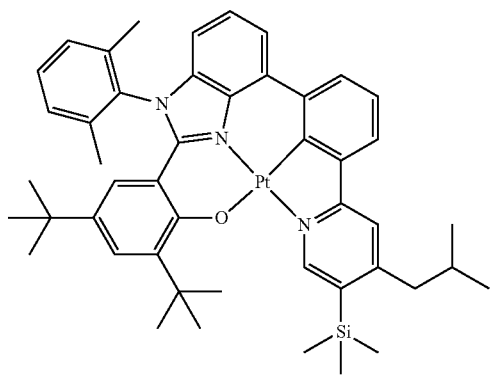
3-143
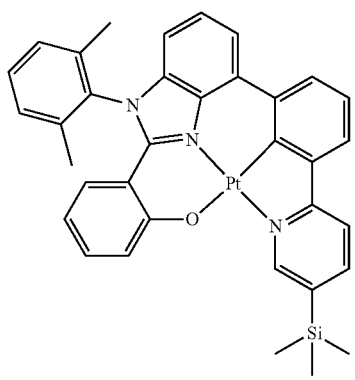
3-144
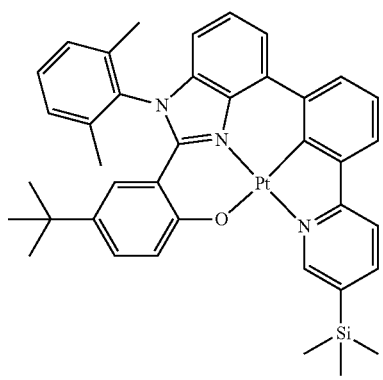

-continued
3-145
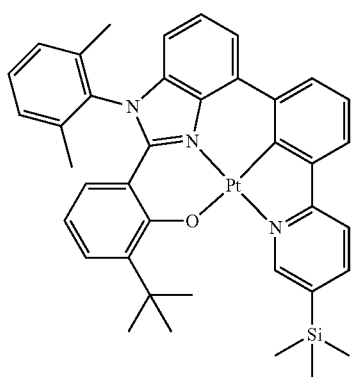
3-146
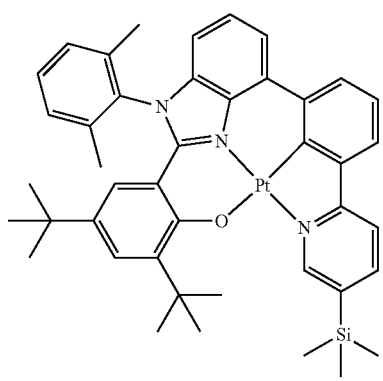
3-147
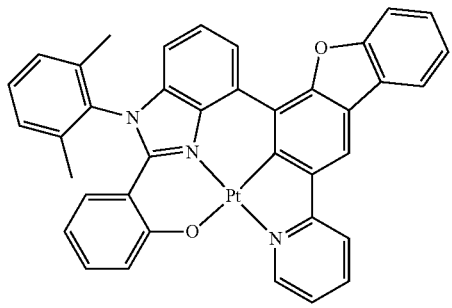
3-148
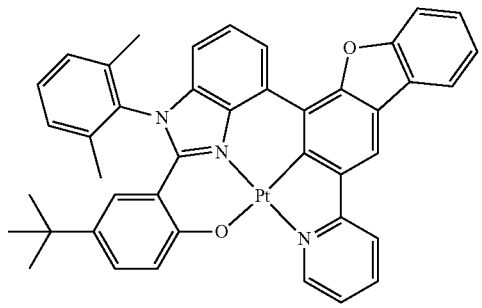
3-149
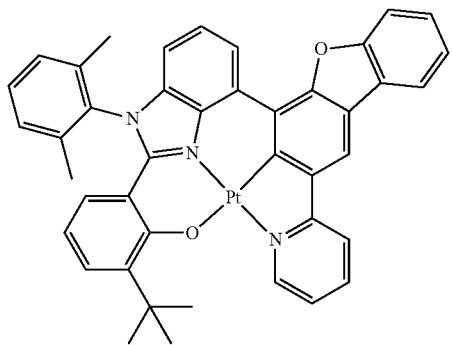
3-150
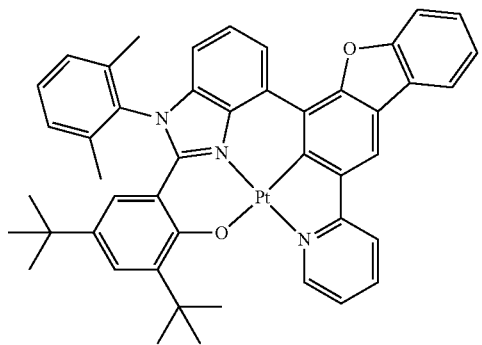
3-151
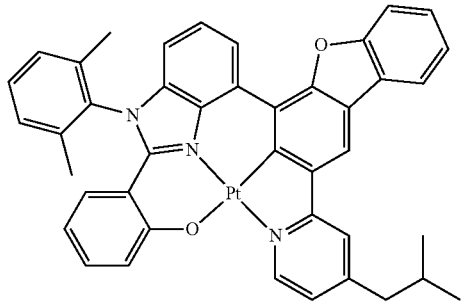
3-152
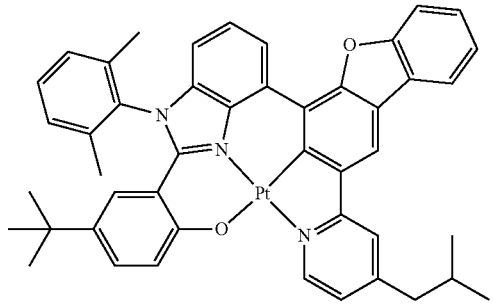

-continued
3-153
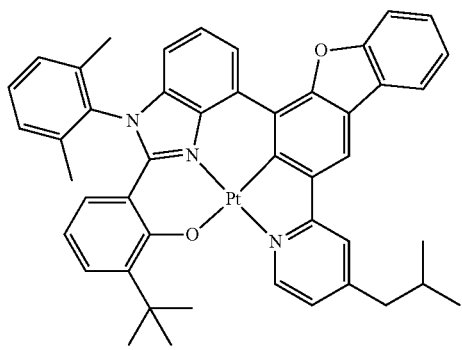
3-154
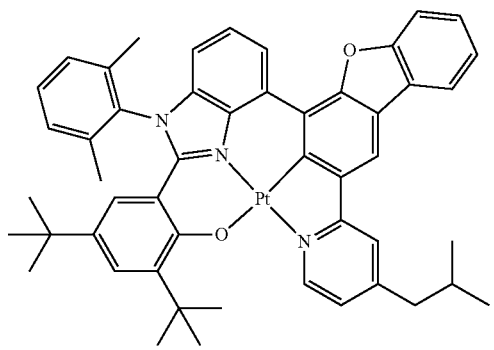
3-155
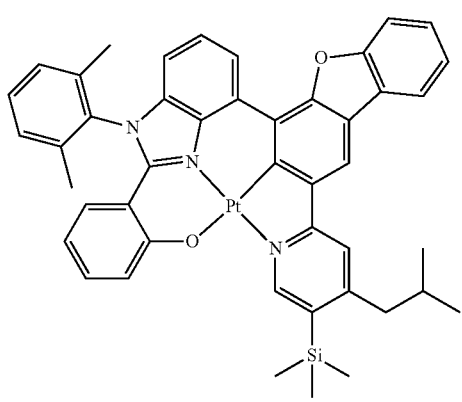
3-156
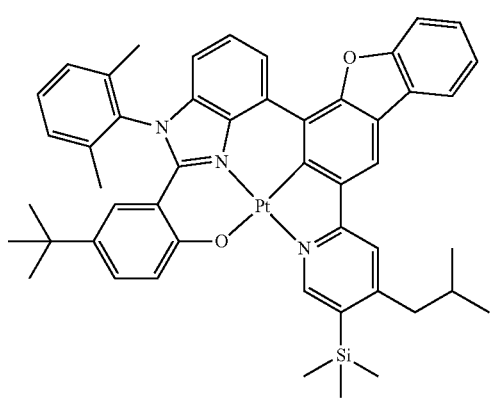
3-157
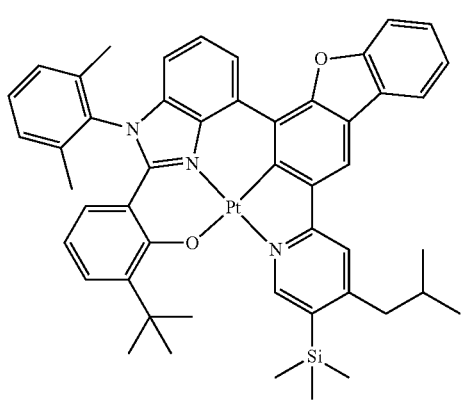
3-158
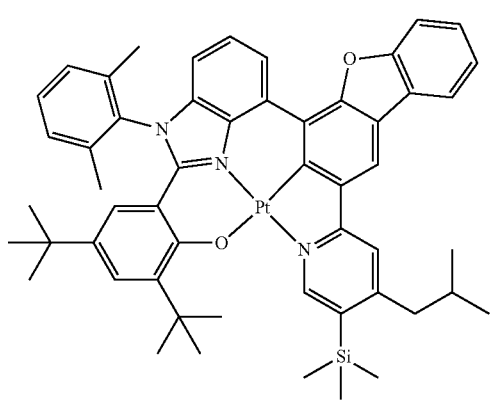
3-159
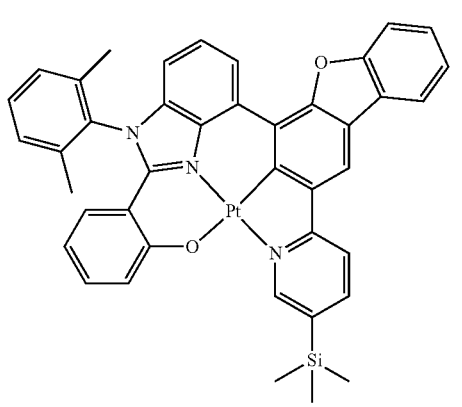
3-160
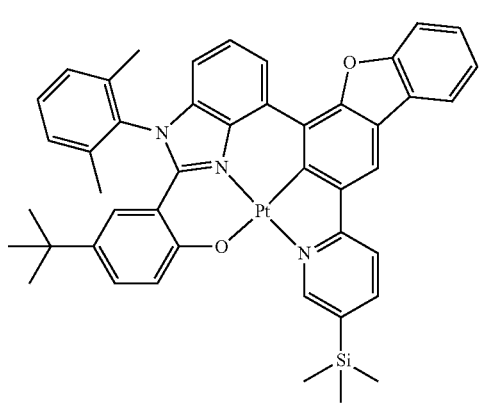

-continued
3-161
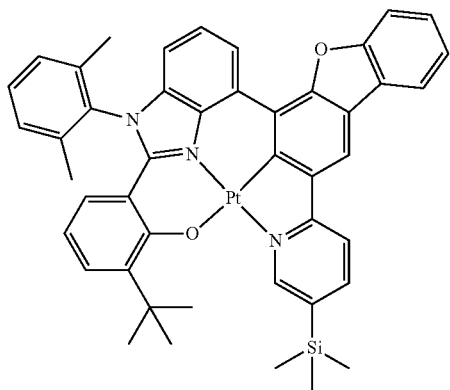
3-162
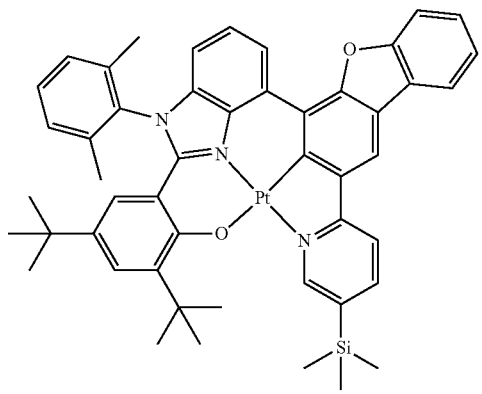
3-163
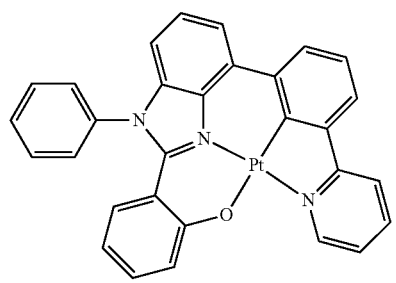
3-164
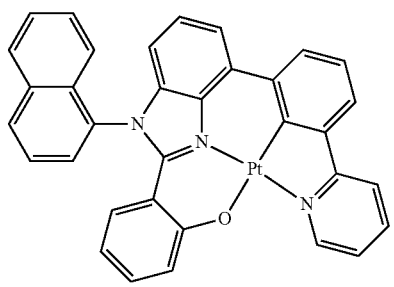
3-165
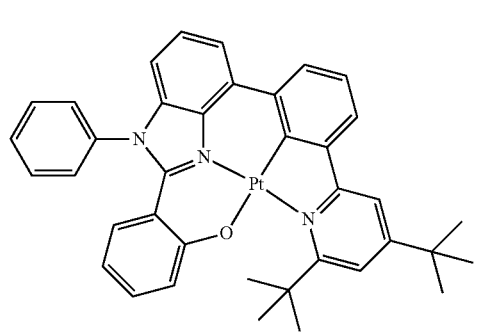
3-166
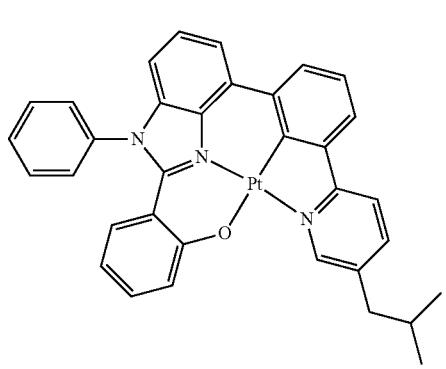
3-167
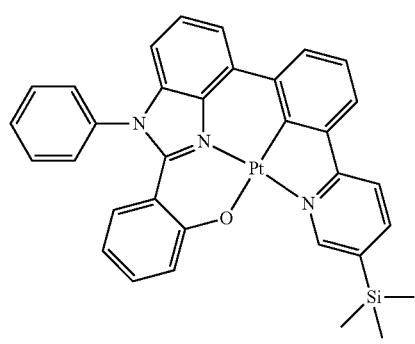
3-168
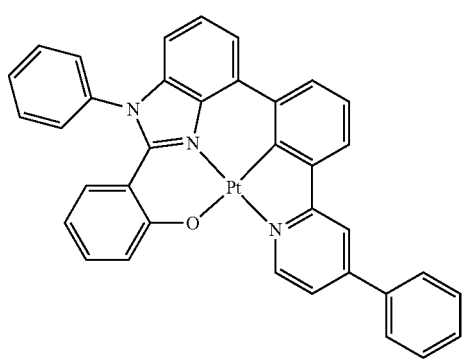

-continued
3-169
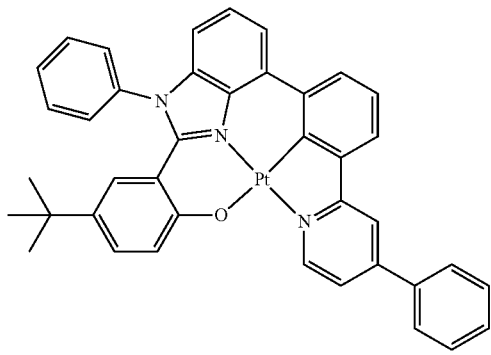
3-170
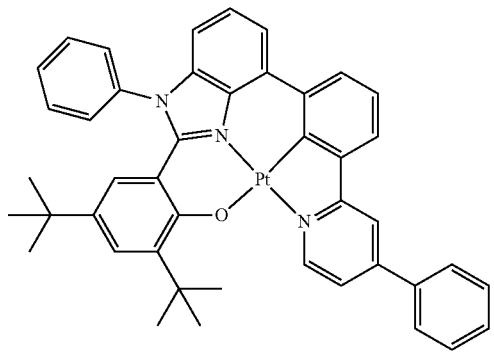
3-171
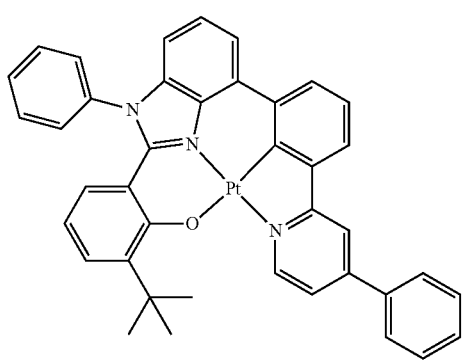
3-172
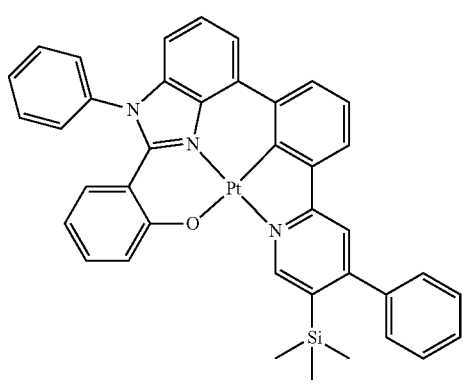
3-173
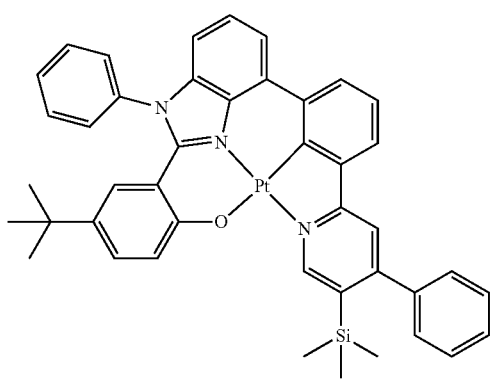
3-174
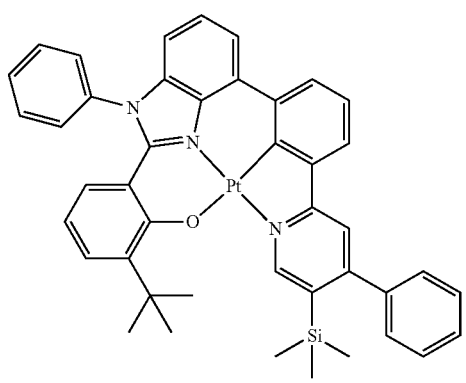
3-175
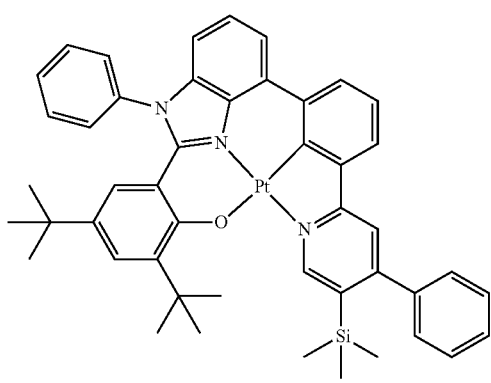
3-176
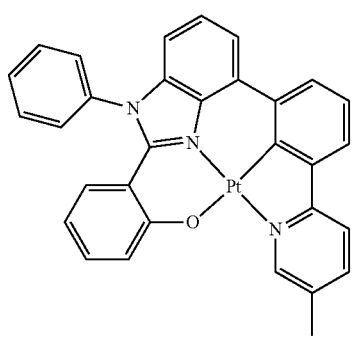

-continued
3-177
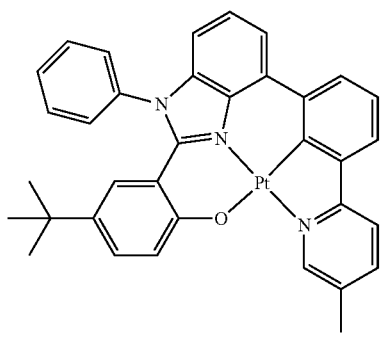
3-178
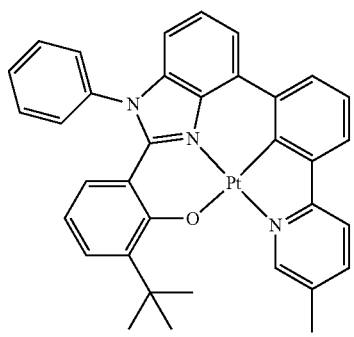
3-179
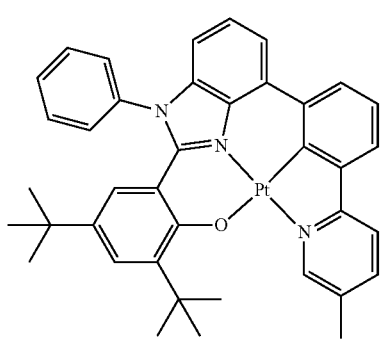
3-180
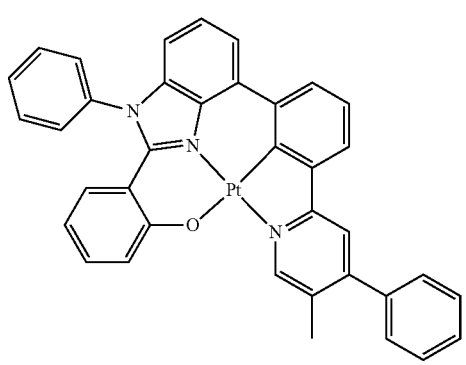
3-181
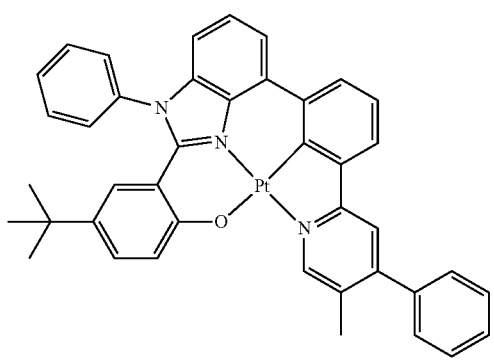
3-182
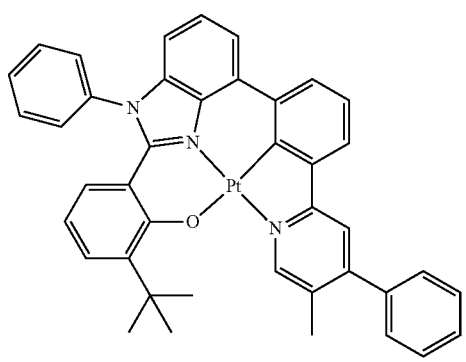
3-183
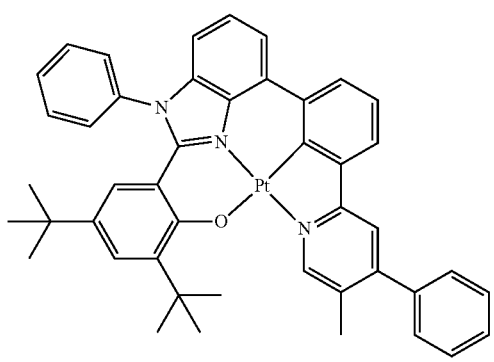
3-184
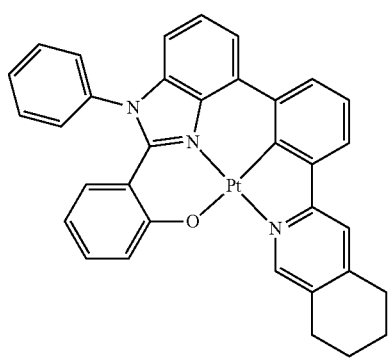

-continued
| 3-185 | 3-186 |
|---|---|
| 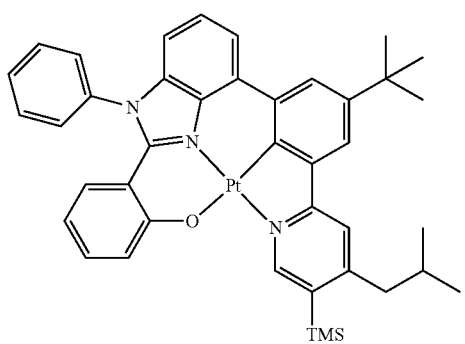 | 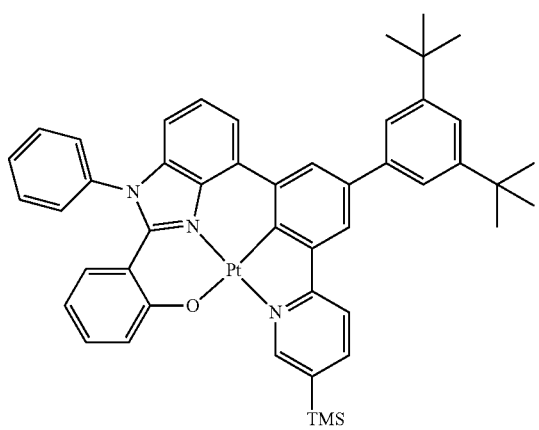 |
| 3-187 | 3-188 |
| 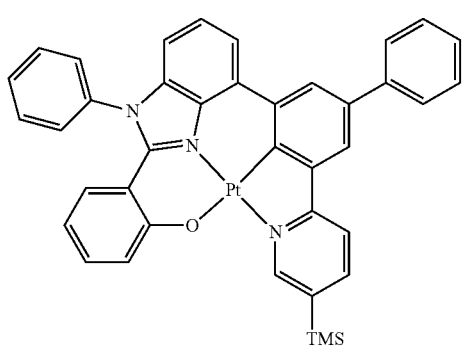 | 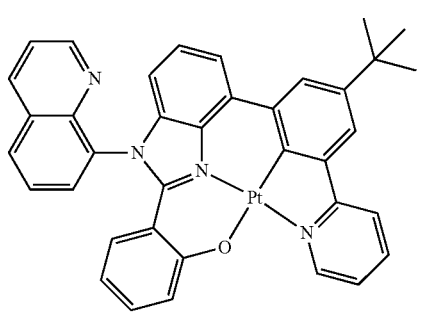 |
| 3-189 | 3-190 |
| 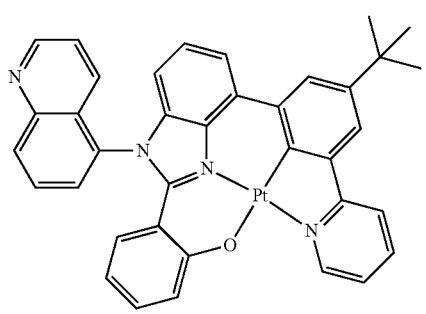 | 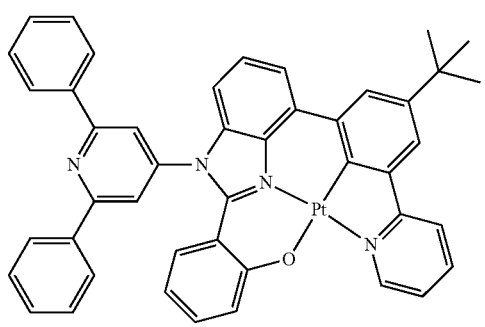 |
| 3-191 | 3-192 |
| 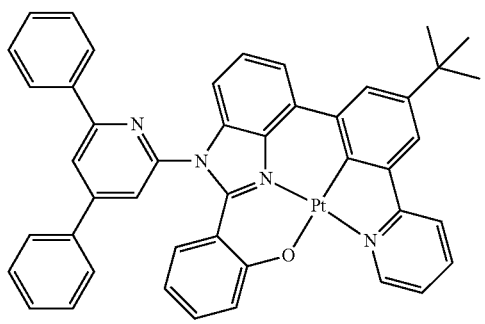 | 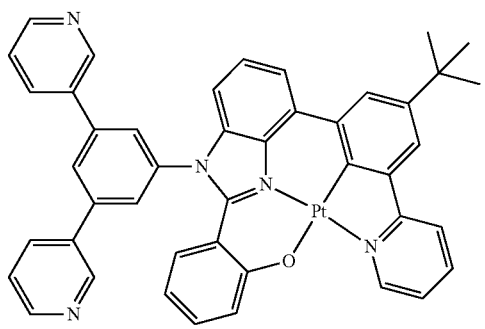 |

-continued
| 3-193 | 3-194 |
|---|---|
| 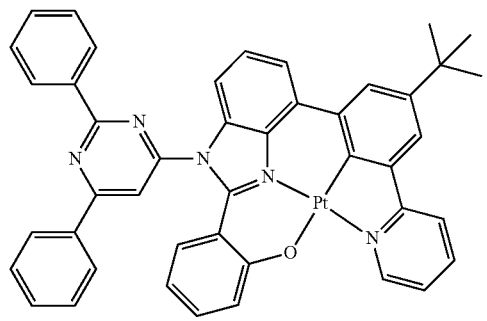 | 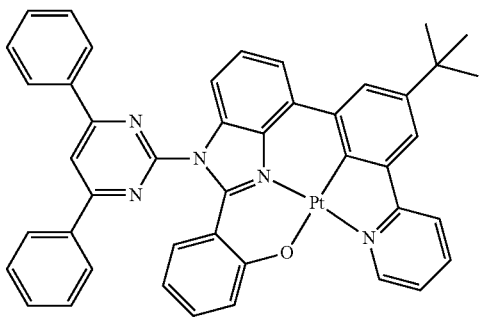 |
| 3-195 | 3-196 |
| 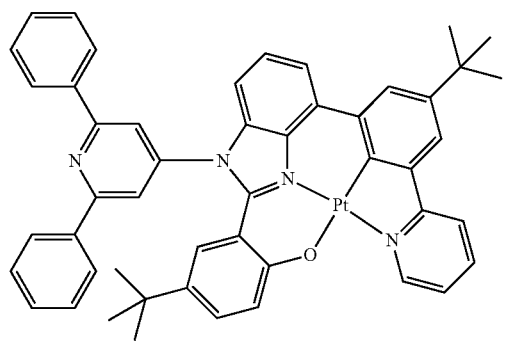 | 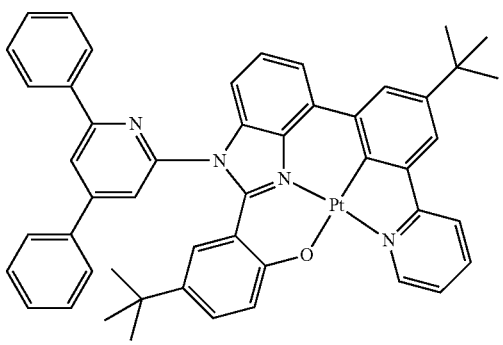 |
| 3-197 | 3-198 |
| 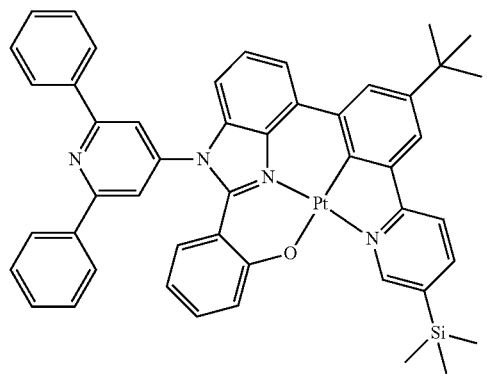 | 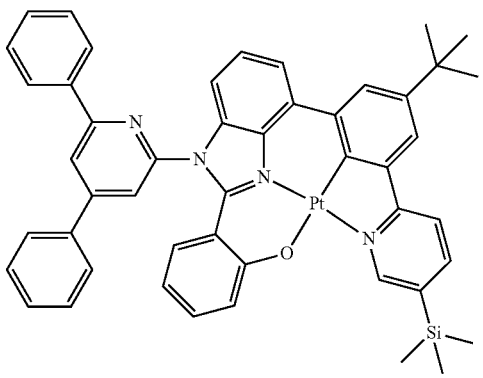 |
| 3-199 | 3-200 |
| 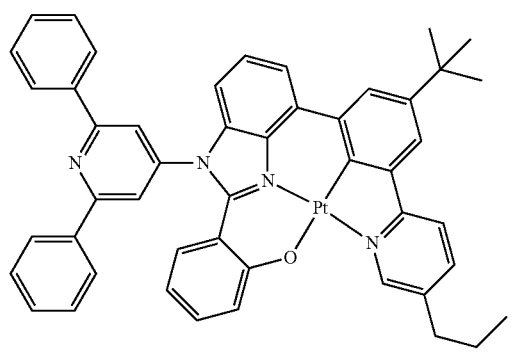 | 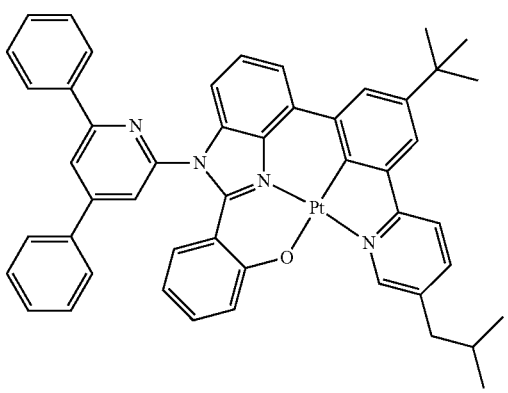 |

-continued
3-201
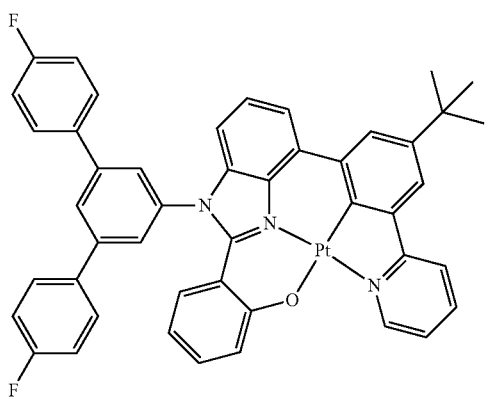
3-202
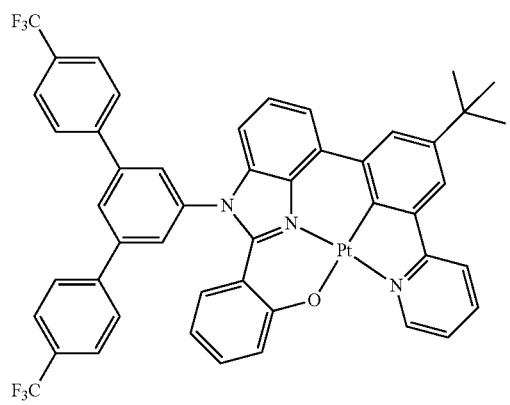
3-203
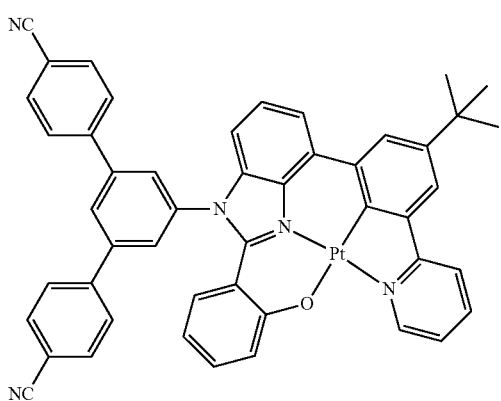
3-204
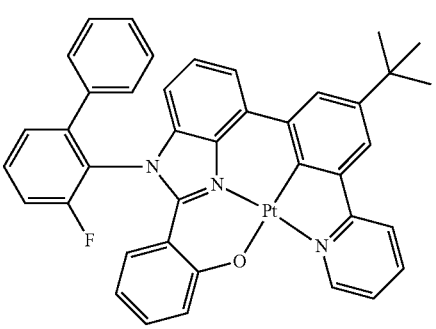
3-205
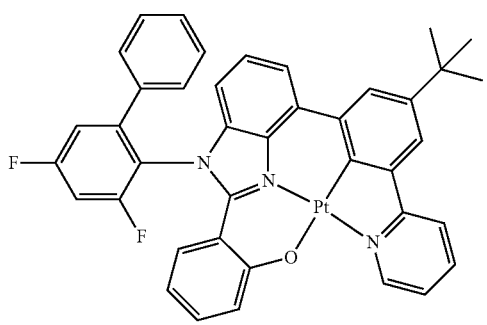
3-206
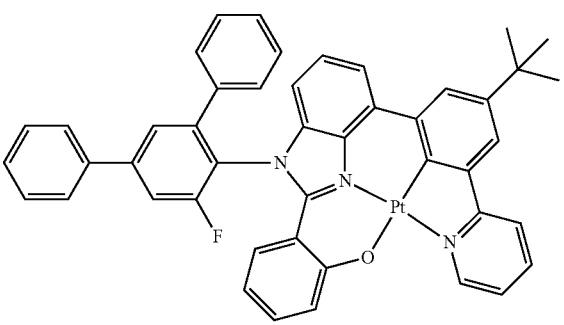
3-207
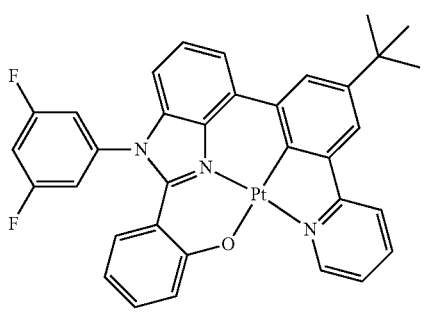
3-208
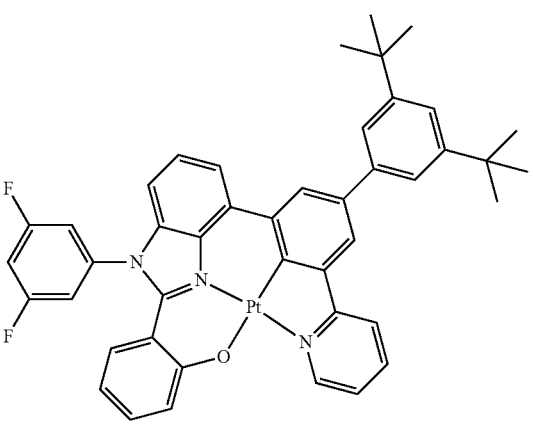

-continued
3-209
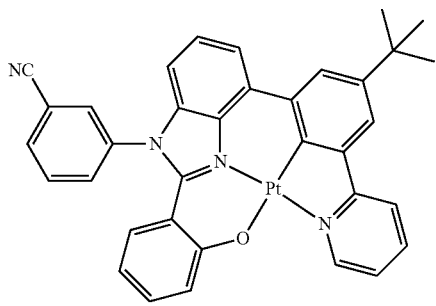
3-210
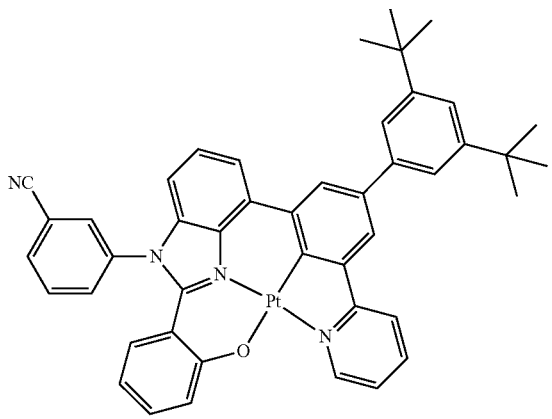
3-211
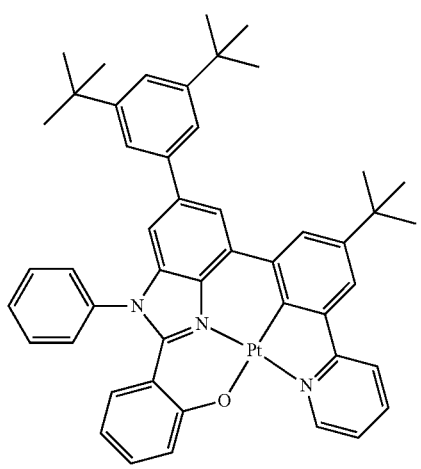
3-212
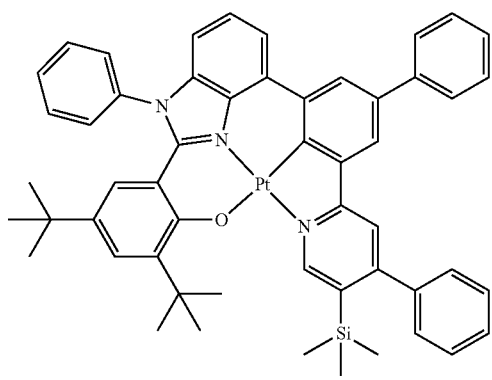
3-213
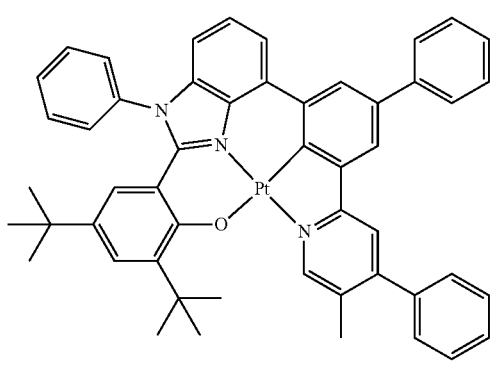
3-214
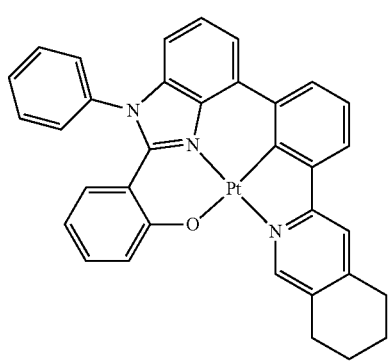

-continued
3-215
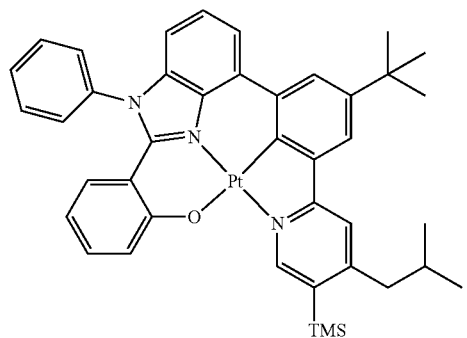
3-216
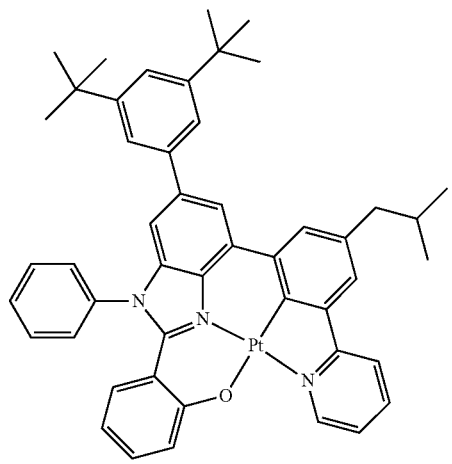
3-217
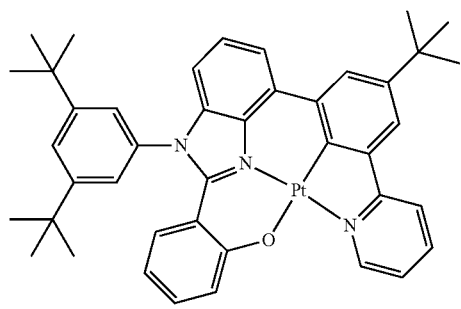
3-218
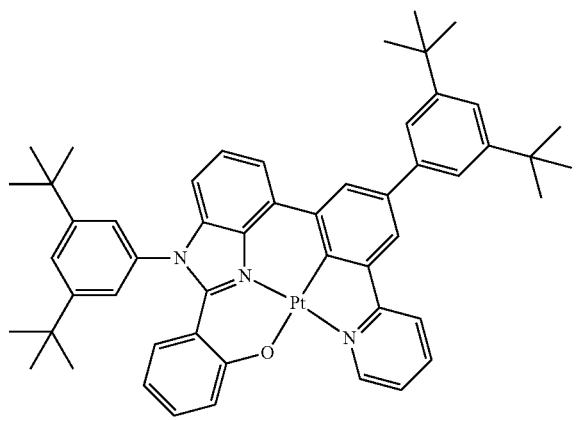
3-219
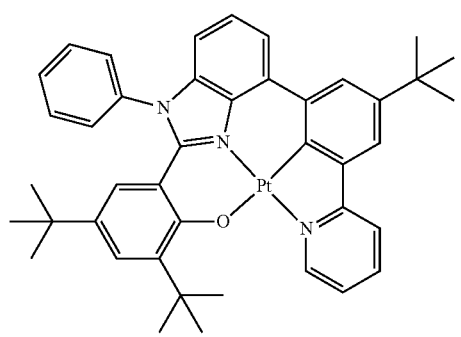
3-220
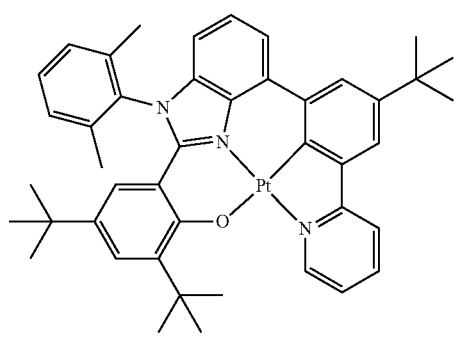

-continued
3-221
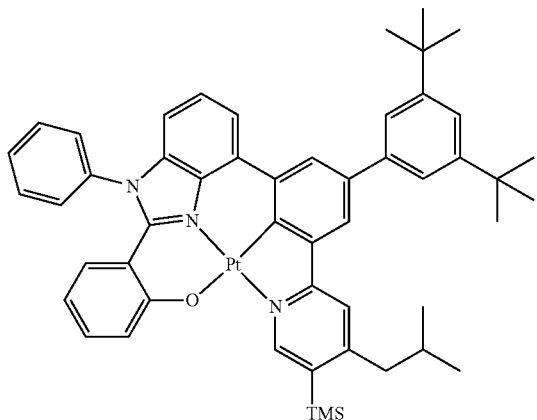
3-222
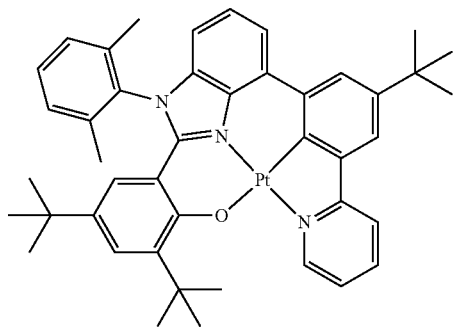
3-223
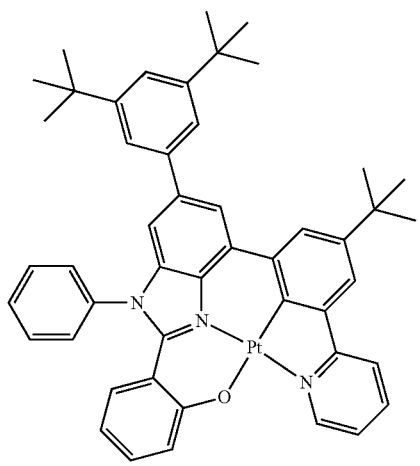
3-224
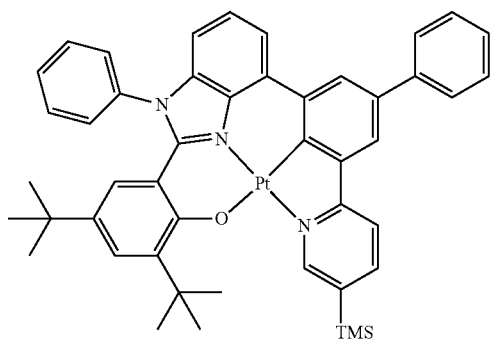
3-225
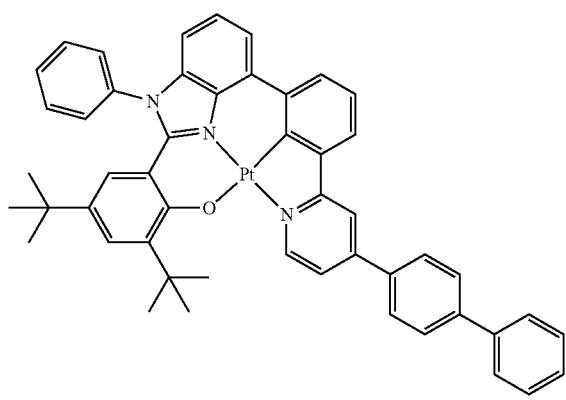
3-226
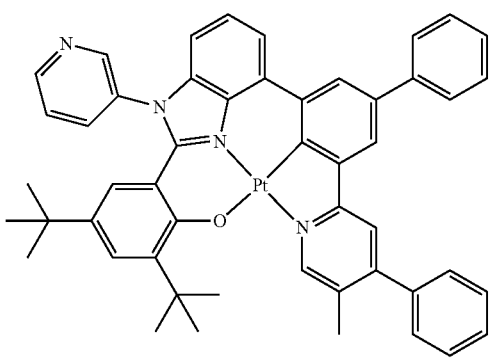

-continued
3-227
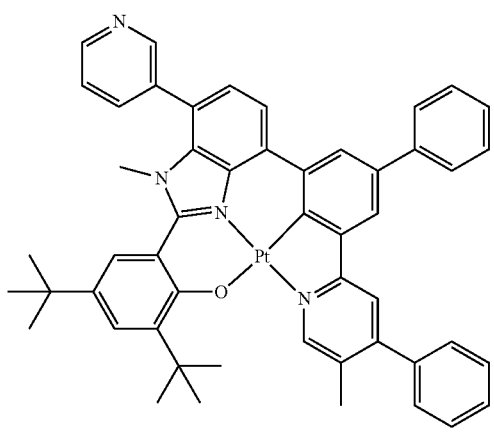
3-228
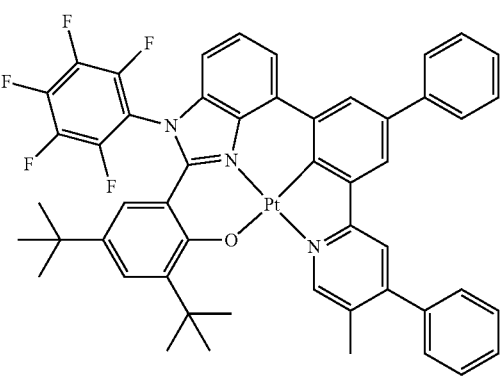
3-229
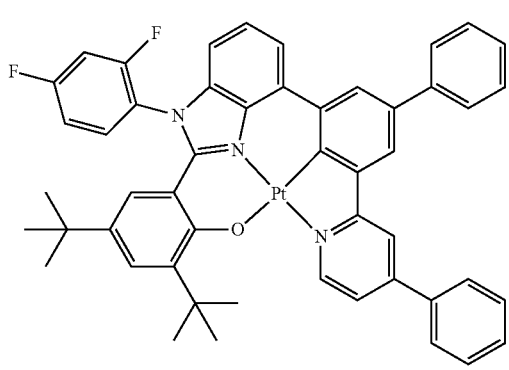
3-230
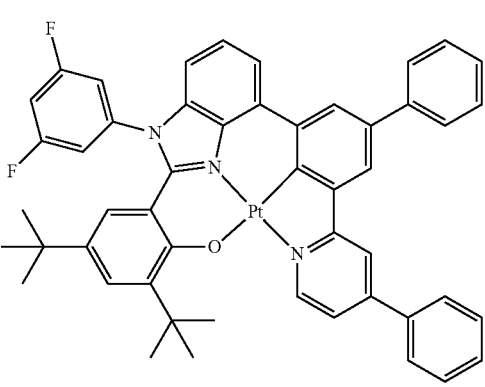
3-231
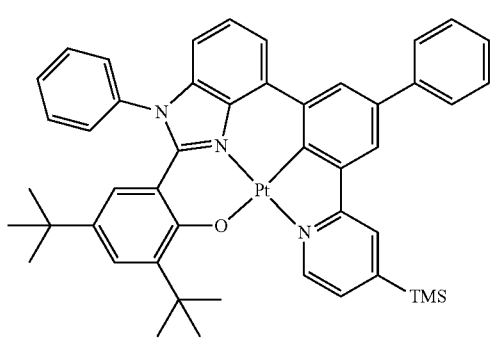
3-232
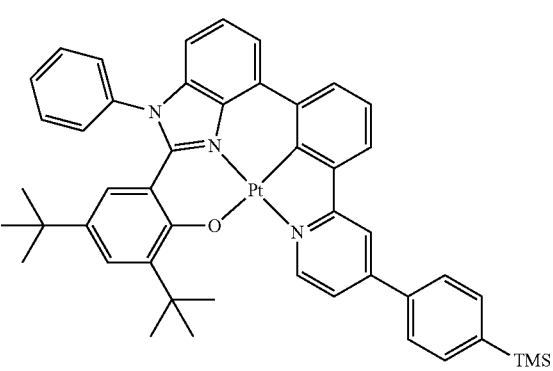
3-233
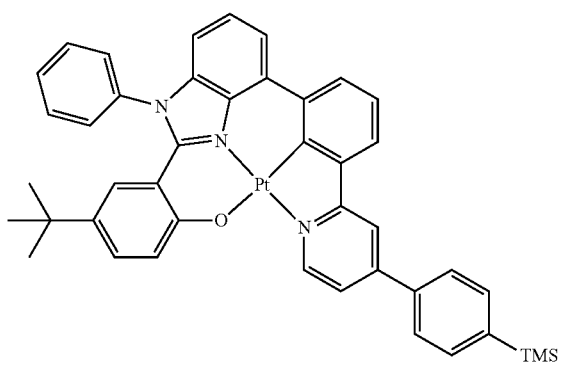
3-234
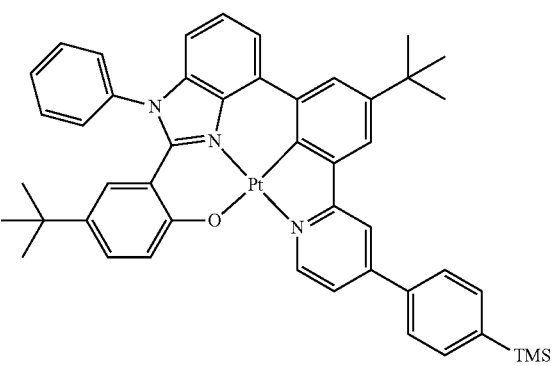

-continued
3-235
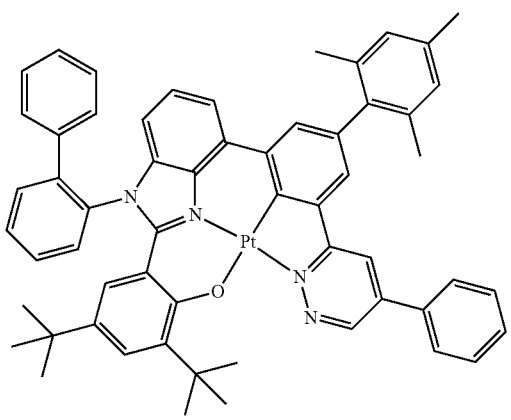
3-236
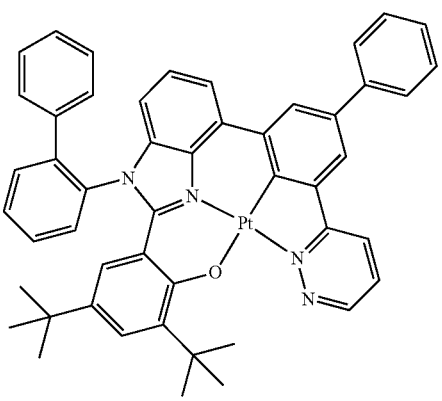
3-237
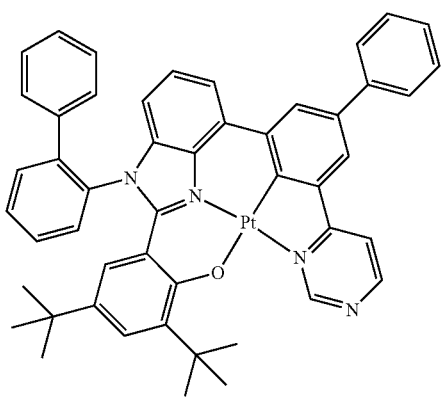
3-238
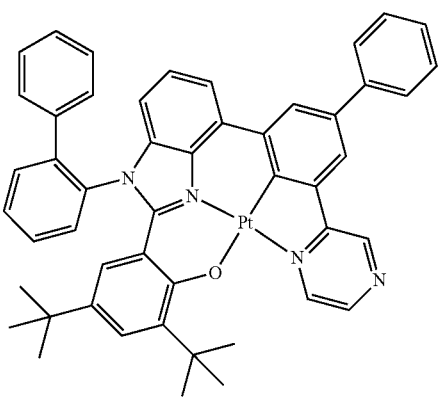
3-239
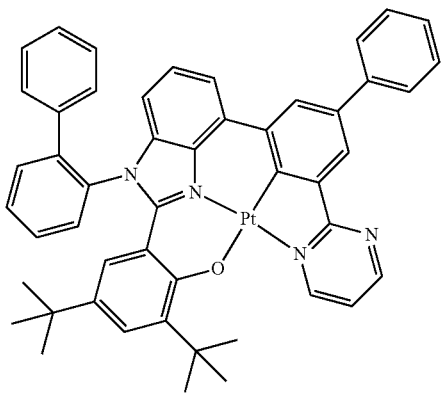
3-240
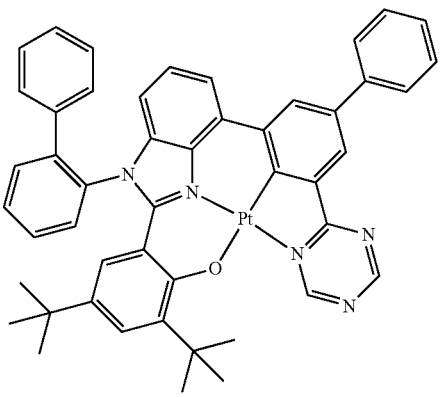
3-241
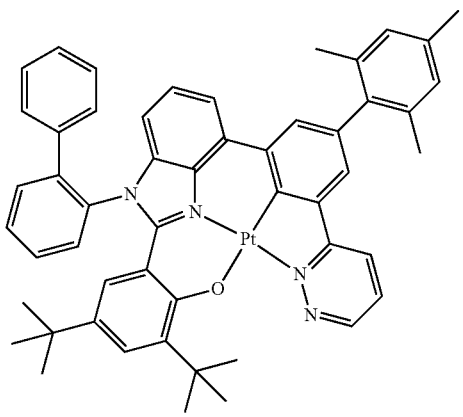
3-242
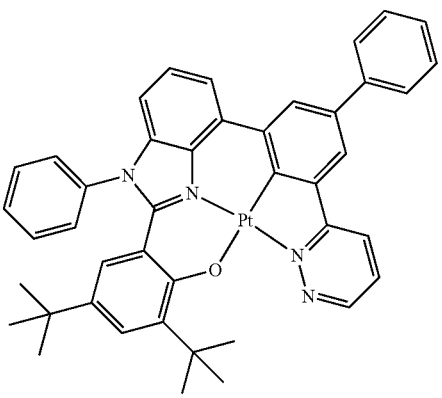

-continued
3-243
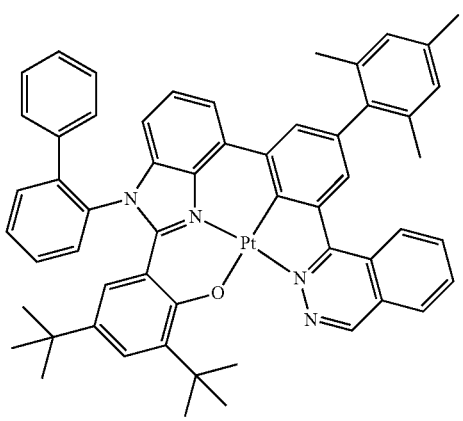
3-244
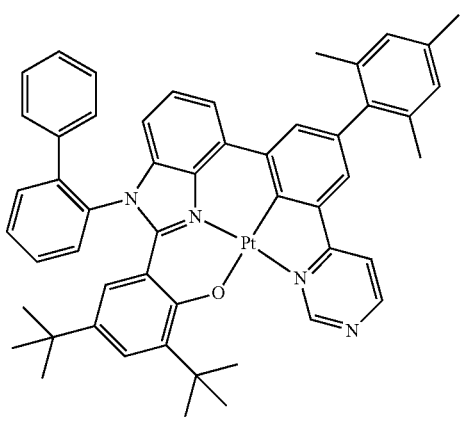
3-245
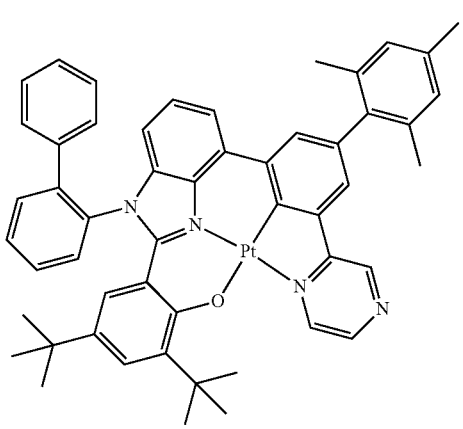
3-246
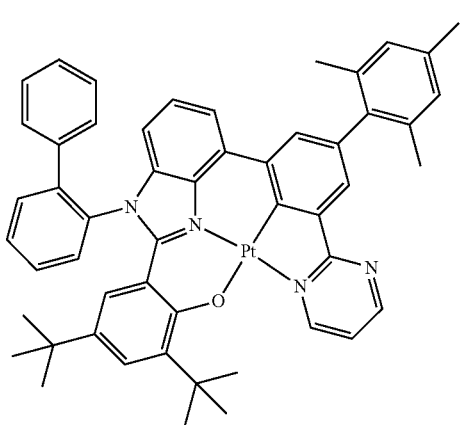
3-247
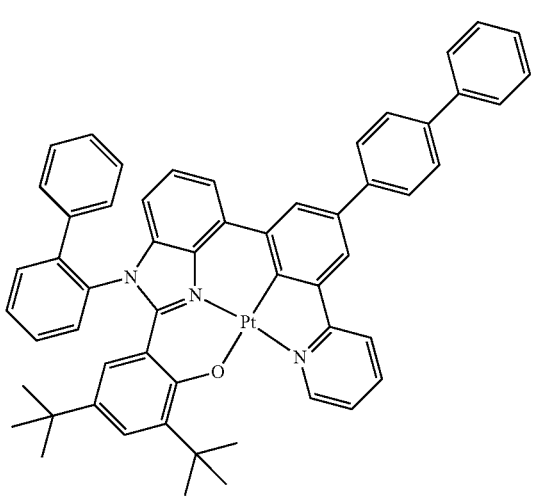
3-248
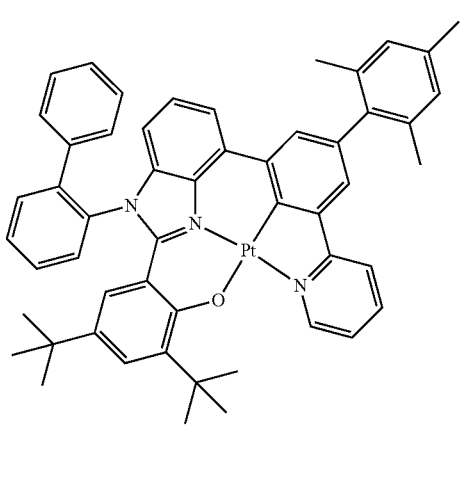

-continued
3-249
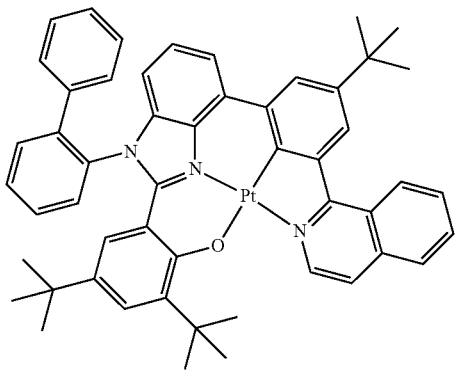
3-250
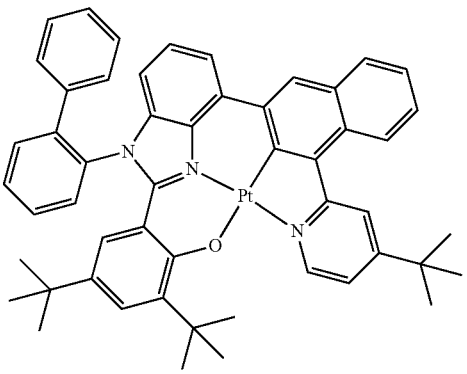
3-251
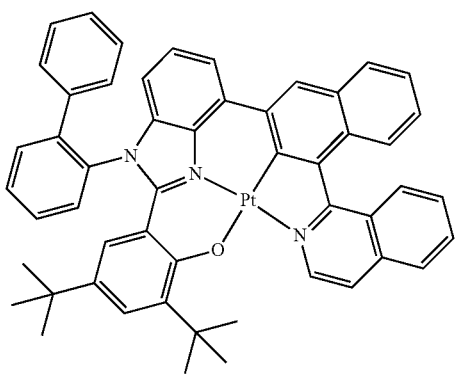
3-252
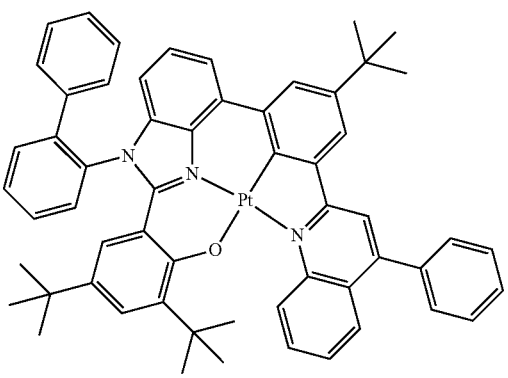
3-253
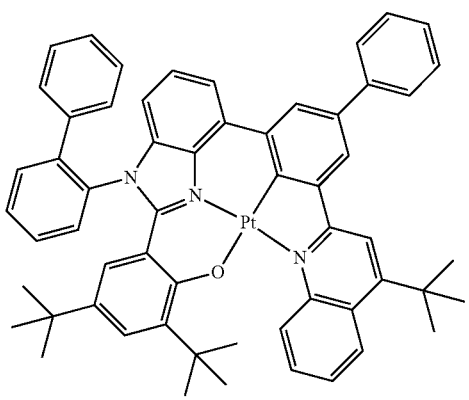
3-254
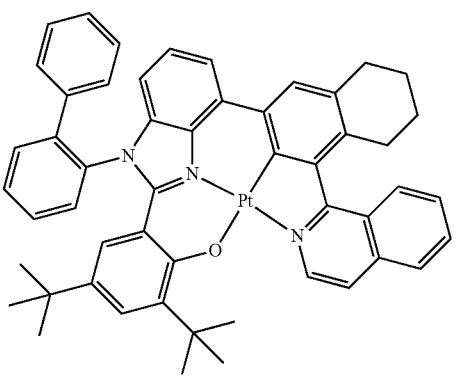
3-255
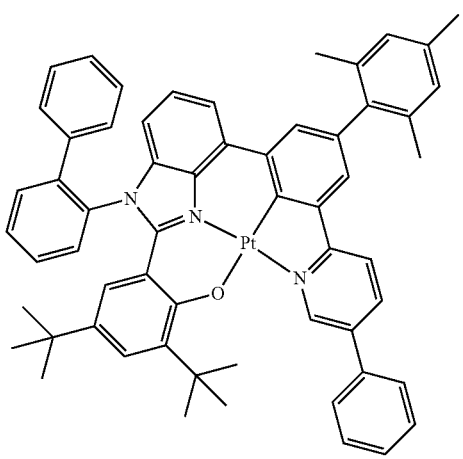
3-256
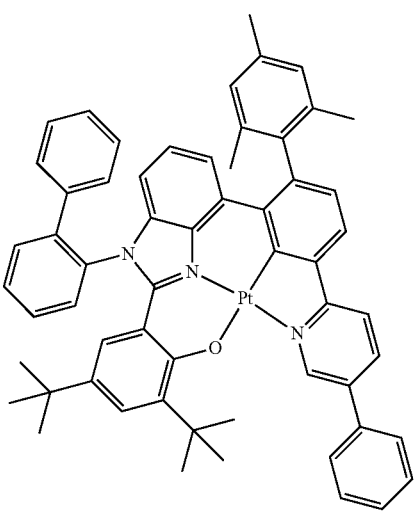

-continued
3-257
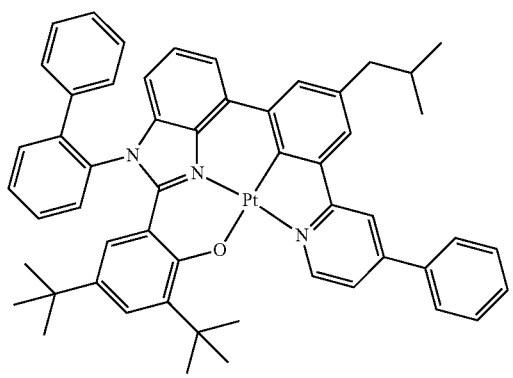
3-258
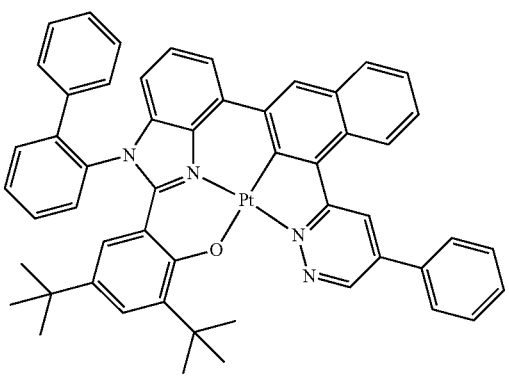
3-259
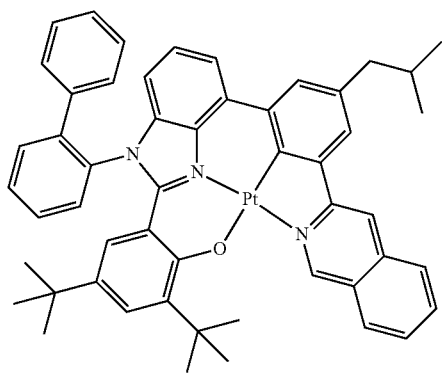
3-260
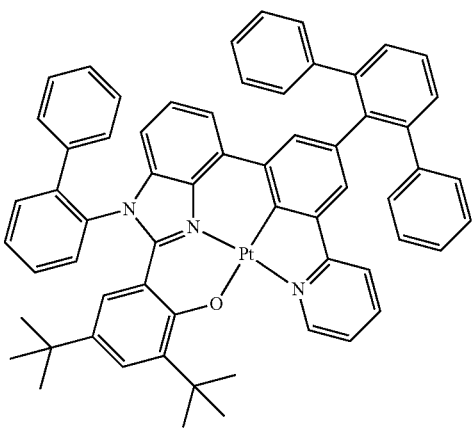
3-261
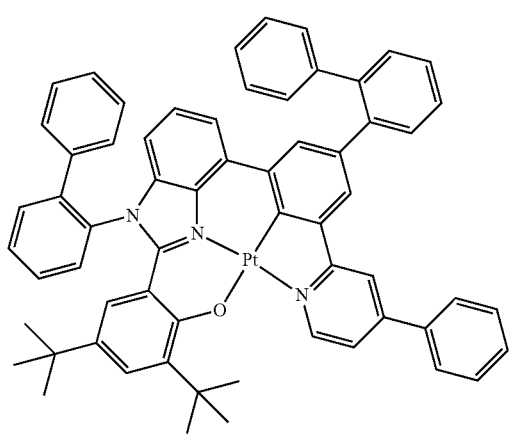
3-262
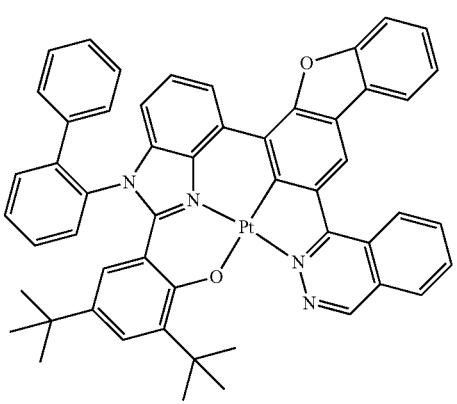

-continued
3-263
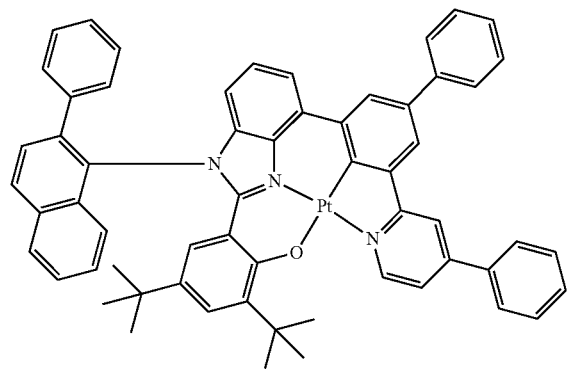
3-264
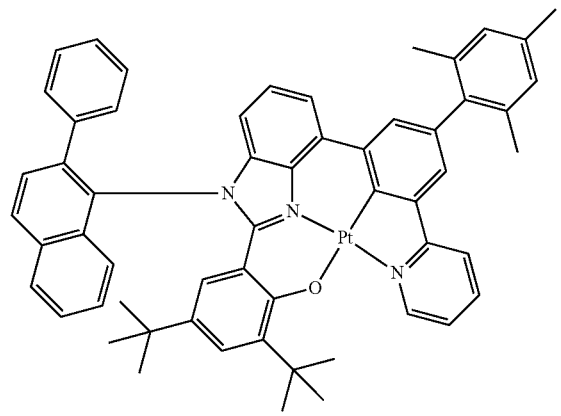
3-265
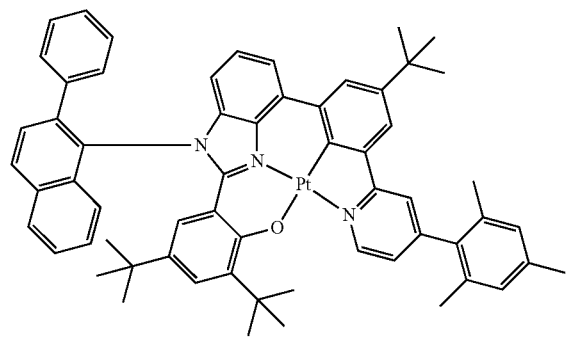
3-266
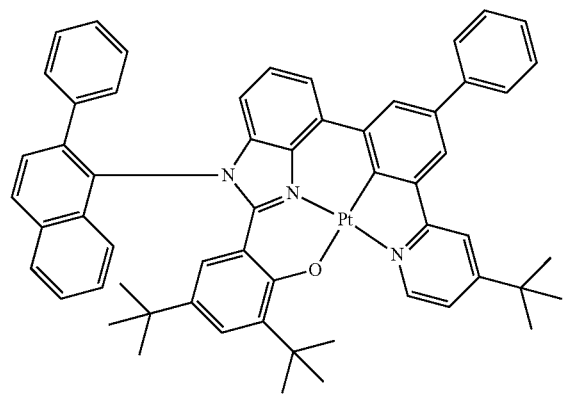
3-267
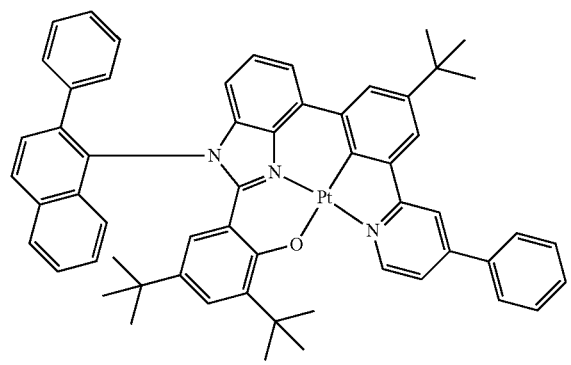
3-268
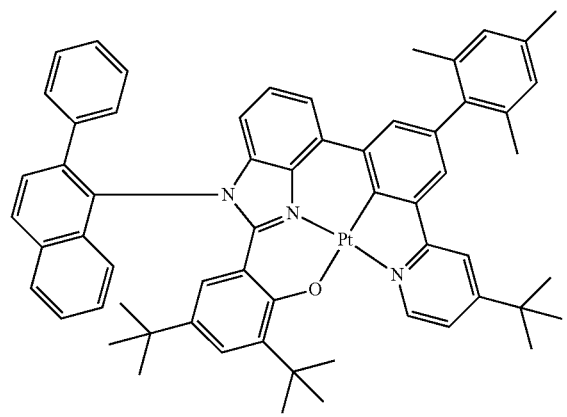

-continued
3-269
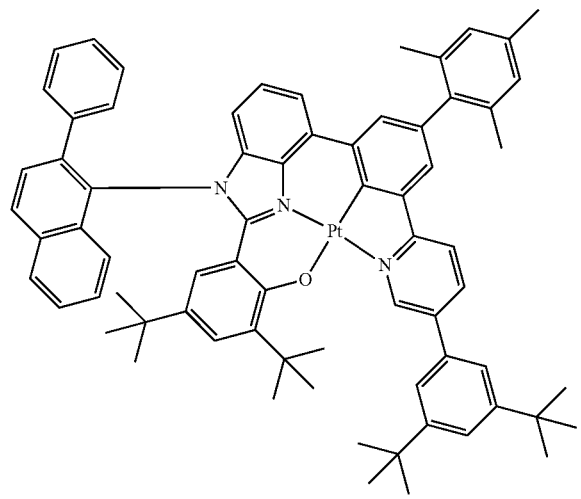
3-270
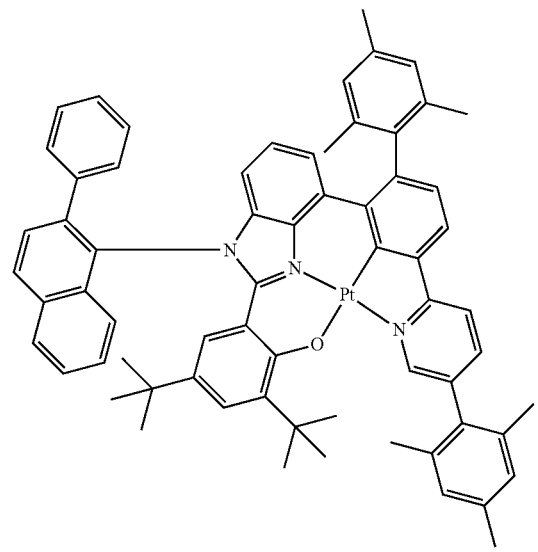
3-271
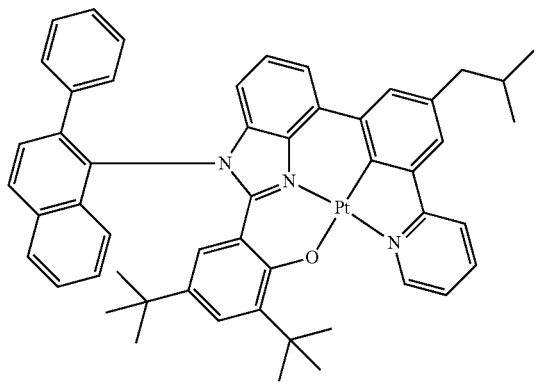
3-272
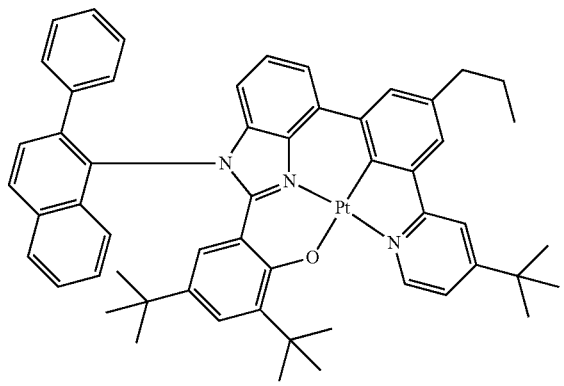
3-273
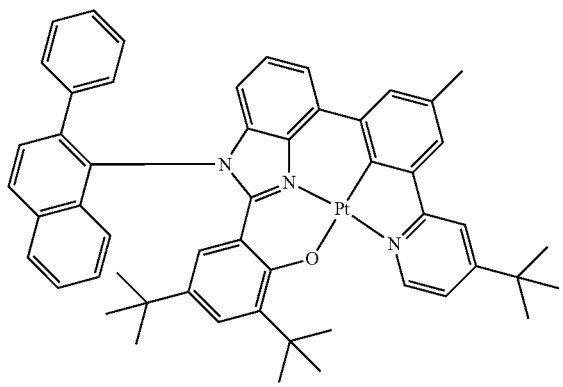
3-274
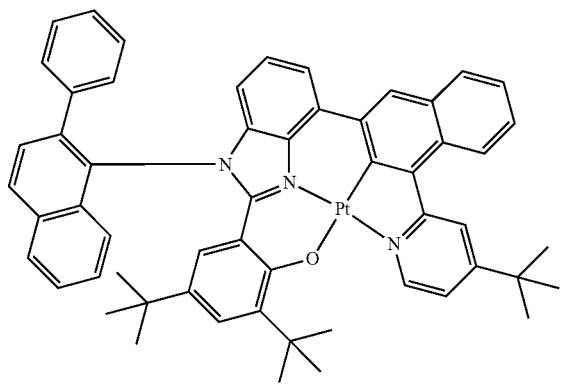

-continued
3-275
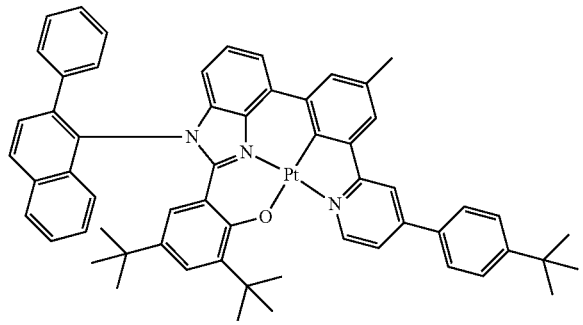
3-276
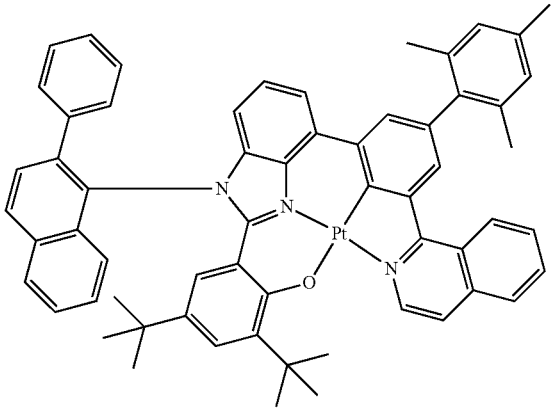
3-277
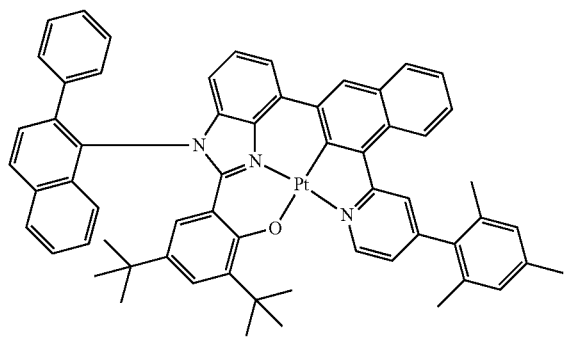
3-278
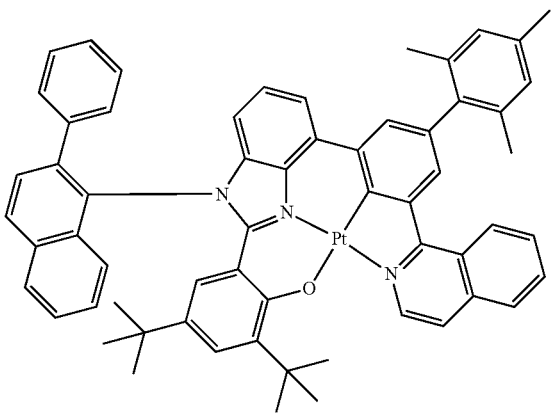
3-279
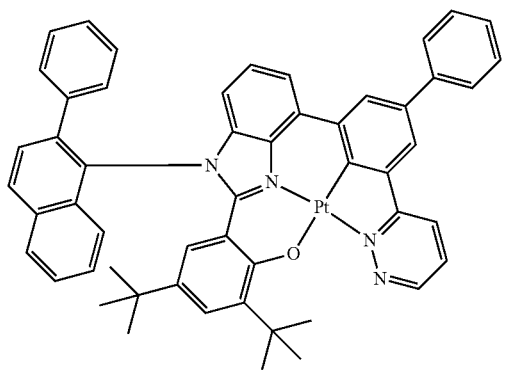
3-280
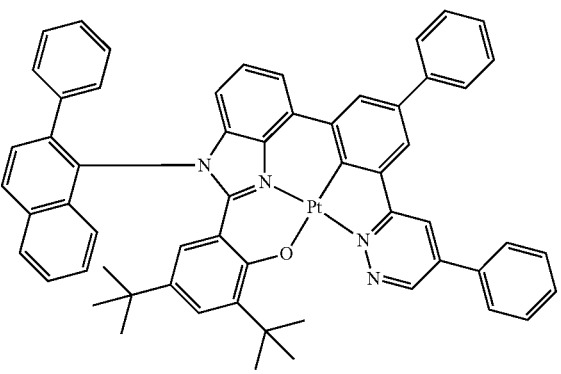
3-281
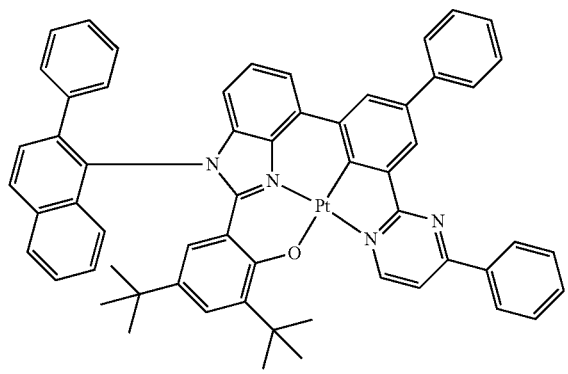
3-282
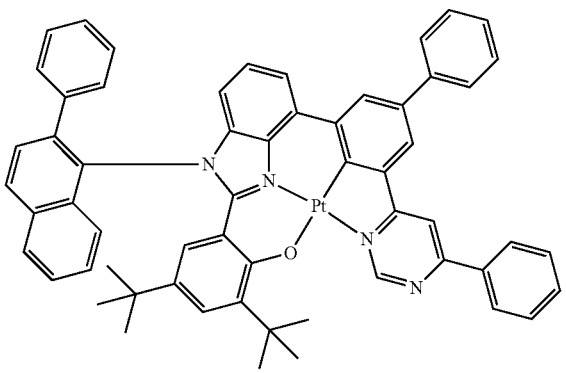

-continued
3-283
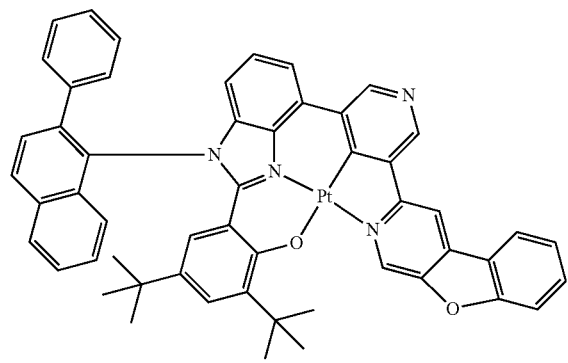
3-284
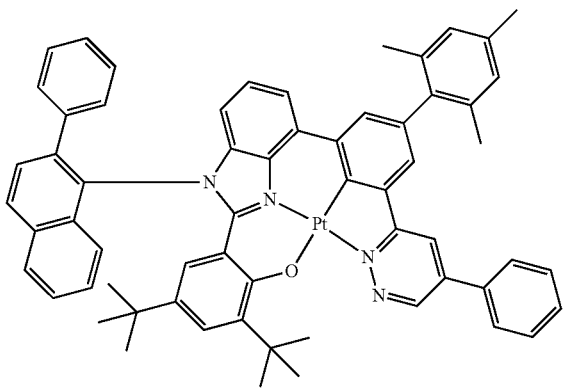
3-285
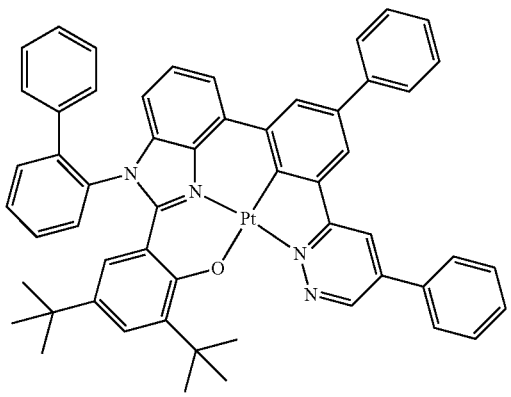
3-286
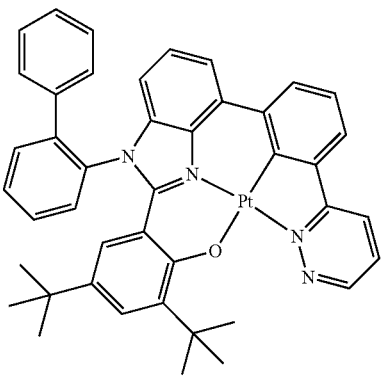
3-287
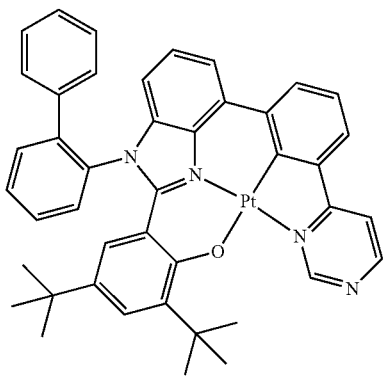
3-288
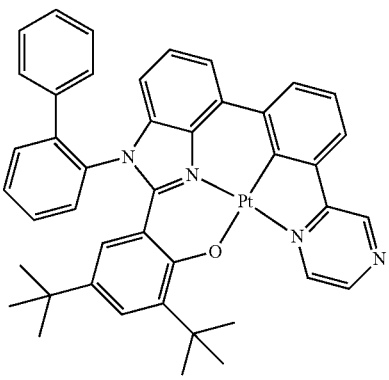
3-289
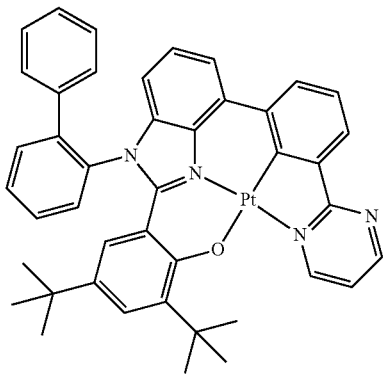
3-290
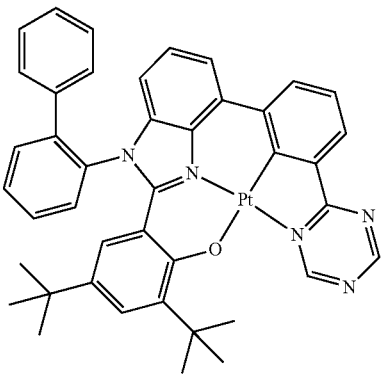

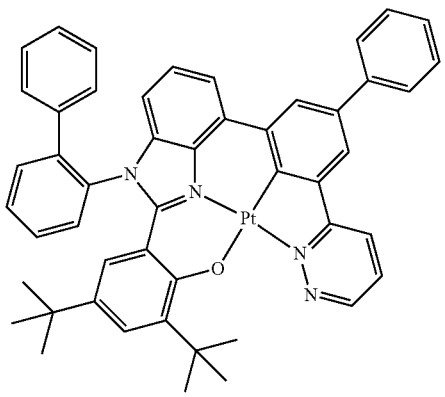
3-291
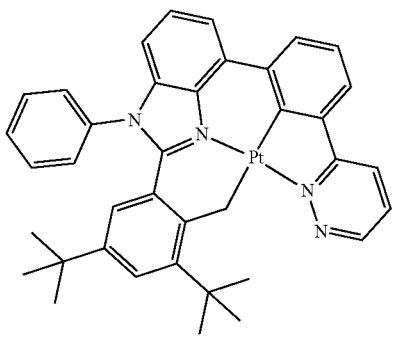
3-292
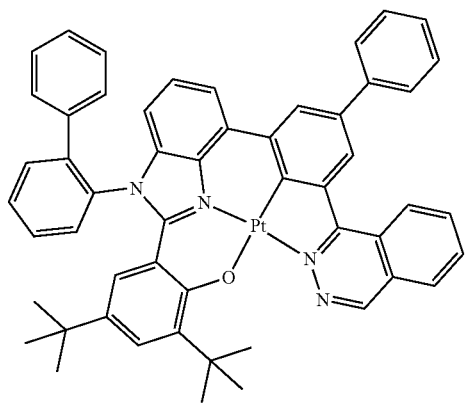
3-293
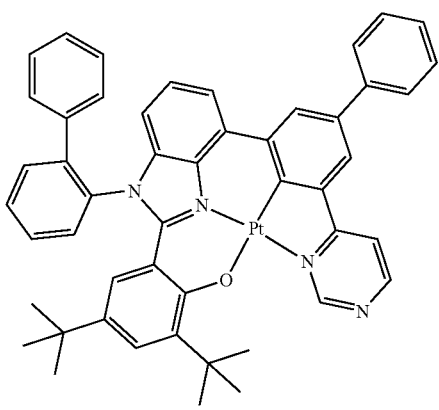
3-294
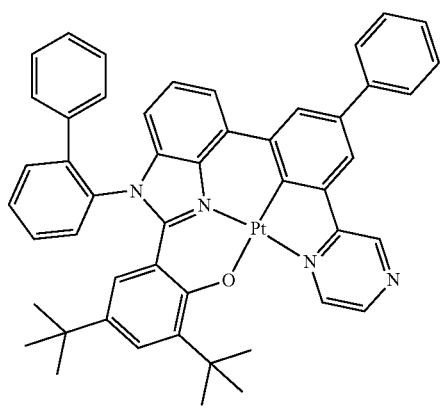
3-295

-continued
3-296
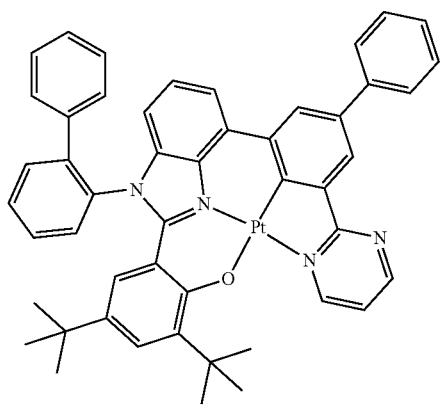
3-297
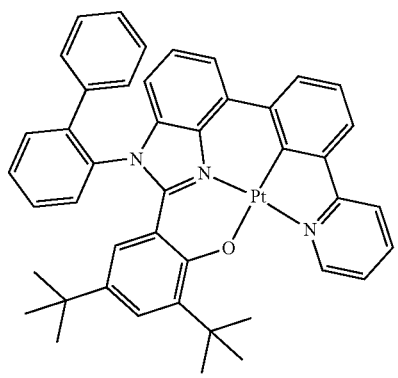
3-298
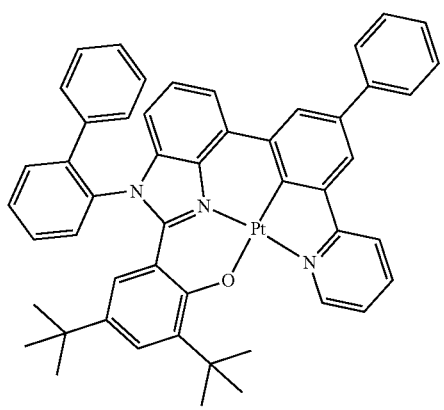
3-299
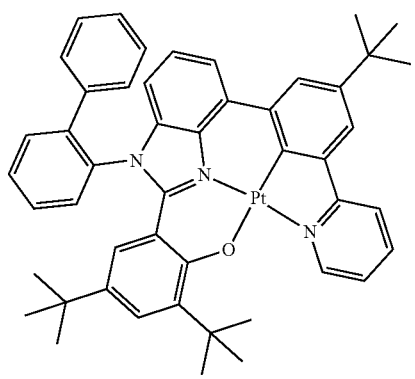
3-300
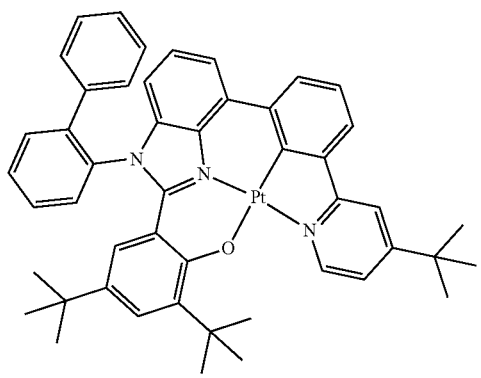
3-301
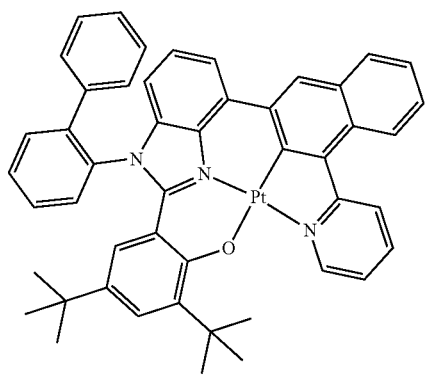
3-302
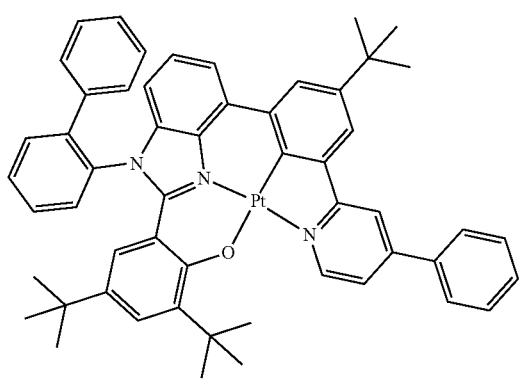
3-303
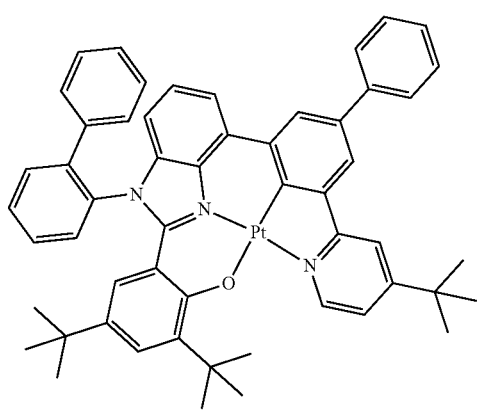

-continued
3-304
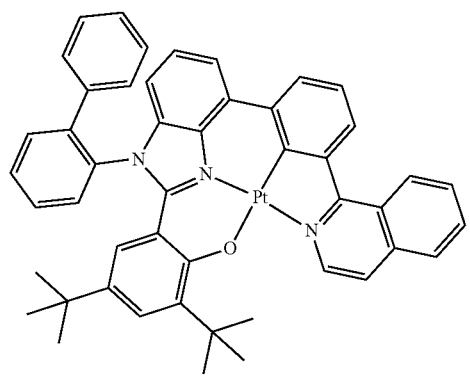
3-305
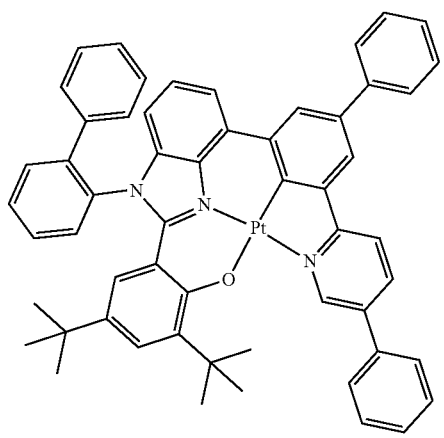
3-306
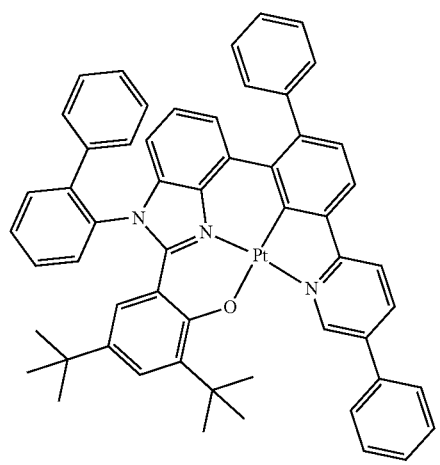
3-307
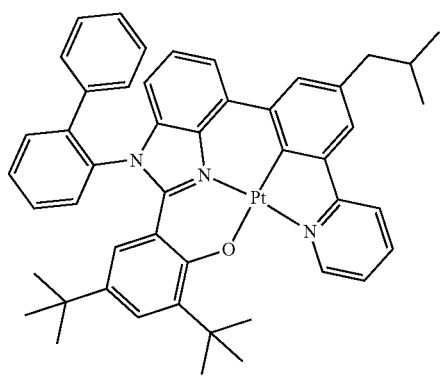
3-308
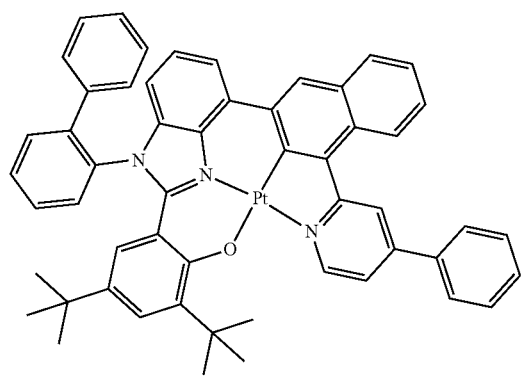
3-309
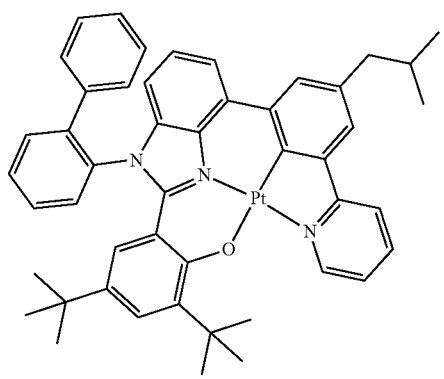

-continued
3-310
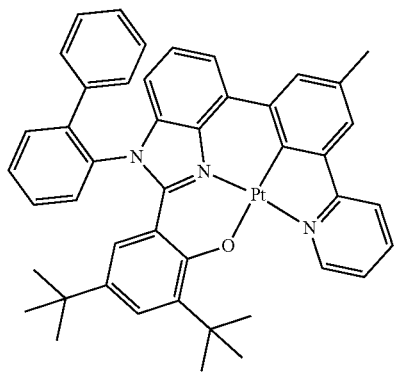
3-311
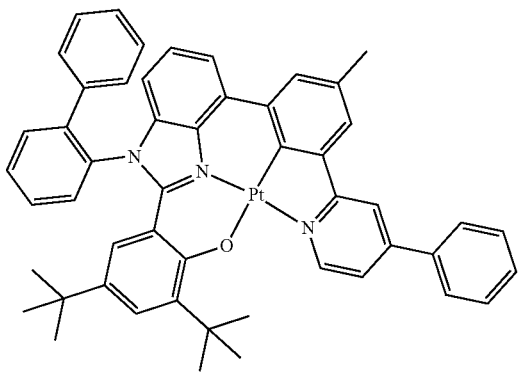
3-312
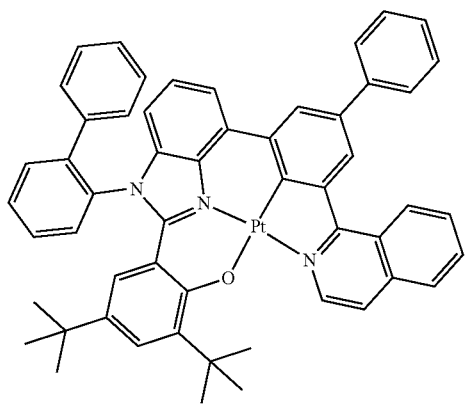
3-313
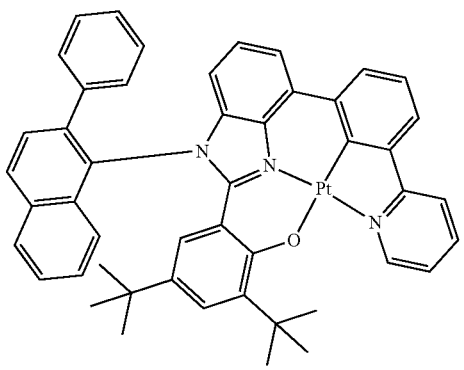
3-314
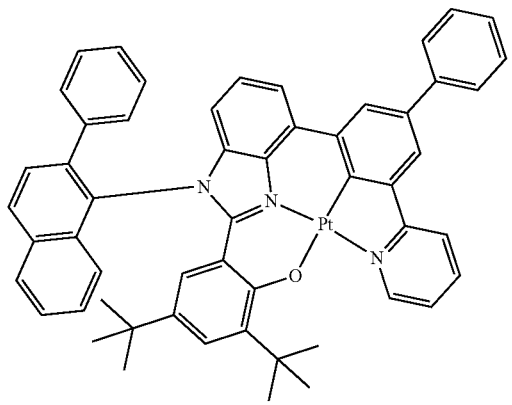
3-315
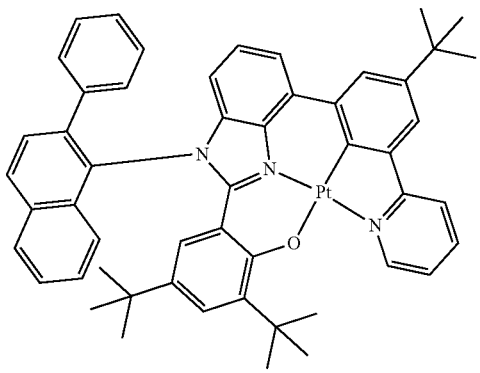
3-316
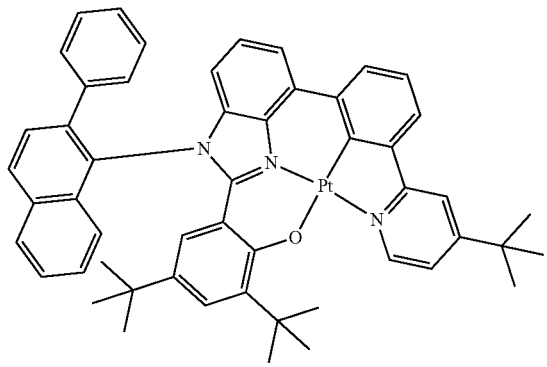
3-317
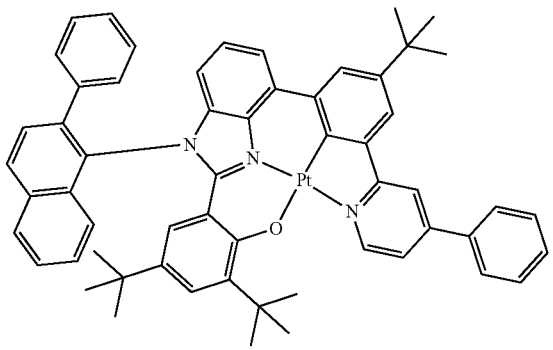

-continued
3-318
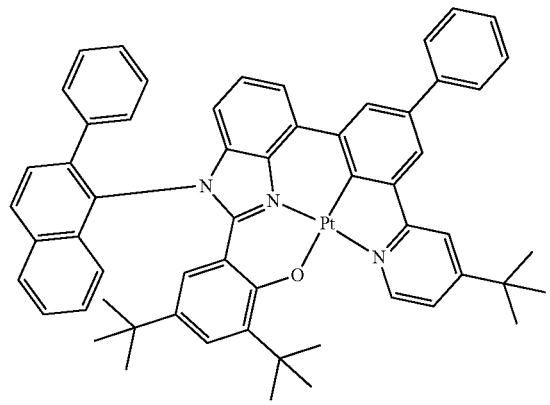
3-319
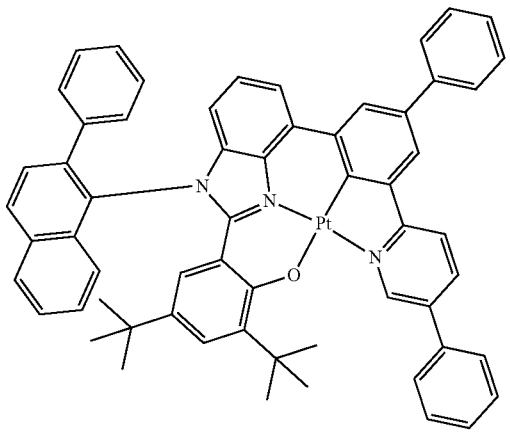
3-320
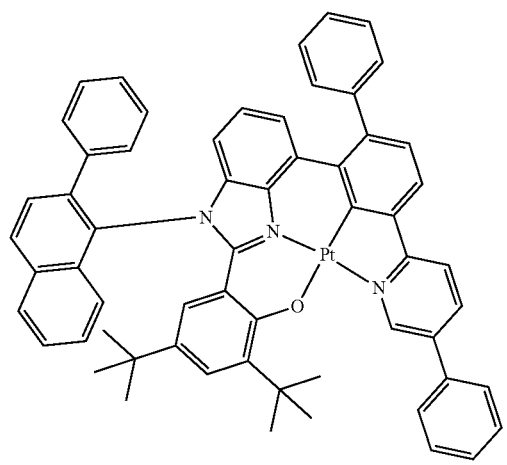
3-321
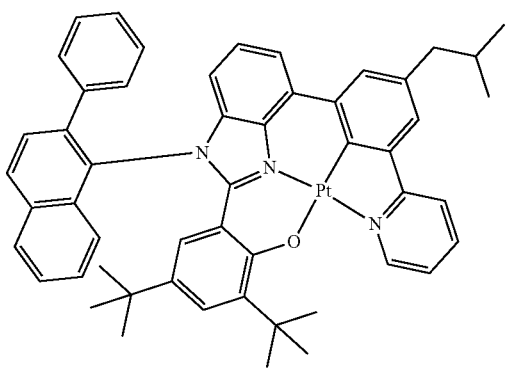
3-322
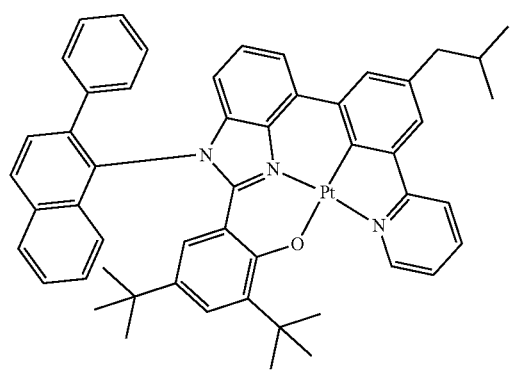
3-323
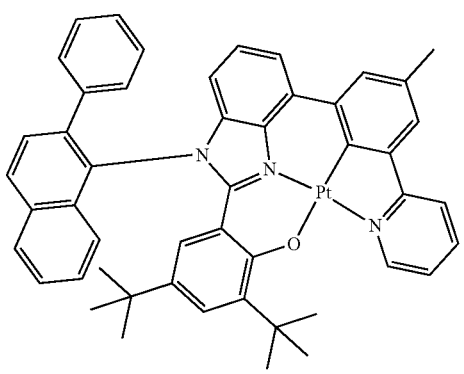

-continued
3-324
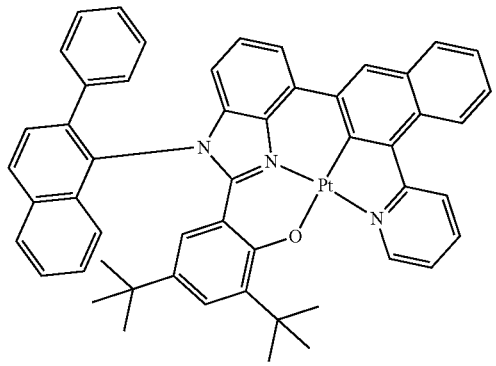
3-325
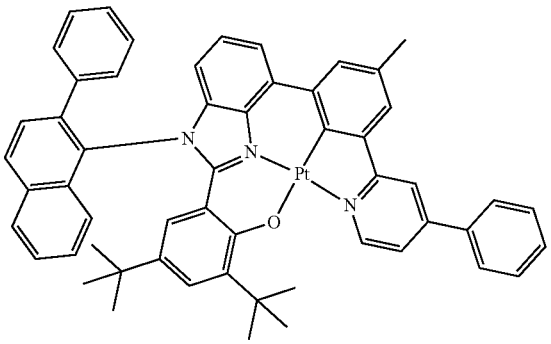
3-326
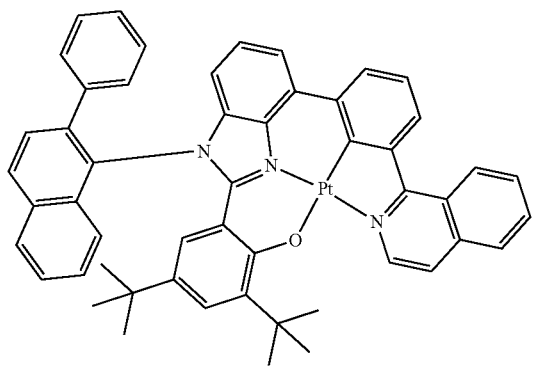
3-327
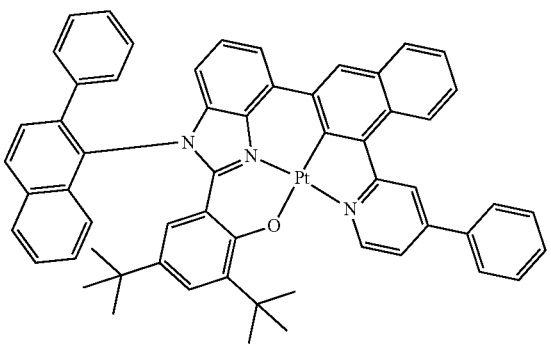
3-328
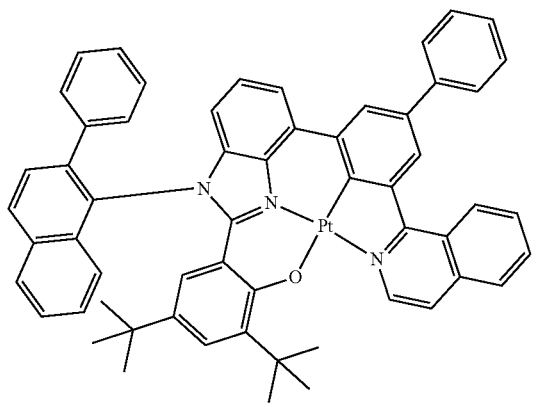
3-329
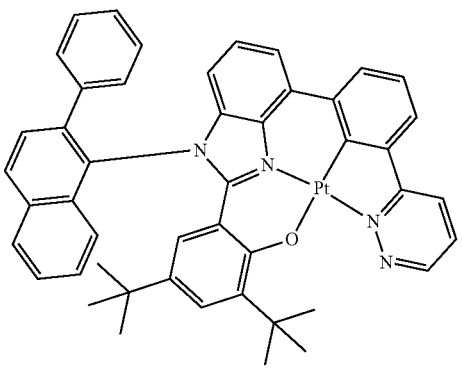
3-330
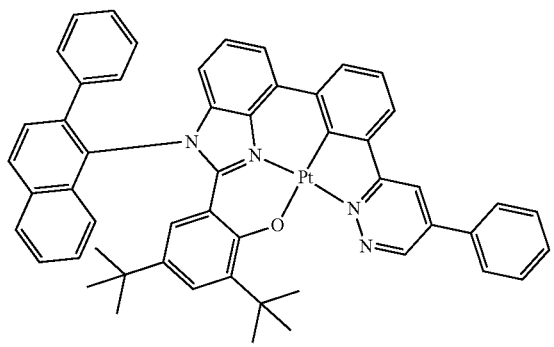
3-331
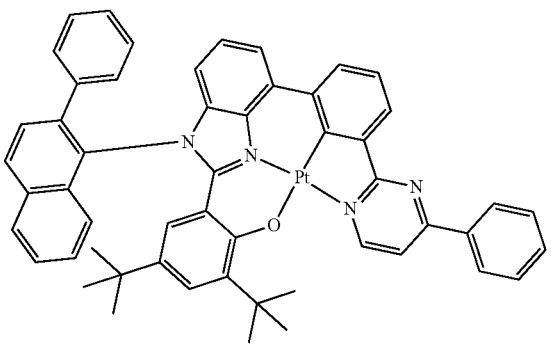

-continued
3-332
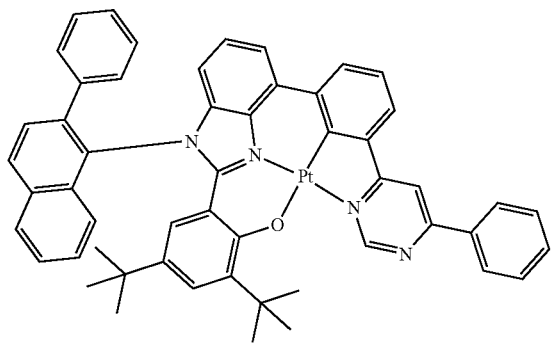
3-333
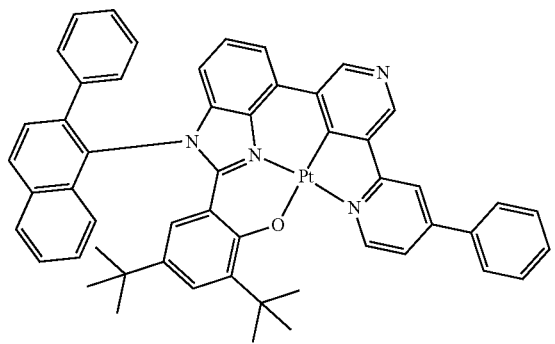
3-334
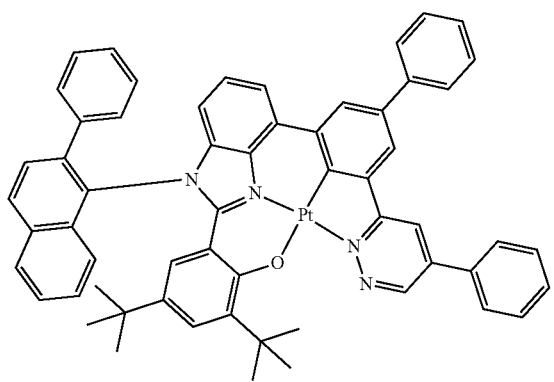
3-335
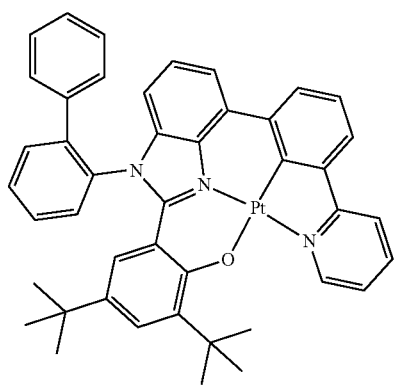
3-336
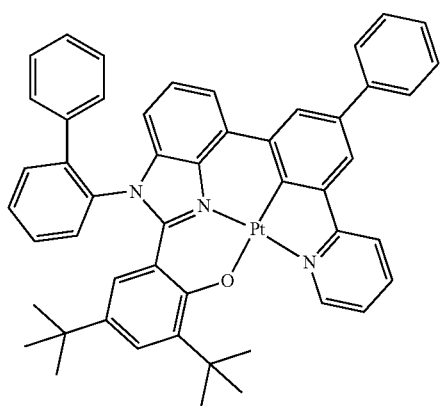
3-337
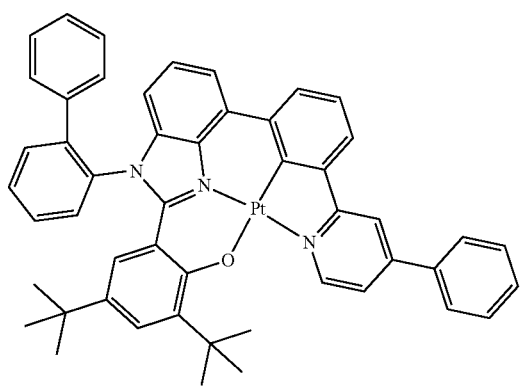

-continued
3-338
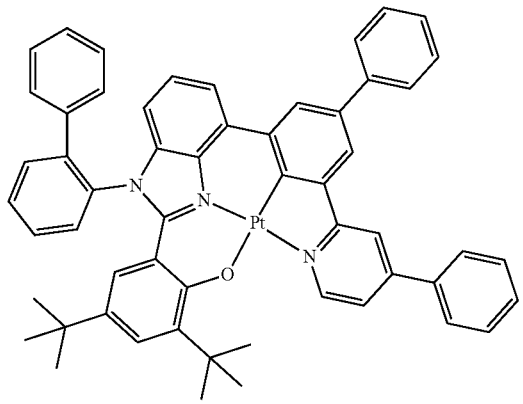
3-339
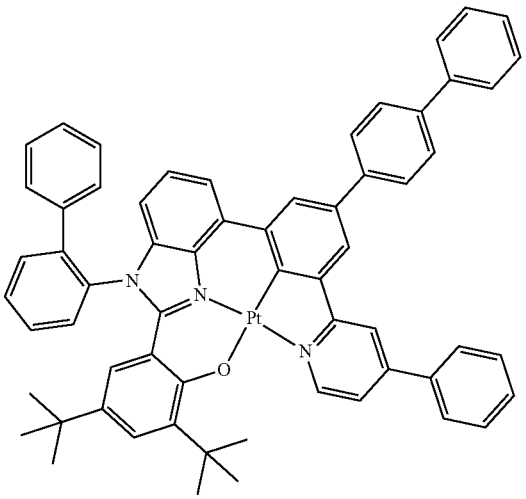
3-340
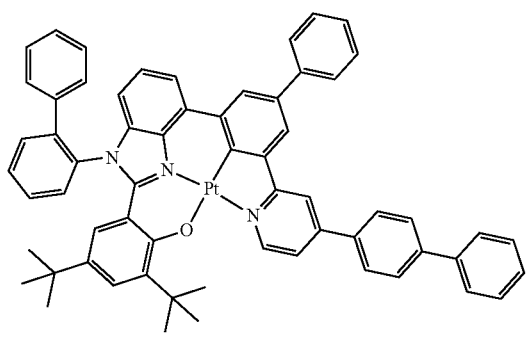
3-341
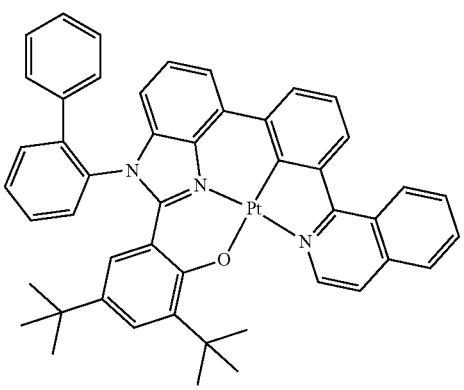
3-342
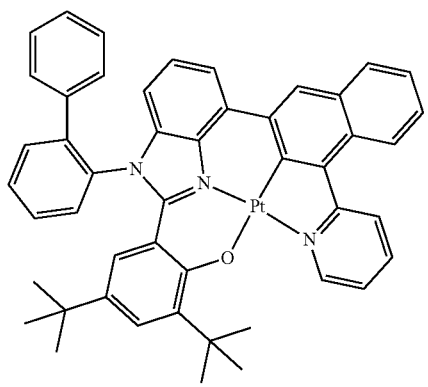
3-343
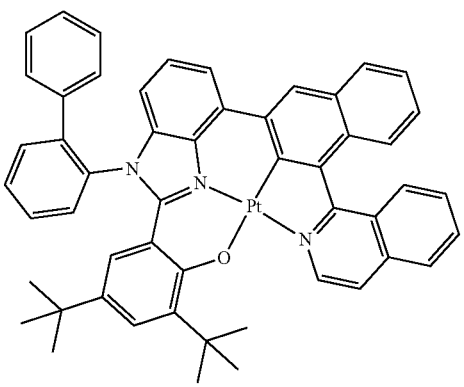

-continued
3-344
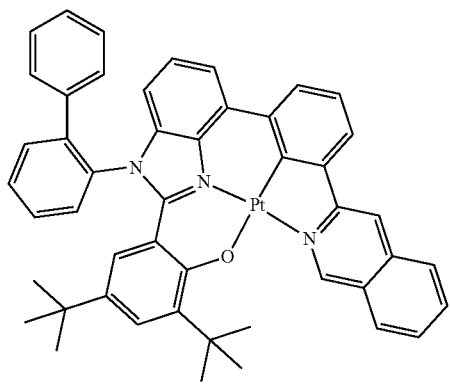
3-345
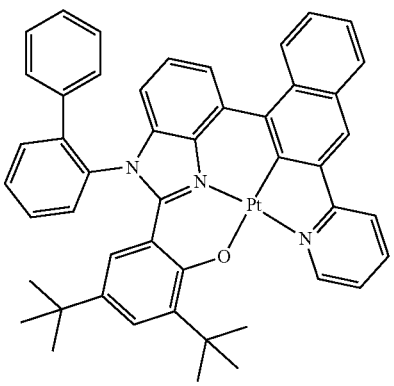
3-346
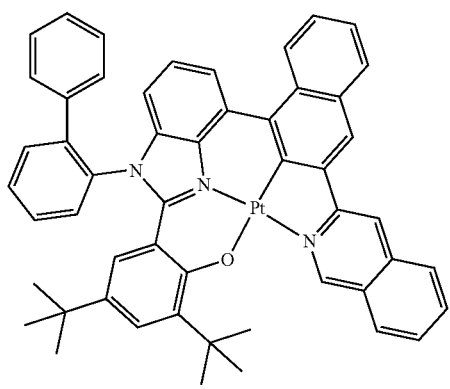
3-347
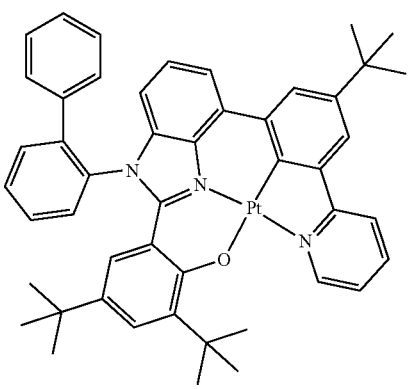
3-348
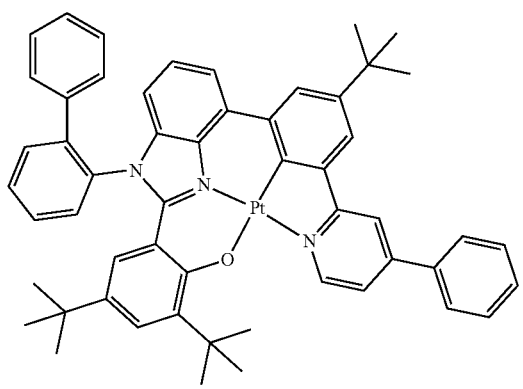
3-349
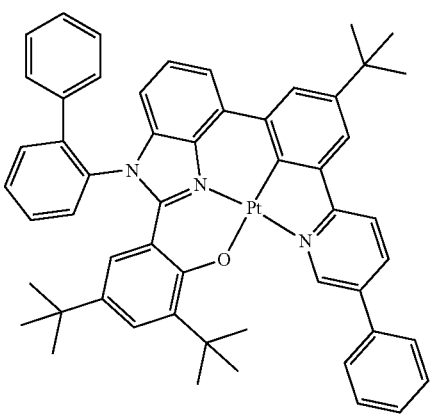
3-350
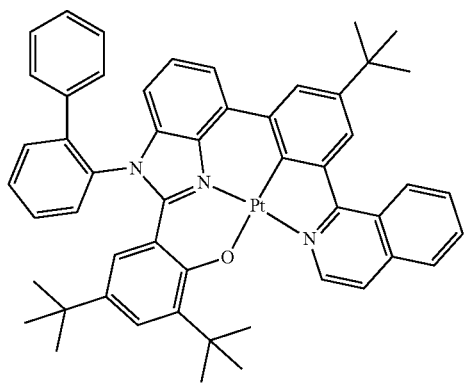
3-351
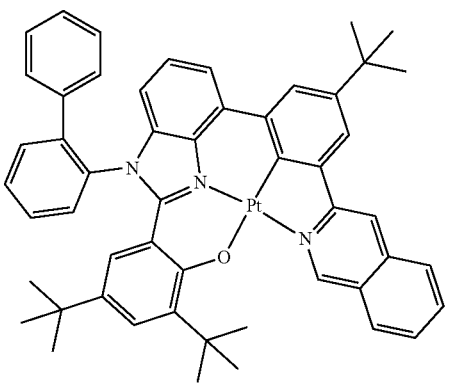

-continued
3-352
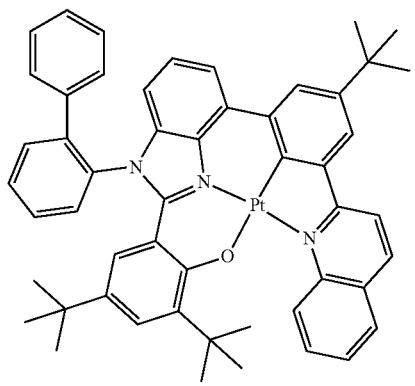
3-353
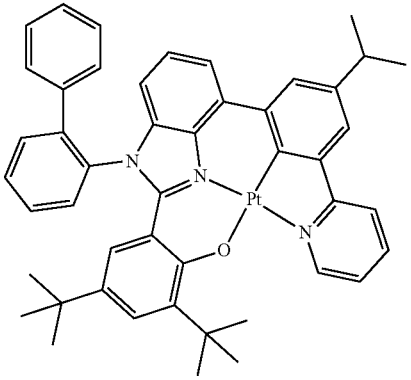
3-354
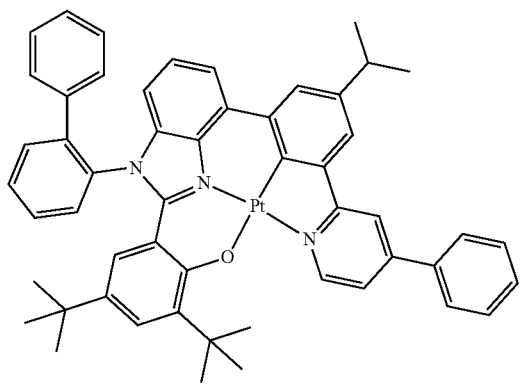
3-355
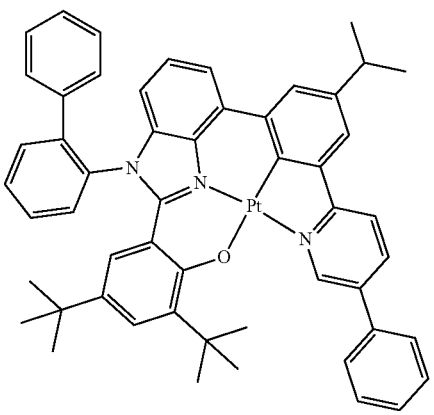
3-356
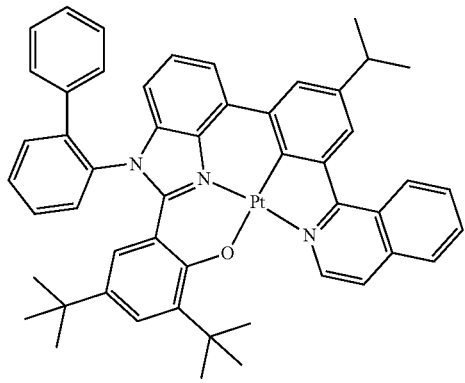
3-357
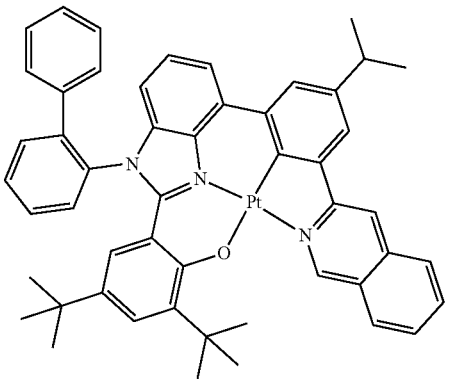
3-358
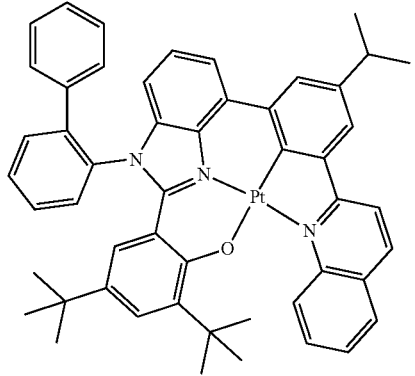
3-359
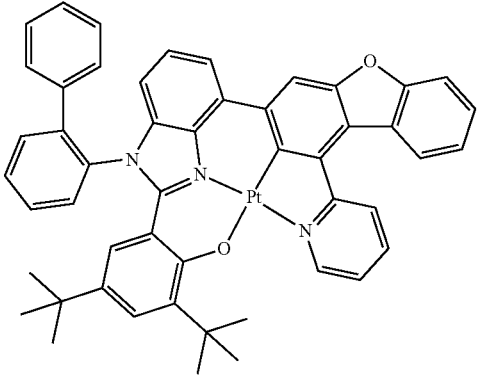

-continued
3-360
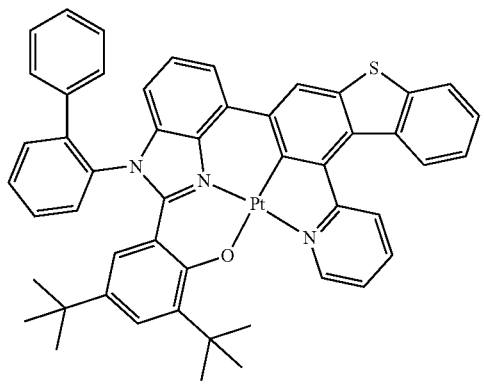
3-361
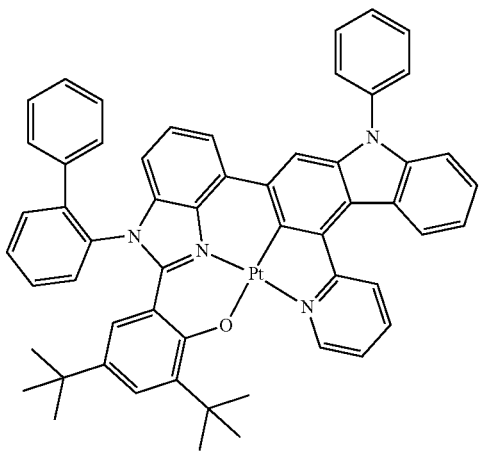
3-362
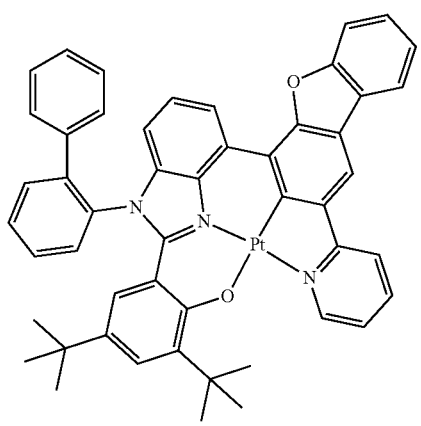
3-363
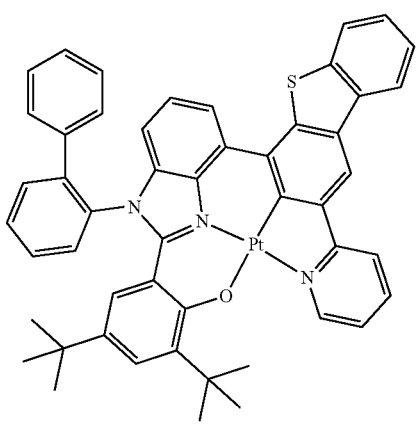
3-364
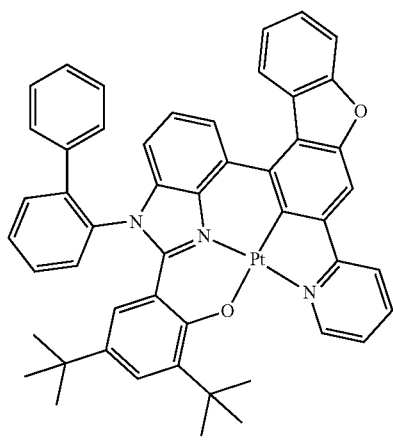
3-365
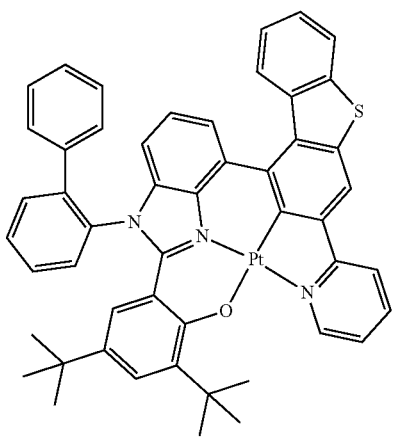

-continued
3-366
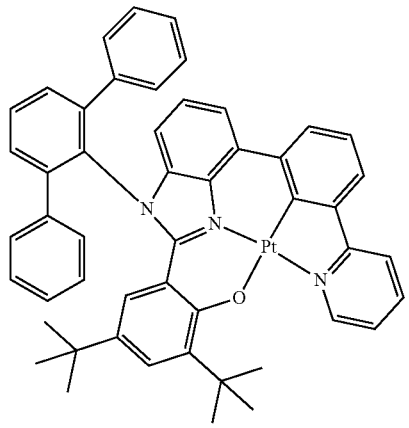
3-367
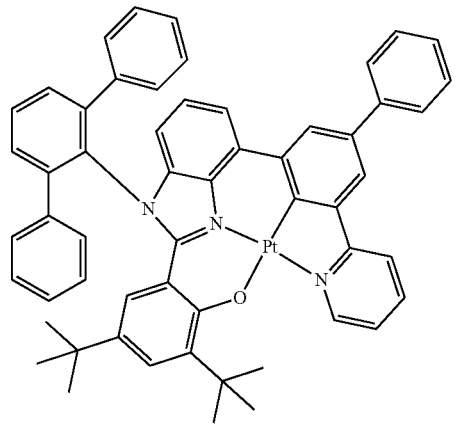
3-368
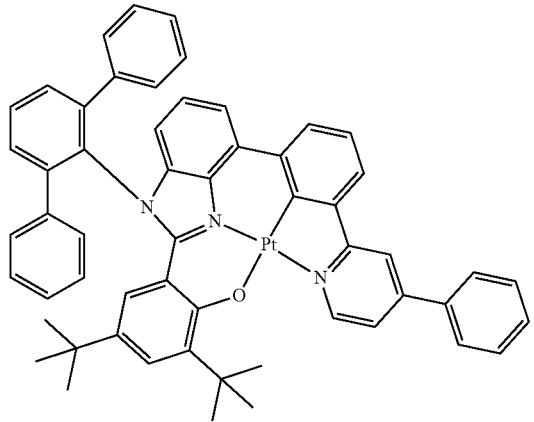
3-369
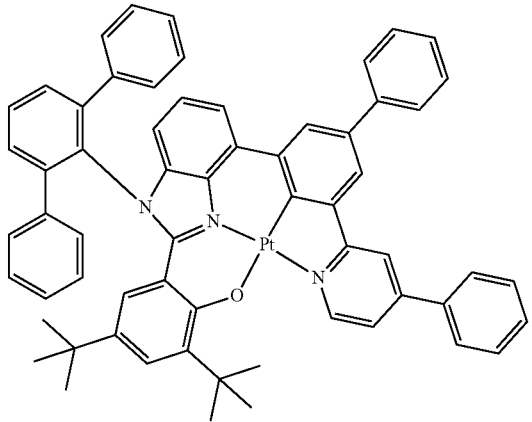
3-370
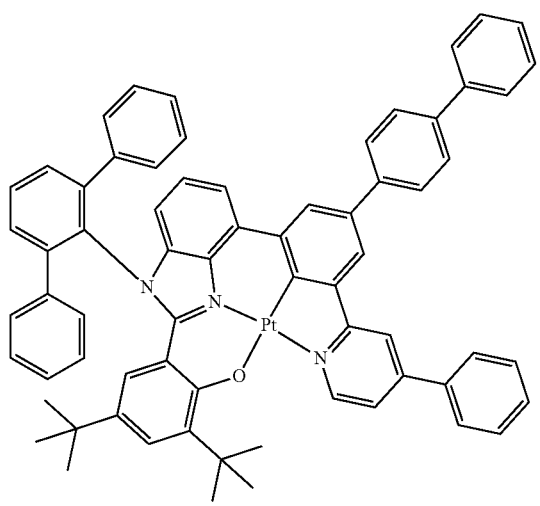
3-371
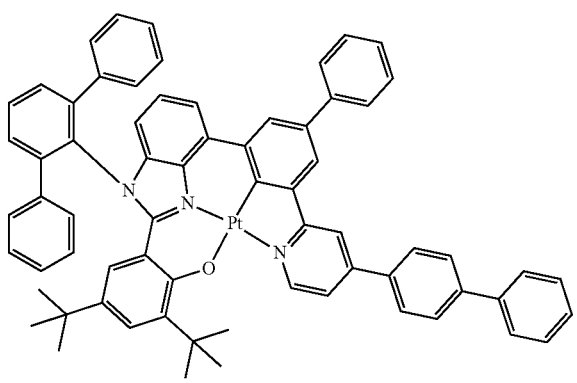

-continued
3-372
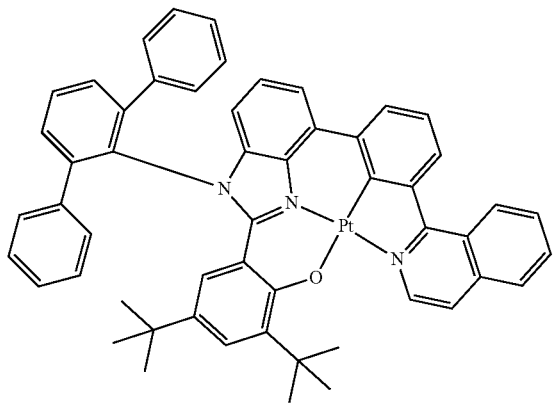
3-373
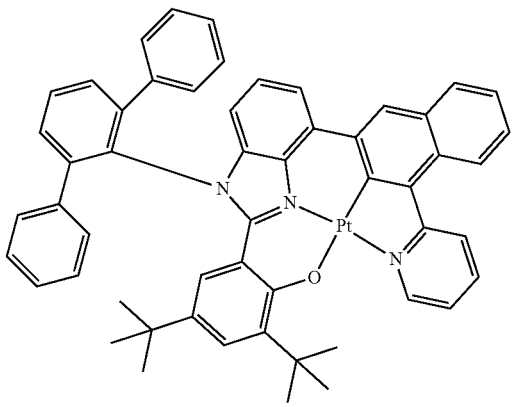
3-374
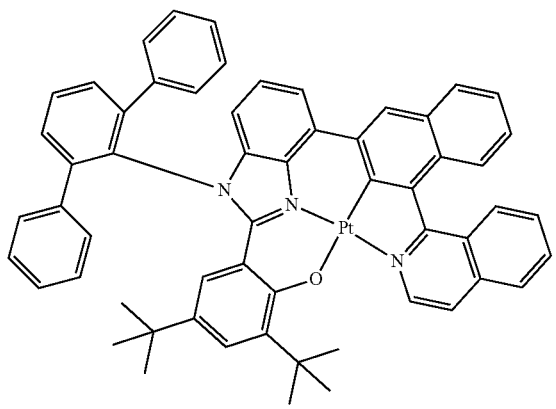
3-375
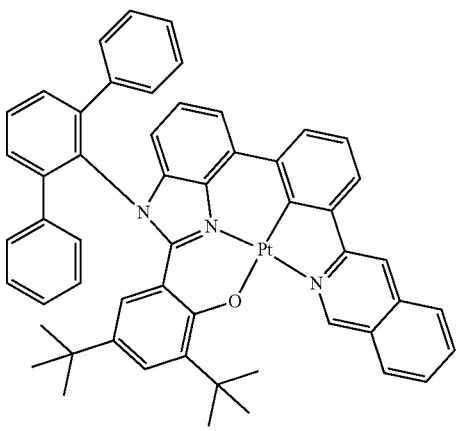
3-376
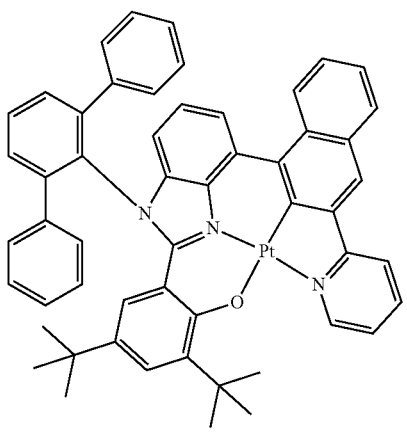
3-377
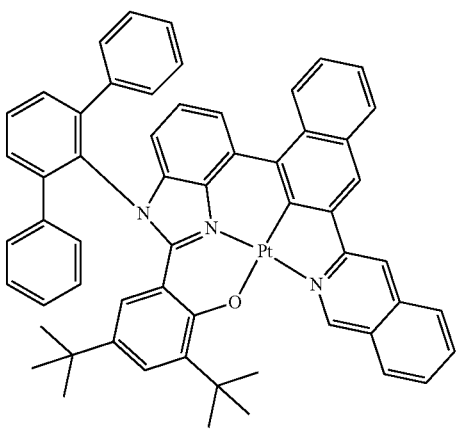

-continued
3-378
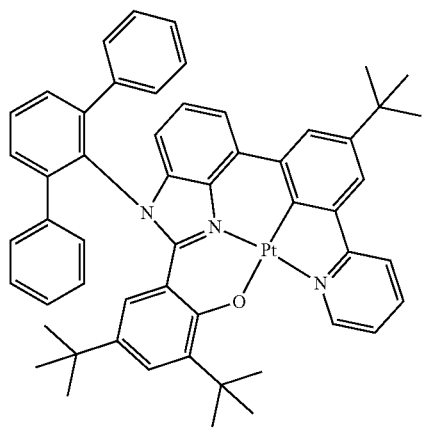
3-379
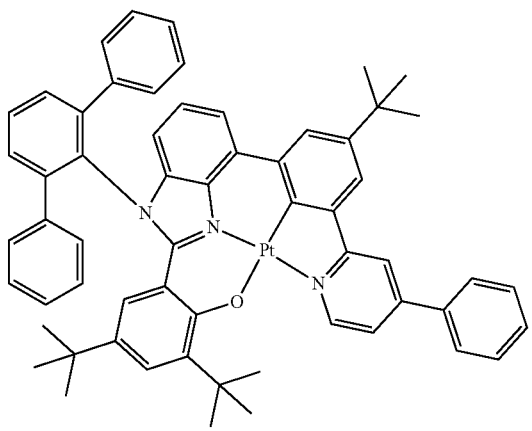
3-380
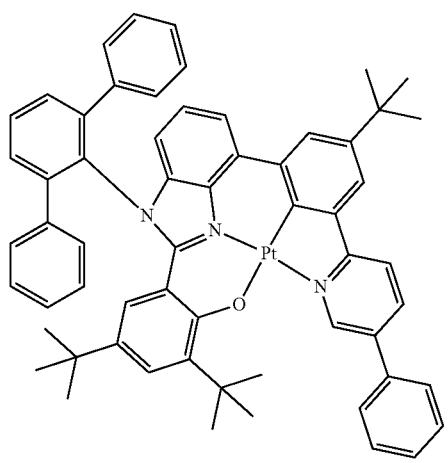
3-381
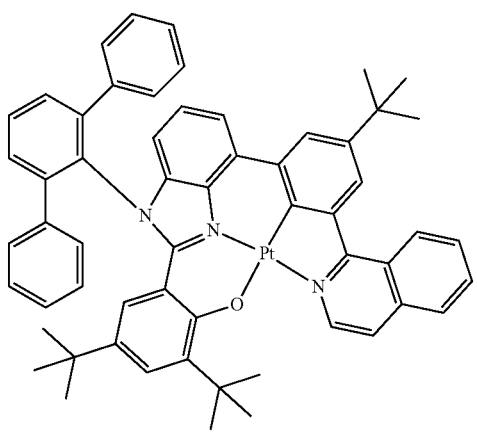
3-382
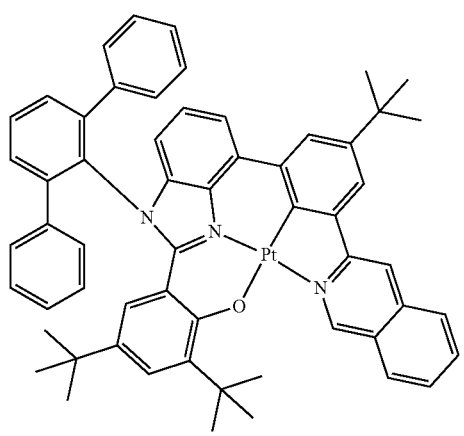
3-383
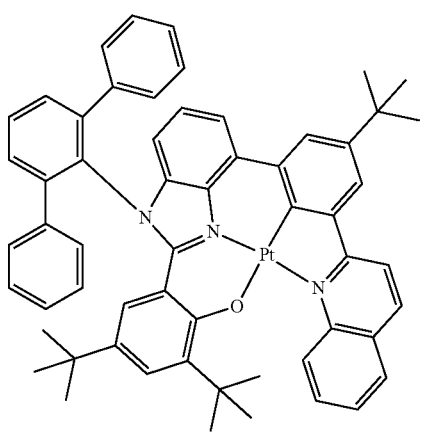

-continued
3-384
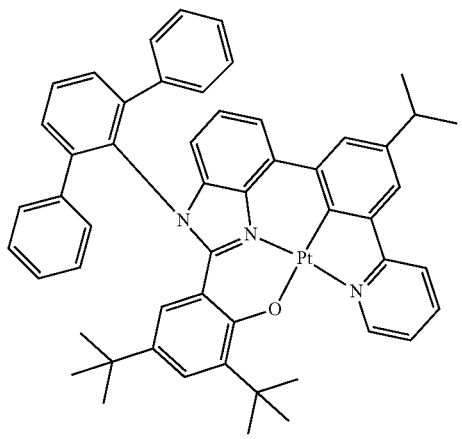
3-385
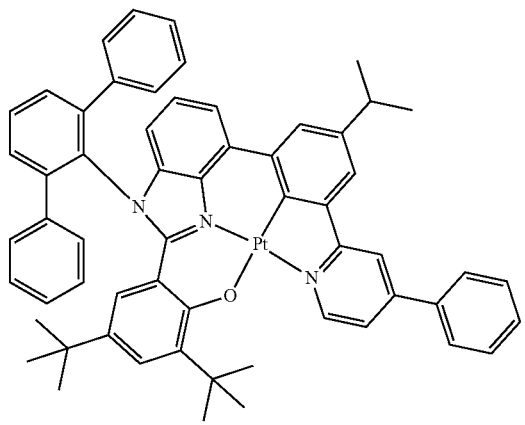
3-386
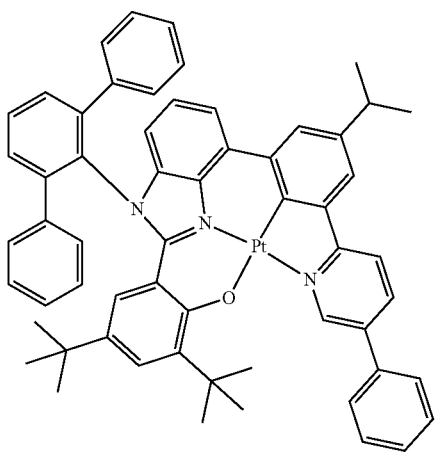
3-387
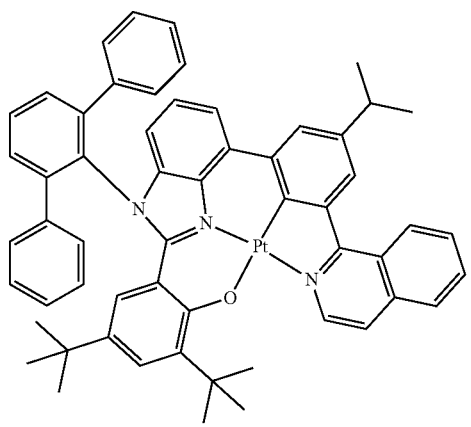
3-388
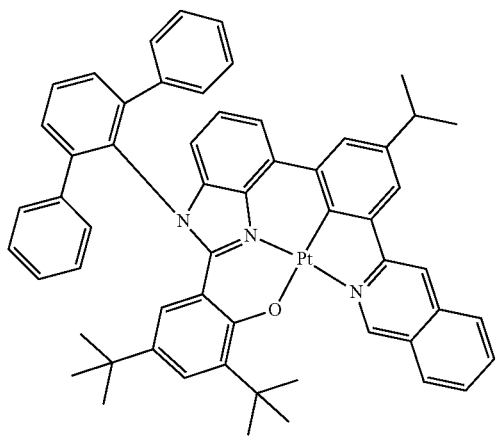
3-389
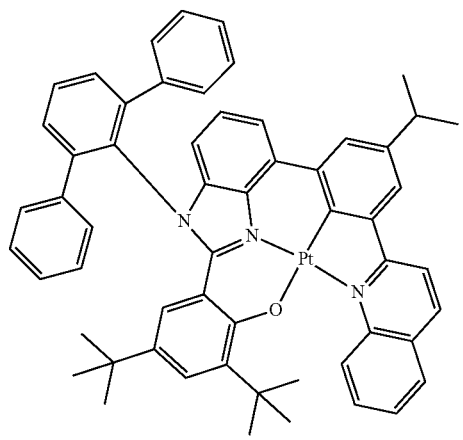

-continued
3-390
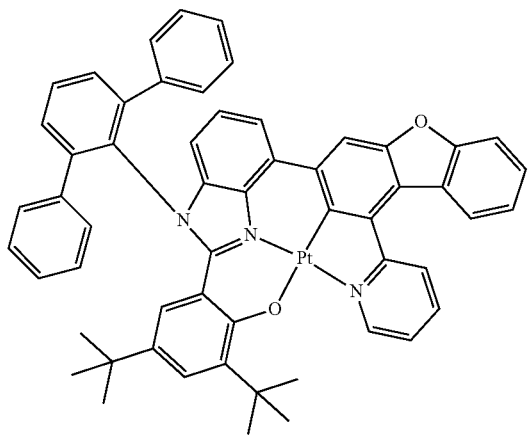
3-391
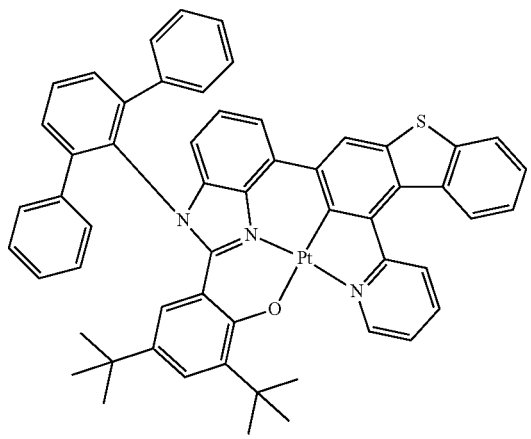
3-392
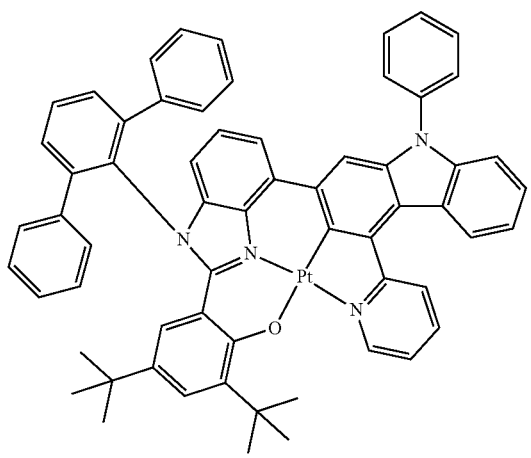
3-393
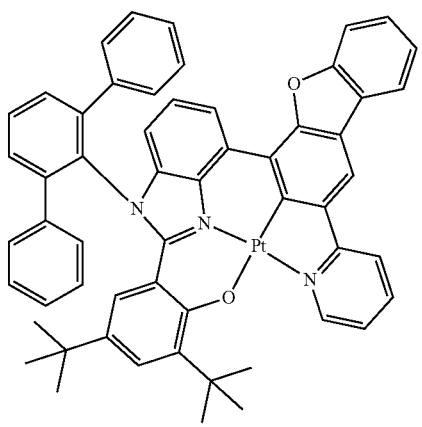
3-394
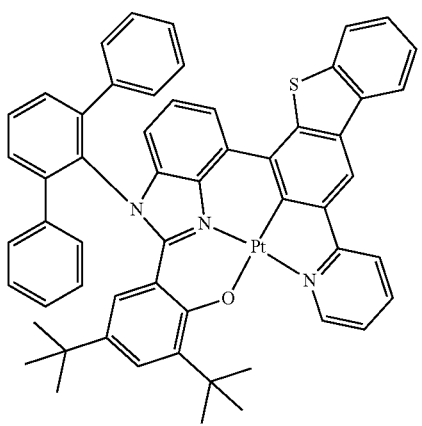
3-395
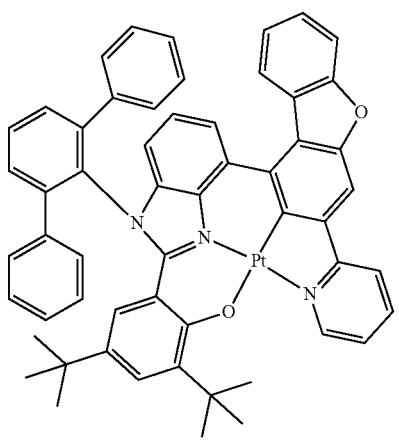

-continued
3-396
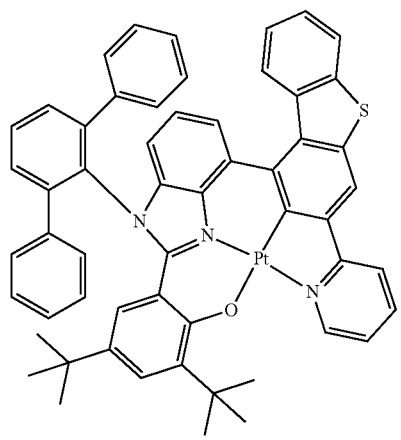
3-397
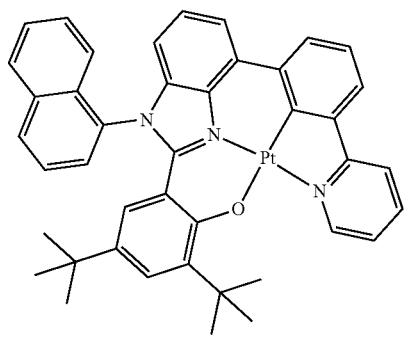
3-398
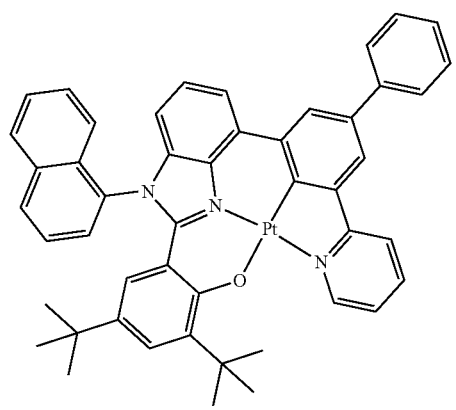
3-399
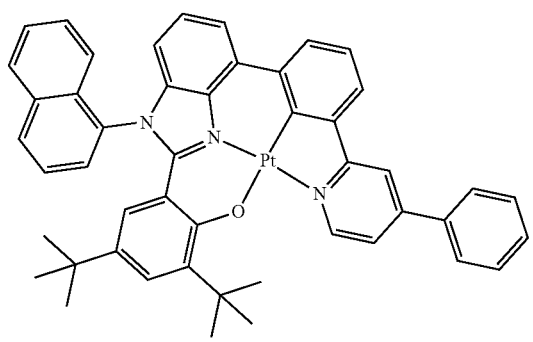
3-400
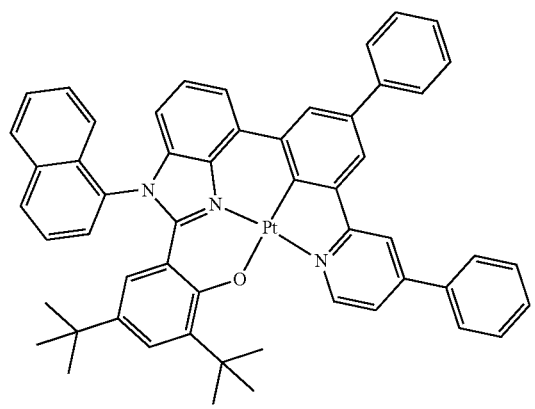
3-401
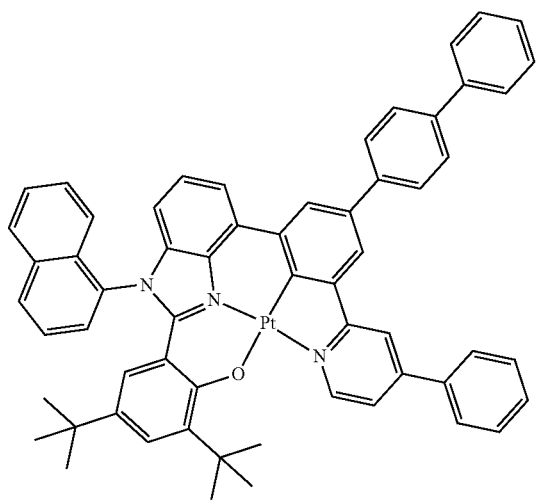

-continued
3-402
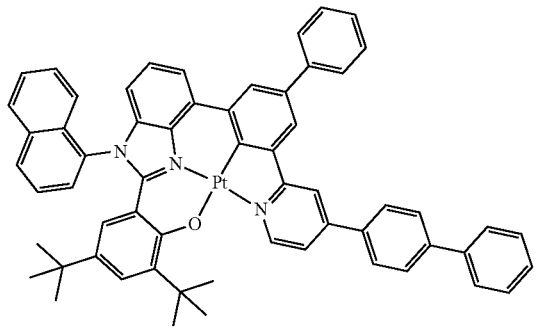
3-403
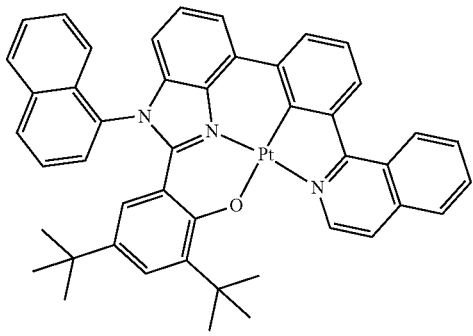
3-404
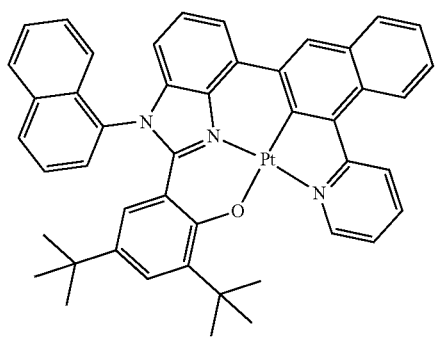
3-405
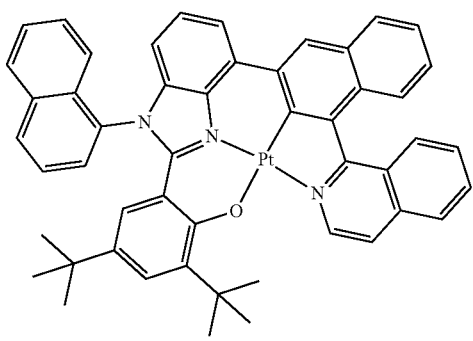
3-406
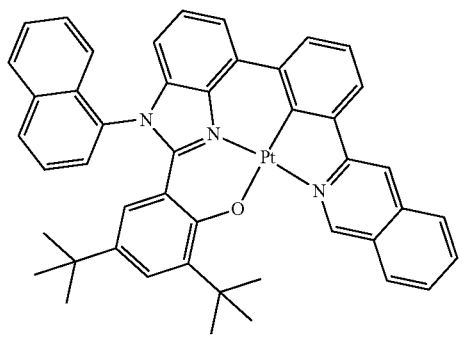
3-407
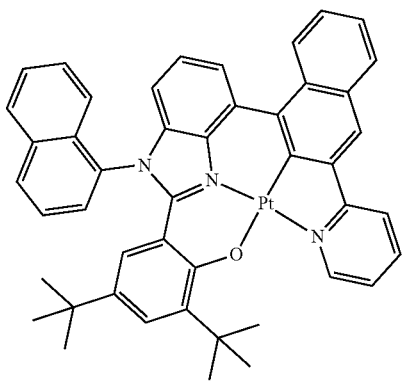
3-408
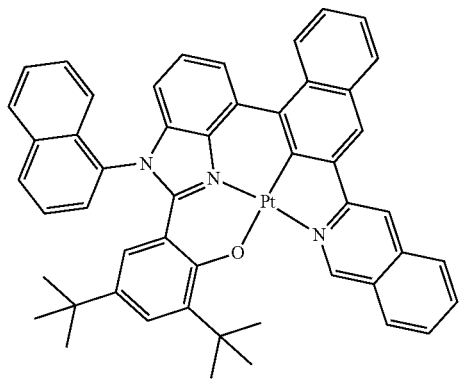
3-409
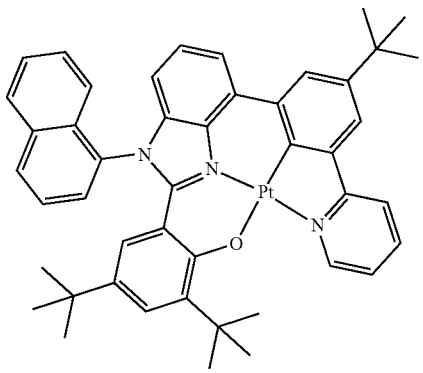

-continued
3-410
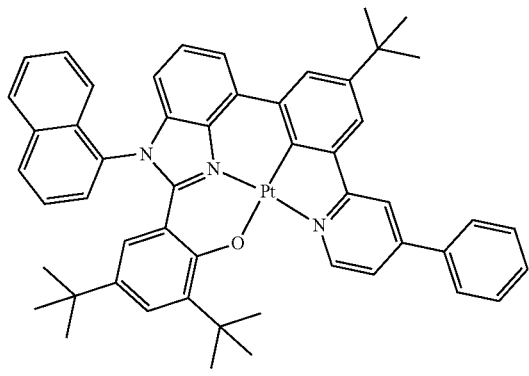
3-411
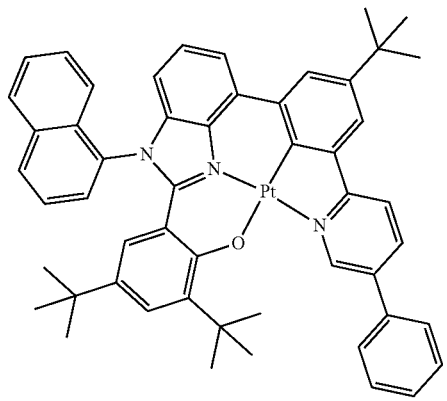
3-412
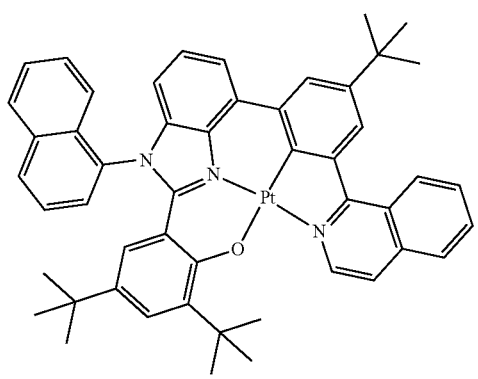
3-413
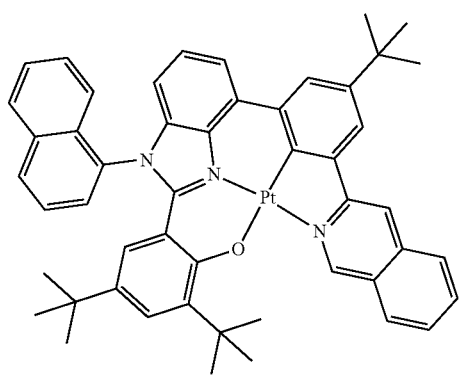
3-414
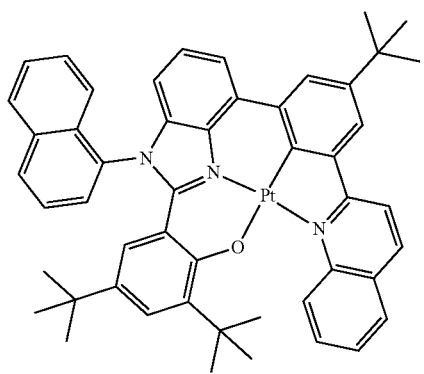
3-415
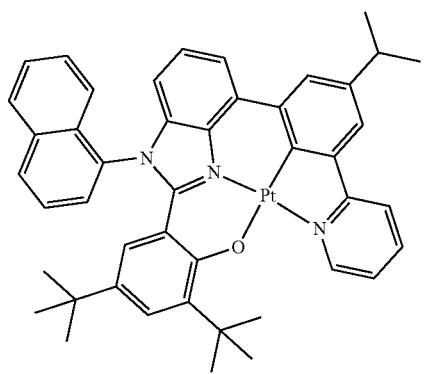
3-416
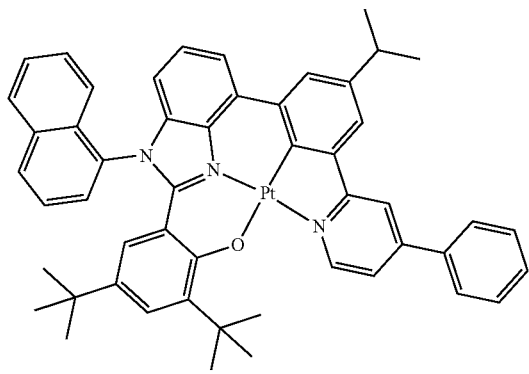
3-417
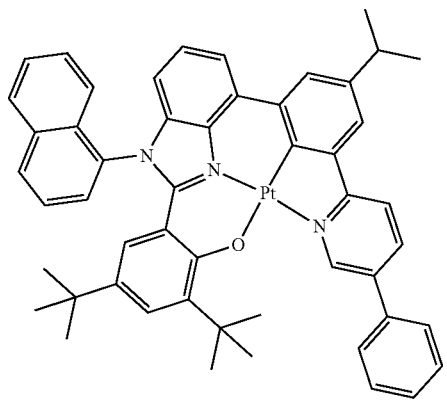

-continued
3-418
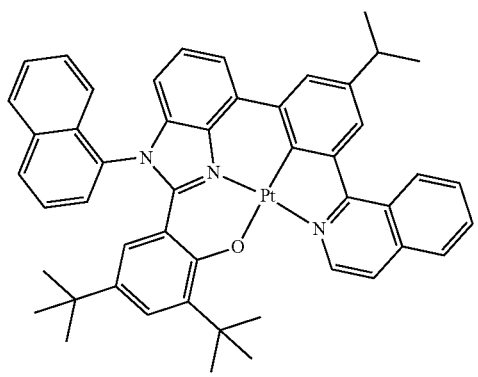
3-419
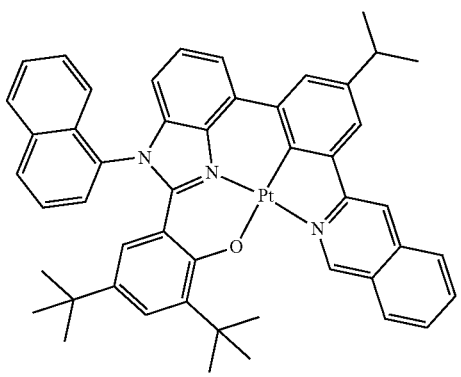
3-420
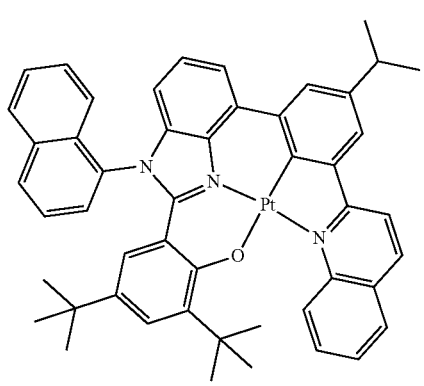
3-421
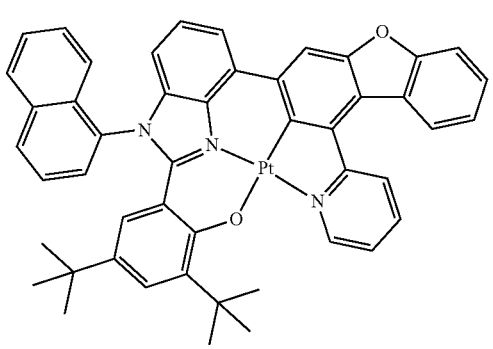
3-422
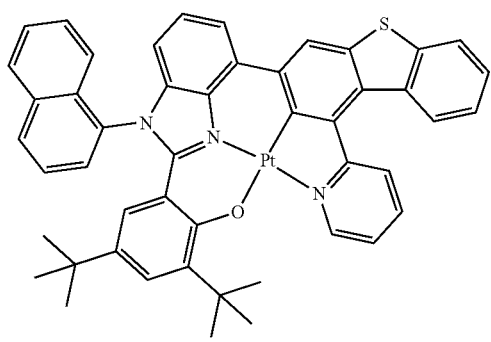
3-423
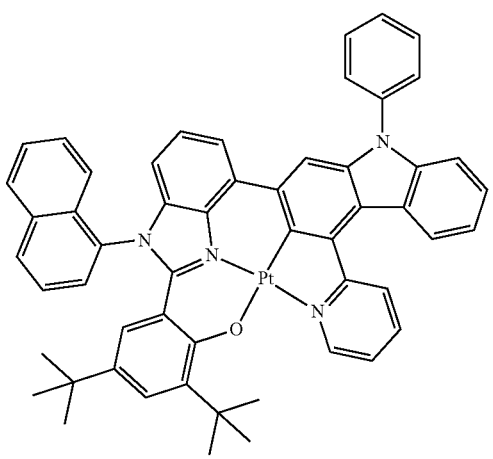
3-424
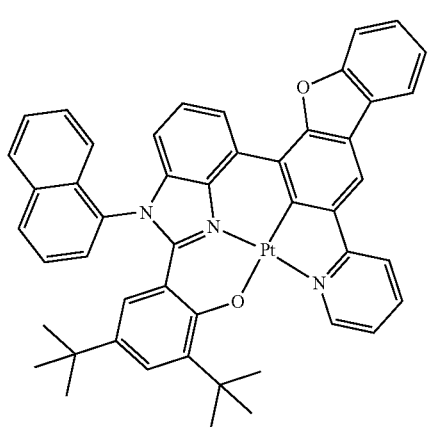
3-425
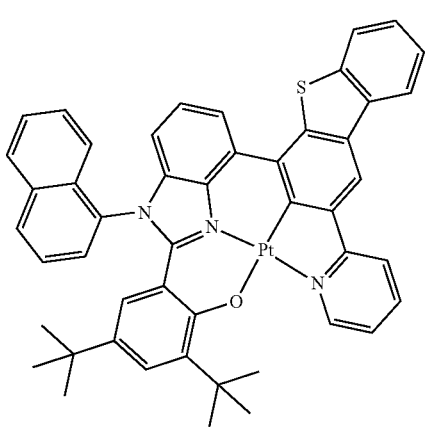

-continued
3-426
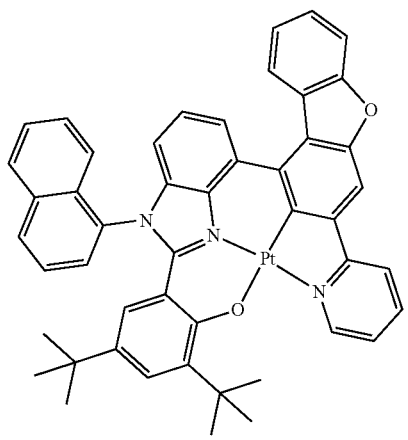
3-427
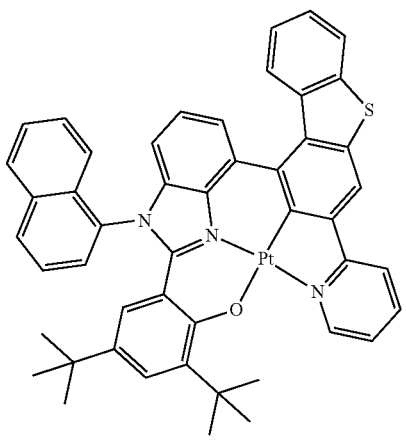
3-428
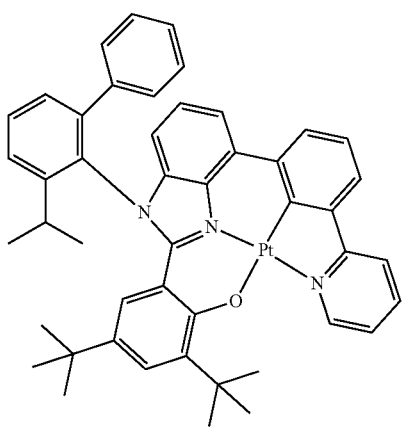
3-429
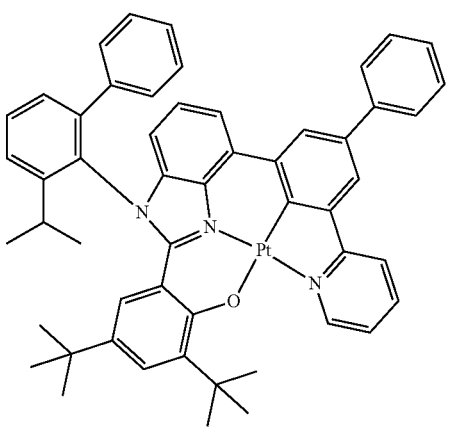
3-430
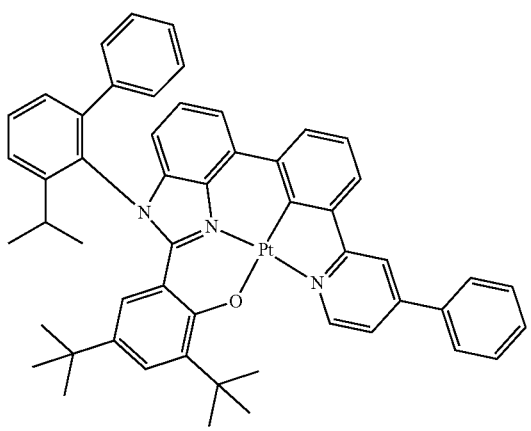
3-431
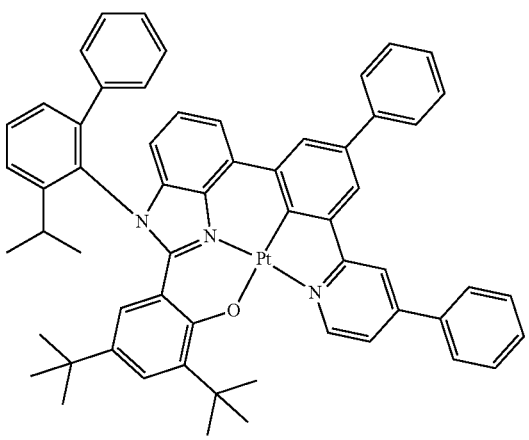

-continued
3-432
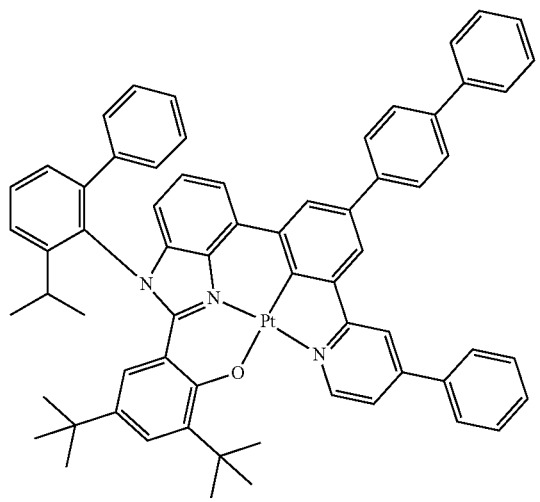
3-433
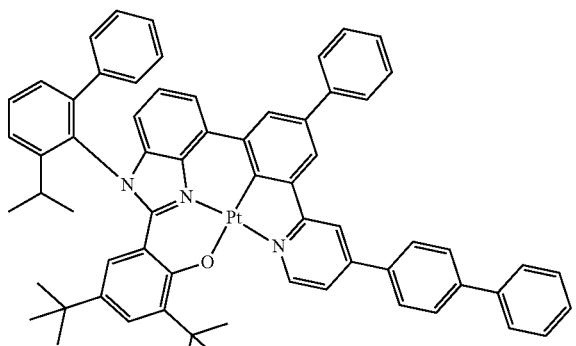
3-434
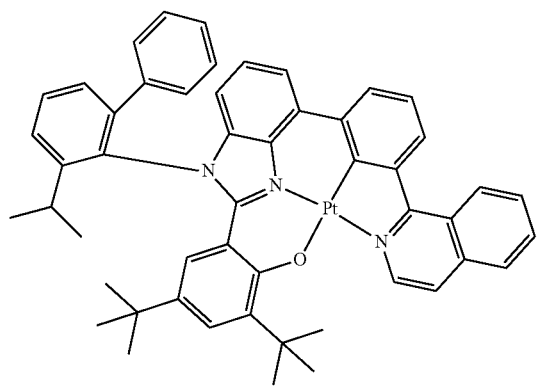
3-435
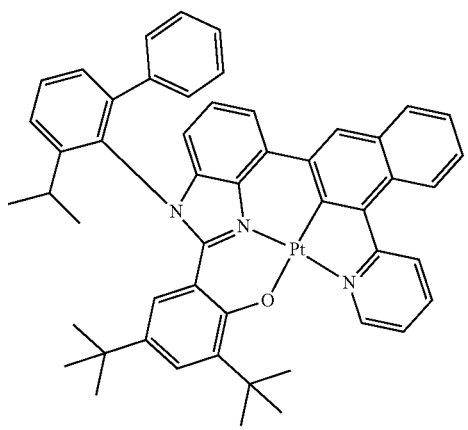
3-436
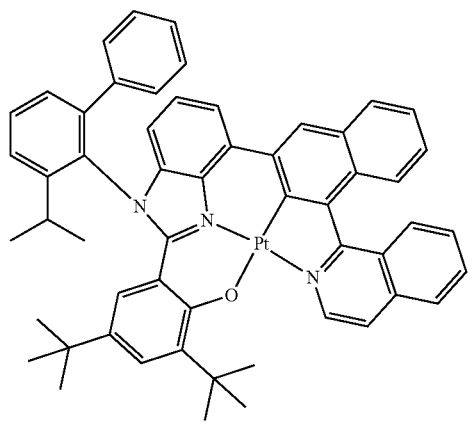
3-437
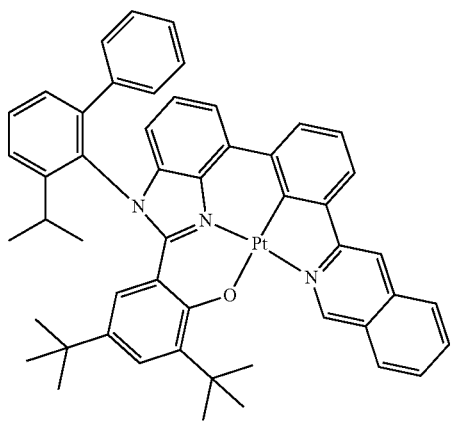

-continued
3-438
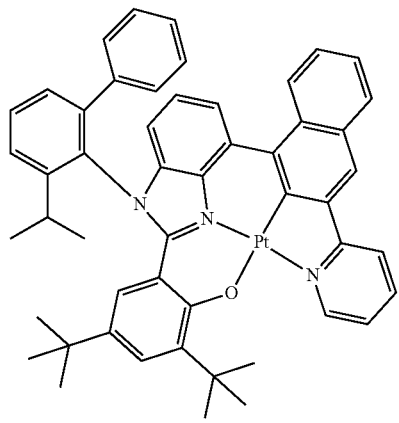
3-439
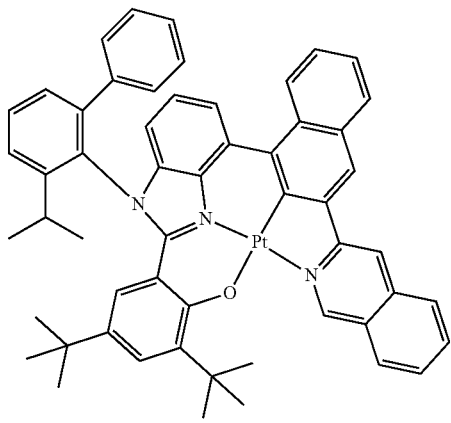
3-440
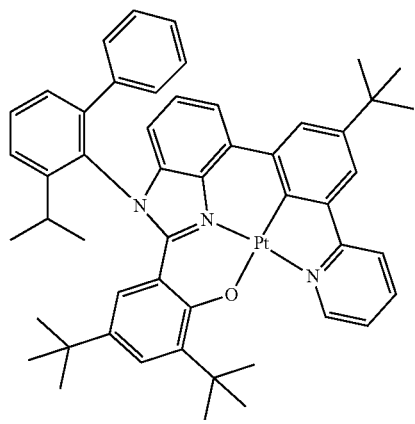
3-441
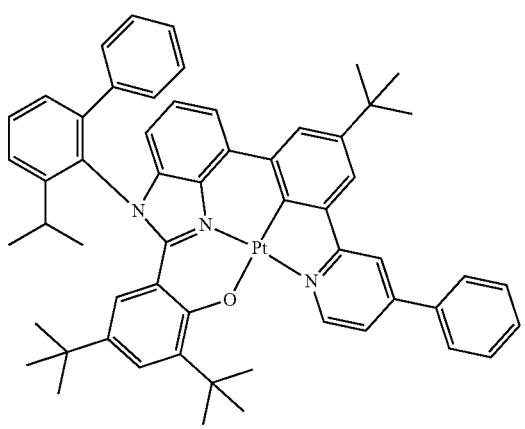
3-442
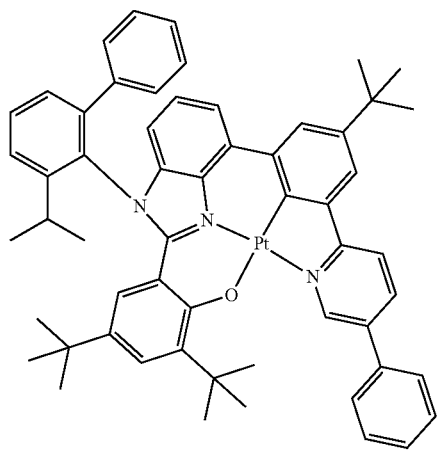
3-443
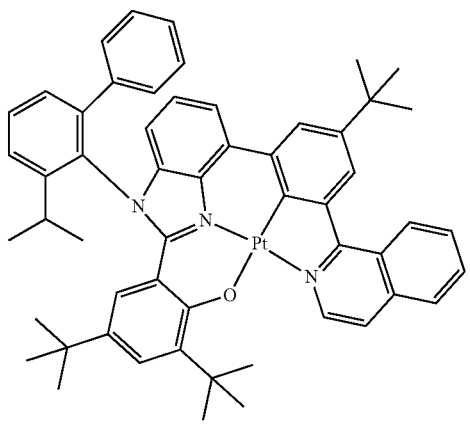

-continued
3-444
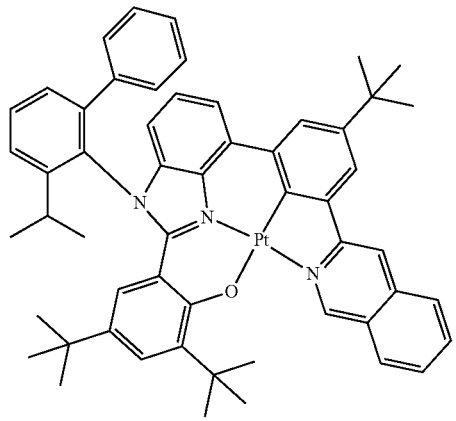
3-445
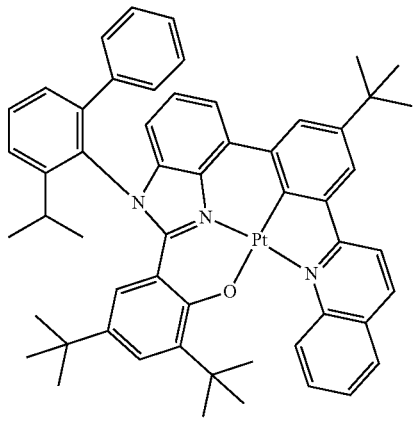
3-446
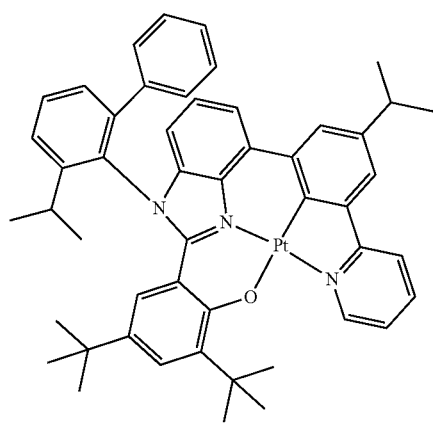
3-447
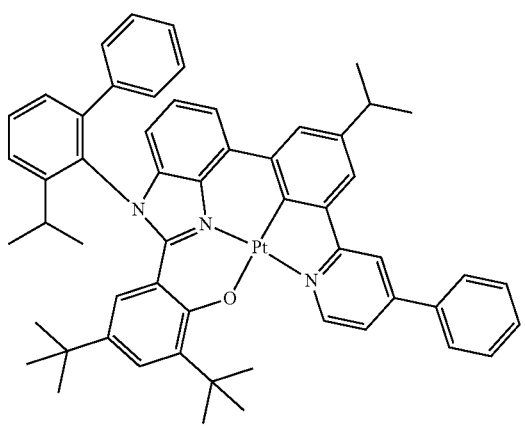
3-448
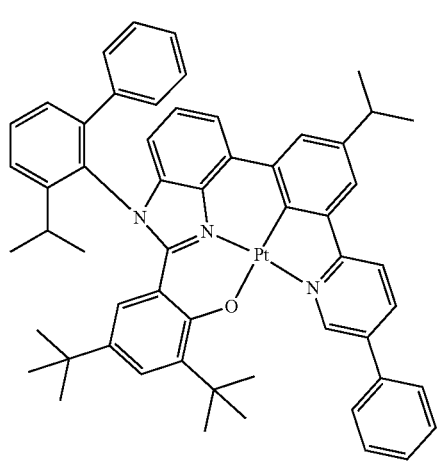
3-449
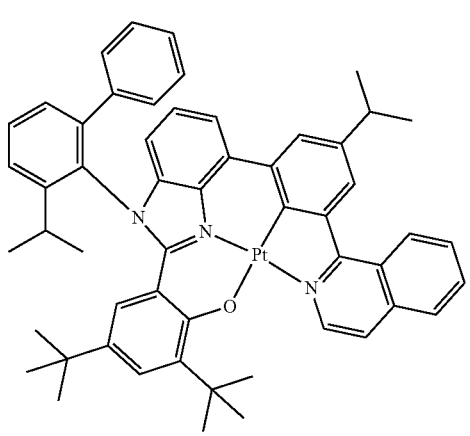

-continued
3-450
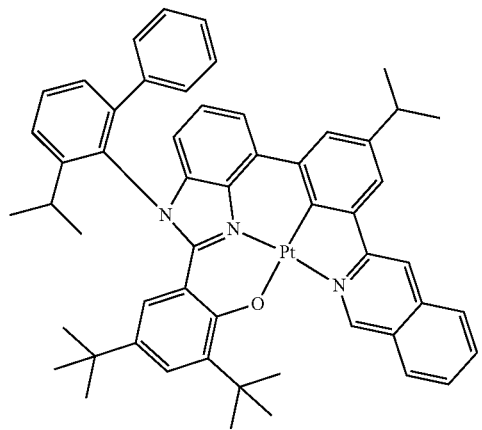
3-451
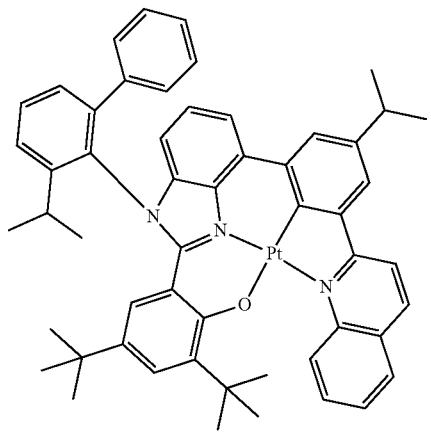
3-452
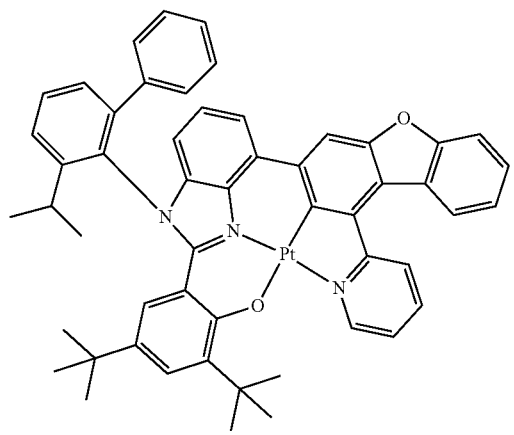
3-453
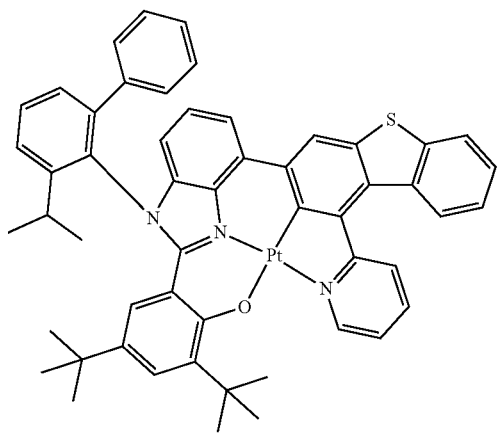
3-454
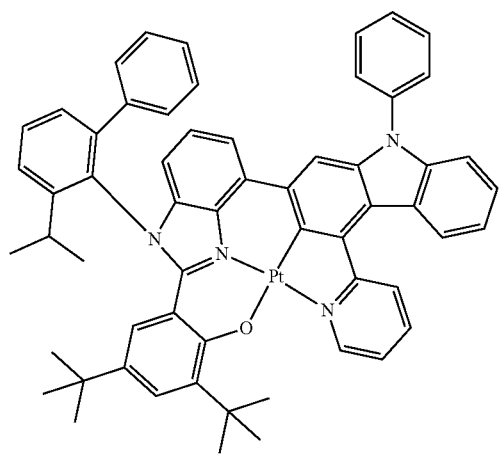
3-455
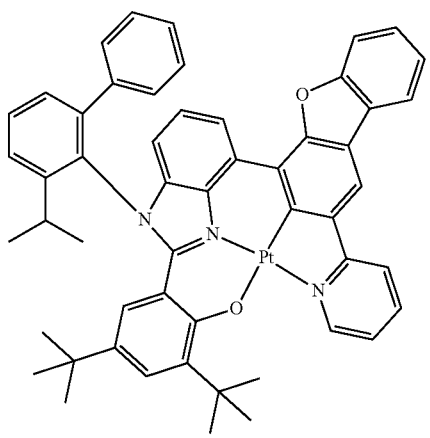

-continued
3-456
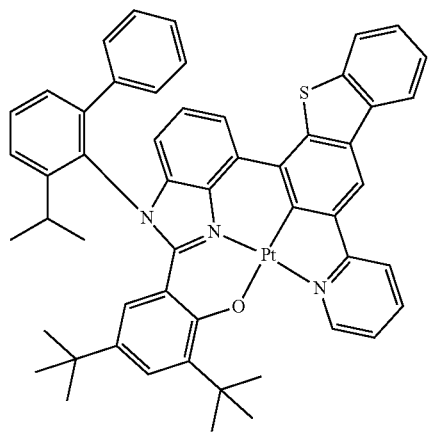
3-457
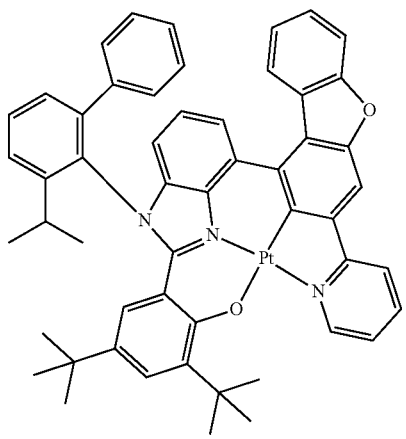
3-458
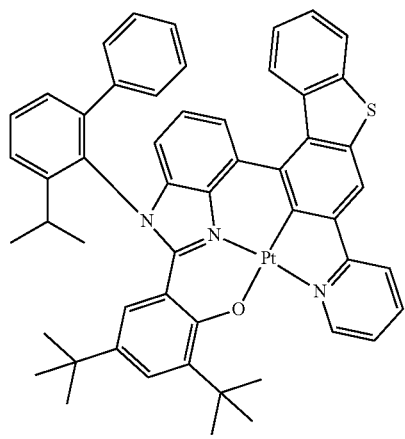
3-459
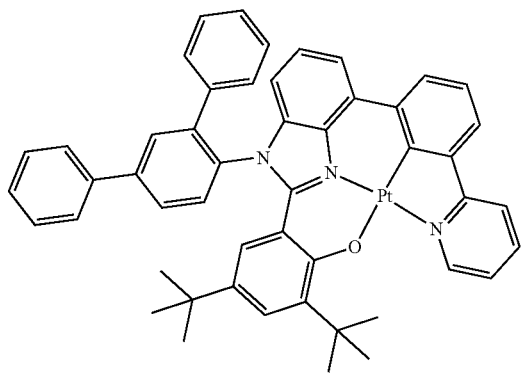
3-460
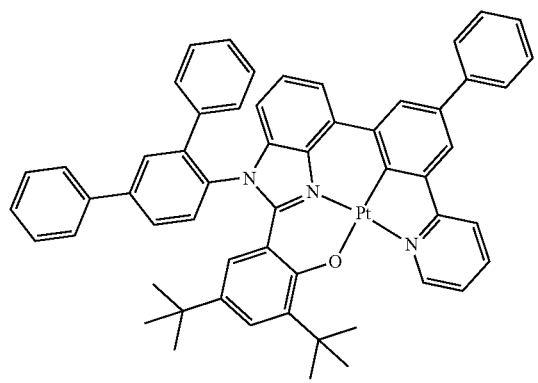
3-461
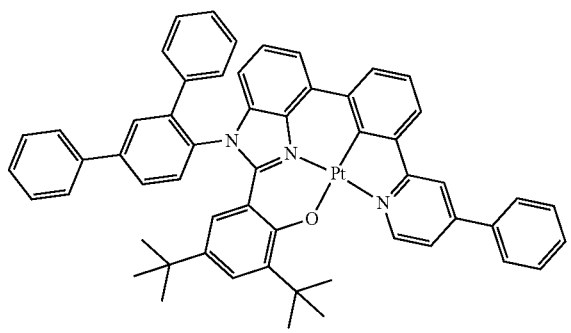

-continued
3-462
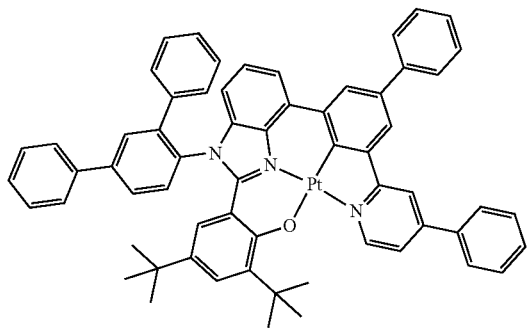
3-463
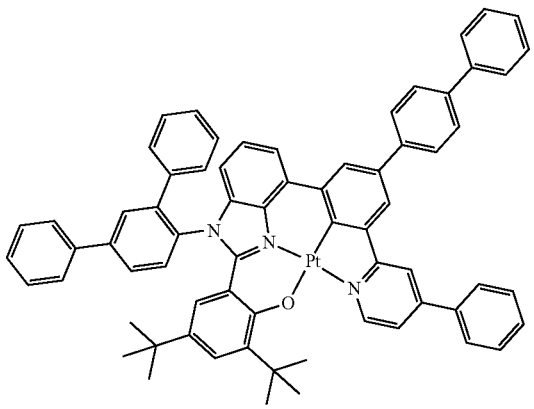
3-464
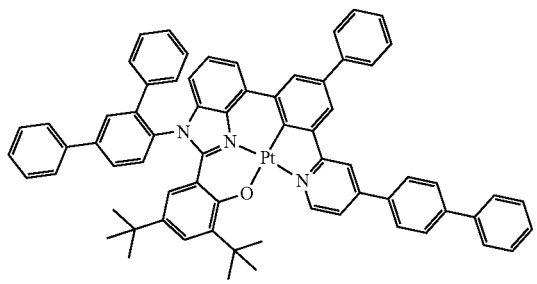
3-465
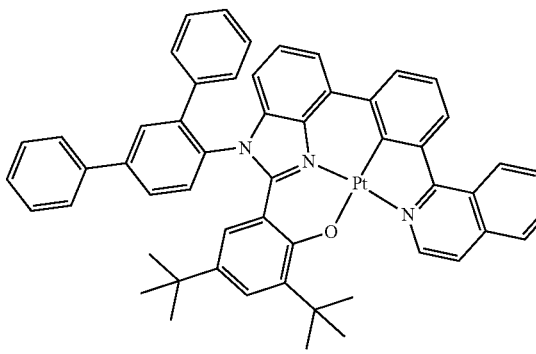
3-466
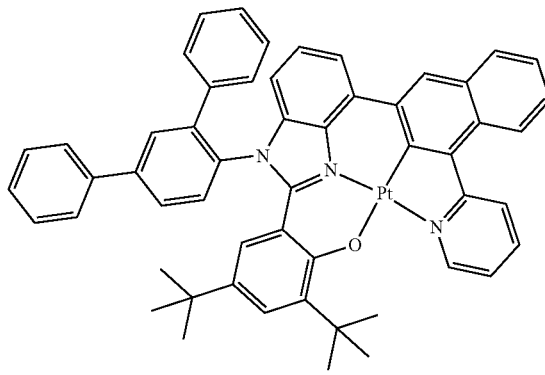
3-467
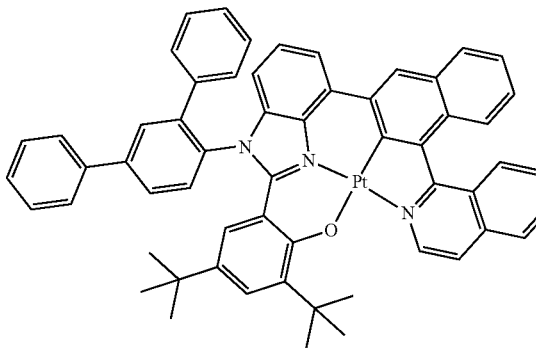
3-468
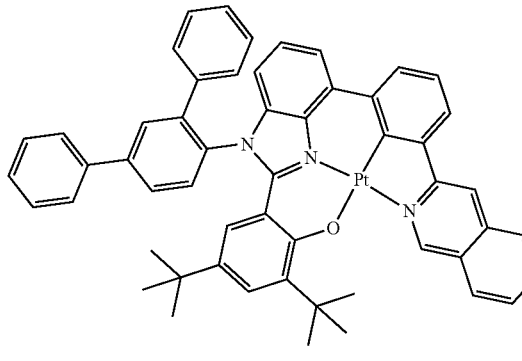
3-469
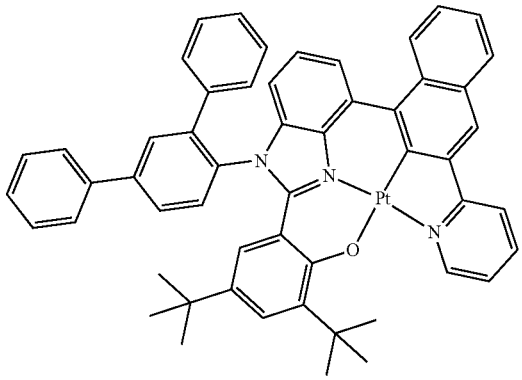

-continued
3-470
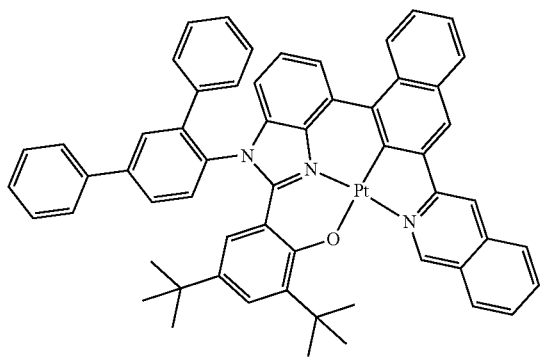
3-471
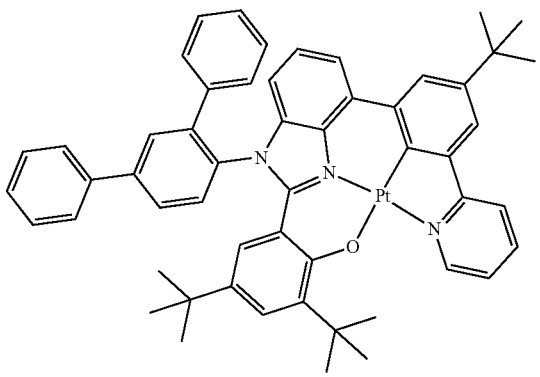
3-472
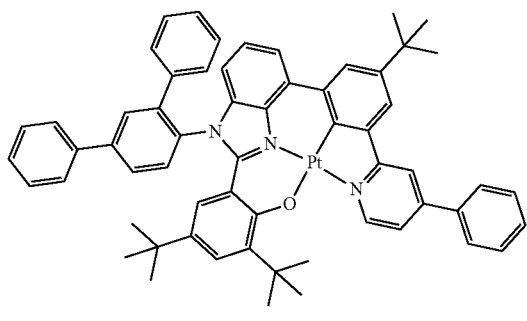
3-473
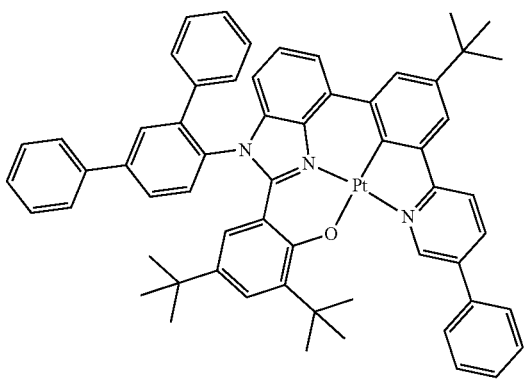
3-474
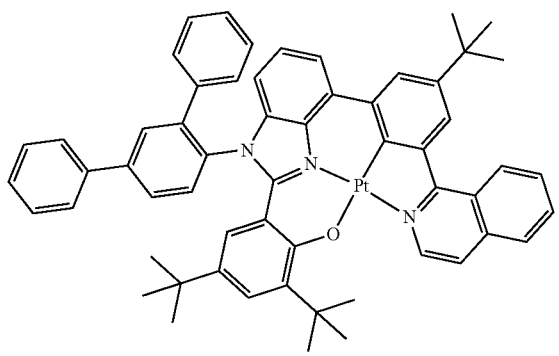
3-475
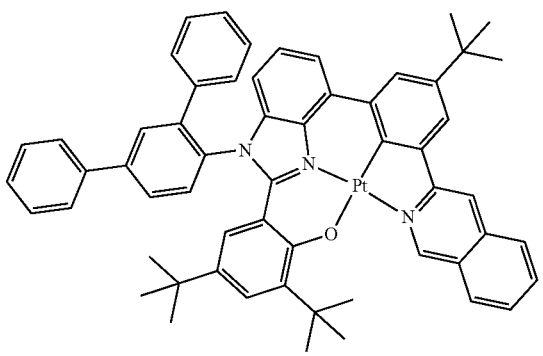
3-476
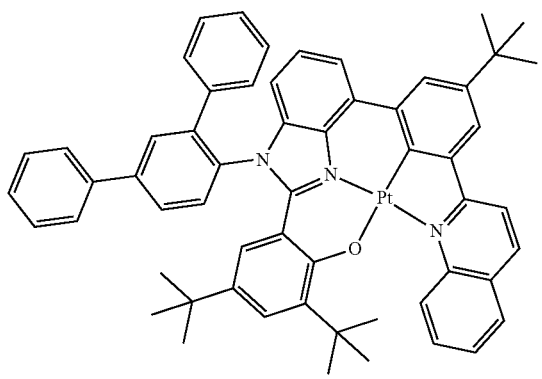
3-477
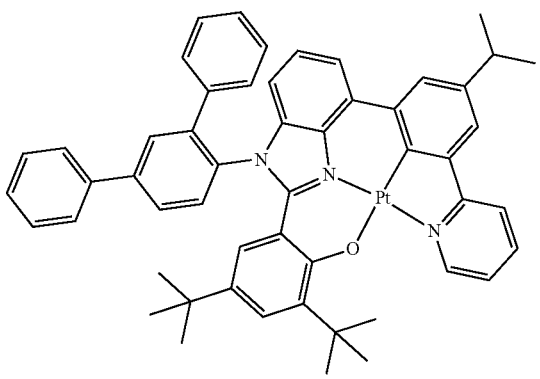

-continued
3-478
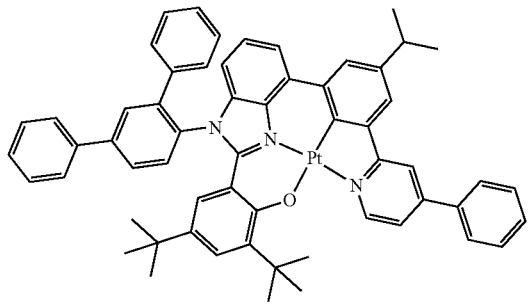
3-479
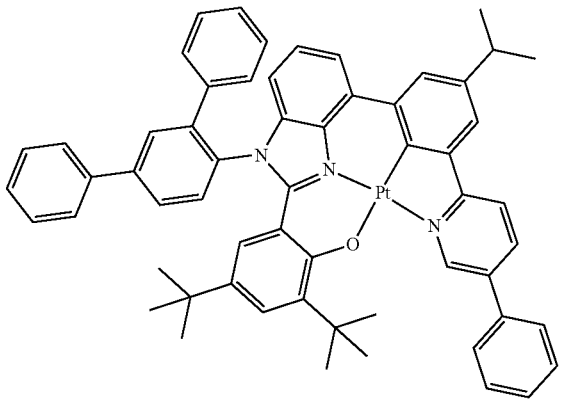
3-480
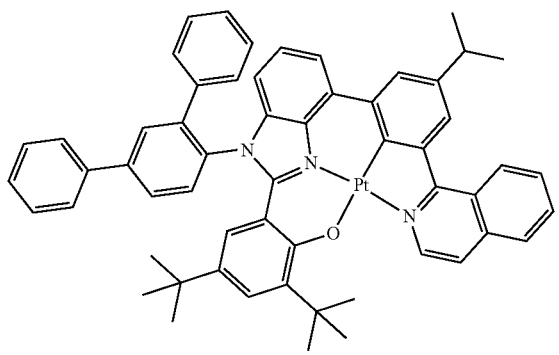
3-481
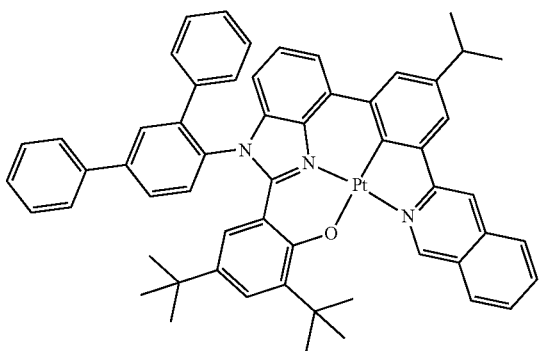
3-482
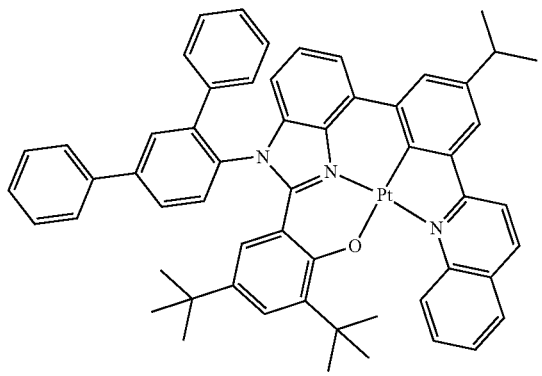
3-483
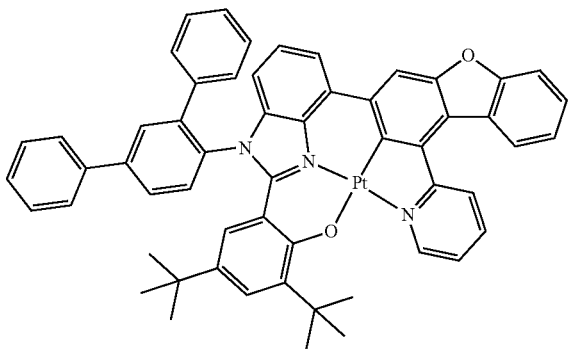
3-484
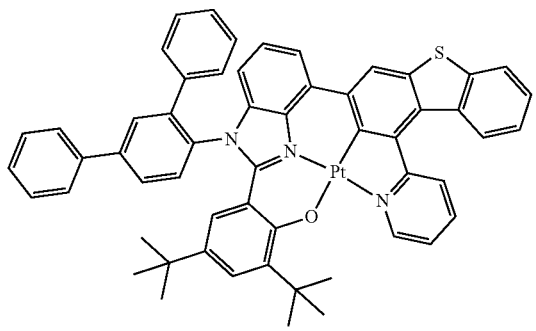
3-485
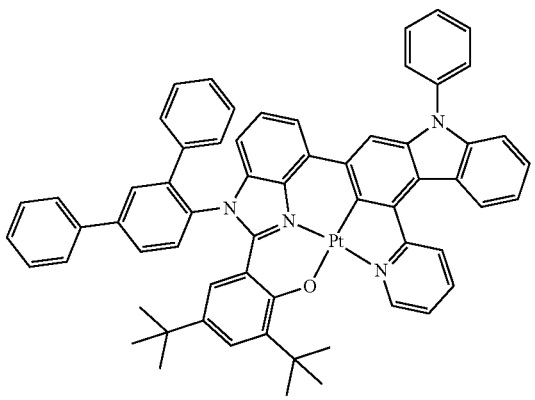

3-486
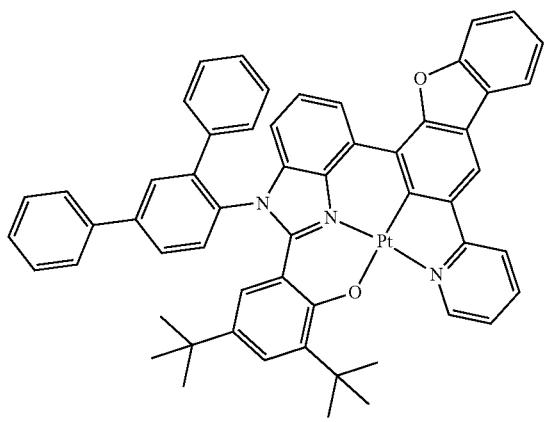
3-487
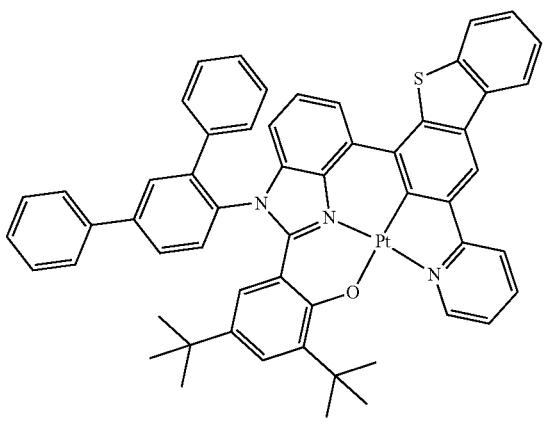
3-488
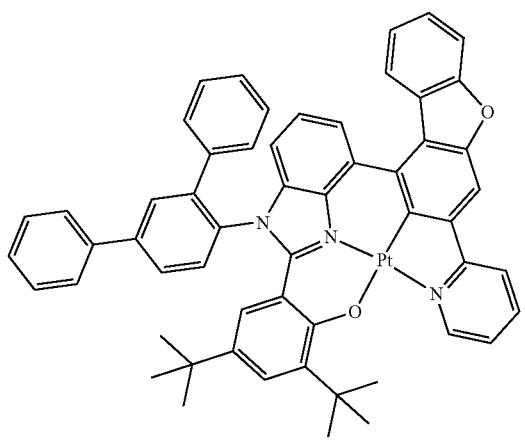
3-489
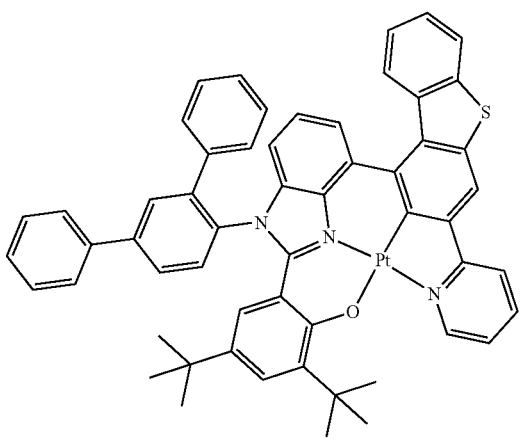
3-490
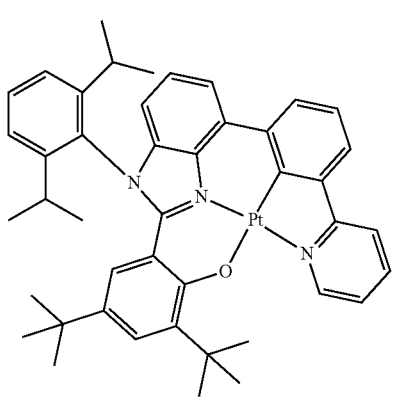
3-491
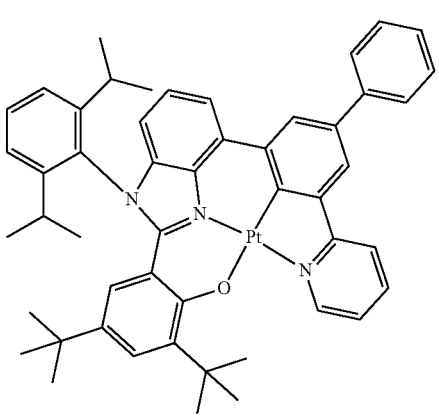

-continued
3-492
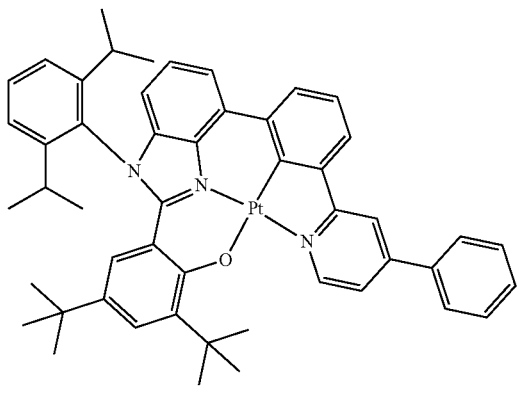
3-493
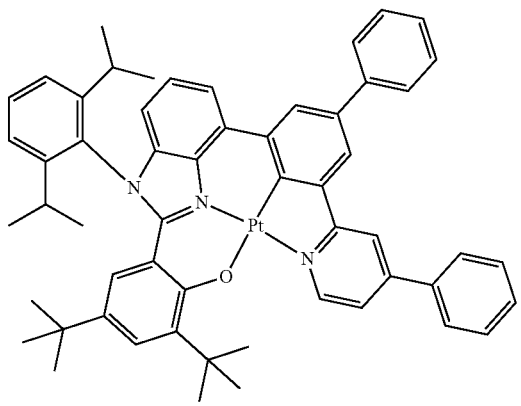
3-494
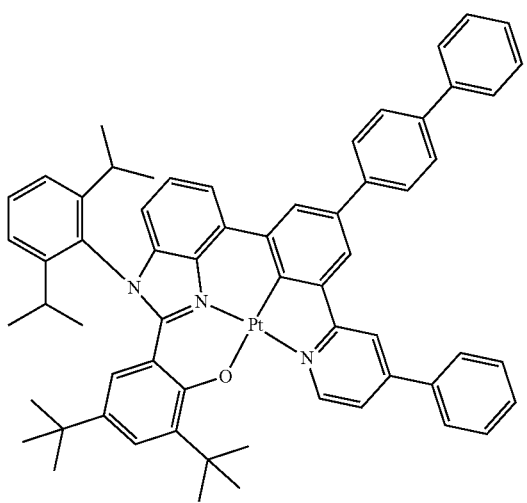
3-495
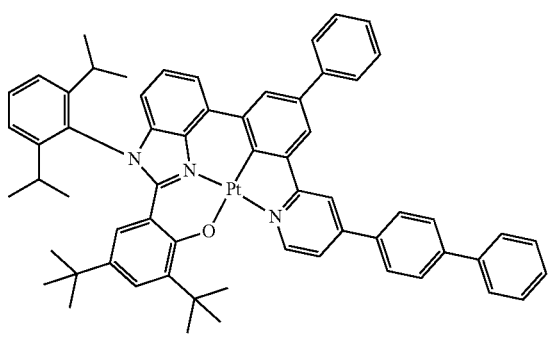
3-496
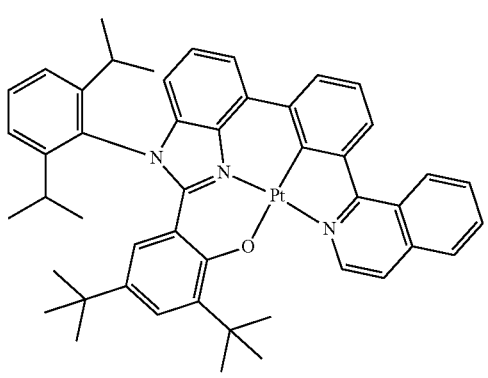
3-497
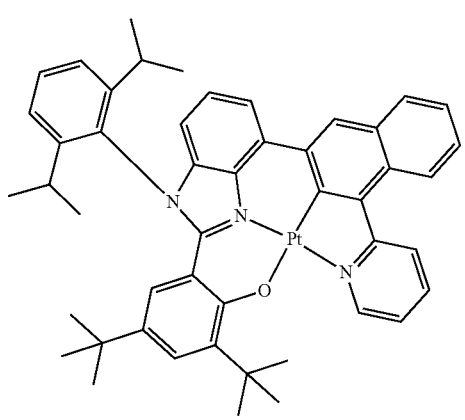

-continued
3-498
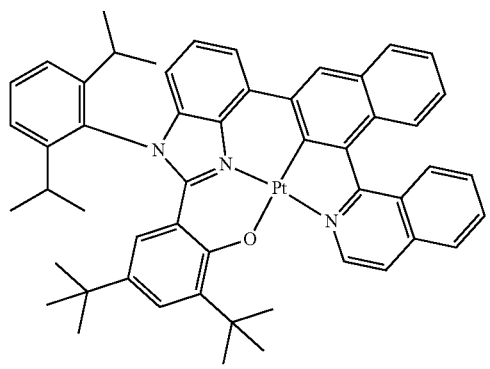
3-499
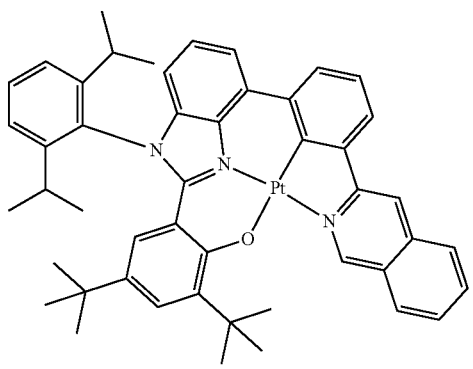
3-500
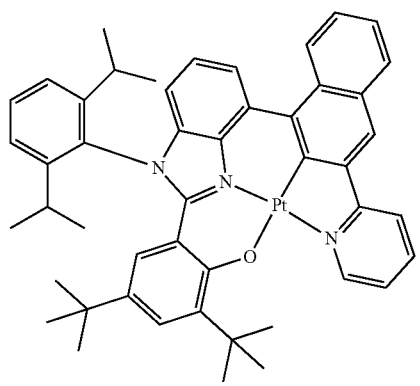
3-501
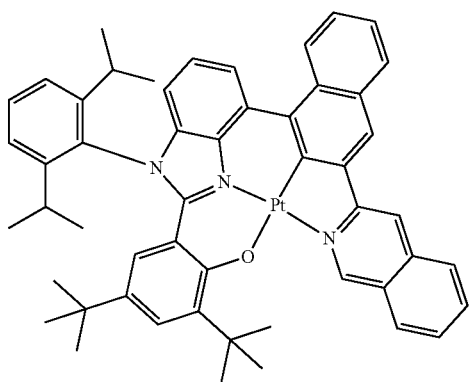
3-502
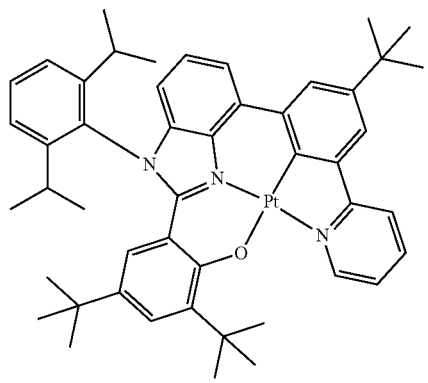
3-503
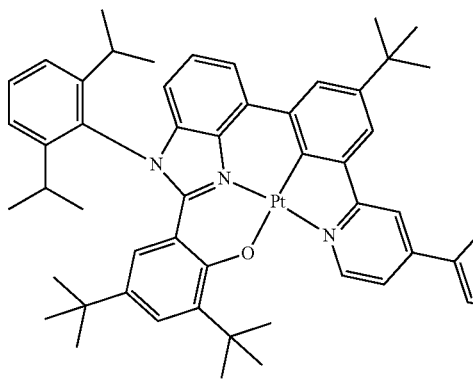
3-504
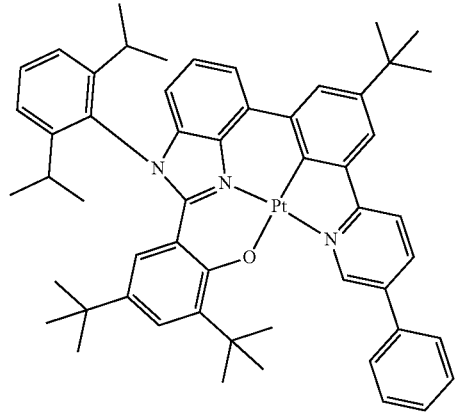
3-505
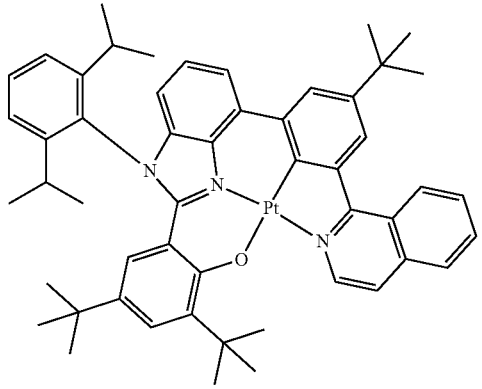

-continued
3-506
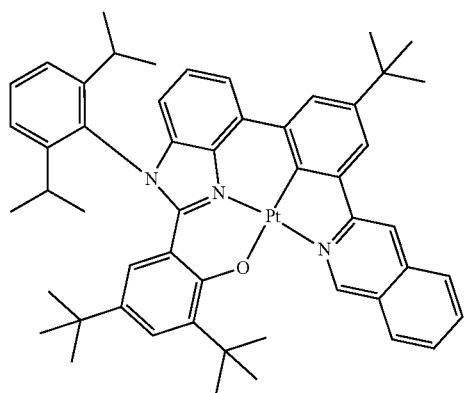
3-507
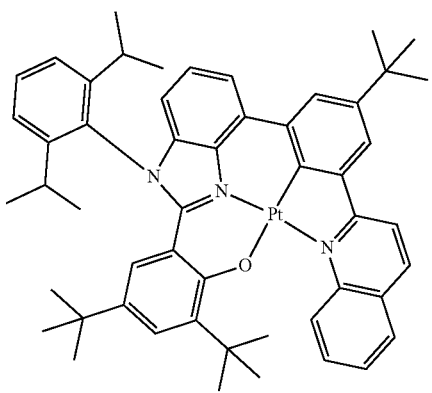
3-508
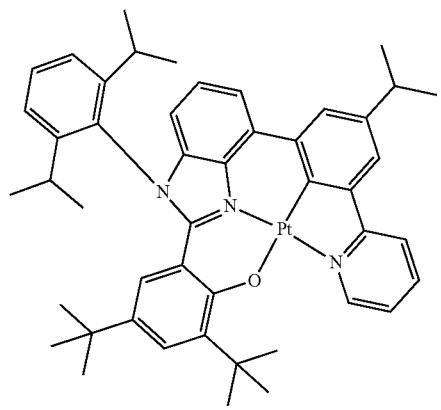
3-509
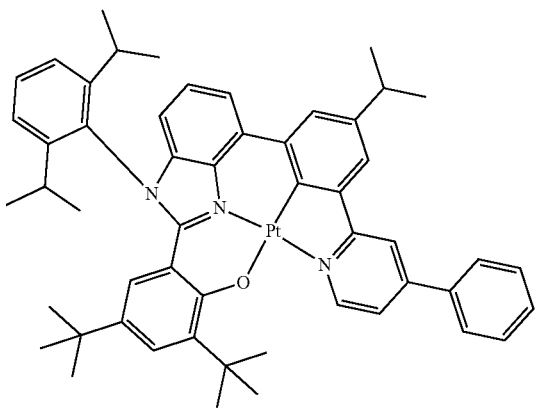
3-510
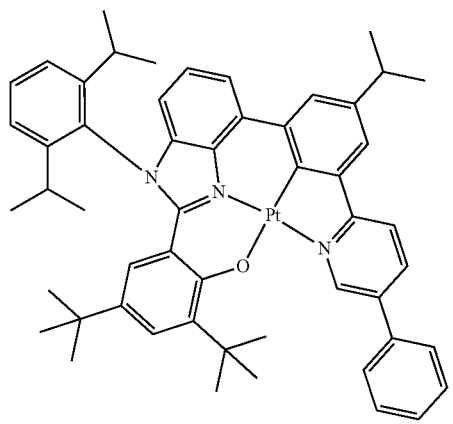
3-511
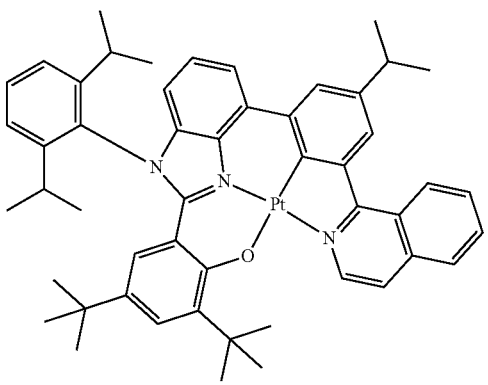
3-512
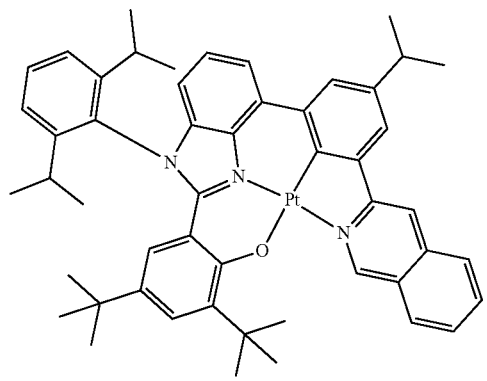
3-513
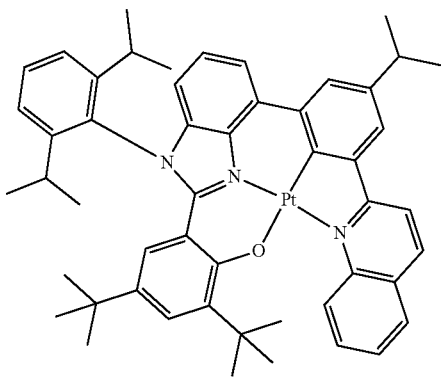

-continued
3-514
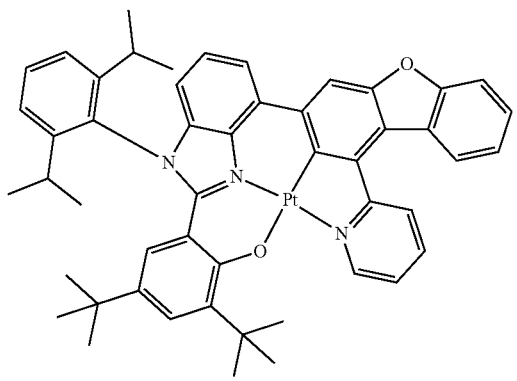
3-515
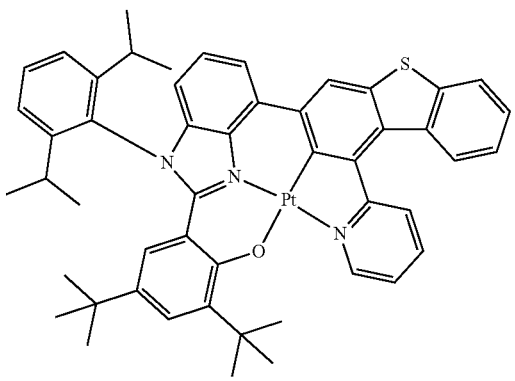
3-516
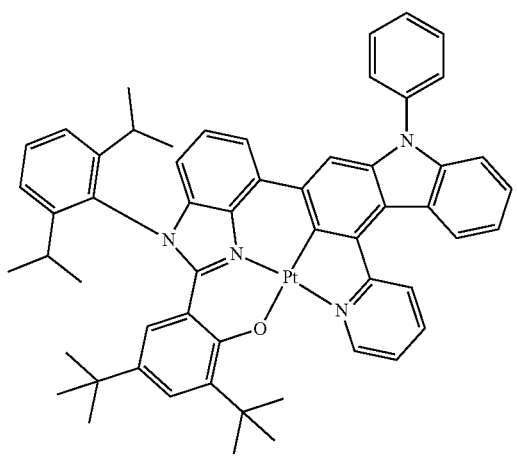
3-517
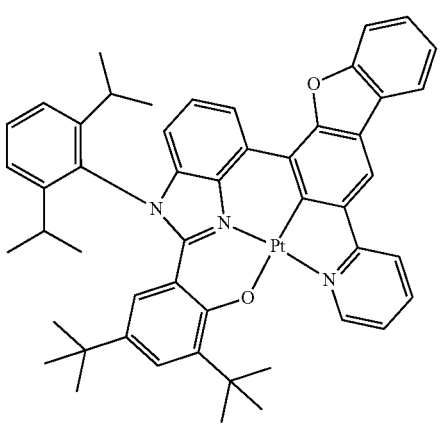
3-518
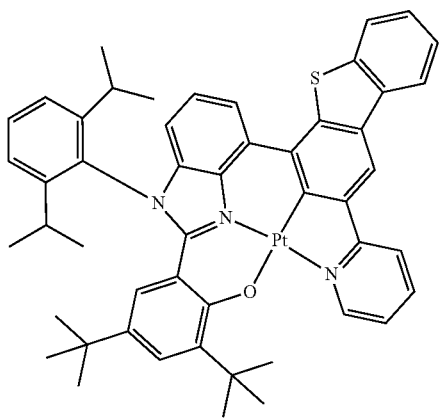
3-519
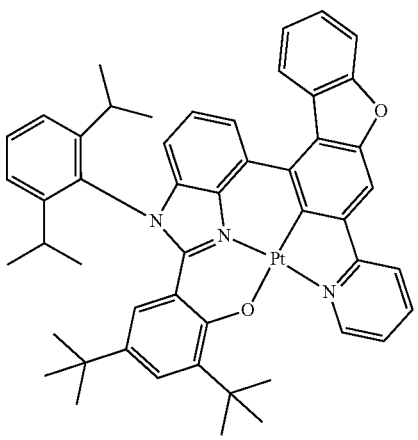

-continued
| 3-520 | 3-521 |
|---|---|
| 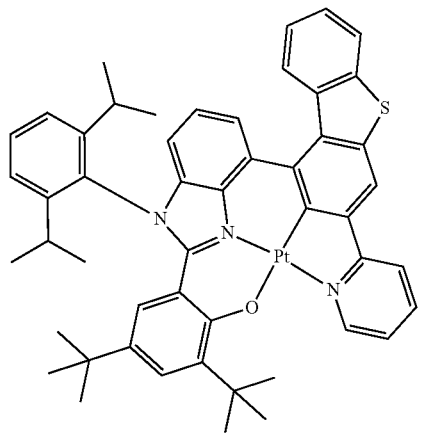 | 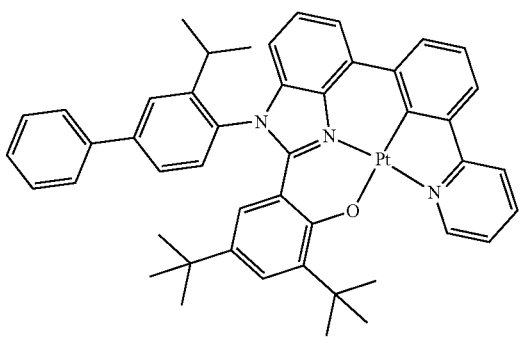 |
| 3-522 | 3-523 |
| 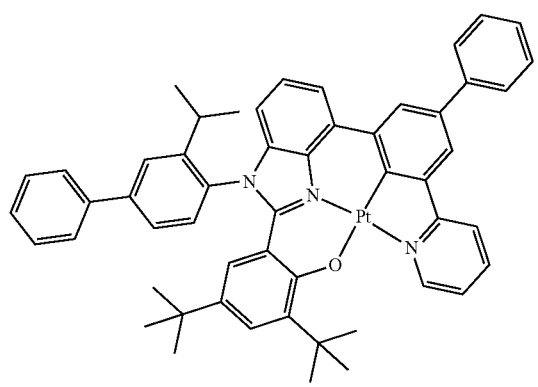 | 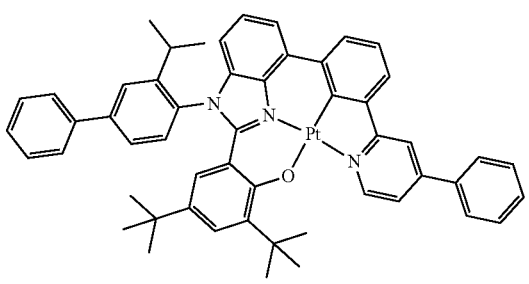 |
| 3-524 | 3-525 |
| 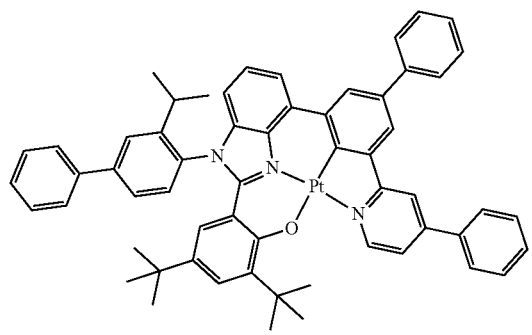 | 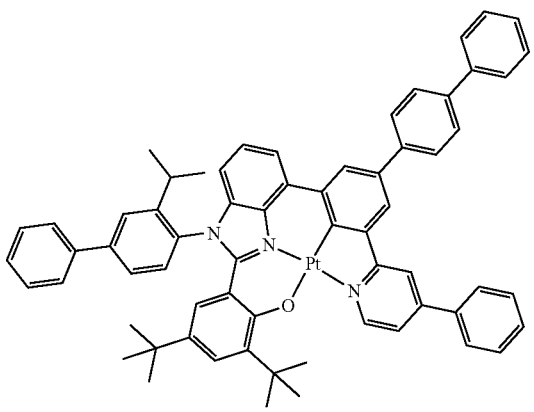 |
| 3-526 | 3-527 |
| 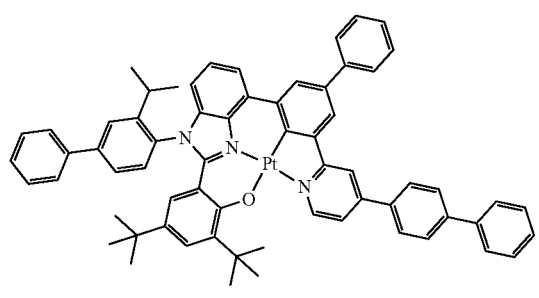 | 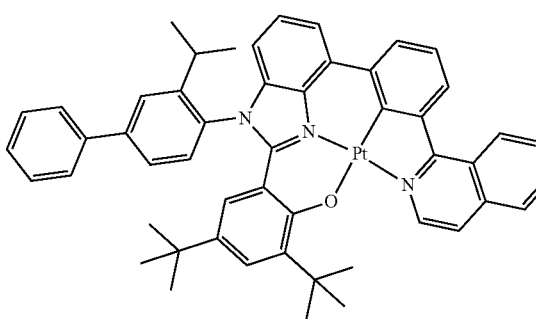 |

-continued
3-528
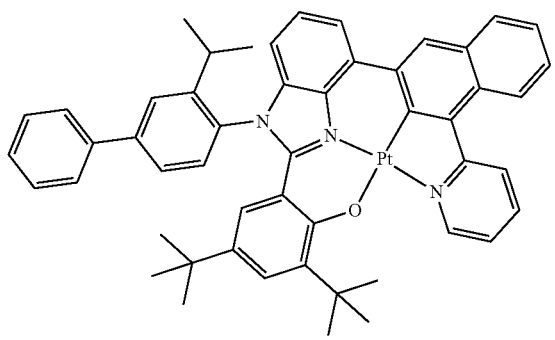
3-529
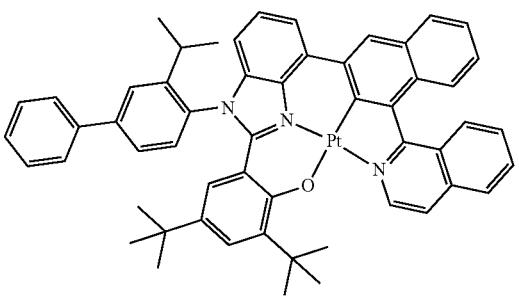
3-530
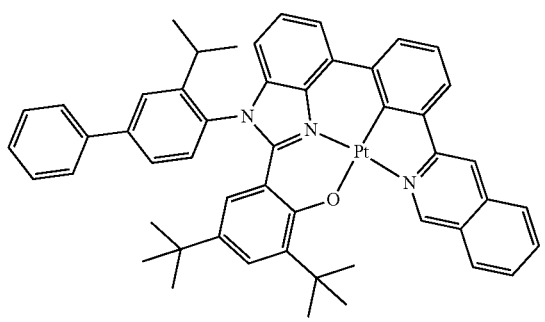
3-531
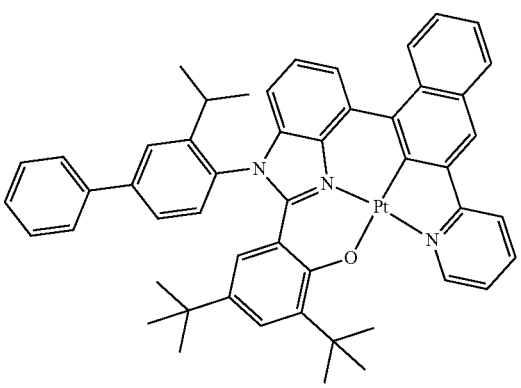
3-532
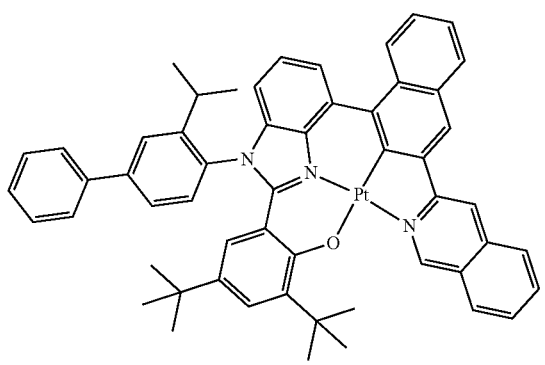
3-533
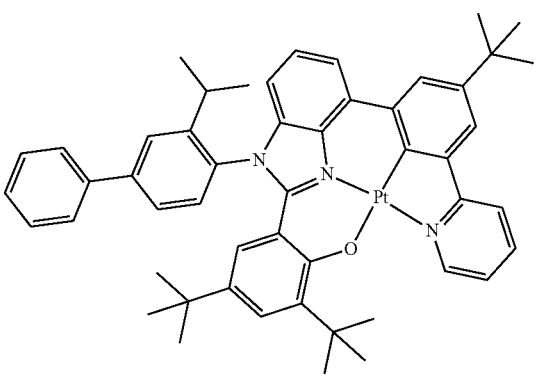
3-534
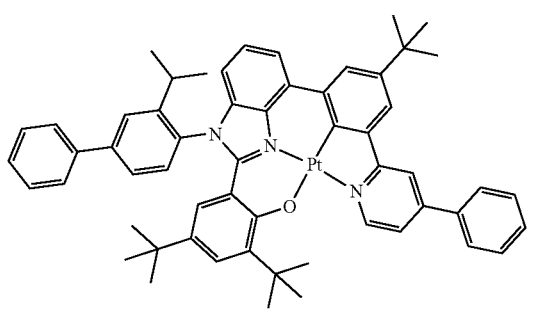
3-535
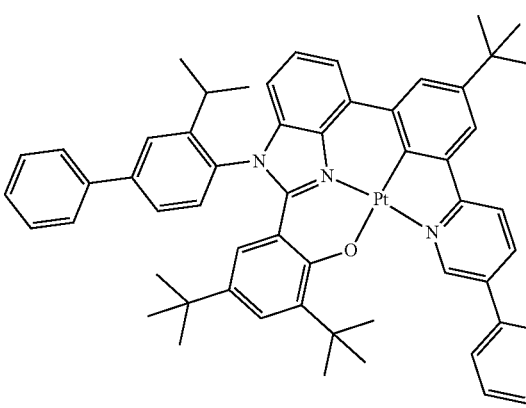

-continued
3-536
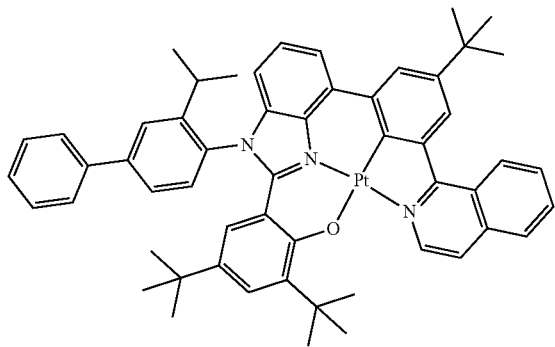
3-537
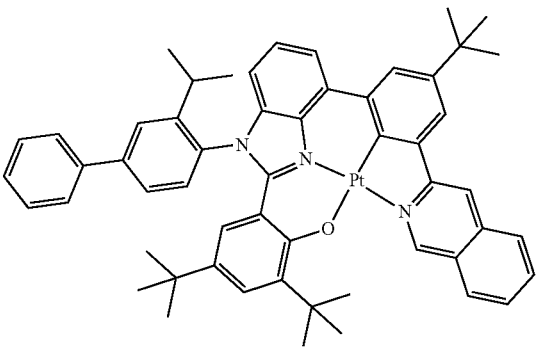
3-538
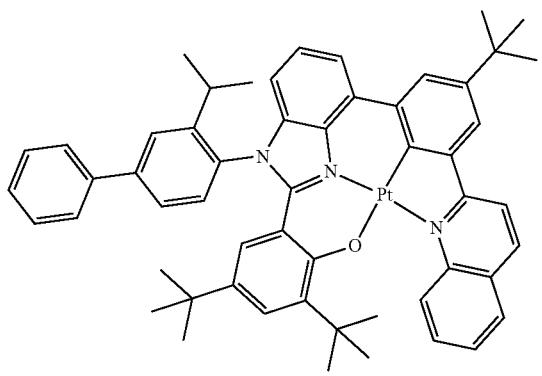
3-539
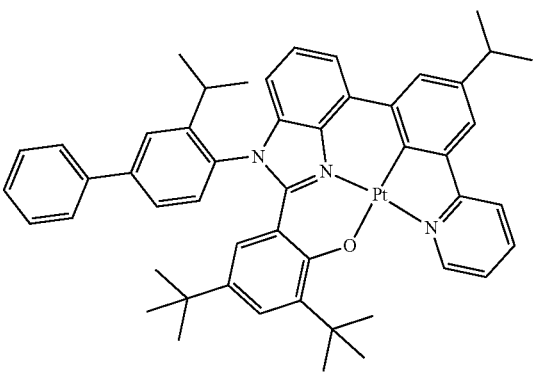
3-540
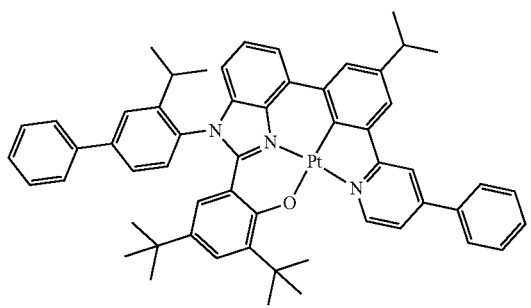
3-541
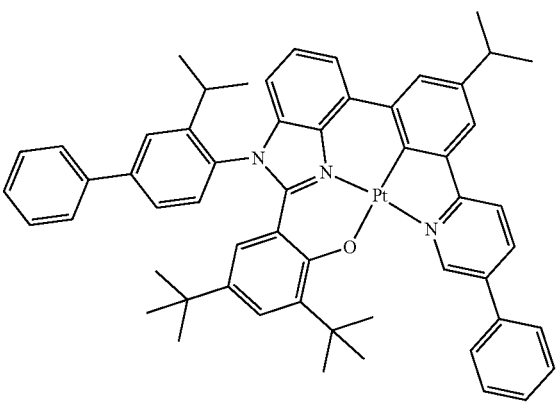
3-542
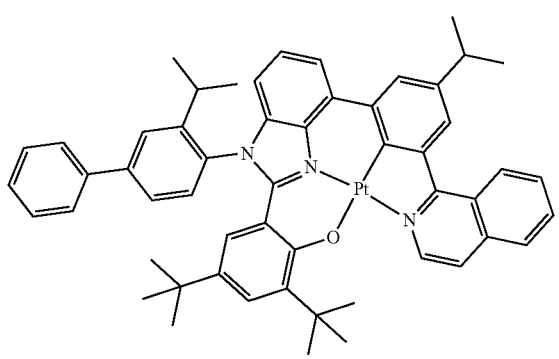
3-543
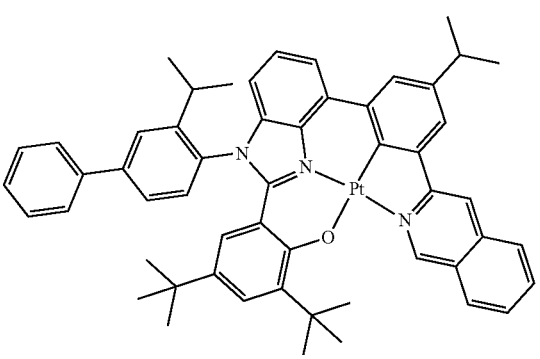

-continued
3-544
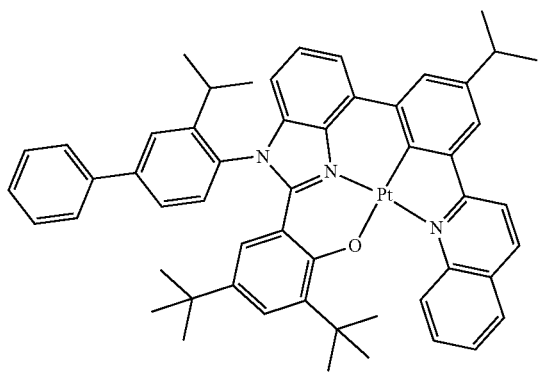
3-545
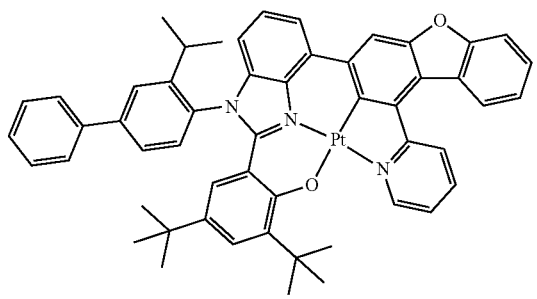
3-546
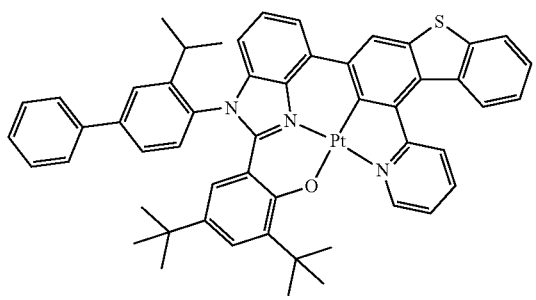
3-547
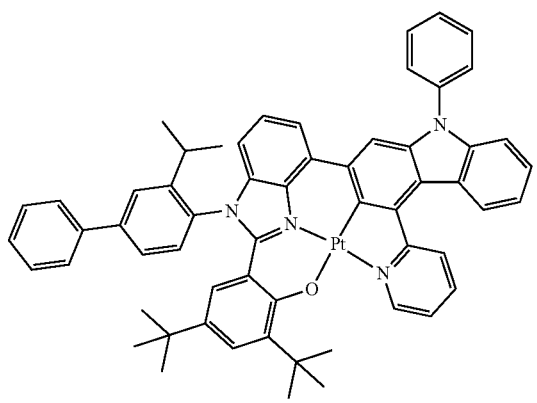
3-548
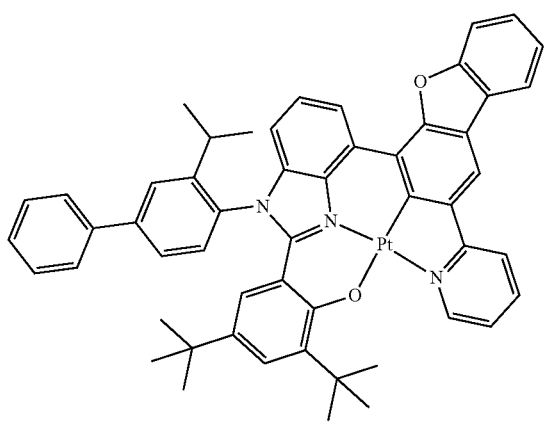
3-549
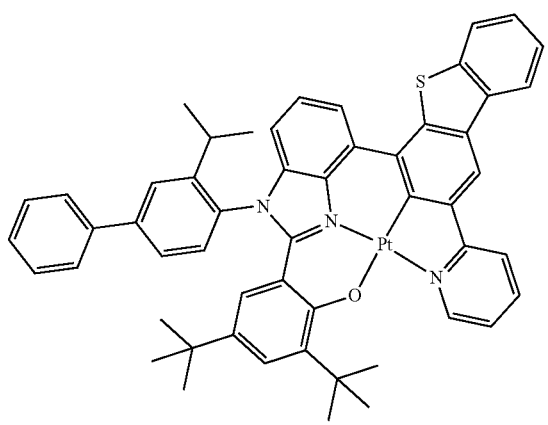

-continued
3-550
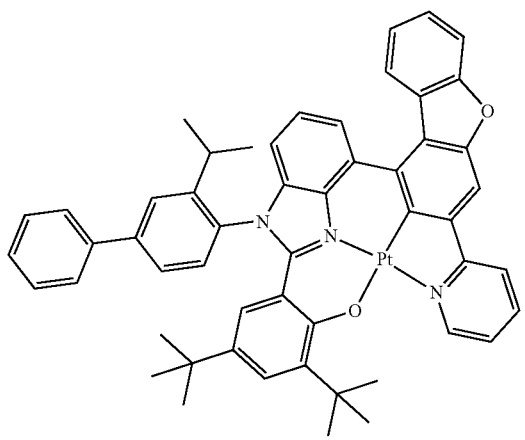
3-551
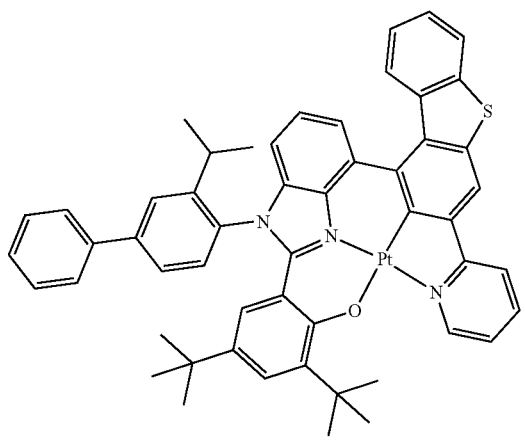
3-552
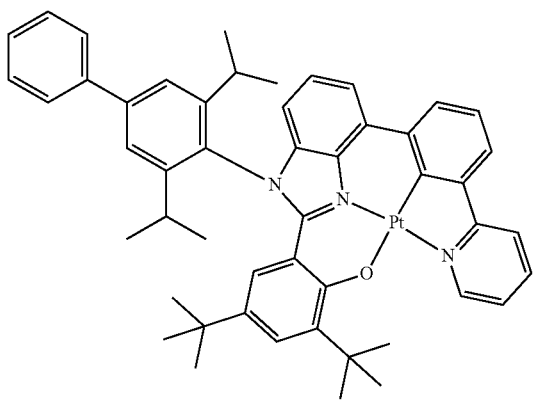
3-553
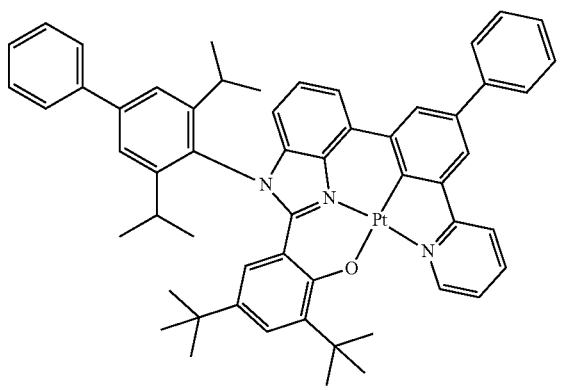
3-554
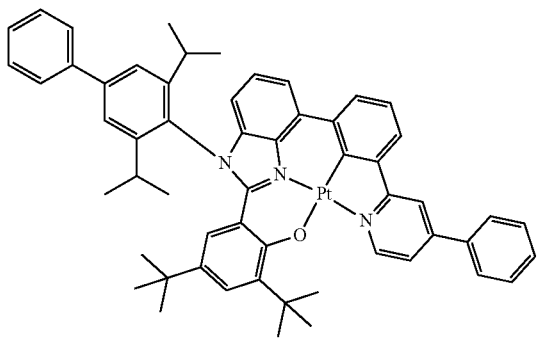
3-555
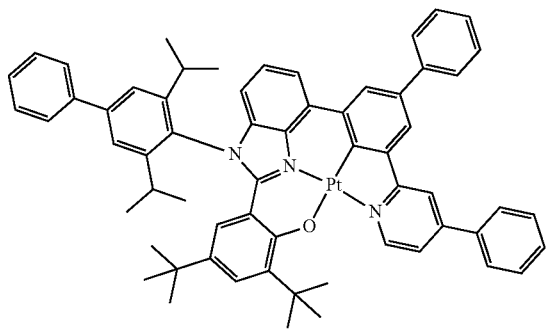

-continued
3-556
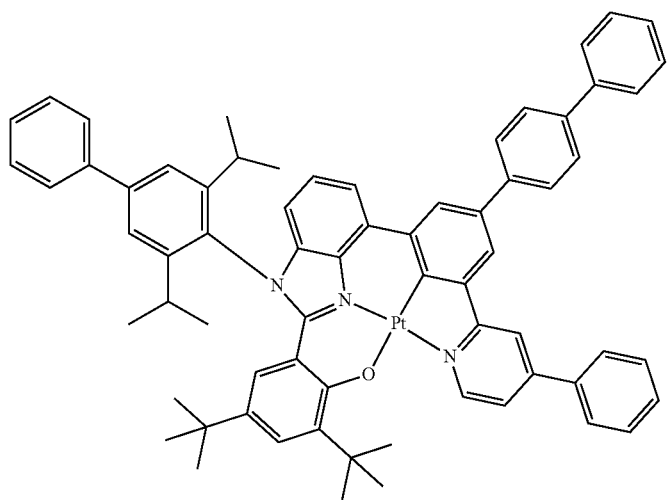
3-557
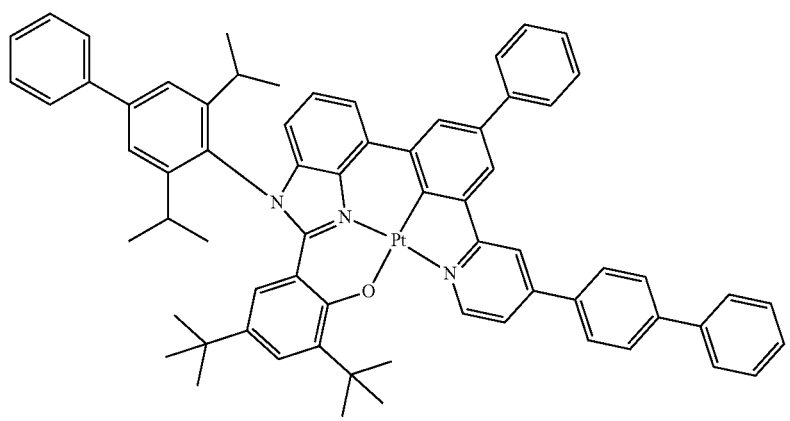
3-558
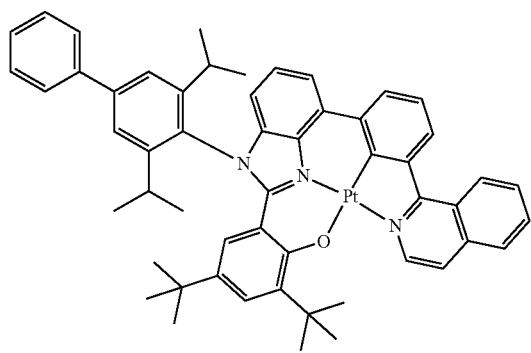
3-559
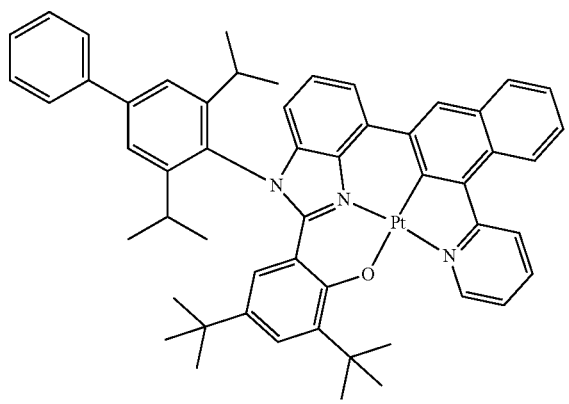

-continued
3-560
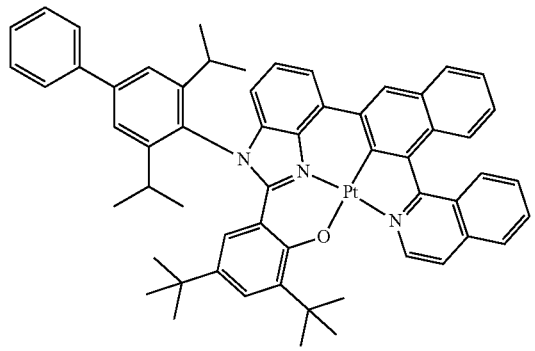
3-561
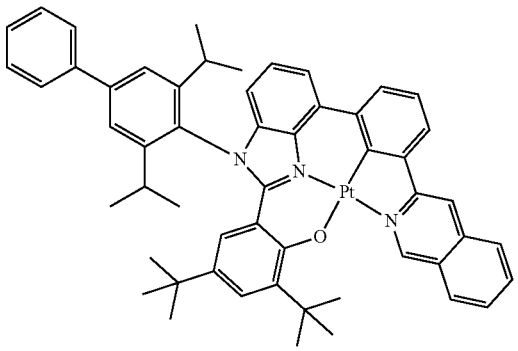
3-562
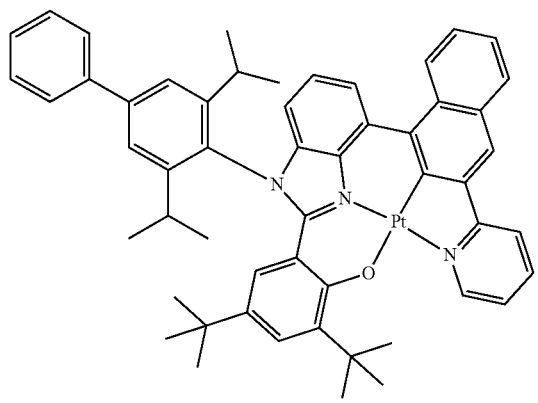
3-563
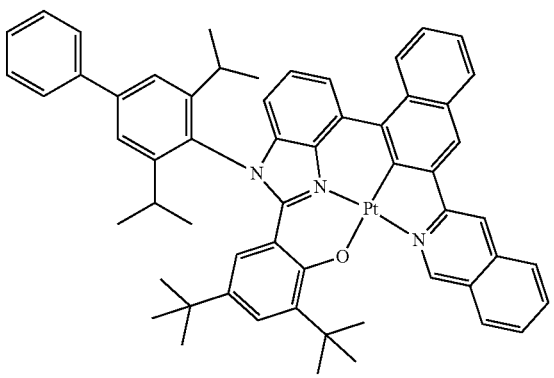
3-564
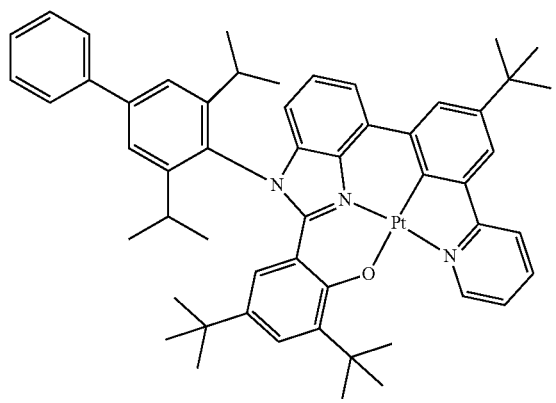
3-565
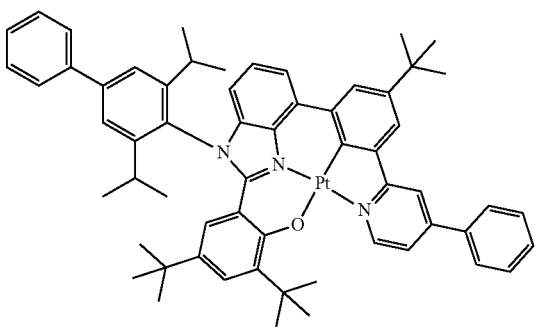
3-566
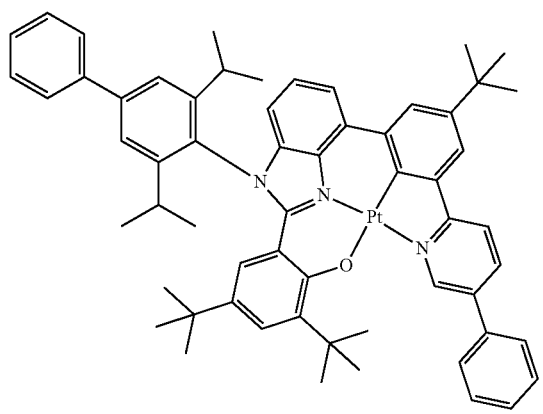
3-567
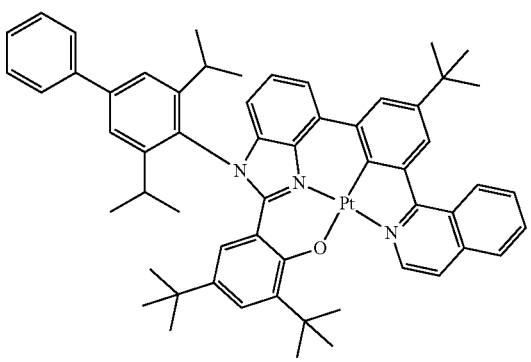

-continued
3-568
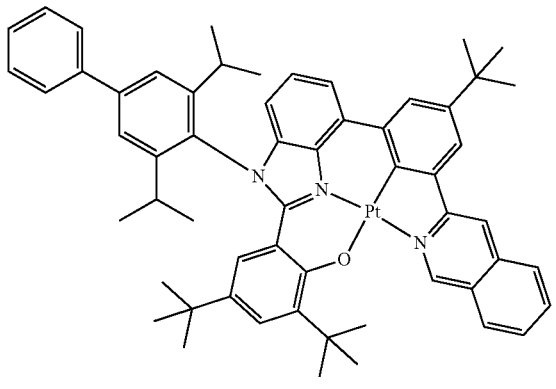
3-569
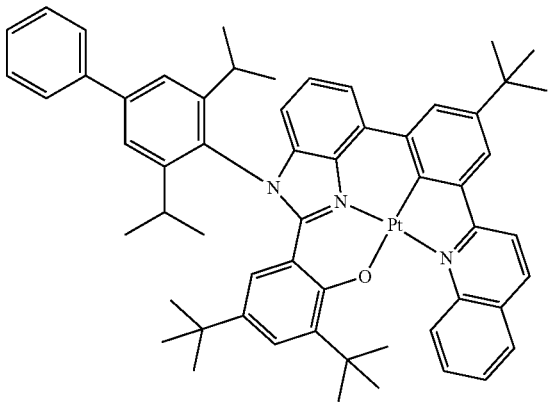
3-570
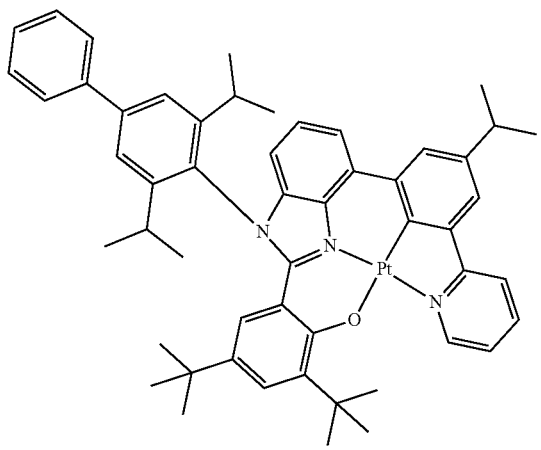
3-571
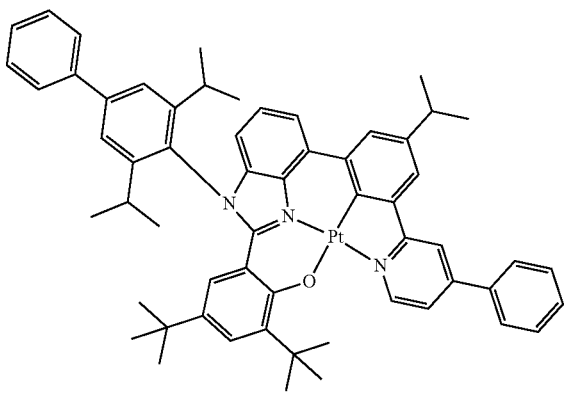
3-572
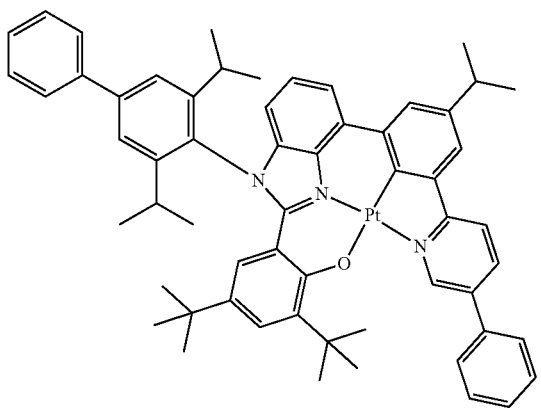
3-573
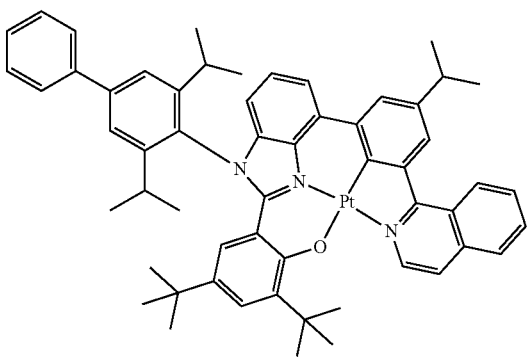

-continued
3-574
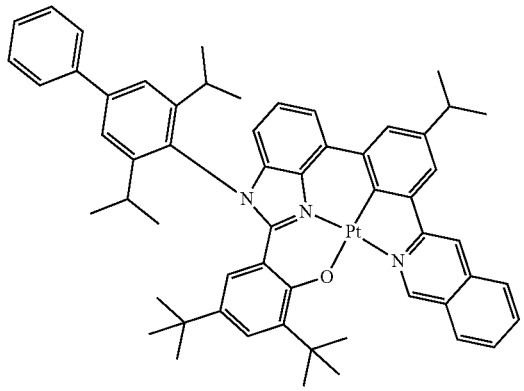
3-575
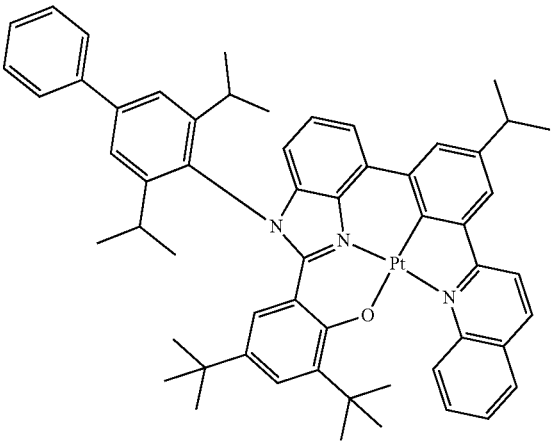
3-576
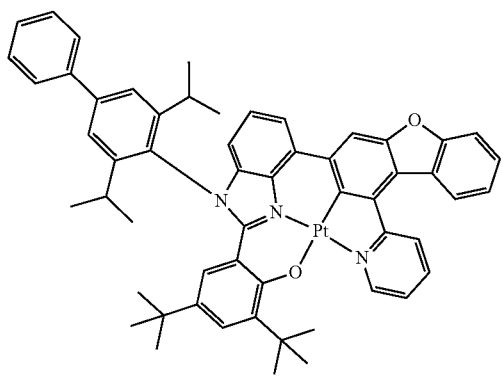
3-577
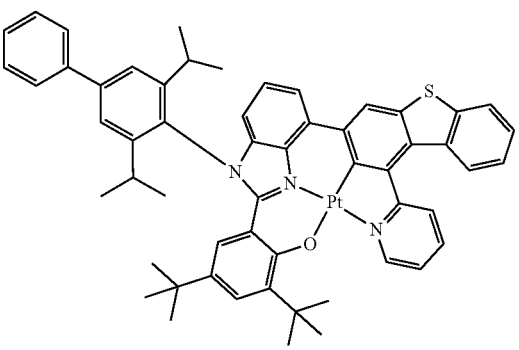
3-578
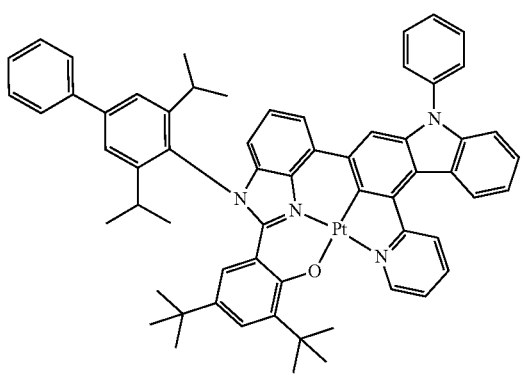
3-579
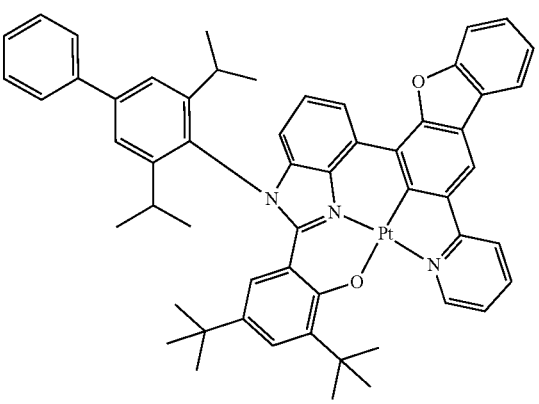

3-580

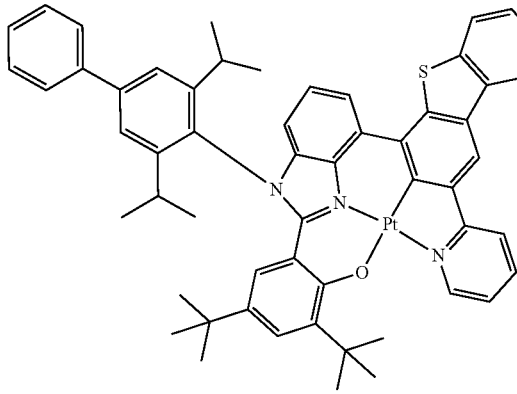

3-581

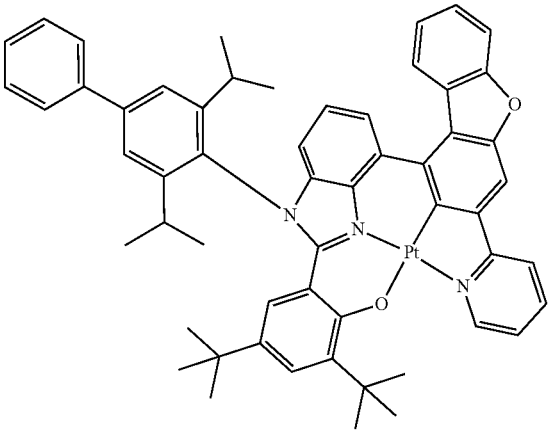

3-582

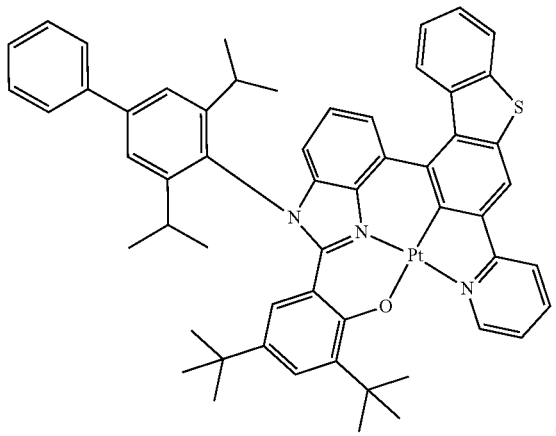

Host in Emission Layer 15

The host in the emission layer 15 may be a single compound or a mixture of two or more different compounds.

In an embodiment, the host may include an electron transport host including at least one electron transport moiety, and a hole transport host including no electron transport moiety. HOMO(host) defined herein may be the same as the HOMO energy level of the hole transport host.

The electron transport moiety may be selected from a cyano group, a π electron-depleted nitrogen-containing cyclic group, and a group represented by one of the following formulae:

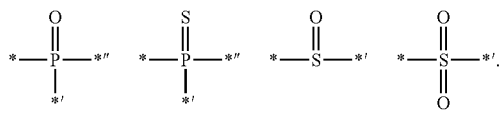

In these formulae, *, *', and *" each indicate a binding site to a neighboring atom.

In one or more embodiments, the host may include an electron transport host and a hole transport host, wherein the electron transport host may include at least one π electron-depleted nitrogen-free cyclic group and at least one electron transport moiety, and the hole transport host may include at least one π electron-depleted nitrogen-free cyclic group and may not include an electron transport moiety.

The π electron-depleted nitrogen-containing cyclic group is a cyclic group having at least one *—N=*' moiety and may be, for example, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group.

The π electron-depleted nitrogen-free cyclic group may be selected from a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a corozene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothioenocarbazole group, and a triindolobenzene group, but embodiments of the present disclosure are not limited thereto.

In an embodiment, the electron transport host may be selected from compounds represented by Formula E-1, and the hole transport host may be selected from compounds represented by Formula H-1, but embodiments of the present disclosure are not limited thereto:

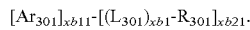  Formula E-1

In Formula E-1, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, and $L_{301}$ may be selected from a single bond, a group represented by one of the following formulae, a substituted or unsubstituted $C_5$-$C_{60}$ carbocyclic group, and a substituted or unsubstituted $C_1$-$C_{60}$ heterocyclic group, and *, *', and *" in the following formulae each indicate a binding site to a neighboring atom:

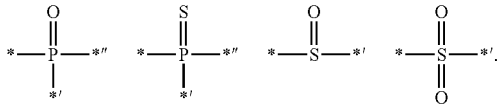

xb1 may be an integer from 1 to 5, $R_{301}$ may be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), —S(=O)($Q_{301}$), —P(=O)($Q_{301}$)($Q_{302}$), and —P(=S)($Q_{301}$)($Q_{302}$), xb21 may be an integer from 1 to 5, $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, the organic light-emitting device satisfies at least one of Condition 1 to Condition 3:

Condition 1 at least one of $Ar_{301}$, $L_{301}$, and $R_{301}$ in Formula E-1 includes a π electron-depleted nitrogen-containing cyclic group, Condition 2 at least one of $L_{301}$ in Formula E-1 is a group represented by one of the following formulae:

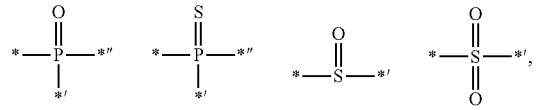

and

Condition 3 at least one of $R_{301}$ in Formula E-1 is selected from a cyano group, —S(=O)$_2$($Q_{301}$), —S(=O)($Q_{301}$), —P(=O)($Q_{301}$)($Q_{302}$), and —P(=S)($Q_{301}$)($Q_{302}$).

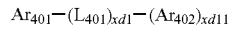  Formula H-1

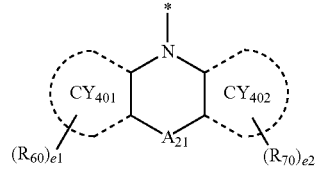  Formula 11

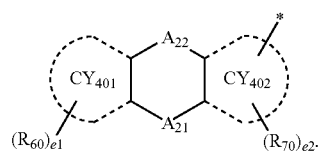  Formula 12

In Formulae H-1, 11, and 12, $L_{401}$ may be selected from:

a single bond; and a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a corozene group, an ovalene group, a pyrrole group, an iso-indole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothioenocarbazole group, and a triindolobenzene group, each unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, and —Si($Q_{401}$)($Q_{402}$)($Q_{403}$), xd1 may be an integer from 1 to 10, wherein, when xd1 is two or more, two or more groups $L_{401}$ may be identical to or different from each other, $Ar_{401}$ may be selected from groups represented by Formulae 11 and 12, $Ar_{402}$ may be selected from:

groups represented by Formulae 11 and 12, a phenyl group, a naphthyl group, a fluorenyl group, a carbazolyl group, a dibenzofuranyl group, a dibenzothiophenyl group, a biphenyl group, a terphenyl group, and a triphenylenyl group; and a phenyl group, a naphthyl group, a fluorenyl group, a carbazolyl group, a dibenzofuranyl group, a dibenzothiophenyl group, a biphenyl group, a terphenyl group, and a triphenylenyl group, each substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, a biphenyl group, a terphenyl group, and a triphenylenyl group, $CY_{401}$ and $CY_{402}$ may each independently be selected from a benzene group, a naphthalene group, a fluorene group, a carbazole group, a benzocarbazole group, an indolocarbazole group, a dibenzofuran group, a dibenzothiophene group, a dibenzosilole group, a benzonaphthofuran group, a benzonaphthothiophene group, and a benzonaphthosilole group, $A_{21}$ may be selected from a single bond, O, S, $N(R_{51})$, $C(R_{51})(R_{52})$, and $Si(R_{51})(R_{52})$, $A_{22}$ may be selected from a single bond, O, S, $N(R_{53})$, $C(R_{53})(R_{54})$, and $Si(R_{53})(R_{54})$, at least one of $A_{21}$ and $A_{22}$ in Formula 12 may not be a single bond, $R_{51}$ to $R_{54}$, $R_{60}$, and $R_{70}$ may each independently be selected from:

hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, and a dibenzothiophenyl group;

a phenyl group, a naphthyl group, a fluorenyl group, a carbazolyl group, a dibenzofuranyl group, a dibenzothiophenyl group, a biphenyl group, a terphenyl group, and a triphenylenyl group;

a phenyl group, a naphthyl group, a fluorenyl group, a carbazolyl group, a dibenzofuranyl group, a dibenzothiophenyl group, a biphenyl group, a terphenyl group, and a triphenylenyl group, each substituted with at least one selected from deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, and a biphenyl group; and —$Si(Q_{404})(Q_{405})(Q_{406})$, e1 and e2 may each independently be an integer from 0 to 10, $Q_{401}$ to $Q_{406}$ may each independently be selected from hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, a dibenzothiophenyl group, a biphenyl group, a terphenyl group, and a triphenylenyl group, and

* indicates a binding site to a neighboring atom.

In an embodiment, in Formula E-1, $Ar_{301}$ may be selected from a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, at least one of groups $L_{301}$ in the number of xb1 may be selected from an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, $R_{301}$ may be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a tetraphenyl group, a naphthyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In one or more embodiments, $R_{301}$ may be selected from groups represented by Formulae 7-1 to 7-9, but embodiments of the present disclosure are not limited thereto:

7-1 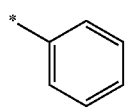
7-2 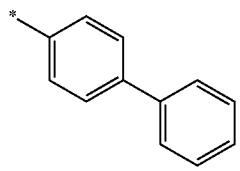
7-3 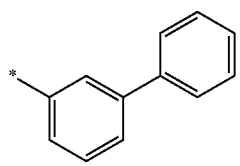
7-4 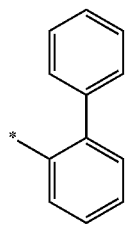
7-5 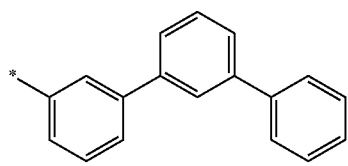
7-6 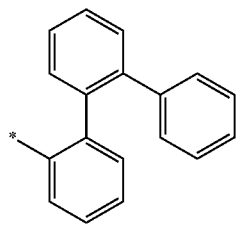
7-7 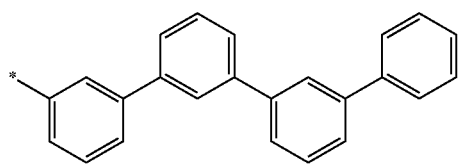
7-8 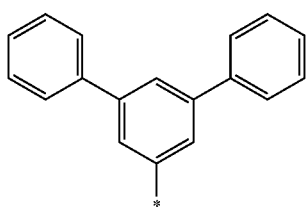
7-9 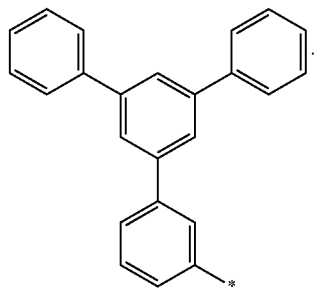
The electron transport host may be selected from Compounds H-E1 to H-E84, but embodiments of the present disclosure are not limited thereto:
H-E1
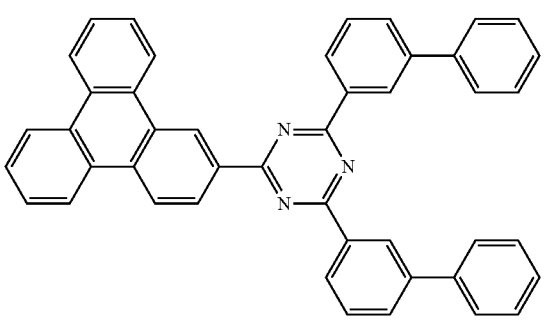
H-E2
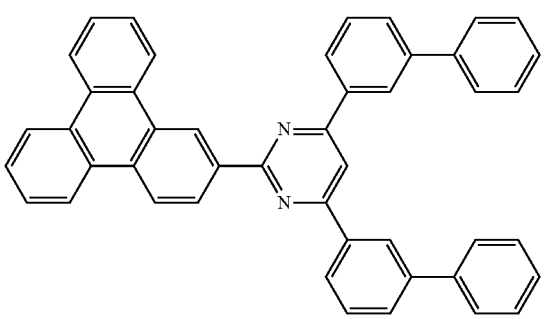
H-E3
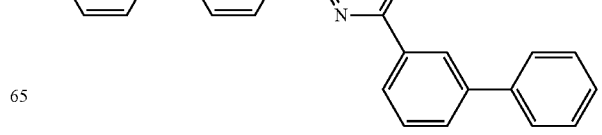

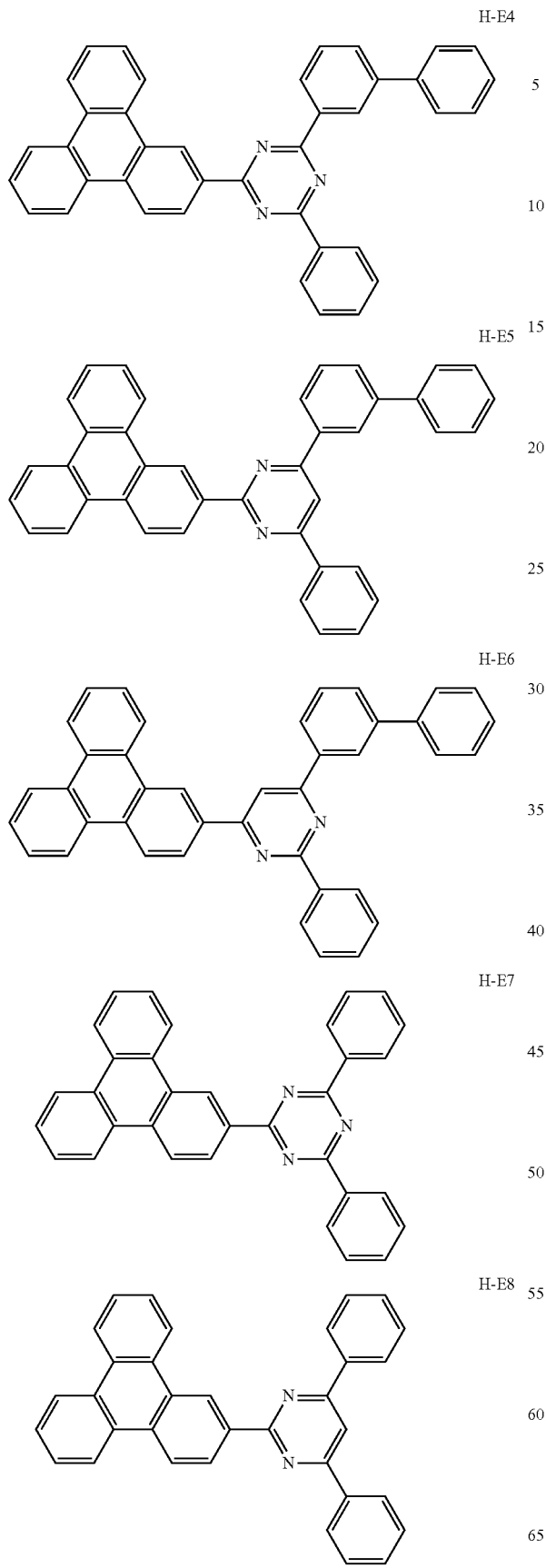
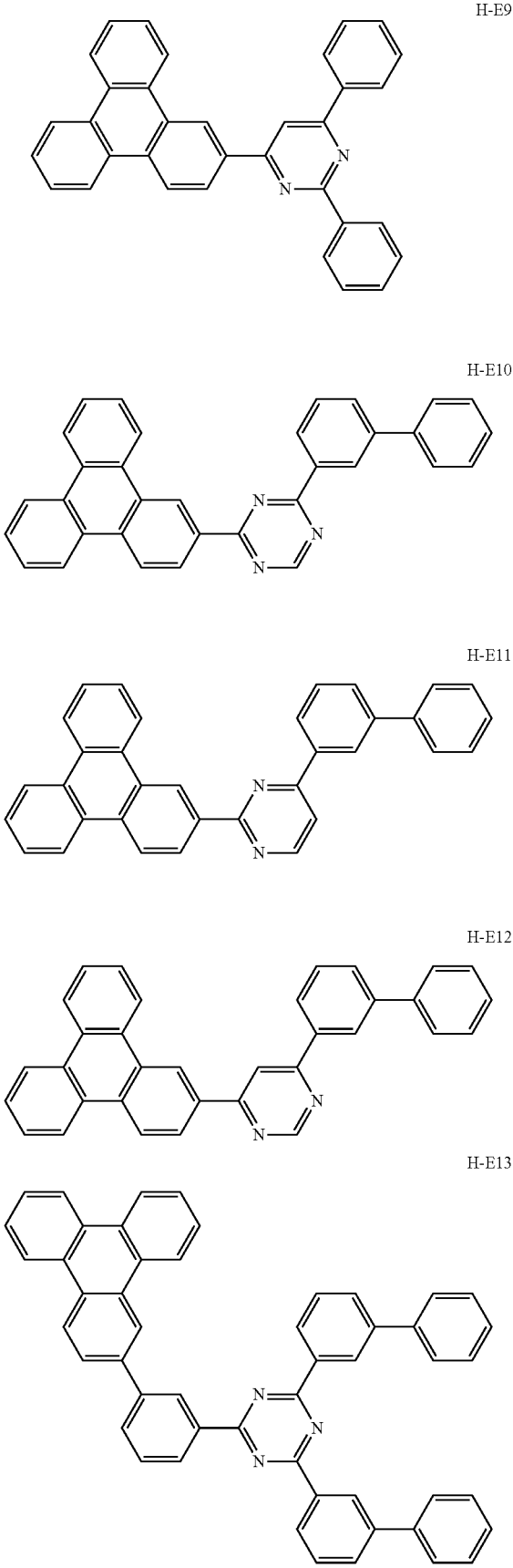

H-E14
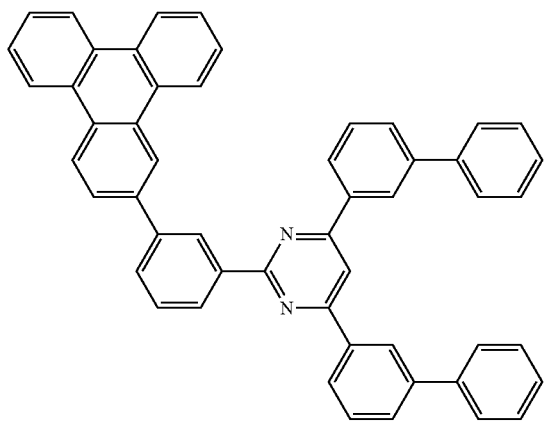
H-E17
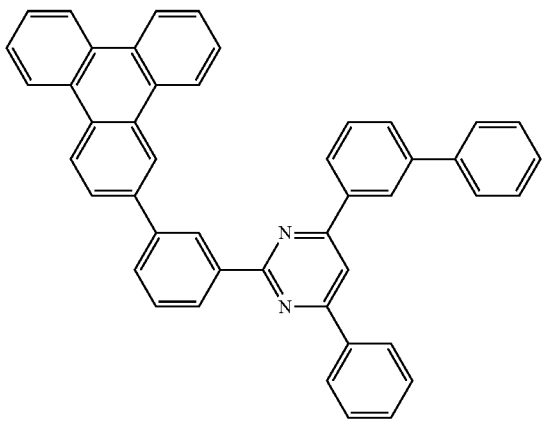
H-E15
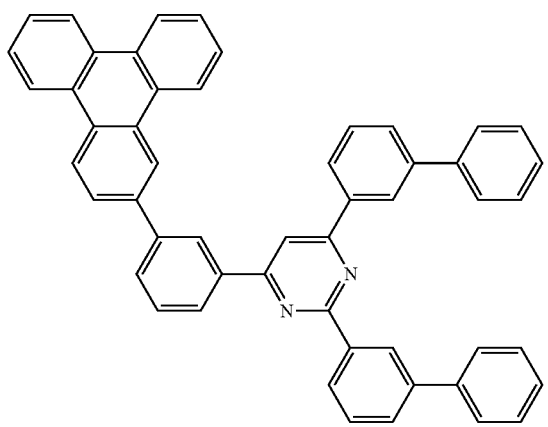
H-E18
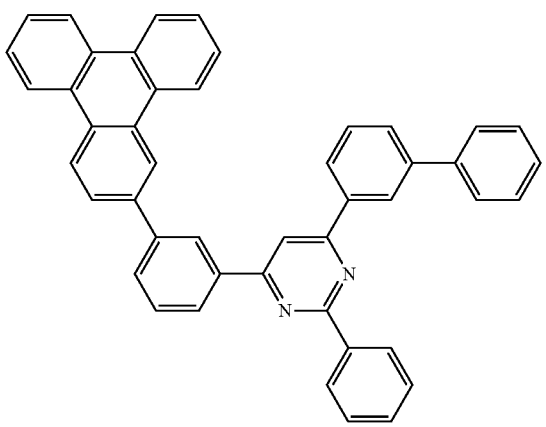
H-E16
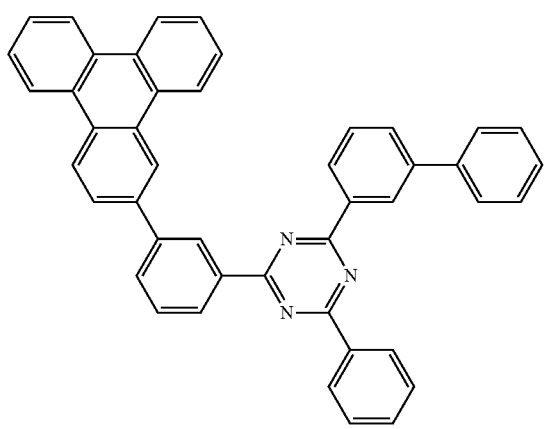
H-E19
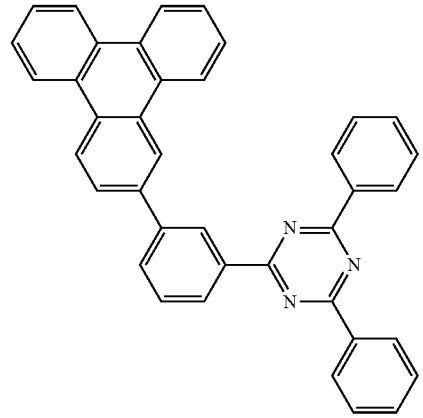

H-E20
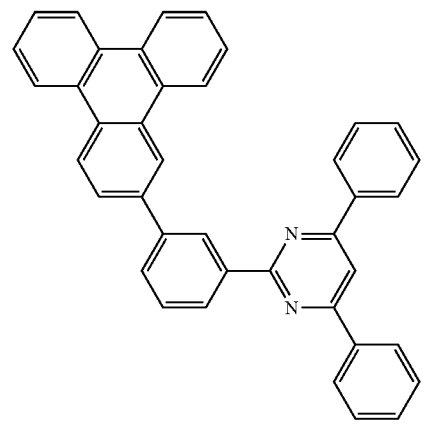
H-E21
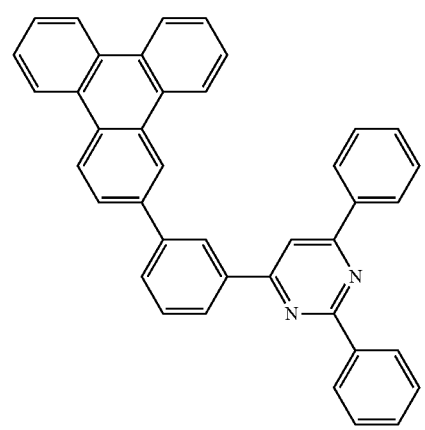
H-E22
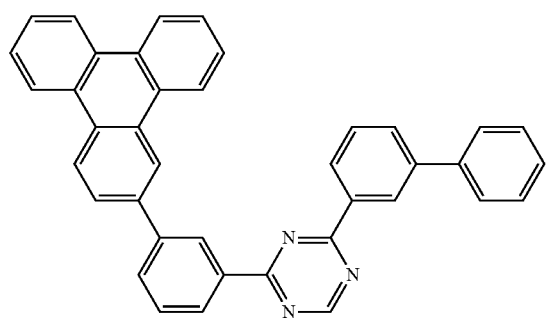
H-E23
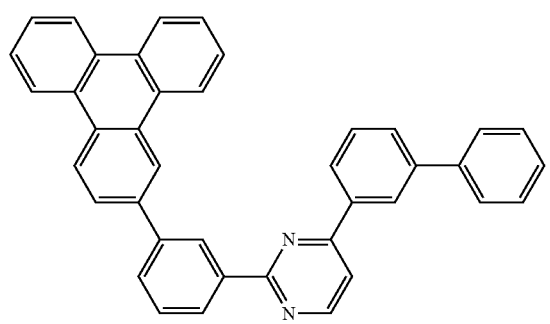
H-E24
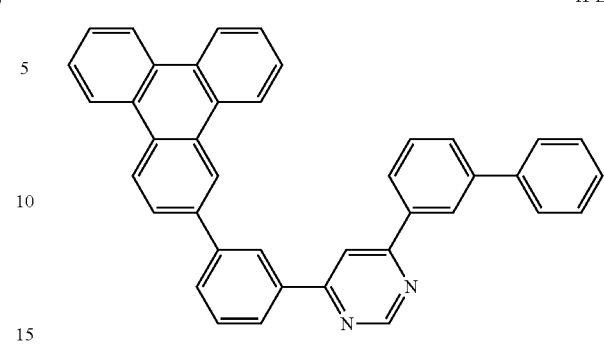
H-E25
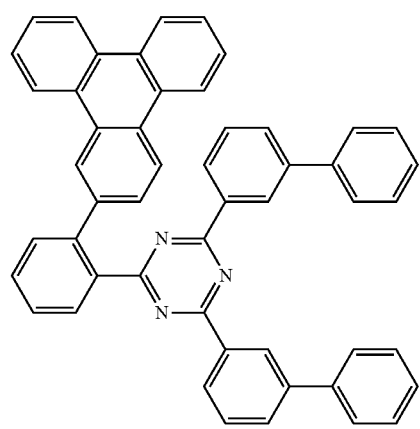
H-E26
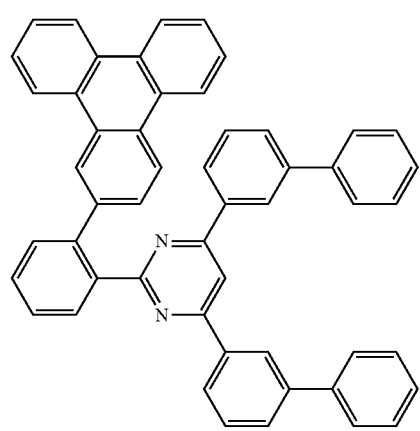
H-E27
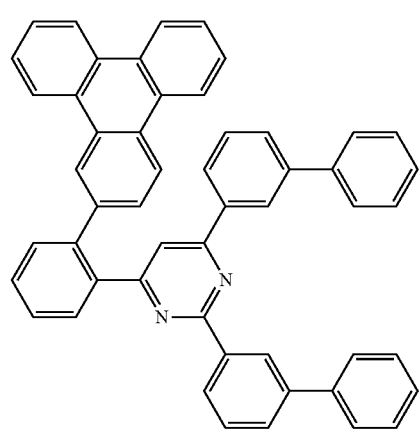

H-E28
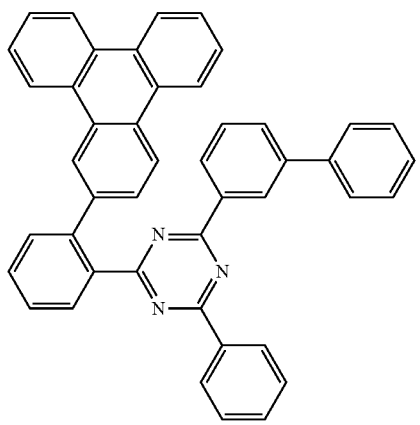
H-E29
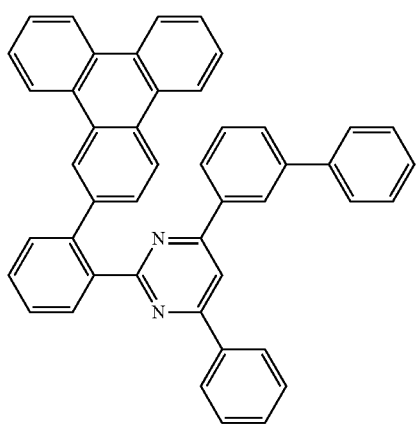
H-E30
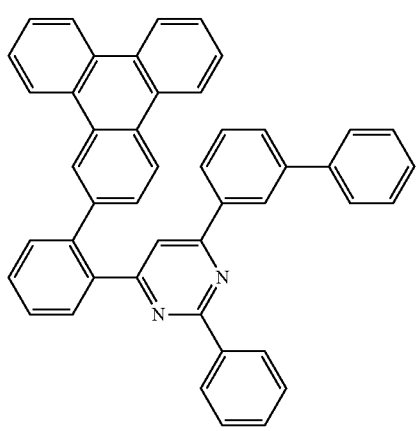
H-E31
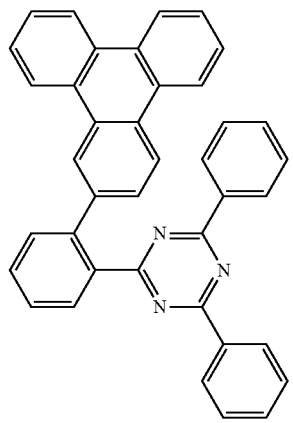
H-E32
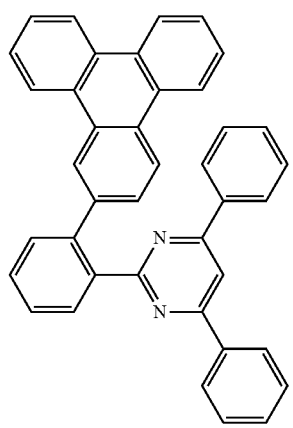
H-E33
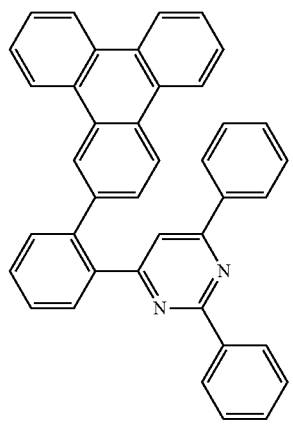
H-E34

H-E35
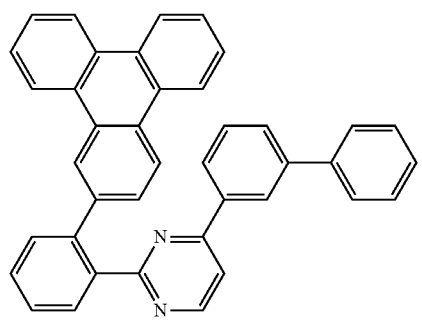
H-E36
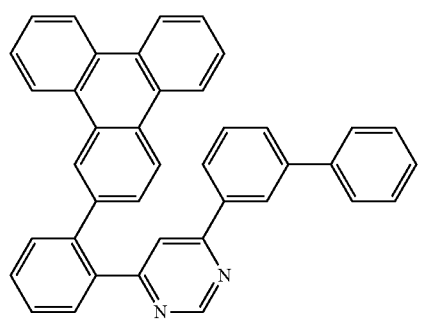
H-E37
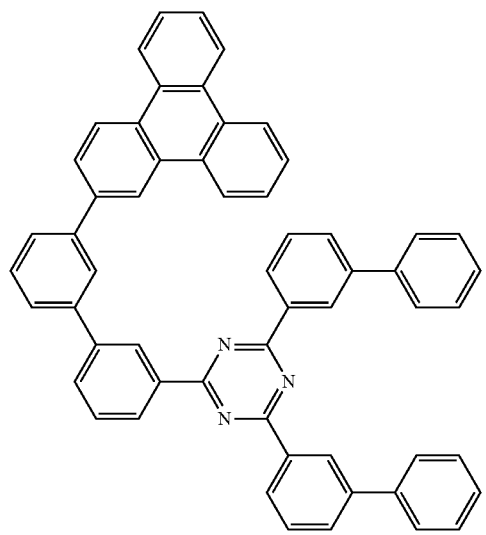
H-E38
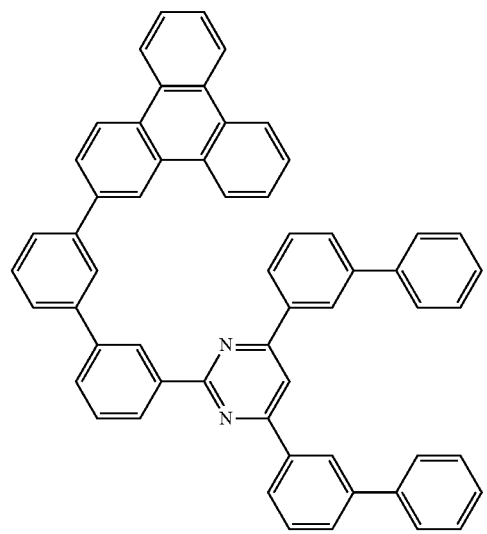
H-E39
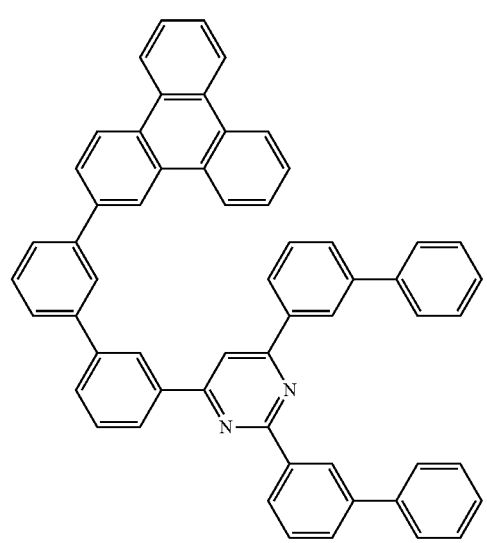
H-E40
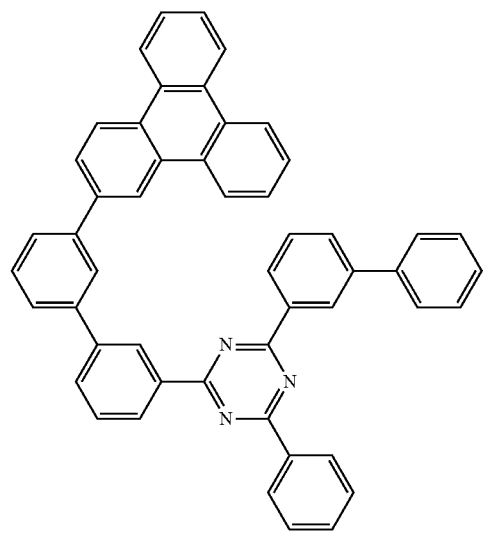

H-E41
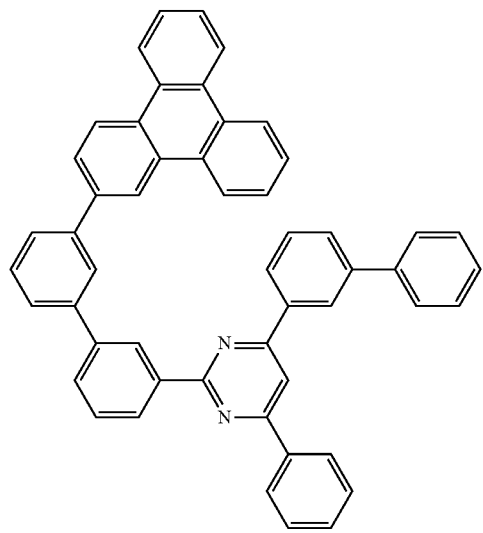
H-E42
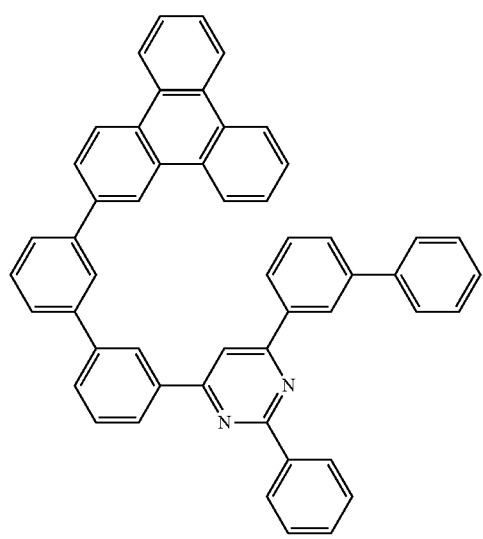
H-E43
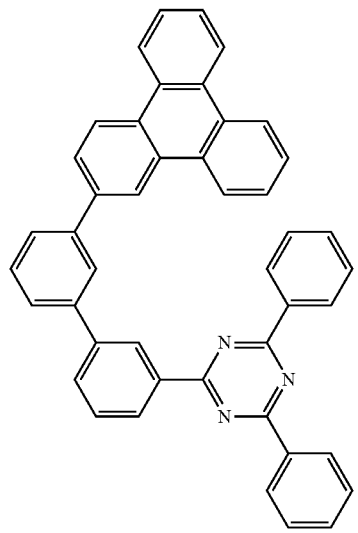
H-E44
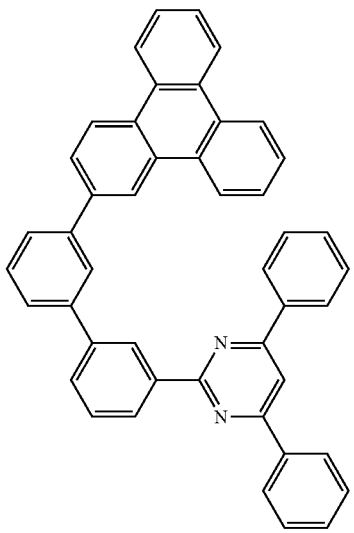
H-E45
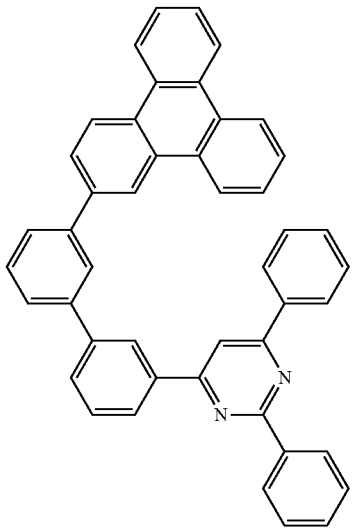
H-E46
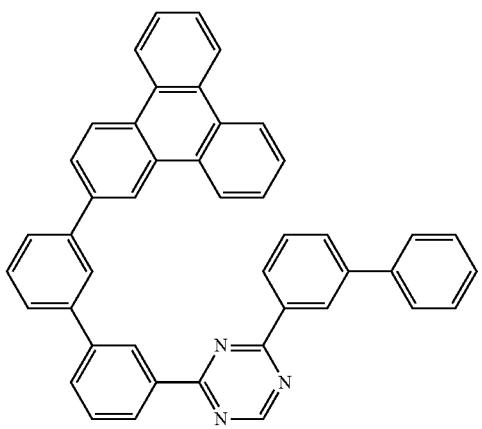

H-E47
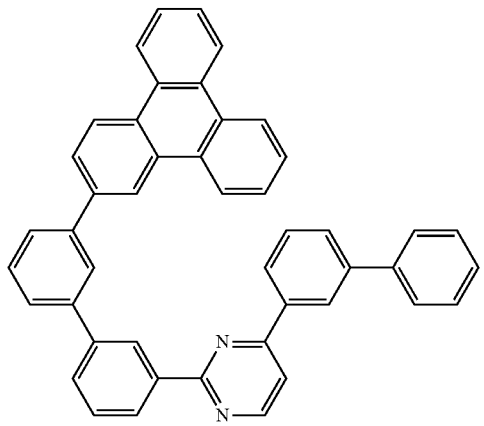
H-E48
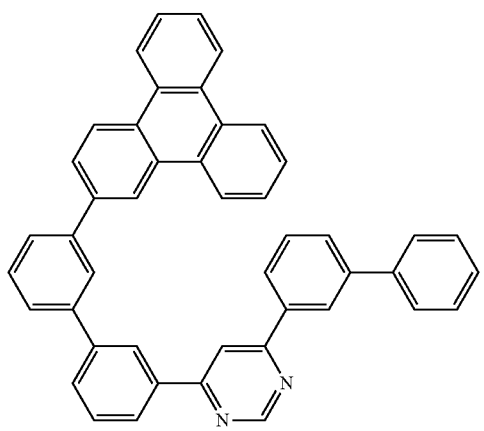
H-E49
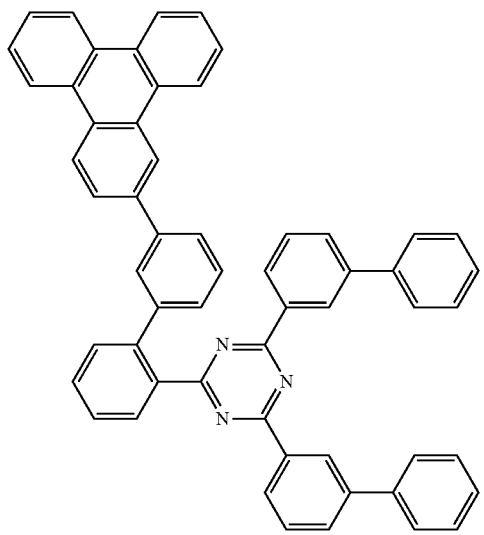
H-E50
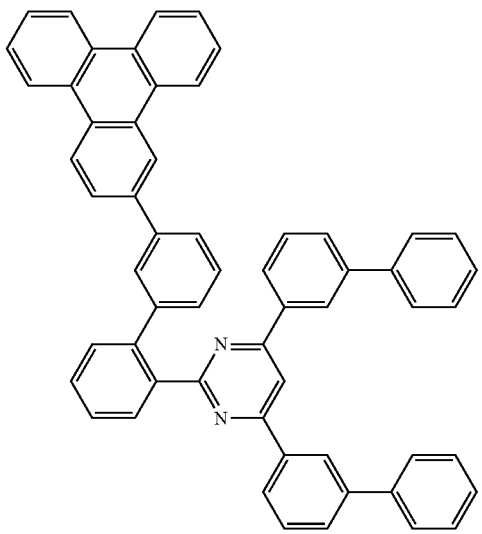
H-E51
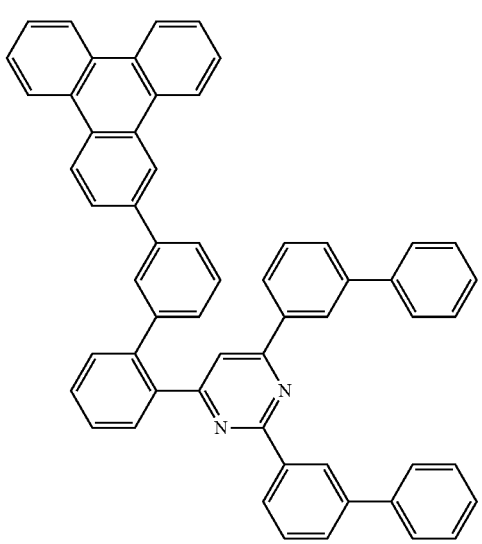

H-E53
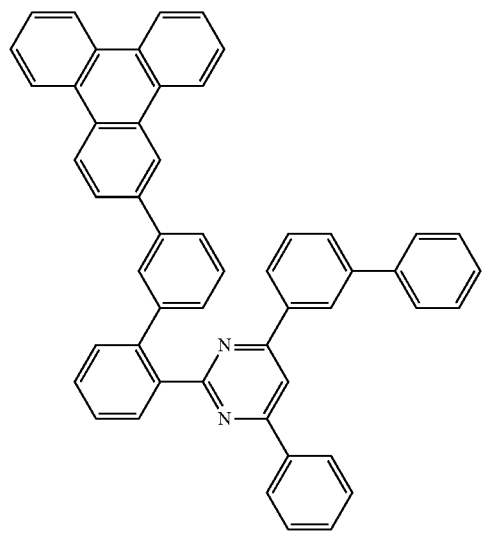
H-E54
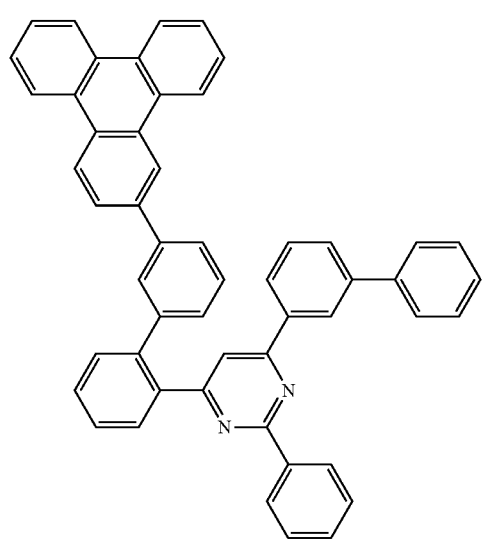
H-E55
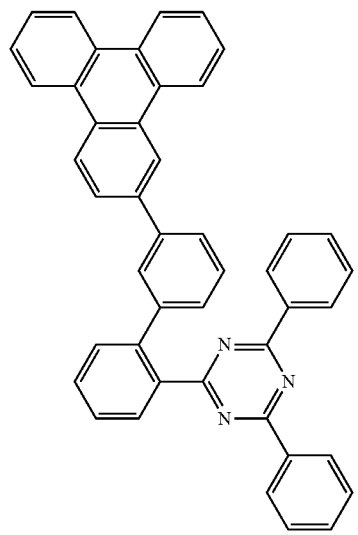
H-E56
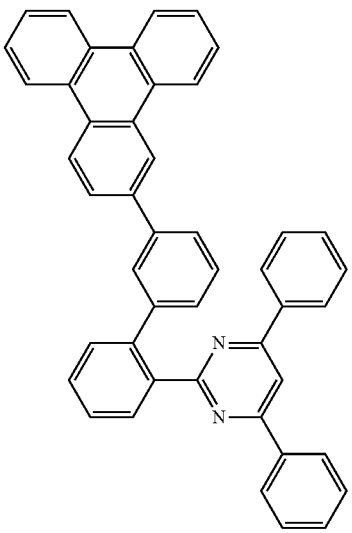
H-E57
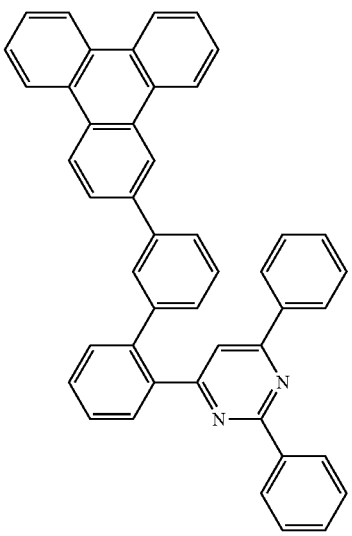
H-E58
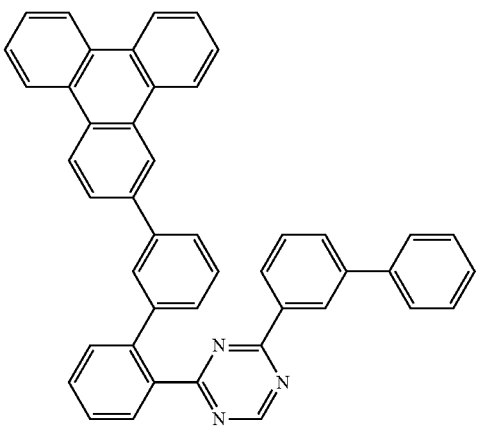

H-E59
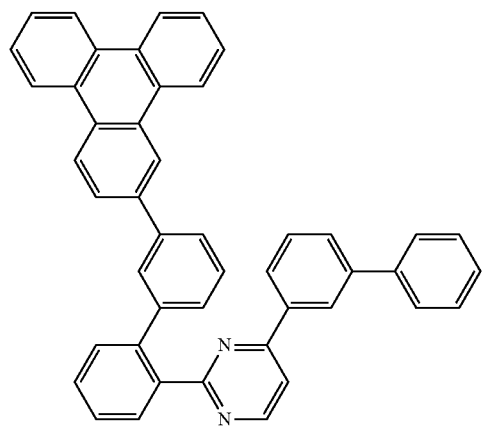
H-E60
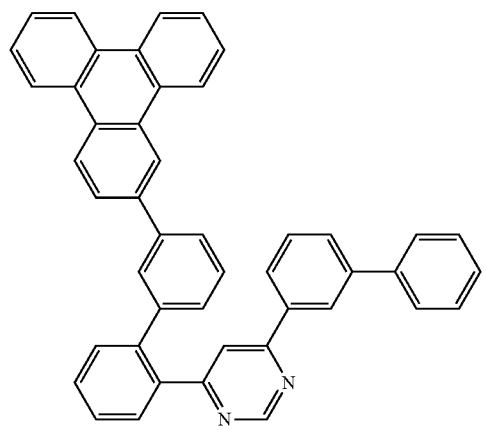
H-E61
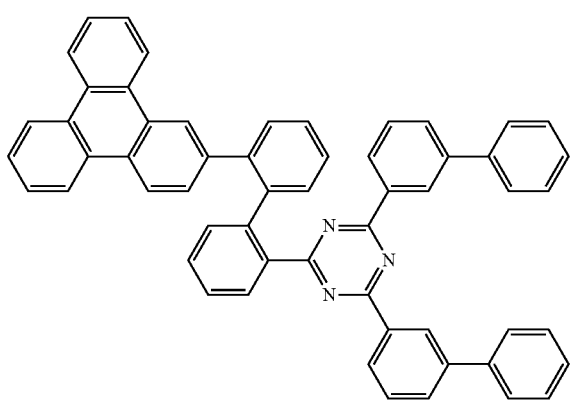
H-E62
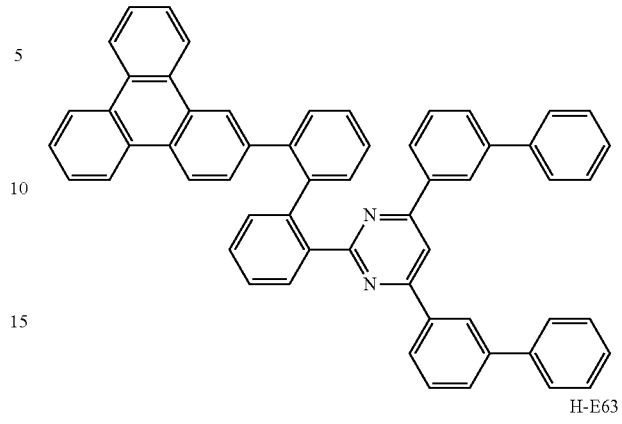
H-E63
H-E64
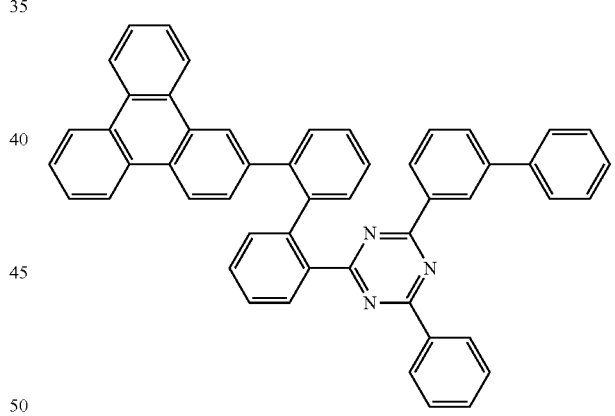
H-E65
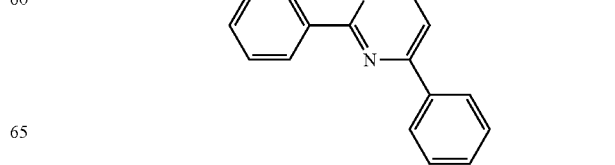

H-E66
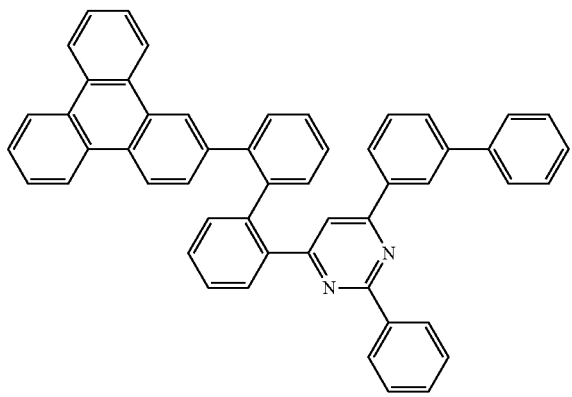
H-E67
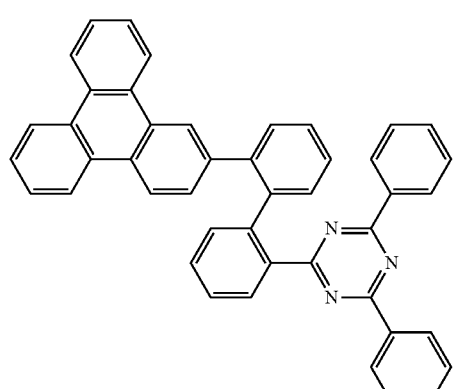
H-E68
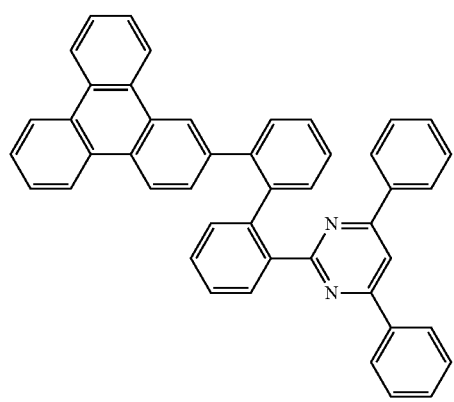
H-E69
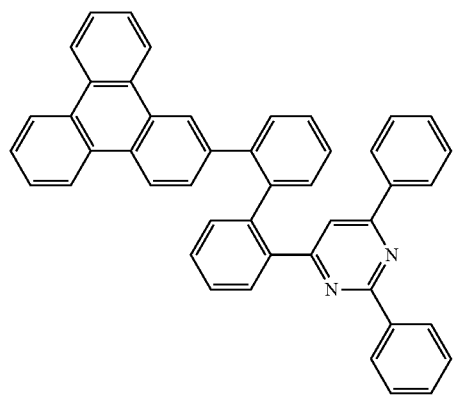
H-E70
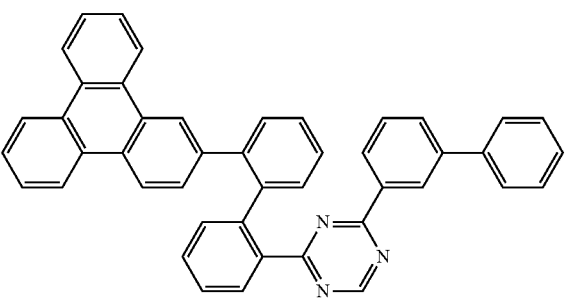
H-E71
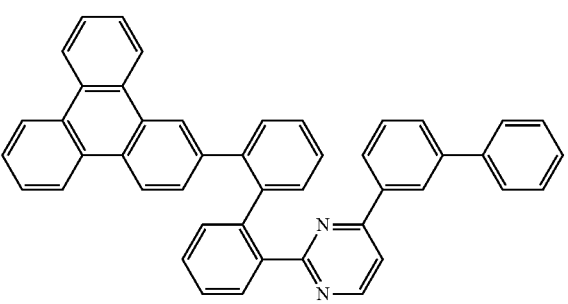
H-E72
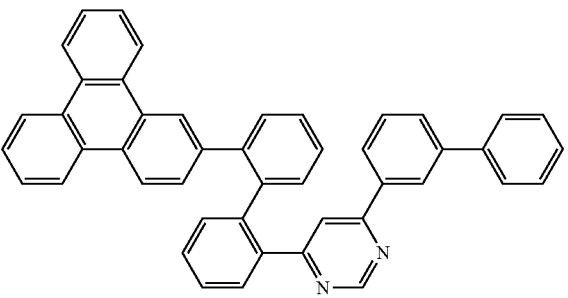
H-E73
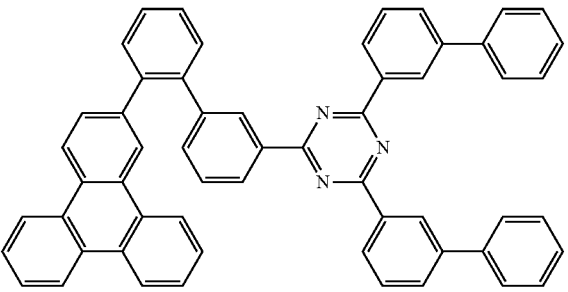
H-E74
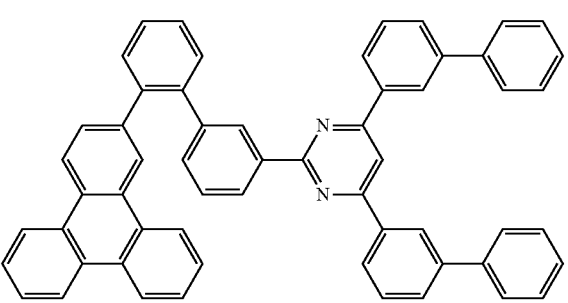

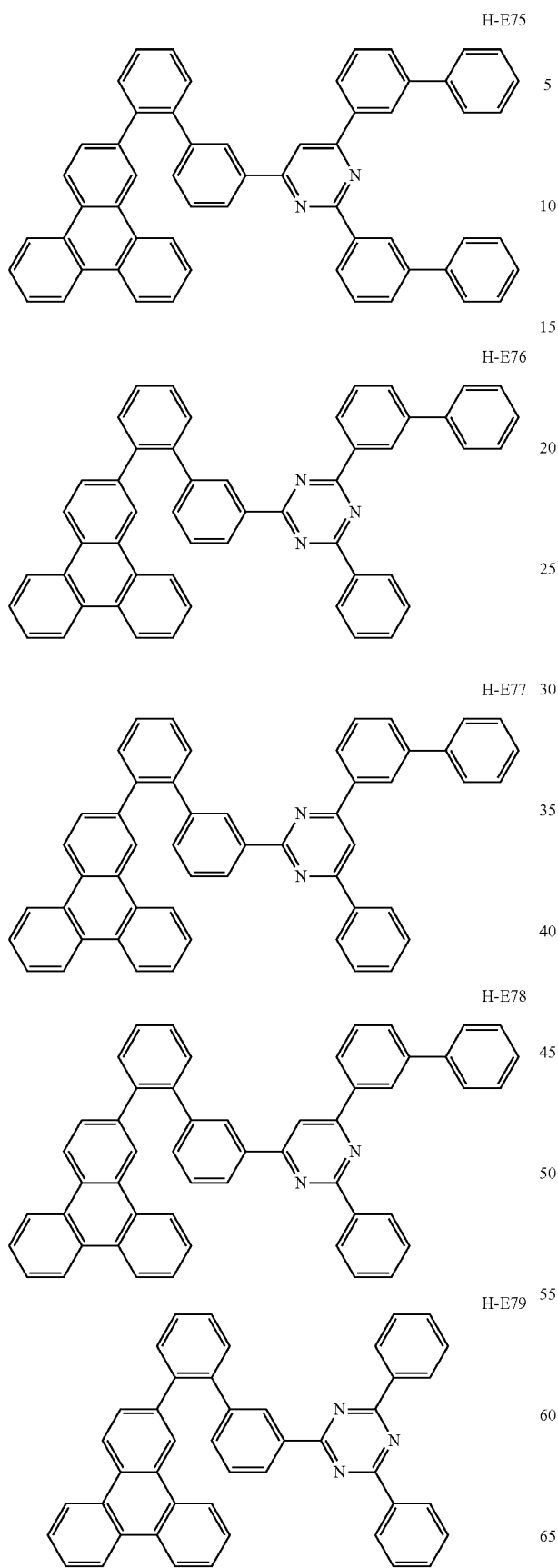
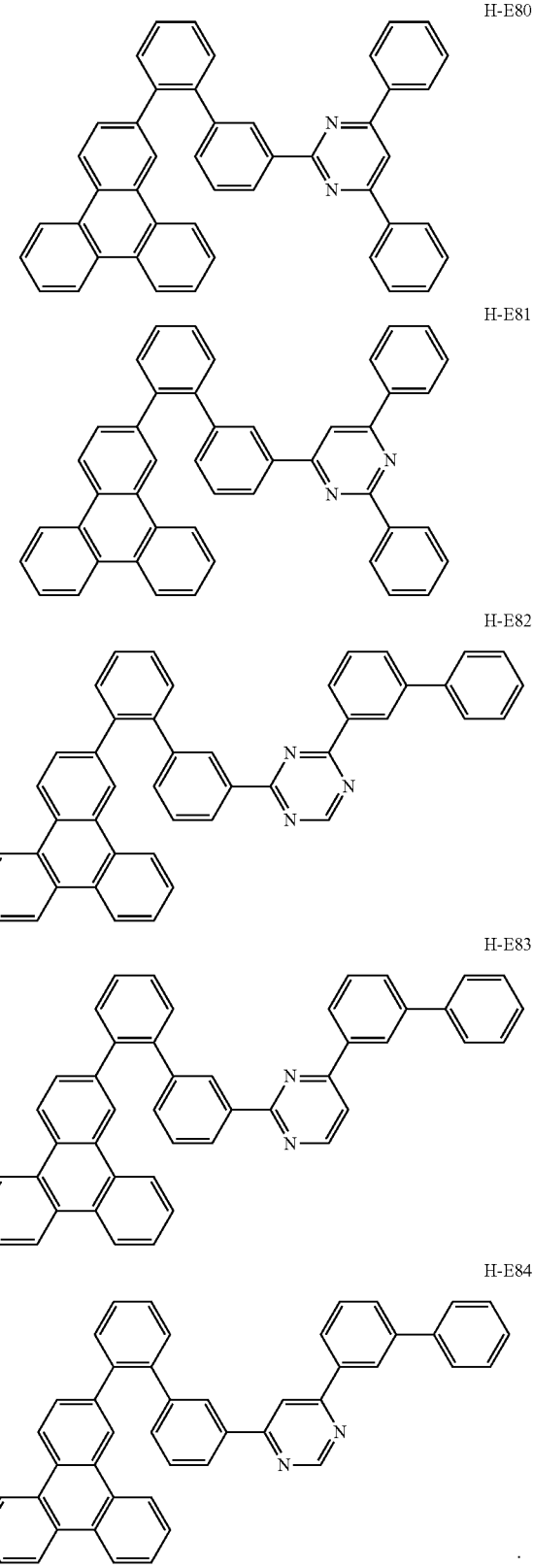
In an embodiment, the hole transport host may be selected from Compounds H-H1 to H-H103, but embodiments of the present disclosure are not limited thereto:

H-H1
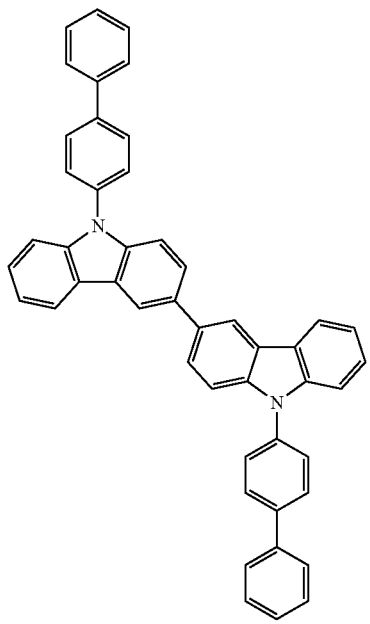
H-H2
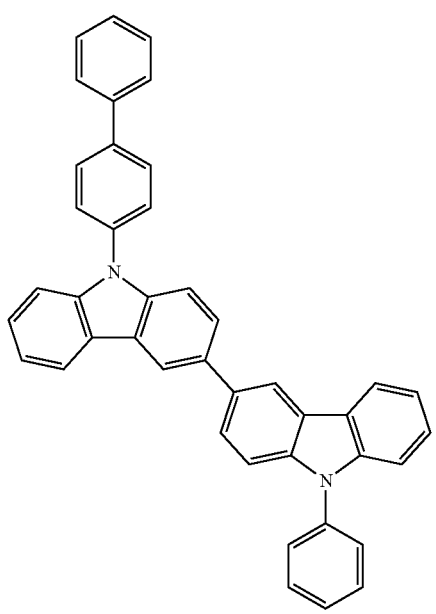
H-H3
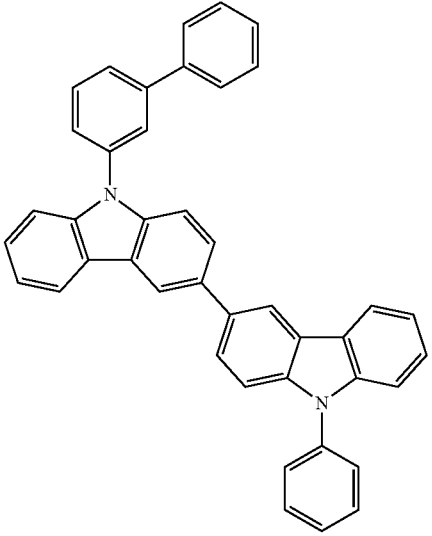
H-H4
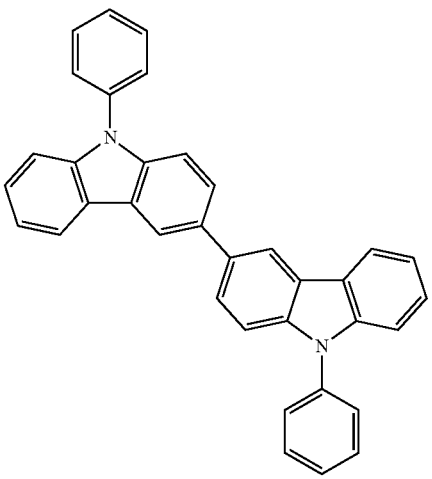
H-H5
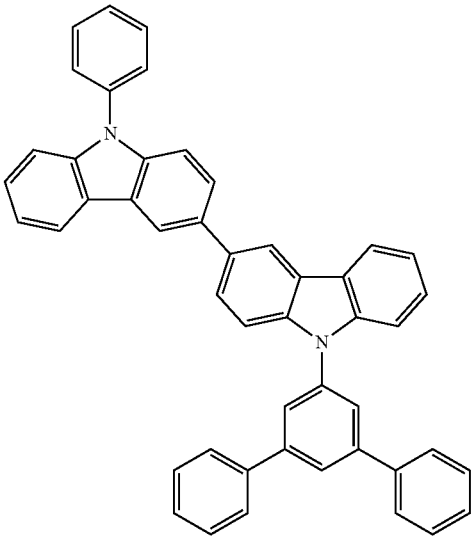

H-H6
H-H7
H-H8
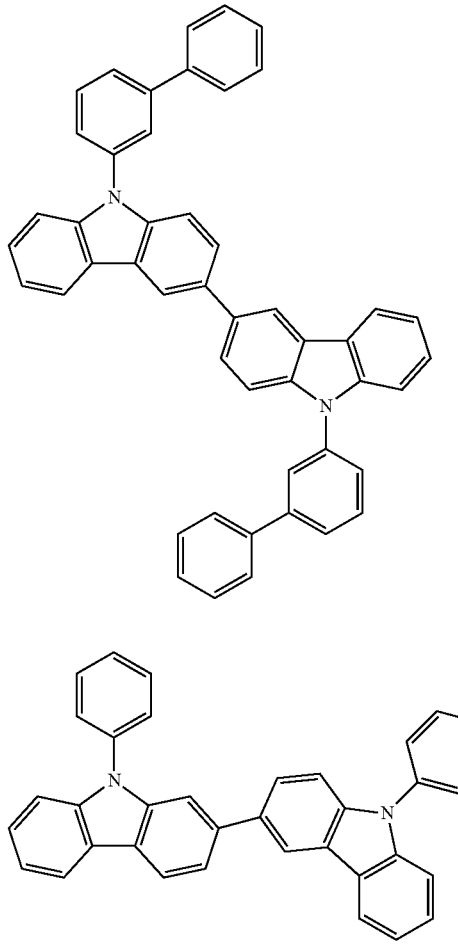
H-H9
H-H10
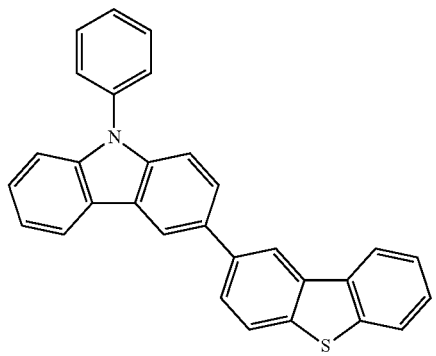
H-H11
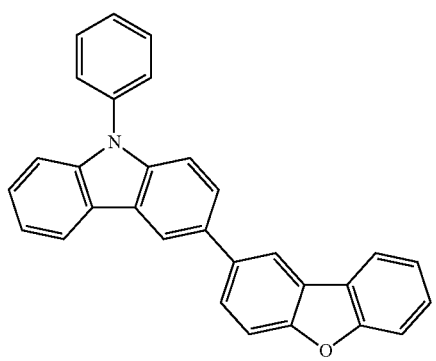

249
-continued
H-H12
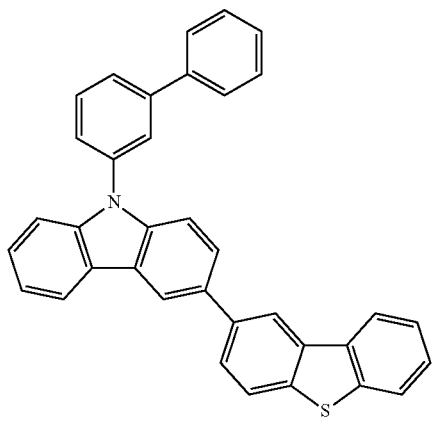
H-H13
H-H14
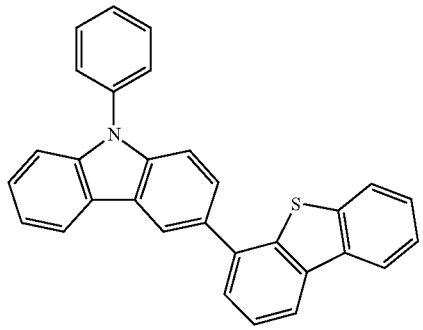
H-H15
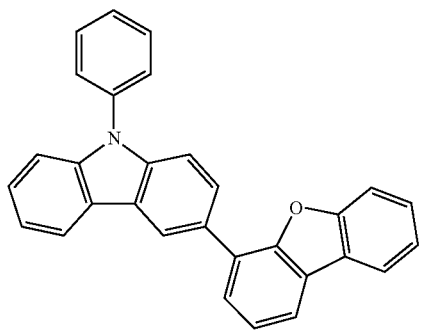
250
-continued
H-H16
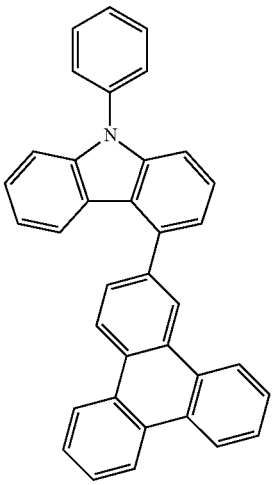
H-H17
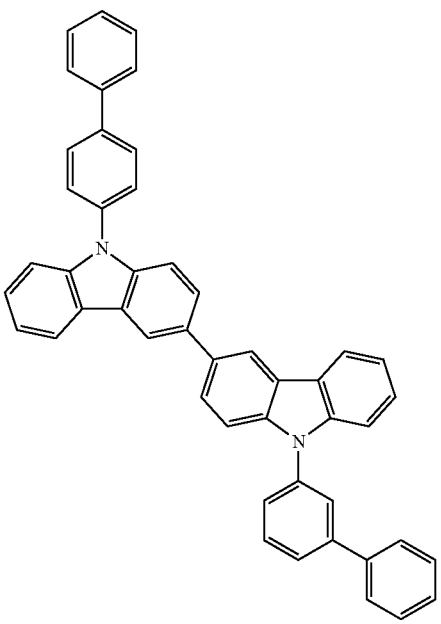
H-H18
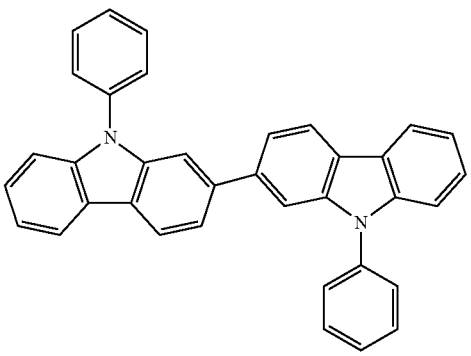

H-H19
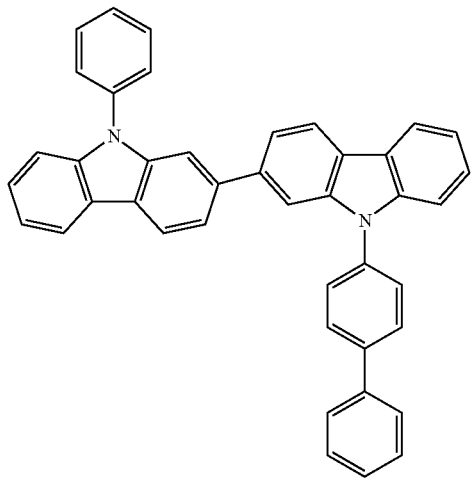
H-H20
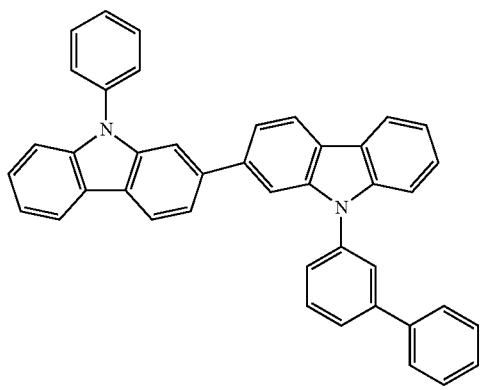
H-H21
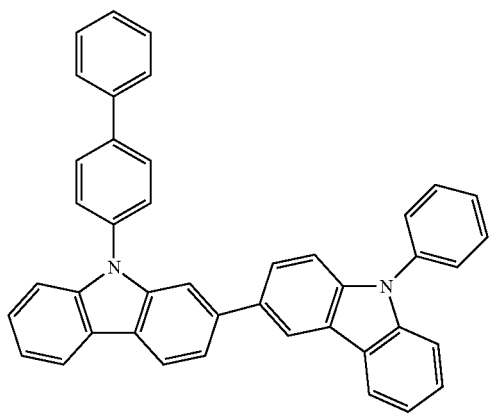
H-H22
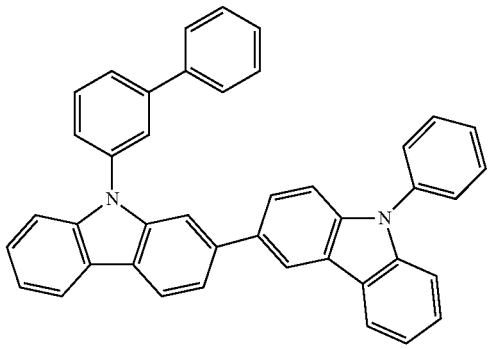
H-H23
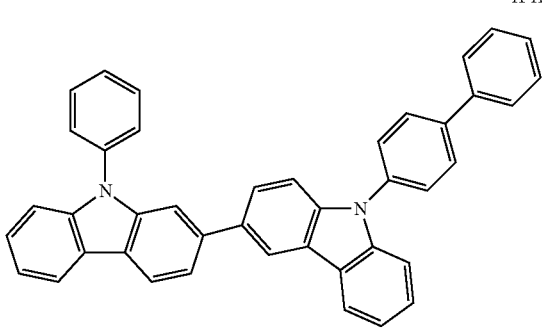
H-H24
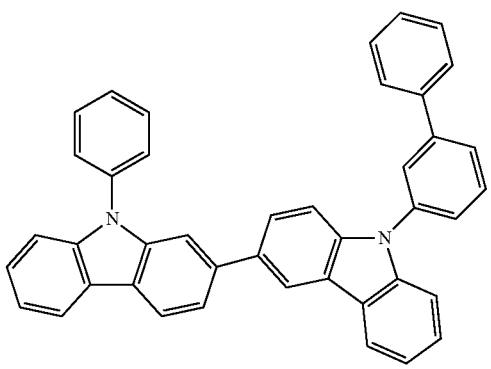
H-H25
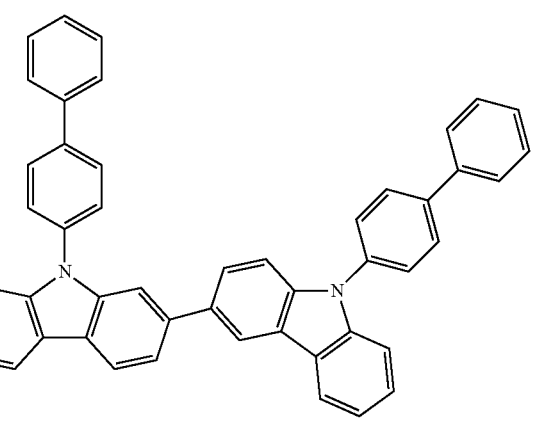

-continued
H-H26
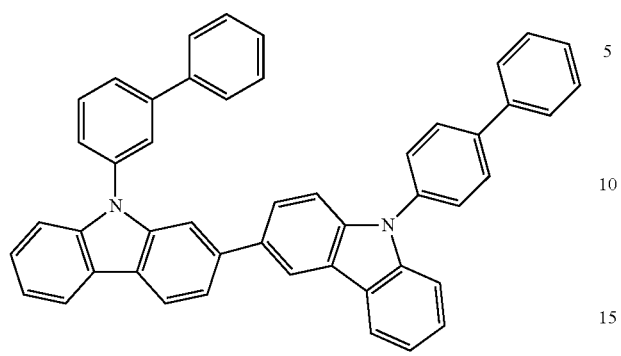
H-H27
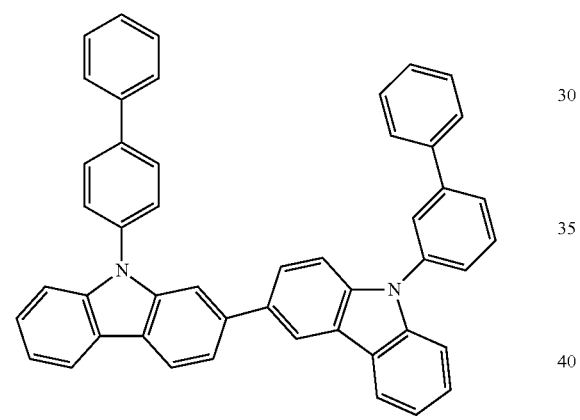
H-H28
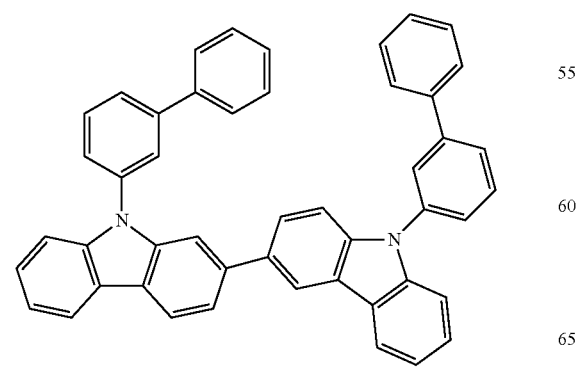
-continued
H-H29
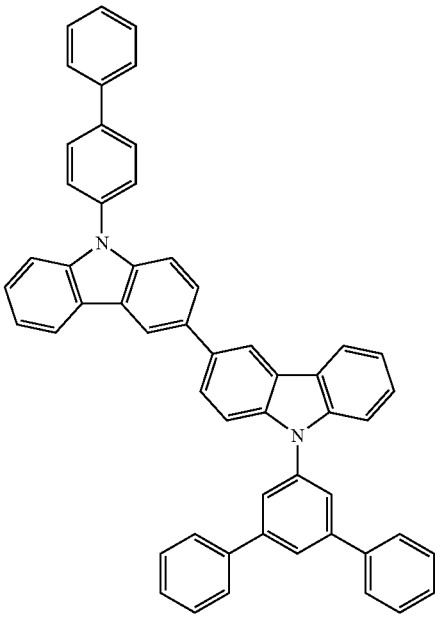
H-H30
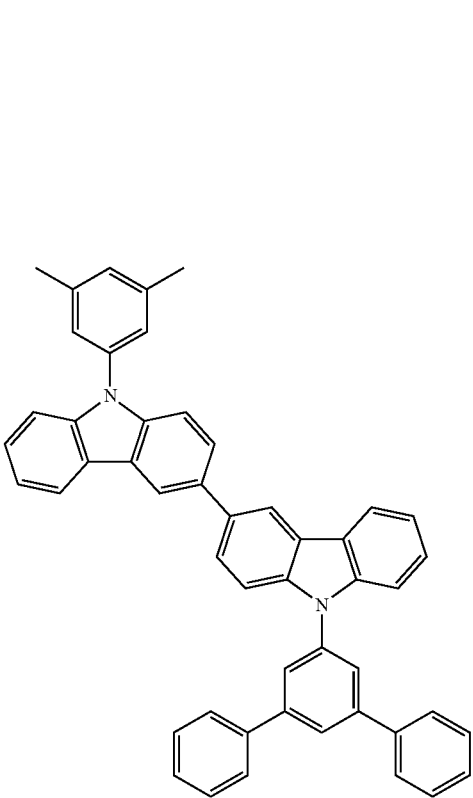

H-H31
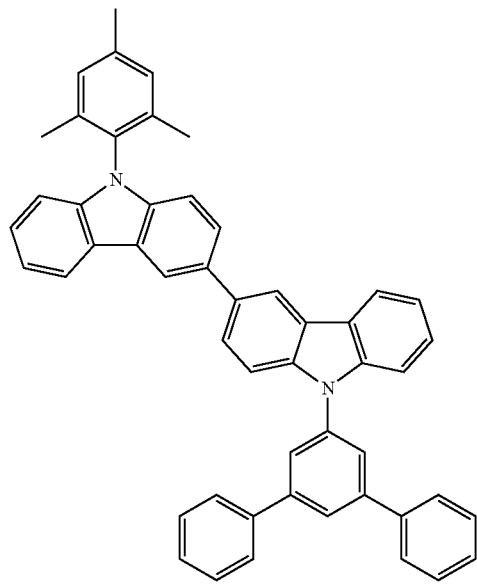
H-H32
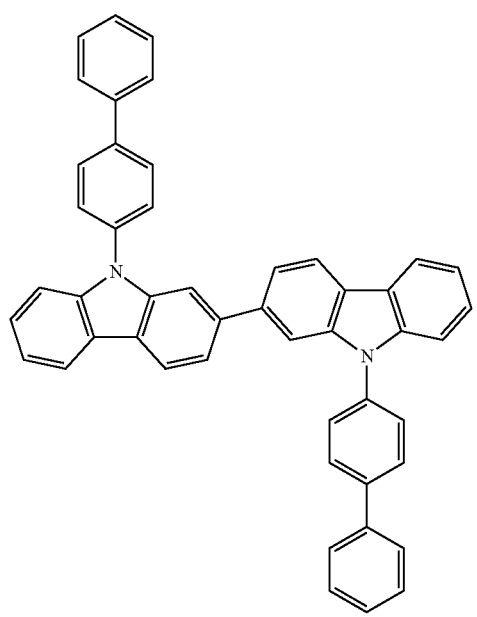
H-H33
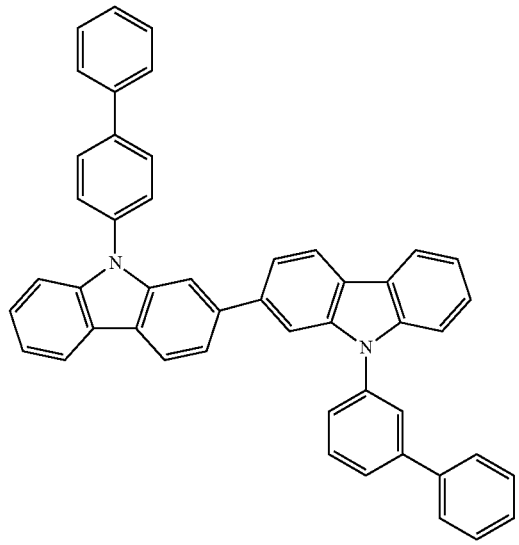
H-H34
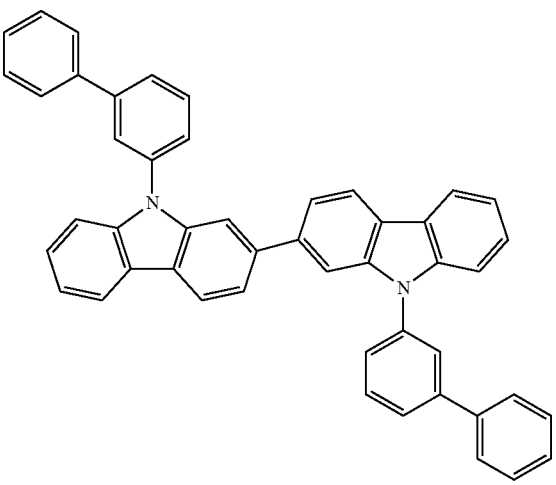
H-H35
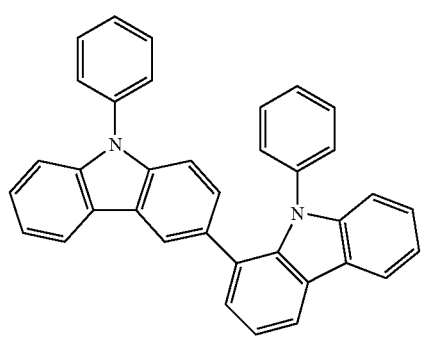

H-H36
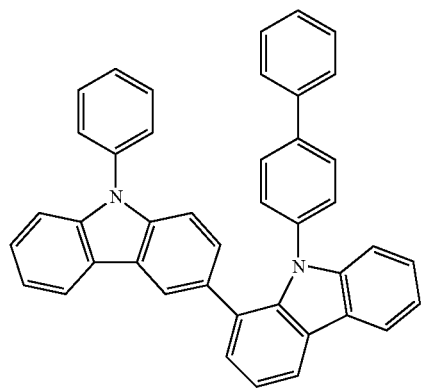
H-H37
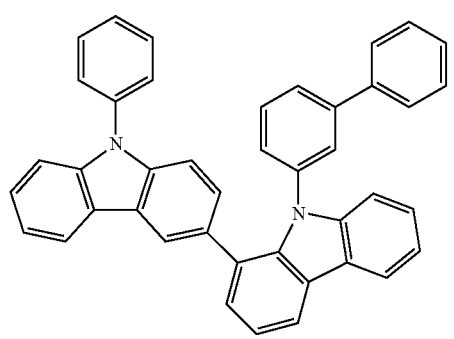
H-H38
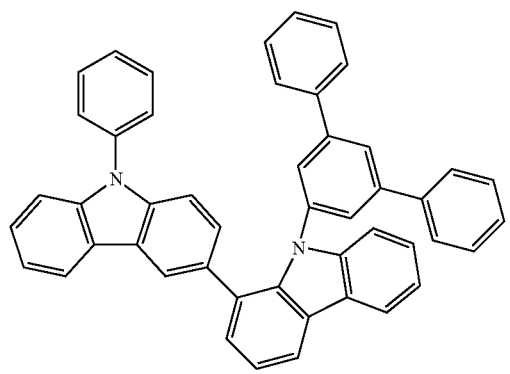
H-H39
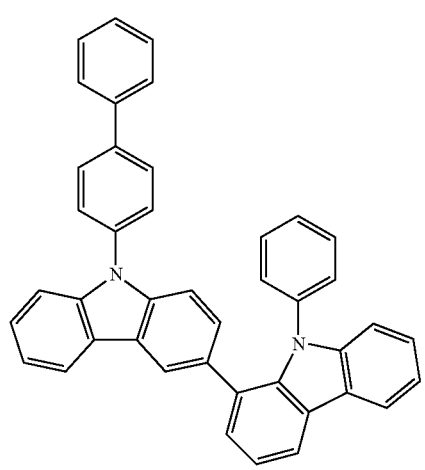
H-H40
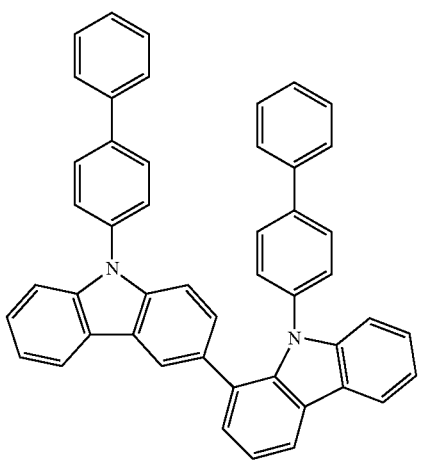
H-H41
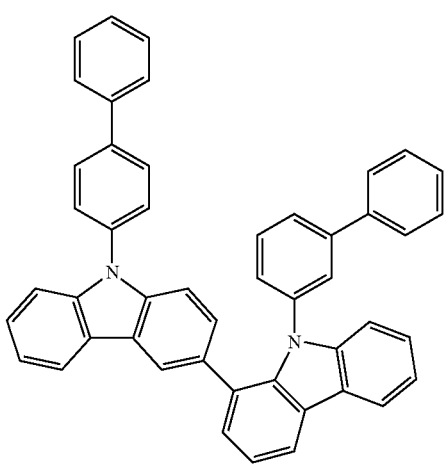
H-H42
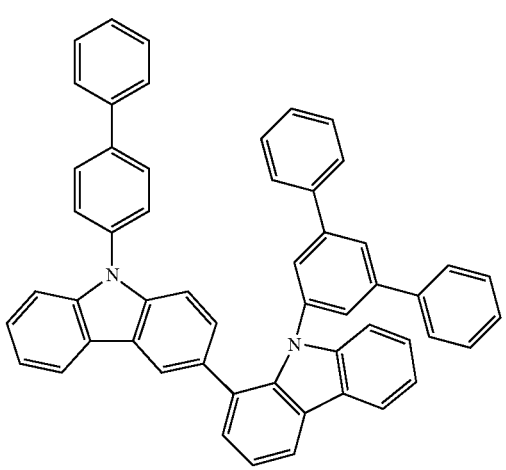

H-H43
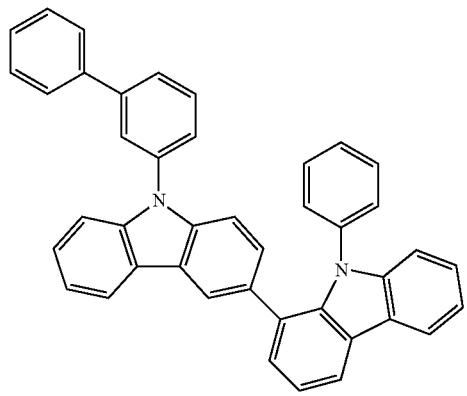
H-H44
H-H45
H-H46
H-H47
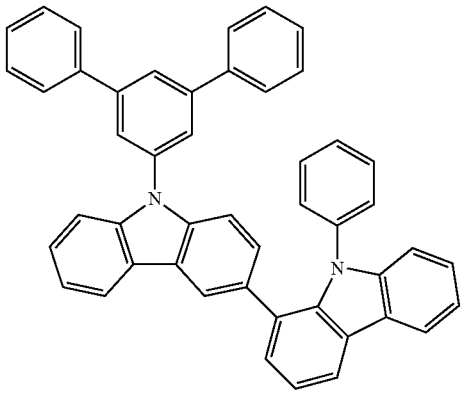
H-H48
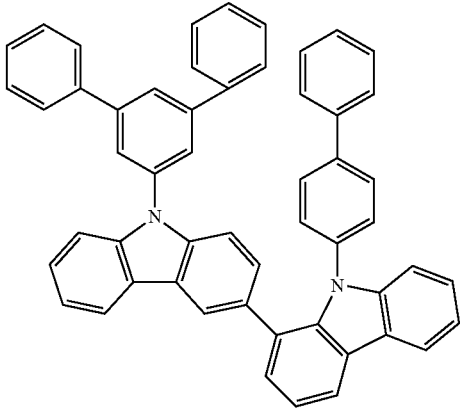
H-H49
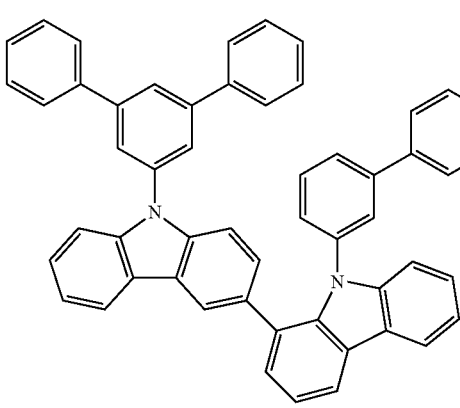
H-H50
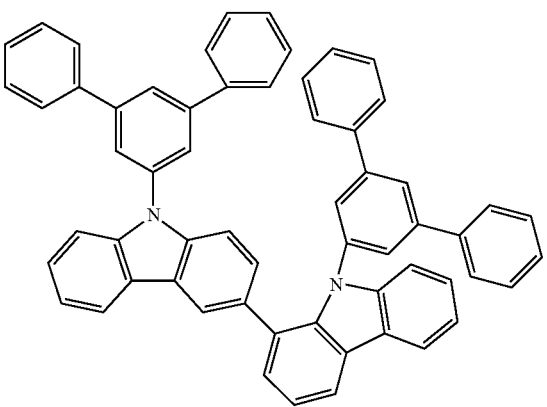

H-H51
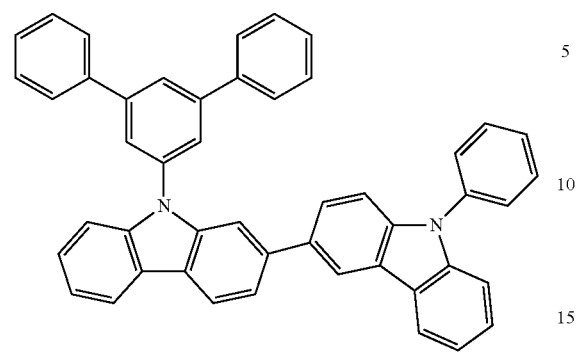
H-H52
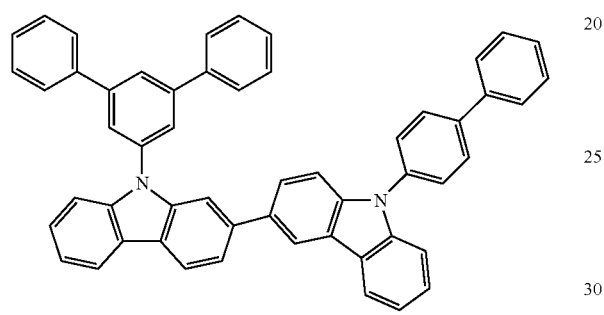
H-H53
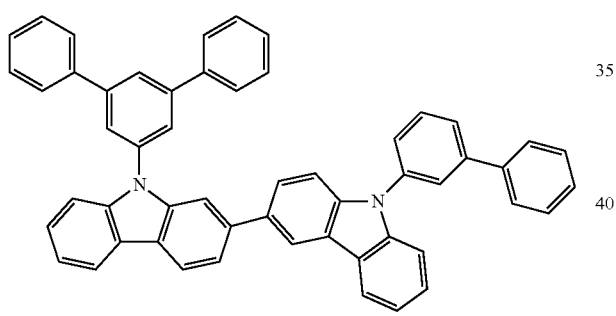
H-H54
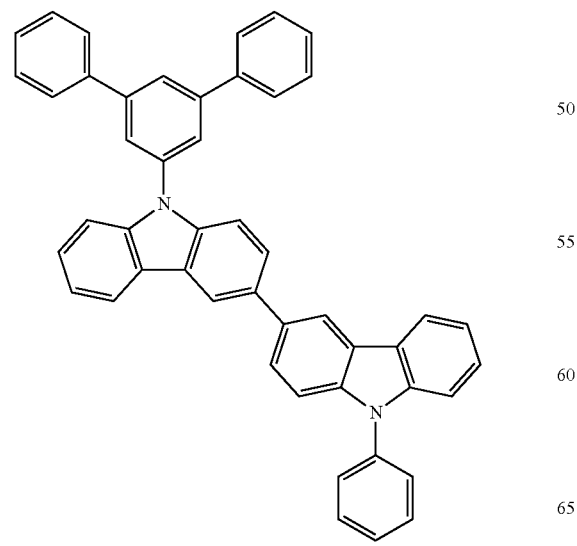
H-H55
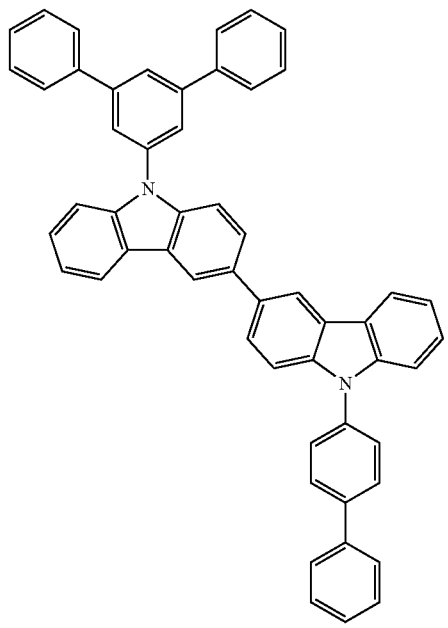
H-H56
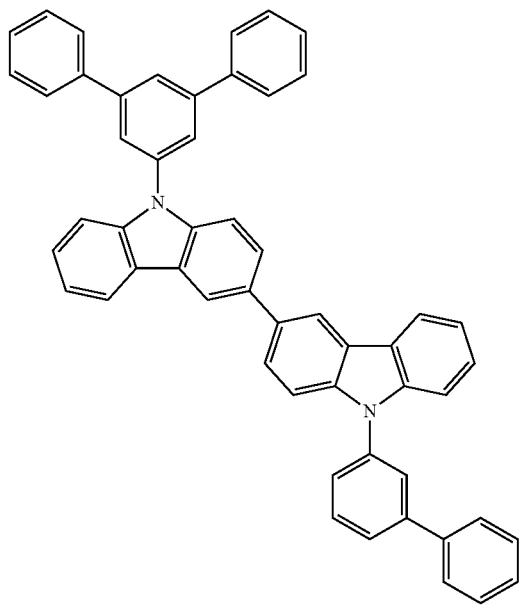

H-H57
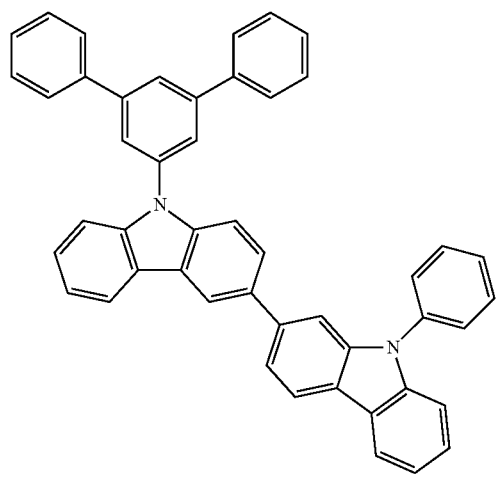
H-H58
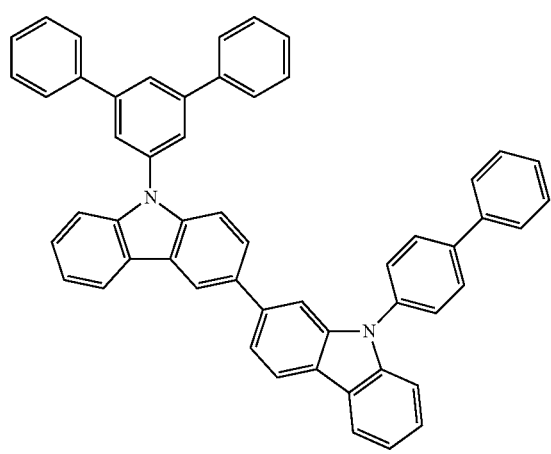
H-H59
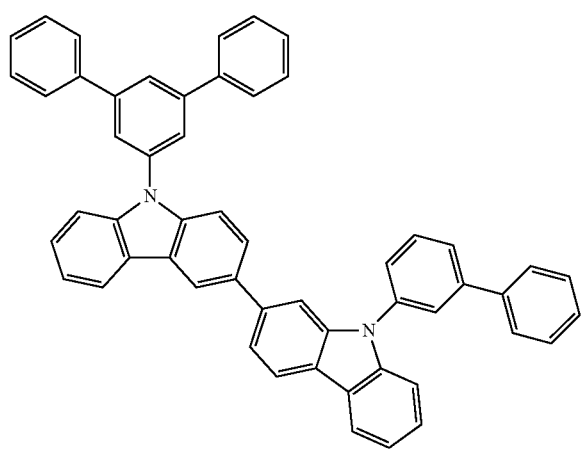
H-H60
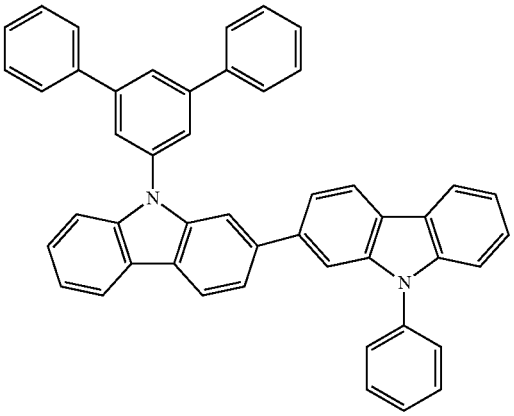
H-H61
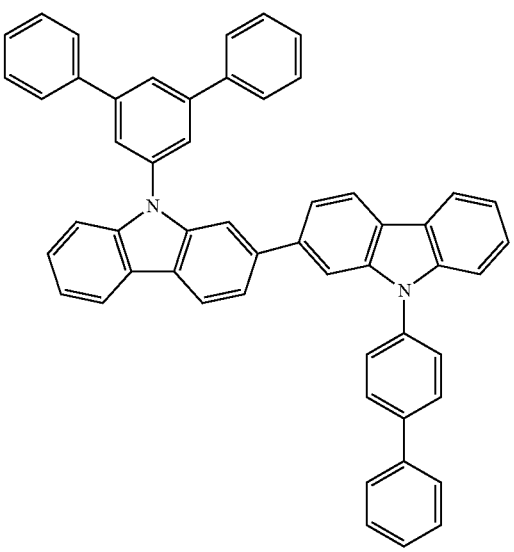
H-H62
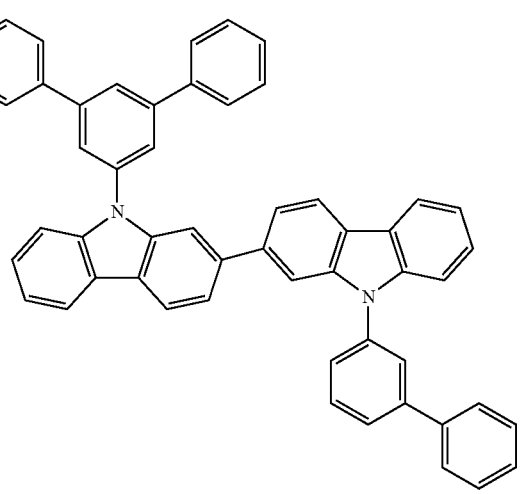

H-H63
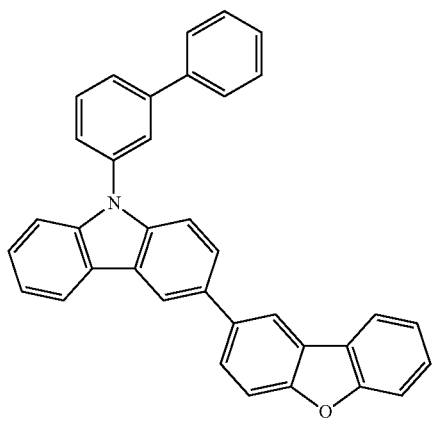
H-H64
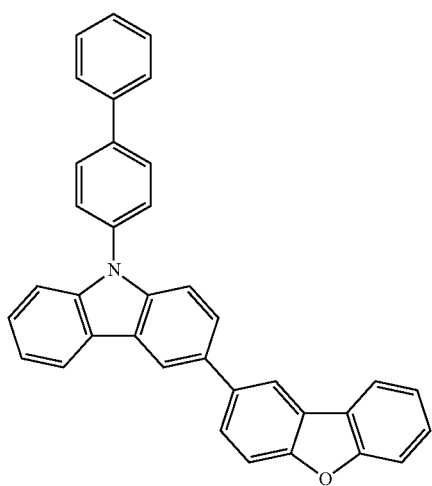
H-H65
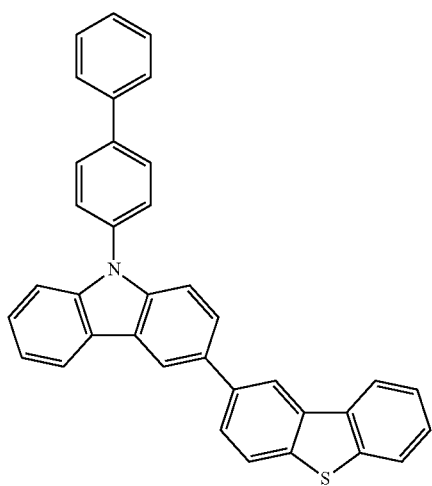
H-H66
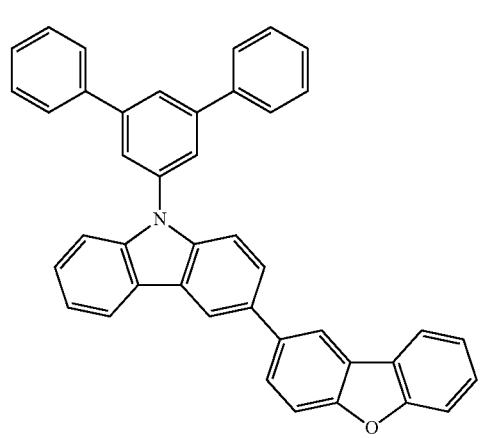
H-H67
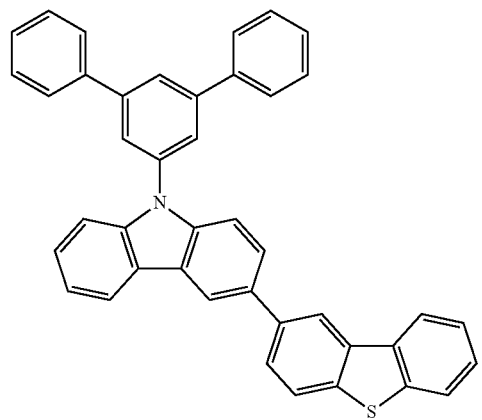
H-H68
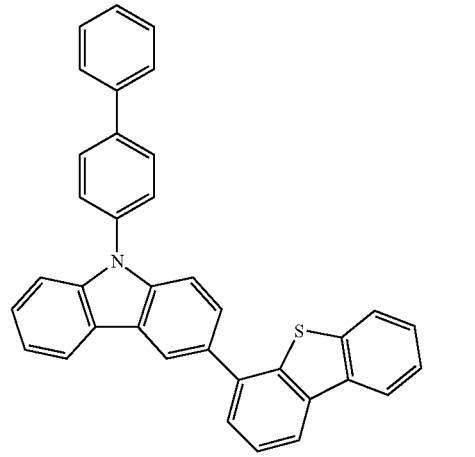

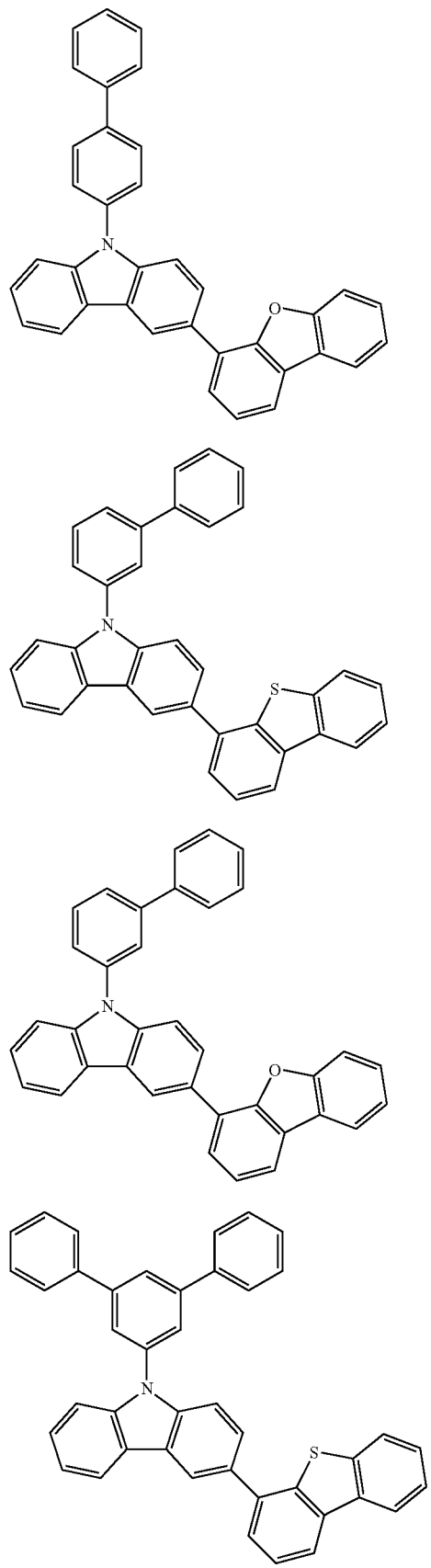
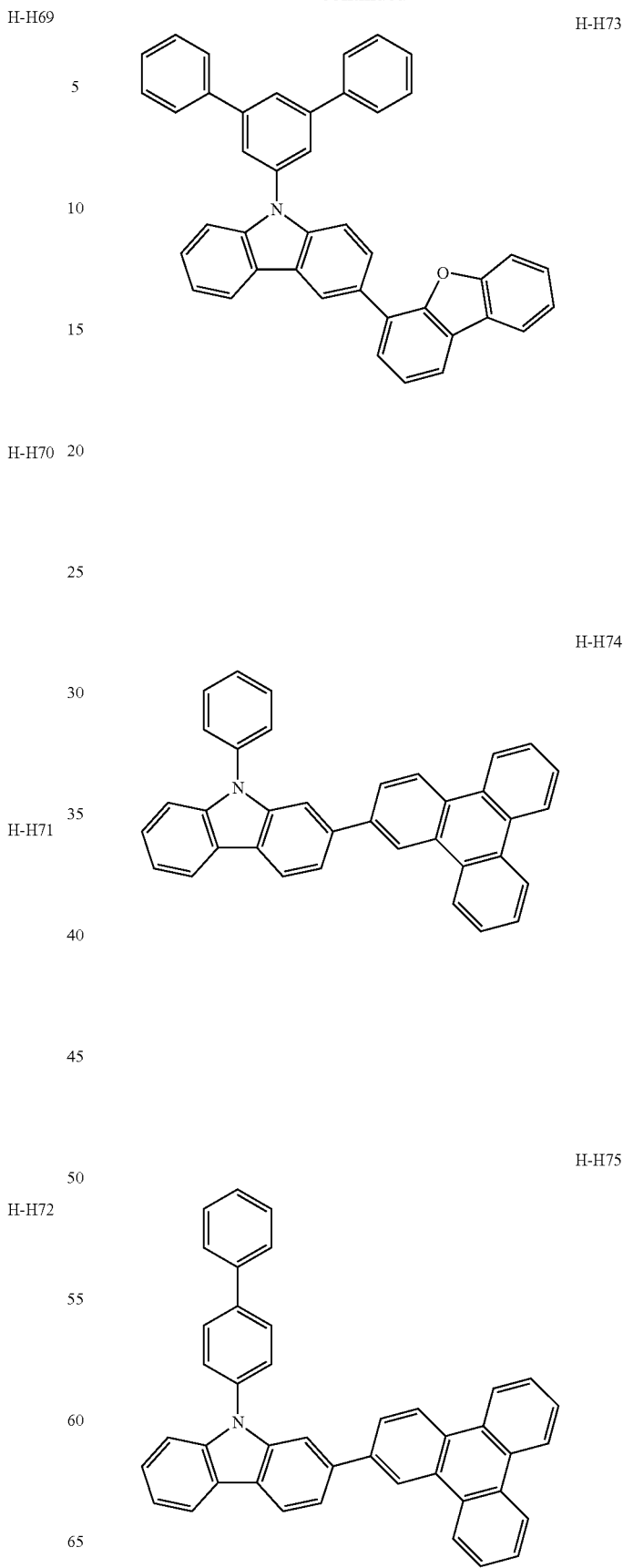

H-H76
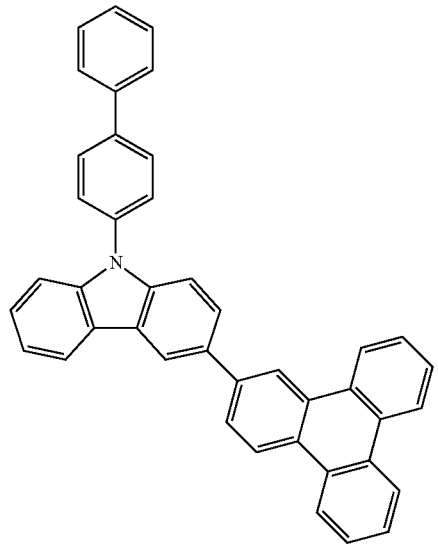
H-H77
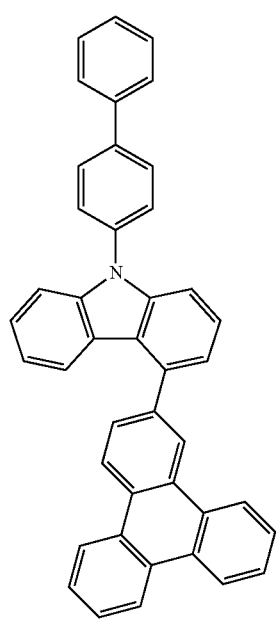
H-H78
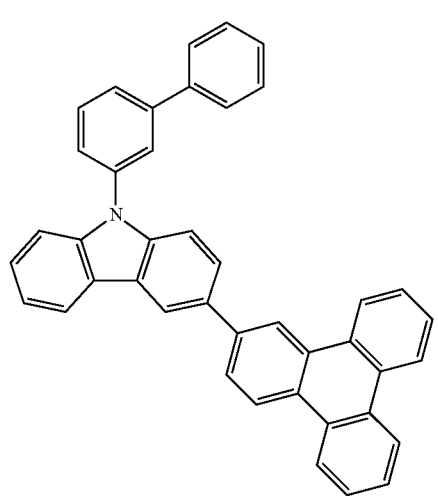
H-H79
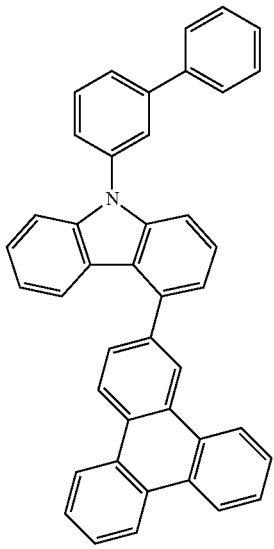
H-H80
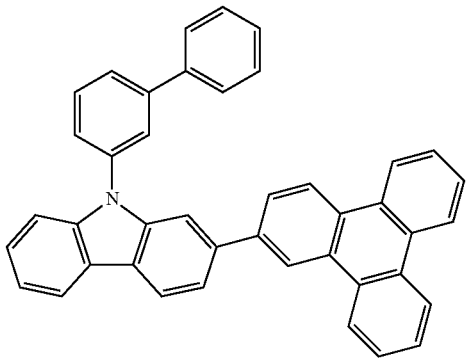
H-H81
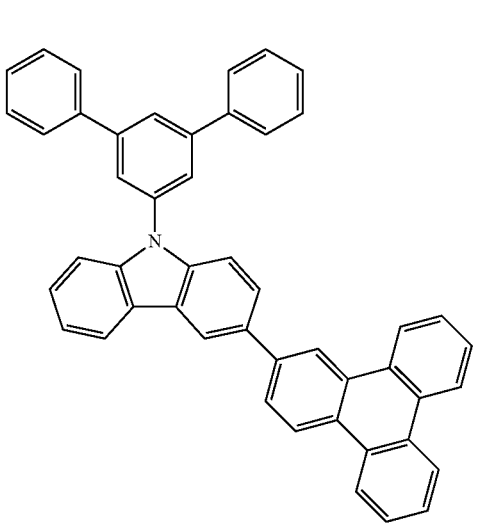

271
-continued
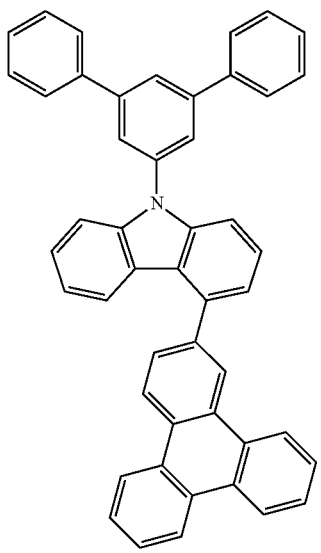
H-H82
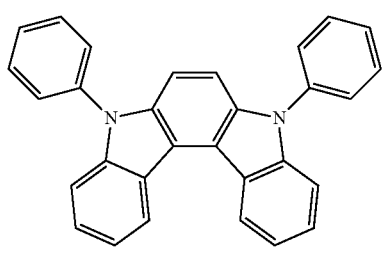
H-H83
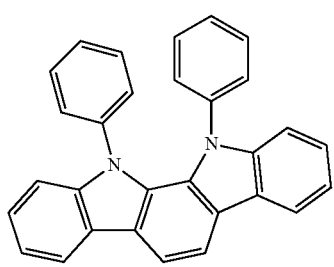
H-H84
H-H85
272
-continued
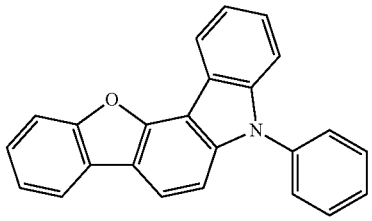
H-H86
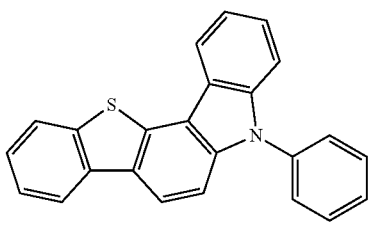
H-H87
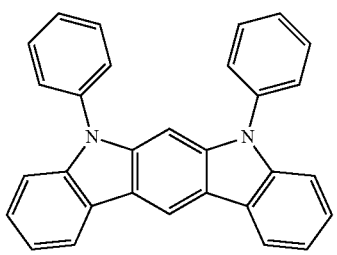
H-H88
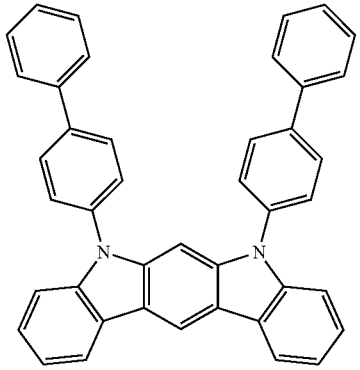
H-H89
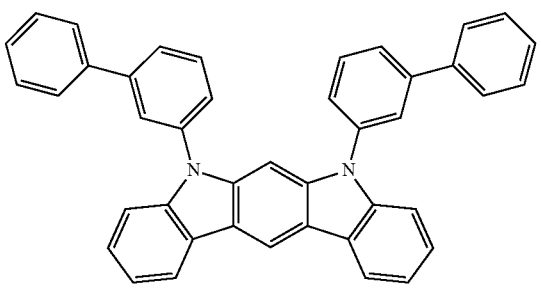
H-H90

H-H91
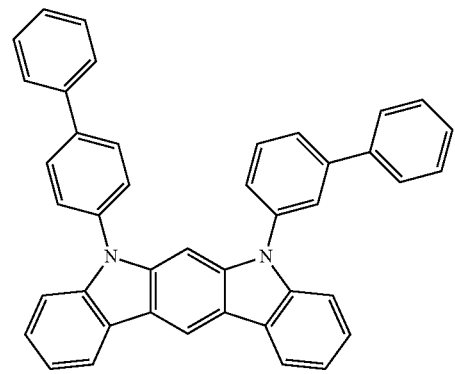
H-H95
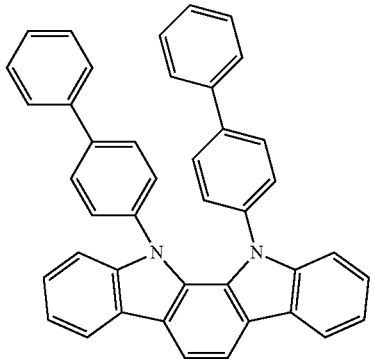
H-H92
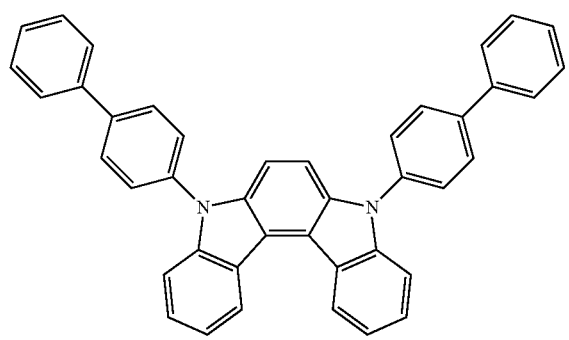
H-H96
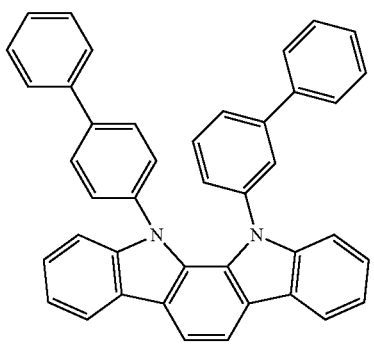
H-H93
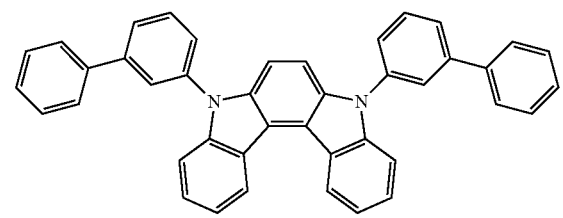
H-H97
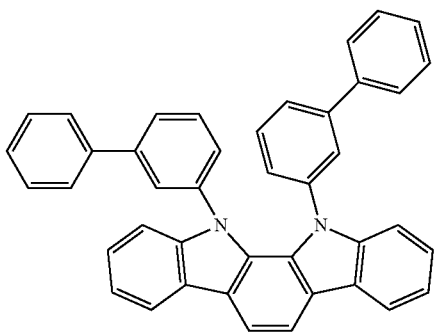
H-H94
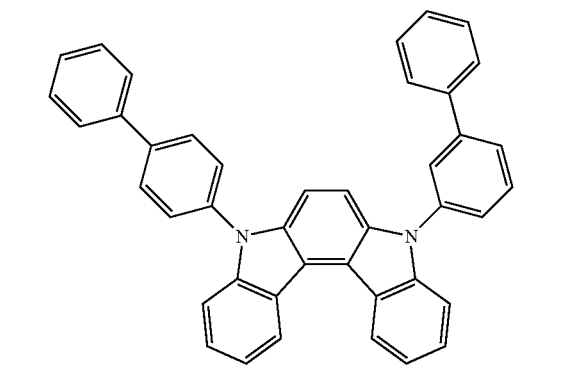
H-H98
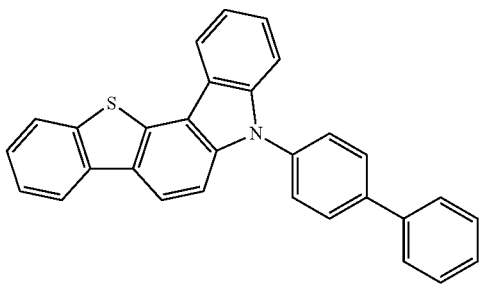
H-H99
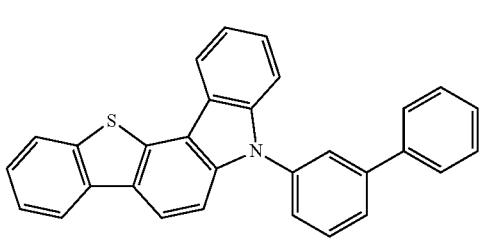

H-H100

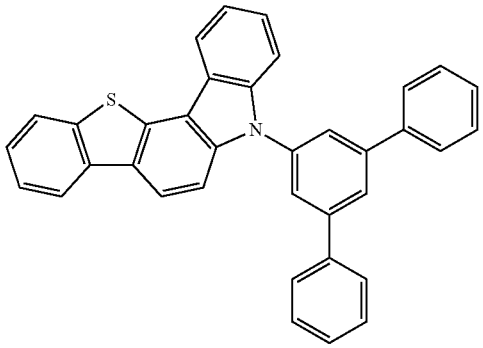

H-H101

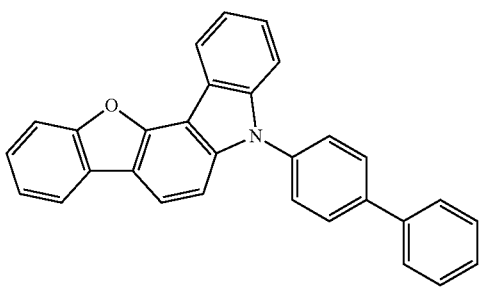

H-H102

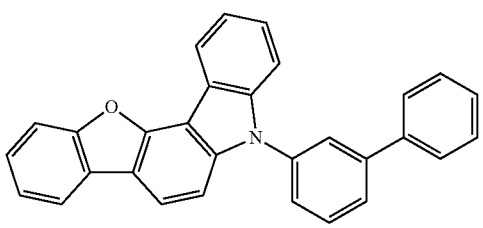

H-H103

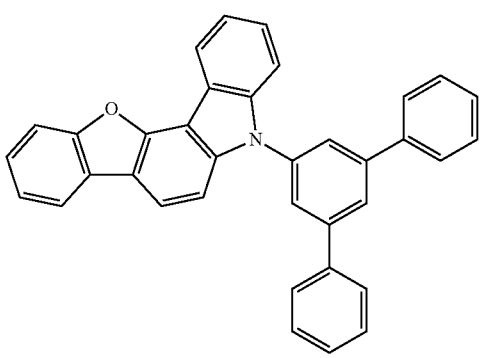

In an embodiment, the host may include an electron transport host and a hole transport host, the electron transport host may include a triphenylene group and a triazine group, and the hole transport host may include a carbazole group, but embodiments of the present disclosure are not limited thereto.

A weight ratio of the electron transport host to the hole transport host may be in a range of 1:9 to 9:1, for example, 2:8 to 8:2. In an embodiment, the weight ratio of the electron transport host to the hole transport host may be in a range of 4:6 to 6:4. While not wishing to be bound by theory, it is understood that when the weight ratio of the electron trans- port host to the hole transport host is within these ranges, hole and electron transport balance into the emission layer 15 may be achieved.

First Hole Transport Material of Intermediate Layer 13 and Second Hole Transport Material of Hole Transport Region 12

The first hole transport material included in the intermediate layer 13 may be selected from materials satisfying a condition of HOMO(h1)−HOMO(host)<0.

For example, the first hole transport material included in the intermediate layer 13 and the second hole transport material included in the hole transport region 12 may each independently be selected from amine-based compounds.

In an embodiment, the first hole transport material and the second hole transport material may each independently be selected from amine-based compounds satisfying a condition of HOMO(h1)−HOMO(h2)<0.

In an embodiment, the first hole transport material may be different from the second hole transport material.

In an embodiment, the first hole transport material and the second hole transport material may each independently be selected from compounds represented by Formulae 201 to 205, but embodiments of the present disclosure are not limited thereto:

Formula 201
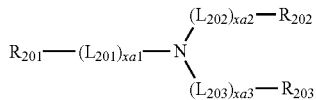

Formula 202
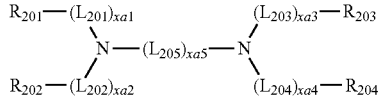

Formula 203
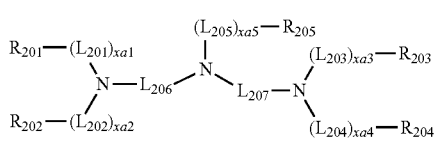

Formula 204
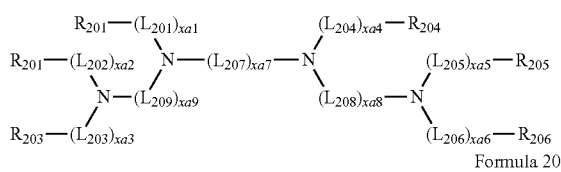

Formula 205
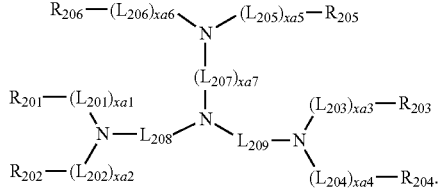

In Formulae 201 to 205, $L_{201}$ to $L_{209}$ may each independently be *—O—*', *—S—*', a substituted or unsubstituted $C_5$-$C_{60}$ carbocyclic group, or a substituted or unsubstituted $C_1$-$C_{60}$ heterocyclic group, xa1 to xa9 may each independently be an integer from 0 to 5, and $R_{201}$ to $R_{206}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, and a substituted or unsubstituted monovalent non-aromatic condensed heteropolycyclic group, and two neighboring groups selected from $R_{201}$ to $R_{206}$ may optionally be linked via a single bond, a dimethyl-methylene group, or a diphenyl-methylene group.

For example, $L_{201}$ to $L_{209}$ may be selected from a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a corozene group, an ovalene group, a pyrrole group, an iso-indole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothioenocarbazole group, and a triindolobenzene group, each unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, and —Si($Q_{11}$)($Q_{12}$)($Q_{13}$), xa1 to xa9 may each independently be 0, 1, or 2, and $R_{201}$ to $R_{206}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an indeno carbazolyl group, an indolocarbazolyl group, a benzofurocarbazolyl group, and a benzothienocarbazolyl group, each unsubstituted or substituted with at least one selected from deuterium, —F, —Cl, —Br, —I, a hydroxy group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$).

In one or more embodiments, the first hole transport material of the intermediate layer 13 may be selected from carbazole group-free amine-based compounds.

In one or more embodiments, the first hole transport material of the intermediate layer 13 may be selected from compounds represented by Formula 201, which do not include a carbazole group.

In one or more embodiments, the first hole transport material of the intermediate layer 13 be selected from compounds represented by Formula 201, which do not include a carbazole group and include at least one of a dibenzofuran group, a dibenzothiophene group, a fluorene group, a spiro-bifluorene group, an indenocarbazole group, an indolocarbazole group, a benzofurocarbazole group, and a benzothienocarbazole group.

In one or more embodiments, the first hole transport material of the intermediate layer 13 is selected from compounds represented by Formula 202, provided that, in Formula 202, xa5 is 1, 2, or 3, xa3 and xa4 are each 0, and $R_{203}$ and $R_{204}$ are linked via a single bond, a dimethyl-methylene group, or a diphenyl-methylene group.

In one or more embodiments, the second hole transport material of the hole transport region 12 may be selected from carbazole group-containing amine-based compounds.

In one or more embodiments, the second hole transport material of the hole transport region 12 may be selected from compounds represented by Formula 201, which include a carbazole group and further include at least one of a dibenzofuran group, a dibenzothiophene group, a fluorene group, a spiro-bifluorene group, an indenocarbazole group, an indolocarbazole group, a benzofurocarbazole group, and a benzothienocarbazole group.

In one or more embodiments, the second hole transport material of the hole transport region 12 may be selected from compounds represented by Formula 201 or 202, which include a carbazole group.

In one or more embodiments, the first hole transport material of the intermediate layer 13 may be selected from compounds represented by Formula 201-1 or 202-1, and the second hole transport material of the hole transport region 12 may be selected from compounds represented by Formula 201-2, but embodiments of the present disclosure are not limited thereto:

Formula 201-1

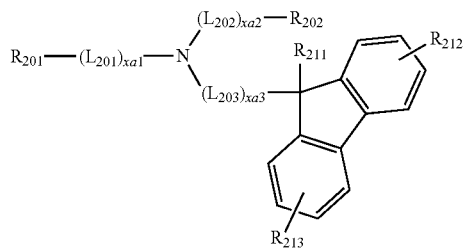

Formula 201-2

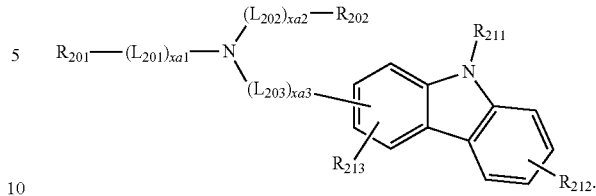

Formula 202-1

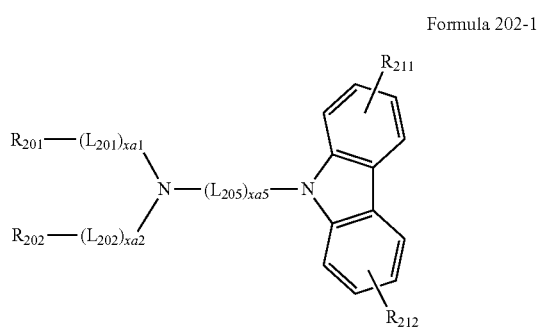

In Formulae 201-1, 202-1, and 201-2, $L_{201}$ to $L_{203}$, $L_{205}$, xa1 to xa3, xa5, $R_{201}$, and $R_{202}$ are each independently the same as described herein, and $R_{211}$ to $R_{213}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a dimethylfluorenyl group, a diphenyl fluorenyl group, a triphenylenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

For example, the first hole transport material may be selected from Compounds HT3 to HT5, HT16 to HT24, HT35, and HT37 to HT39, and the second hole transport material may be selected from HT1, HT2, HT6 to HT15, HT25 to HT34, and HT36, but embodiments of the present disclosure are not limited thereto:

HT1

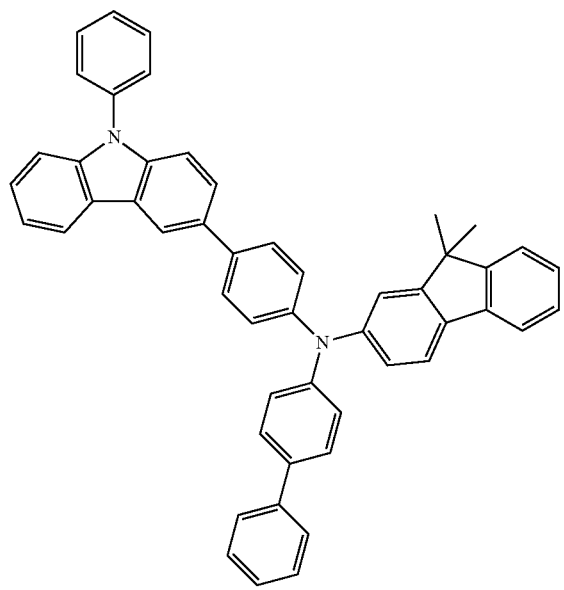

HT2

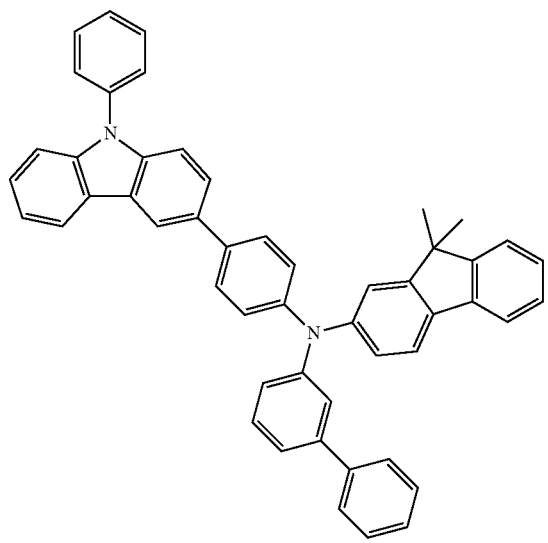

-continued
281 HT3
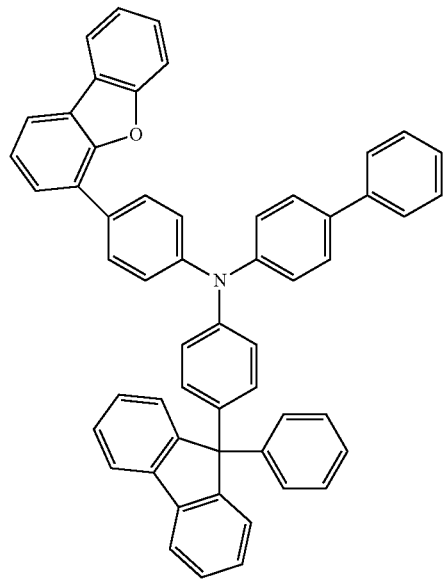
282 HT4
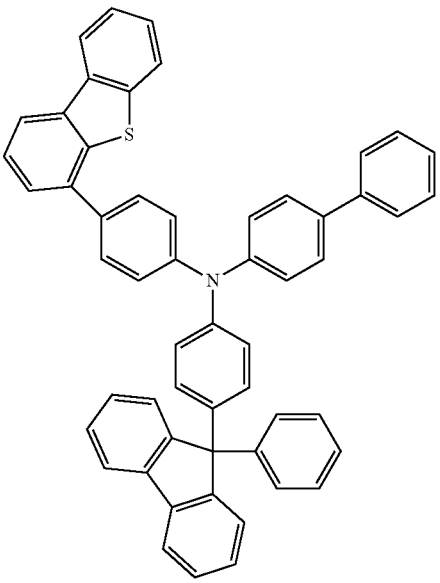
HT5
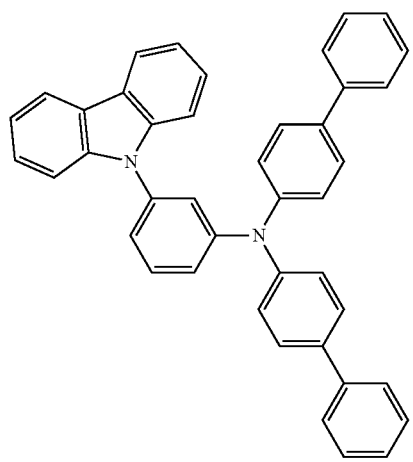
HT6
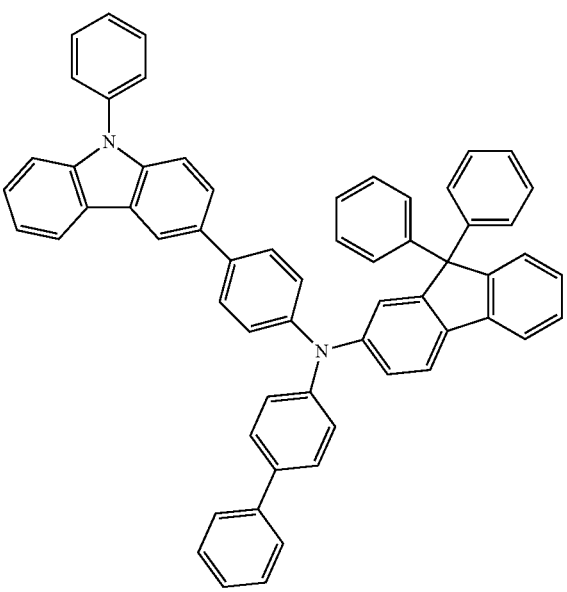

-continued
HT7
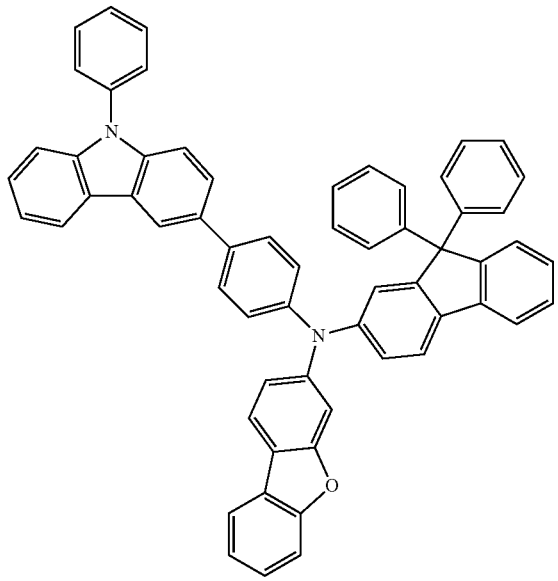
HT8
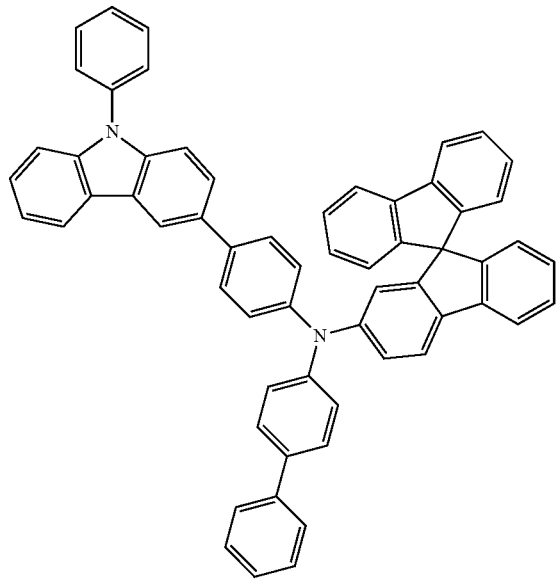
HT9
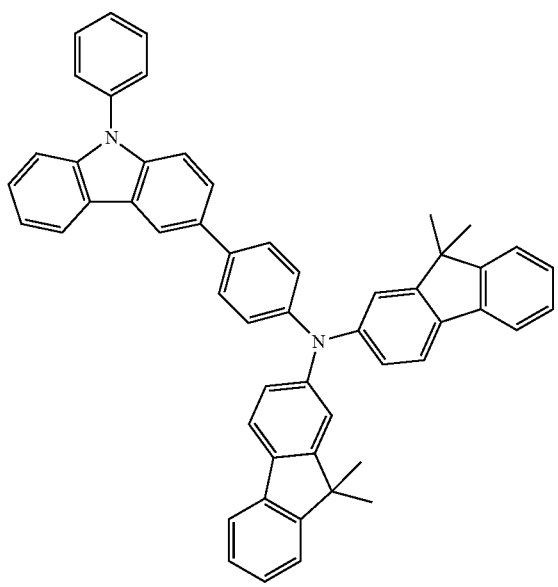
HT10
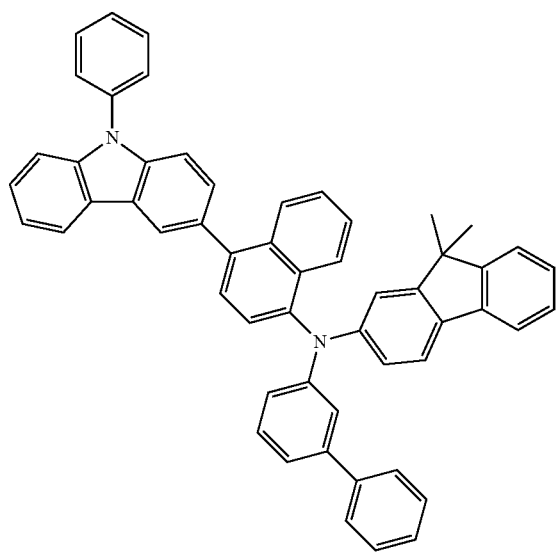

-continued
HT11
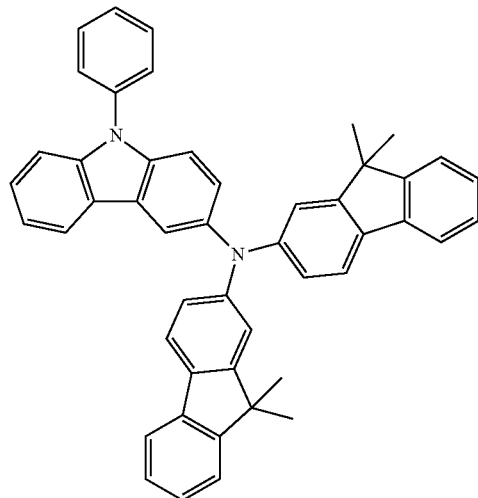
HT12
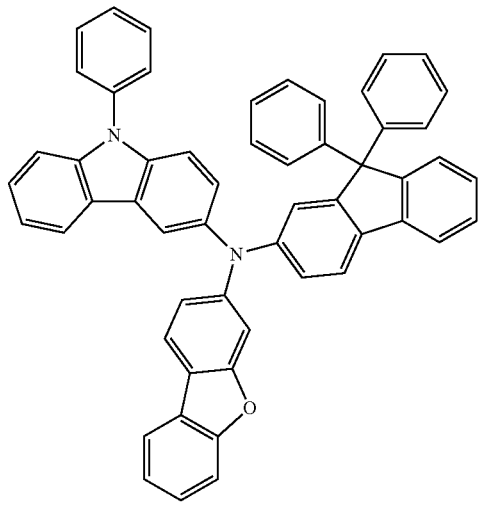
HT13
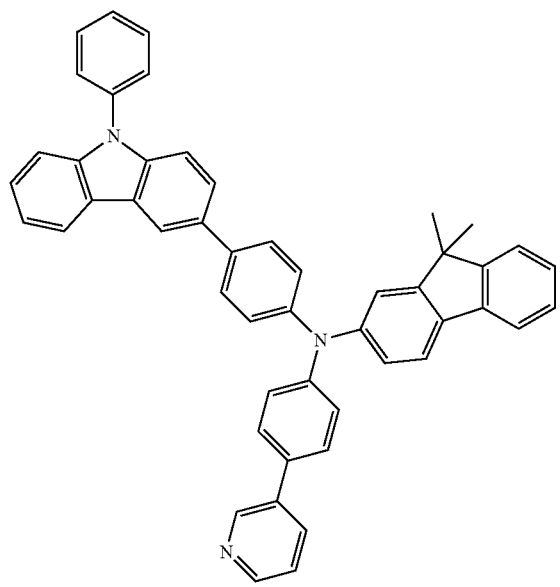
HT14
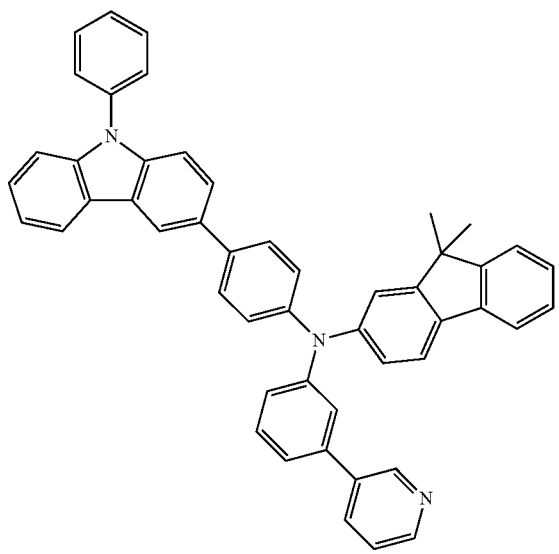
HT15
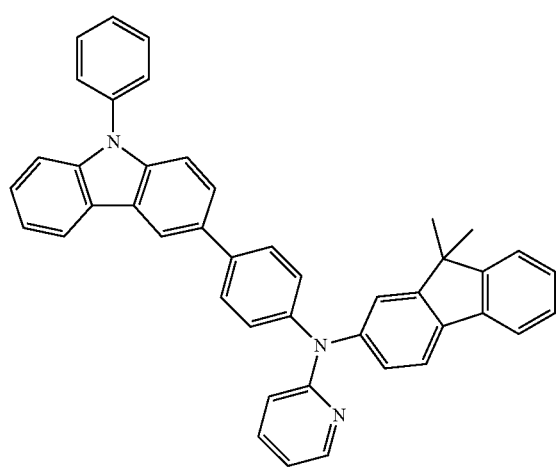
HT16
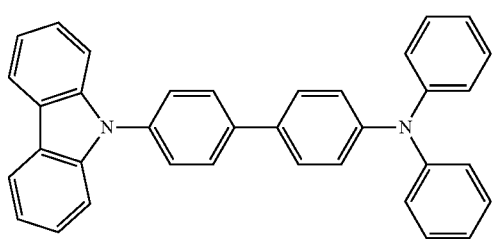

-continued
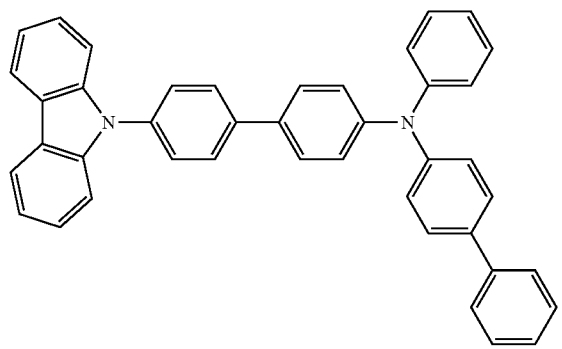

-continued
HT21
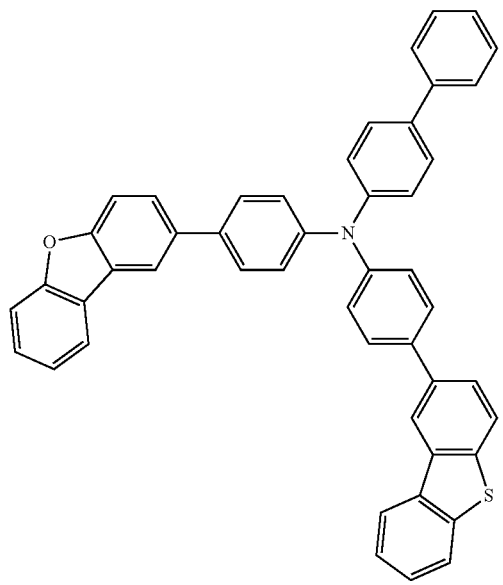
HT22
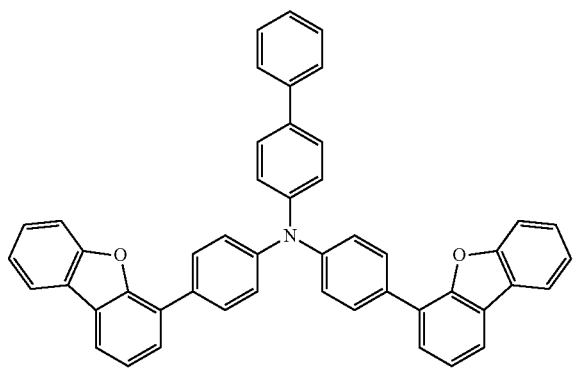
HT23
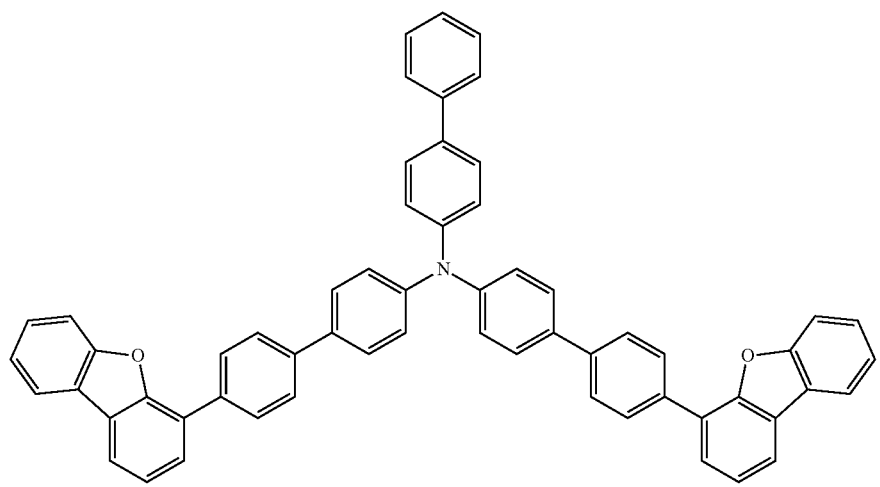
HT24
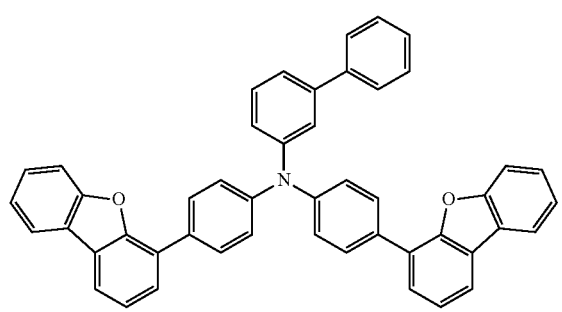
HT25
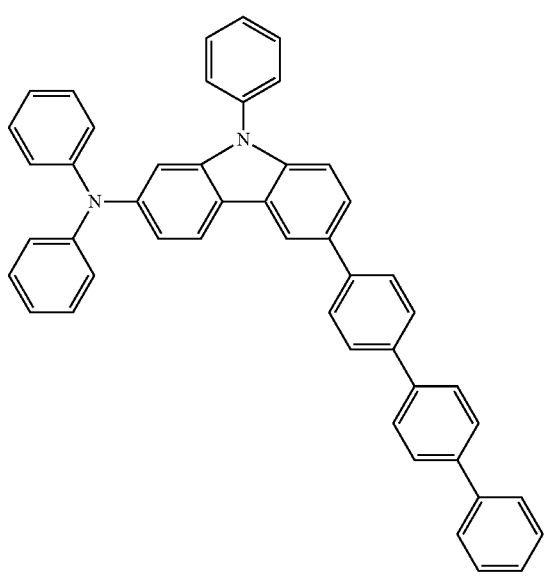

-continued
291 HT26
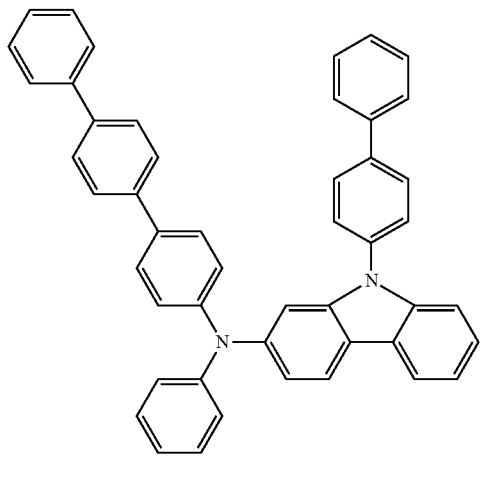
292 HT27
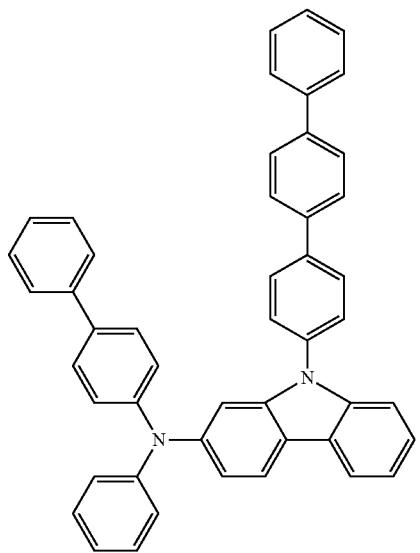
HT28
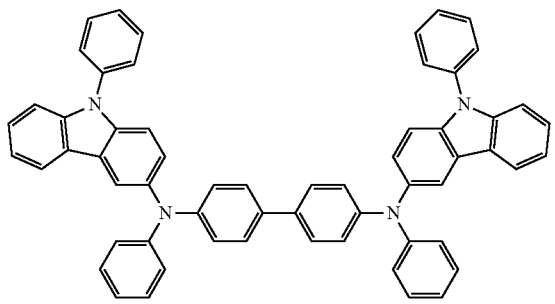
HT29
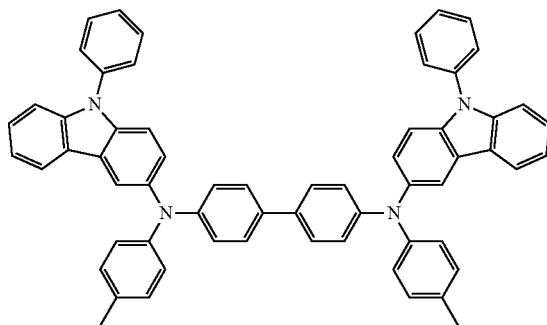
HT30
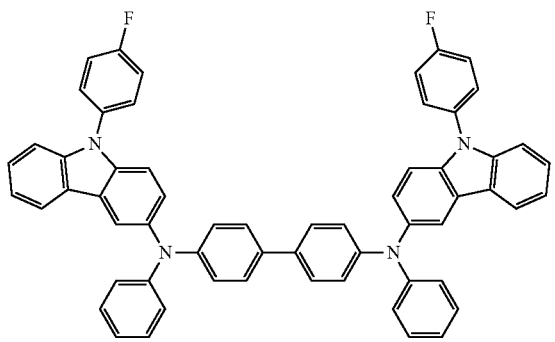
HT31
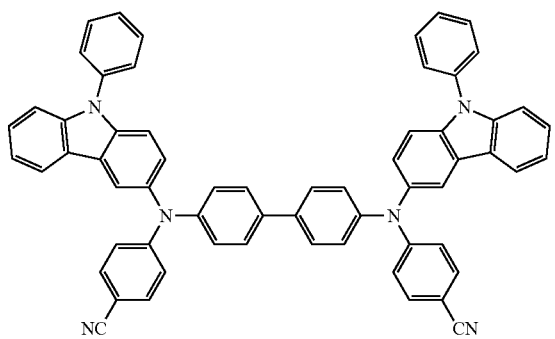

-continued
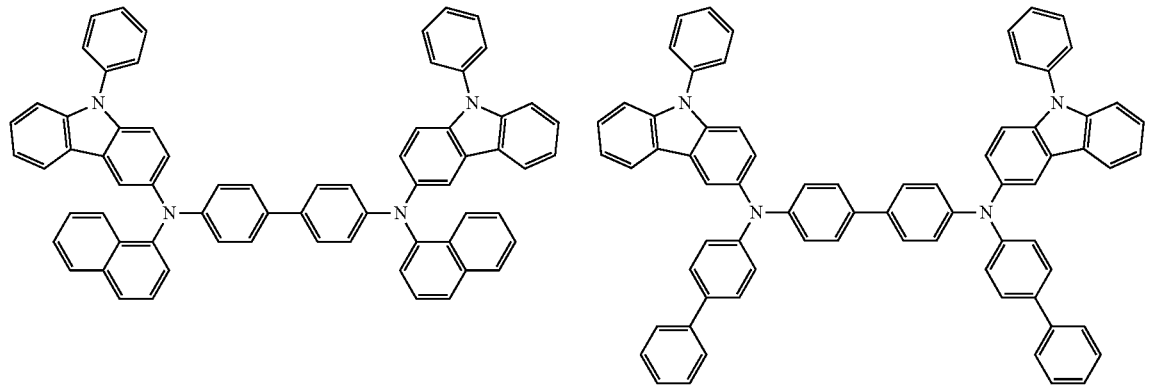
HT32  HT33
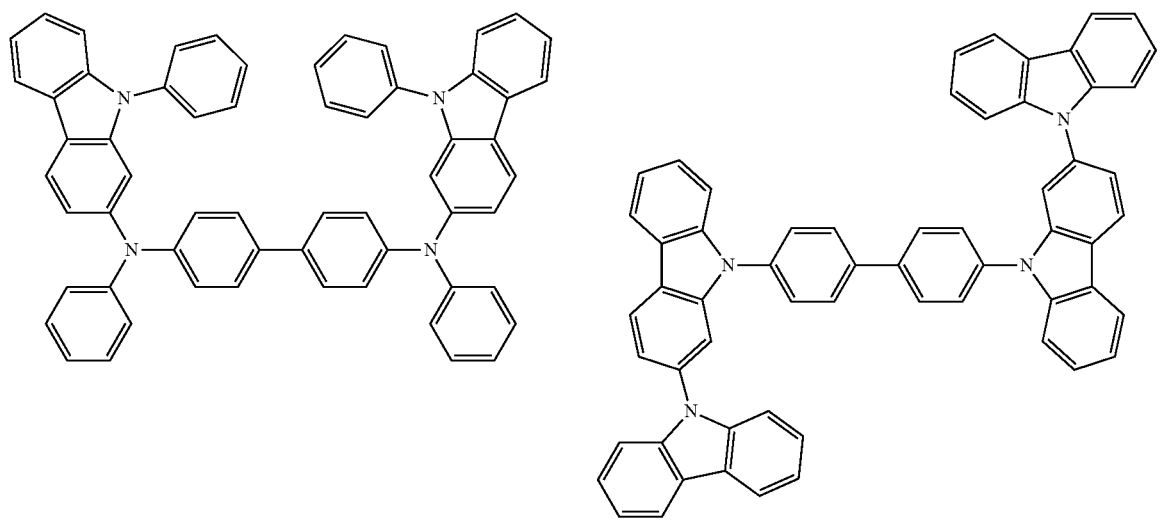
HT34  HT35
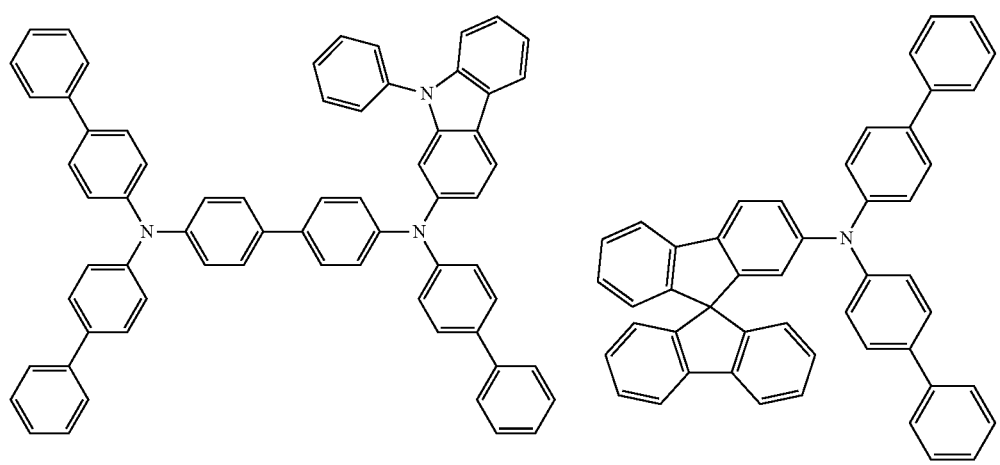
HT36  HT37

HT38

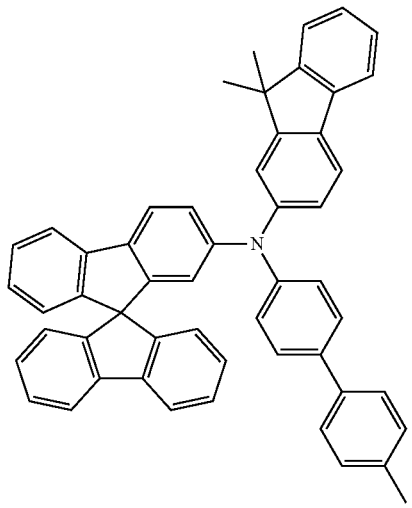

HT39

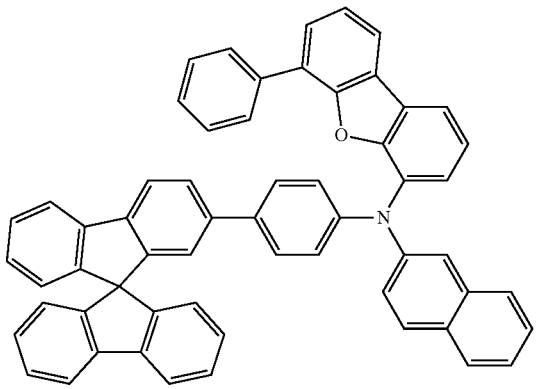

The intermediate layer 13 of the organic light-emitting device 10 may not include a p-dopant. For example, the intermediate layer 13 may include at least one of the compound belonging to the first hole transport material.

The hole transport region 12 of the organic light-emitting device 10 may further include a p-dopant. When the hole transport region 12 further includes the p-dopant, the hole transport region 12 may have a structure including a matrix (second hole transport material) and a p-dopant included in the matrix. The p-dopant may be homogeneously or non-homogeneously doped in the hole transport region 12.

In an embodiment, the p-dopant may have the lowest unoccupied molecular orbital (LUMO) energy level of about −3.5 eV or less.

The p-dopant may include at least one selected from a quinone derivative, a metal oxide, and a cyano group-containing compound, but embodiments of the present disclosure are not limited thereto.

For example, the p-dopant may include at least one selected from:

a quinone derivative such as tetracyanoquinodimethane (TCNQ), 2,3,5,6-tetrafluoro-7,7,8,8-tetracyanoquinodimethane (F4-TCNQ), and F6-TCNNQ;

a metal oxide such as a tungsten oxide and a molybdenum oxide; 1,4,5,8,9,11-hexaazatriphenylene-hexacarbonitrile (HAT-CN); and a compound represented by Formula 221, but embodiments of the present disclosure are not limited thereto:

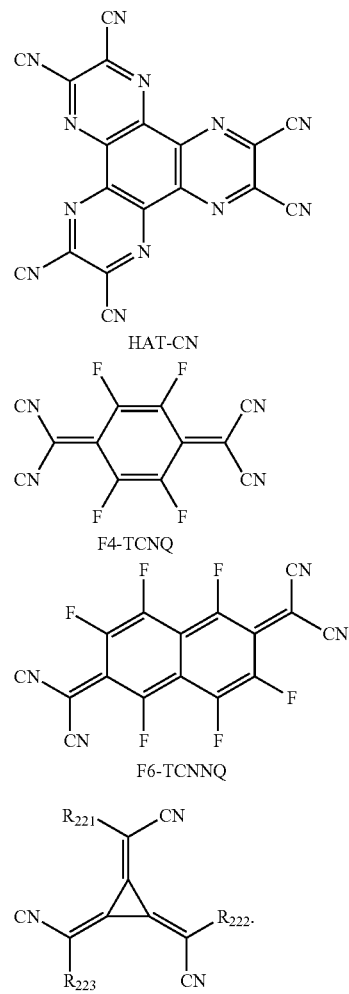

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, provided that at least one of $R_{221}$ to $R_{223}$ has at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

A thickness of the hole transport region 12 may be in a range of about 100 Angstroms (Å) to about 10,000 Å, for example, about 400 Å to about 2,000 Å, a thickness of the intermediate layer 13 may be in a range of about 100 Å to about 1,000 Å, for example, about 200 Å to about 500 Å, and a thickness of the emission layer 15 may be in a range of about 100 Å to about 3,000 Å, for example, about 300 Å to about 1,000 Å. While not wishing to be bound by theory, it is understood that when the thicknesses of the hole transport region 12, the intermediate layer 13, and the emission layer 15 are within these ranges, satisfactory hole transporting characteristics and/or luminescence characteristics may be obtained without a substantial increase in driving voltage.

Electron Transport Region 17

An electron transport region 17 may be disposed between the emission layer 15 and the second electrode 19 in the organic light-emitting device 10.

The electron transport region 17 may have a single-layered structure or a multi-layered structure.

For example, the electron transport region 17 may have a structure of electron transport layer, electron transport layer/electron injection layer, buffer layer/electron transport layer, hole blocking layer/electron transport layer, buffer layer/electron transport layer/electron injection layer, or hole blocking layer/electron transport layer/electron injection layer, but embodiments of the present disclosure are not limited thereto. For example, the electron transport region 17 may additionally have an electron control layer.

The electron transport region 17 may include a known electron transport material.

The electron transport region (for example, the buffer layer, the hole blocking layer, the electron control layer, or the electron transport layer in the electron transport region) may include a metal-free compound including at least one π electron-depleted nitrogen-containing cyclic group. The π electron-depleted nitrogen-containing cyclic group is the same as described above.

For example, the electron transport region may include a compound represented by Formula 601:

[Ar$_{601}$]$_{xe11}$-[(L$_{601}$)$_{xe1}$-R$_{601}$]$_{xe21}$.  Formula 601

In Formula 601, $Ar_{601}$ and $L_{601}$ may each independently be a substituted or unsubstituted $C_5$-$C_{60}$ carbocyclic group or a substituted or unsubstituted $C_1$-$C_{60}$ heterocyclic group, xe11 may be 1, 2, or 3, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one of groups $Ar_{601}$ in the number of xe11 and at least one of groups $R_{601}$ in the number of xe21 may include the π electron-depleted nitrogen-containing cyclic group.

In an embodiment, in Formula 601, ring $Ar_{601}$ and ring $L_{601}$ may each independently be selected from a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an iso-benzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is two or more, two or more groups $Ar_{601}$ may be linked via a single bond.

In one or more embodiments, $Ar_{601}$ in Formula 601 may be an anthracene group.

In one or more embodiments, a compound represented by Formula 601 may be represented by Formula 601-1:

Formula 601-1

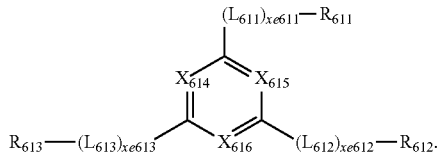

In Formula 601-1, $X_{614}$ may be N or $C(R_{614})$, $X_{615}$ may be N or $C(R_{615})$, $X_{616}$ may be N or $C(R_{616})$, and at least one selected from $X_{614}$ to $X_{616}$ may be N, $L_{611}$ to $L_{613}$ may each independently be the same as described in connection with $L_{601}$, xe611 to xe613 may each independently be the same as described in connection with xe1

$R_{611}$ to $R_{613}$ may each independently be the same as described in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, xe1 and xe611 to xe613 in Formulae 601 and 601-1 may each independently be 0, 1, or 2.

In one or more embodiments, in Formulae 601 and 601-1, $R_{601}$ and $R_{611}$ to $R_{613}$ may each independently be selected from a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S($=$O)$_2$($Q_{601}$) and —P($=$O)($Q_{601}$)($Q_{602}$), wherein $Q_{601}$ and $Q_{602}$ are the same as described above.

The electron transport region may include at least one compound selected from Compounds ET1 to ET36, but embodiments of the present disclosure are not limited thereto:

ET1

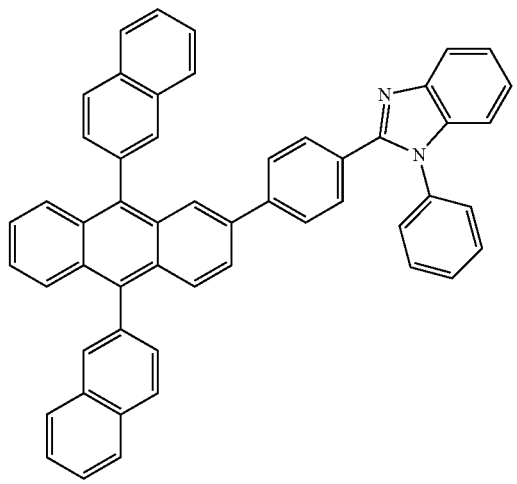

ET2

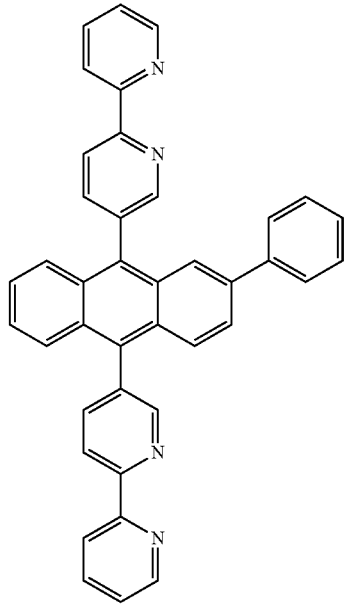

ET3
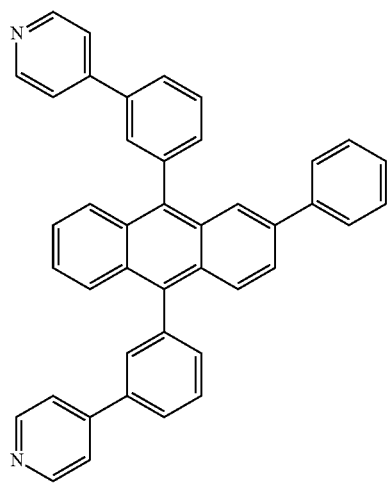
ET6
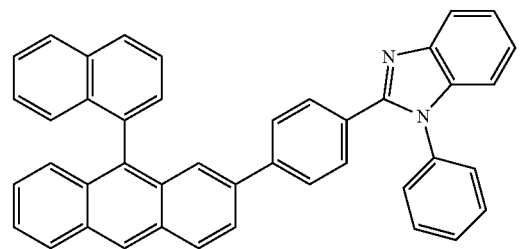
ET7
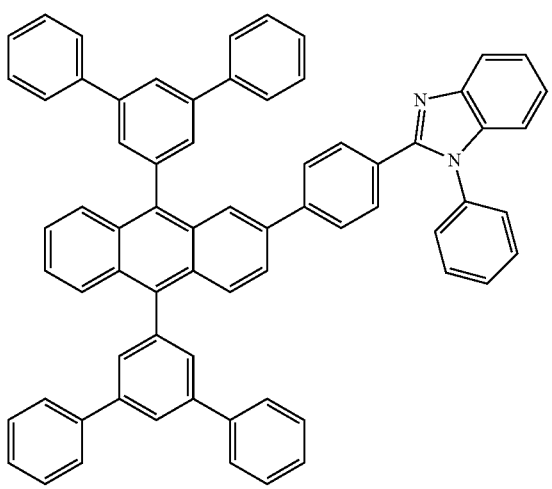
ET4
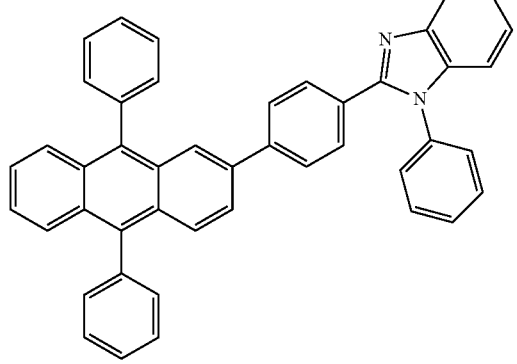
ET5
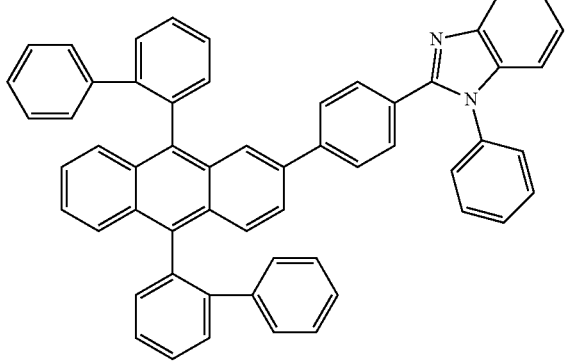
ET8
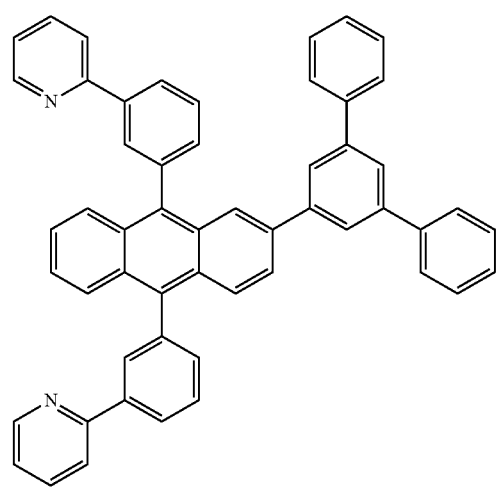

303
-continued
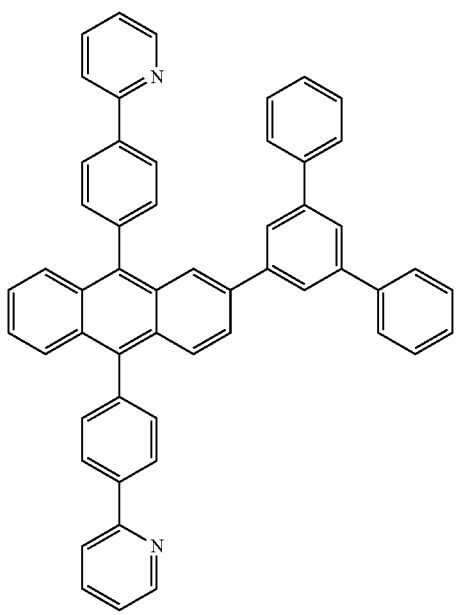
304
-continued
ET9
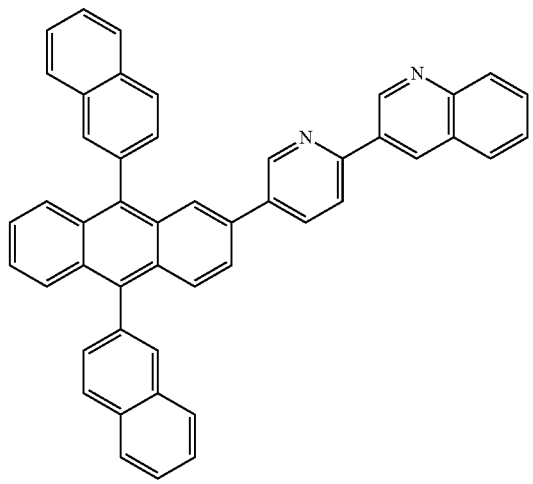
ET11
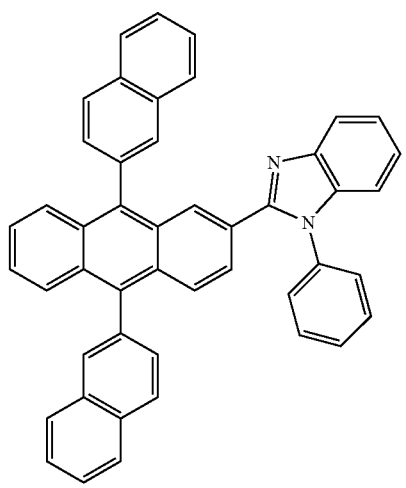
ET12
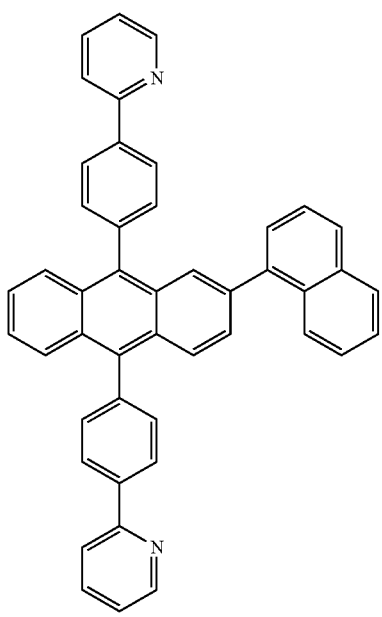
ET10
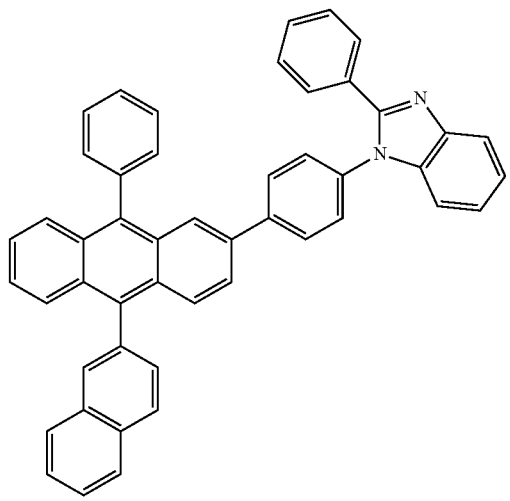
ET13

305
-continued
ET14
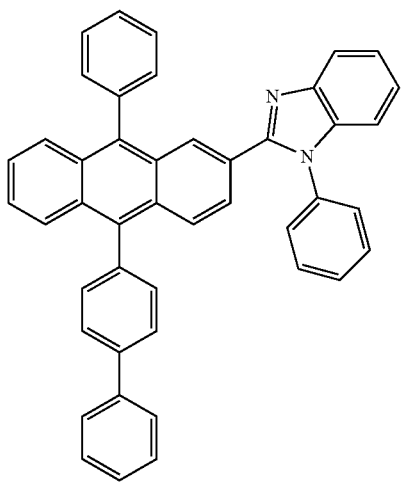
ET15
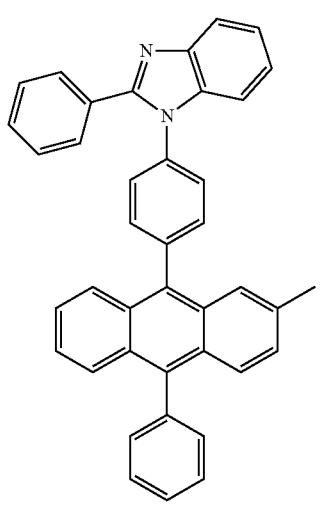
ET16
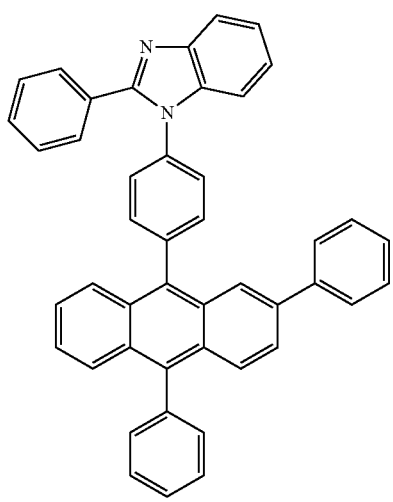
306
-continued
ET17
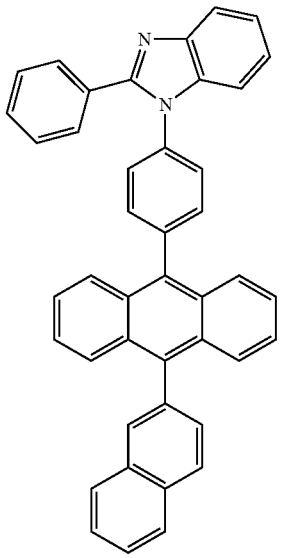
ET18
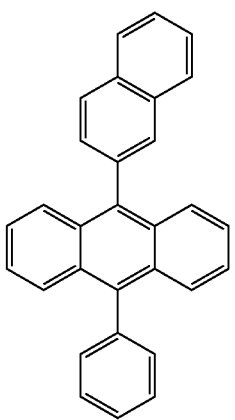
ET19

ET20
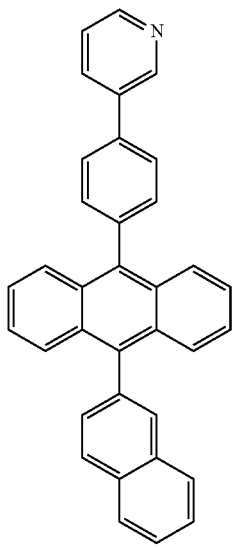
ET21
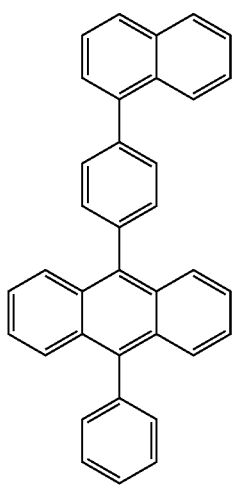
ET22
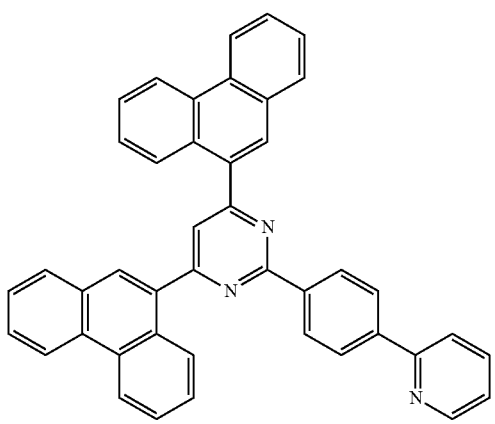
ET23
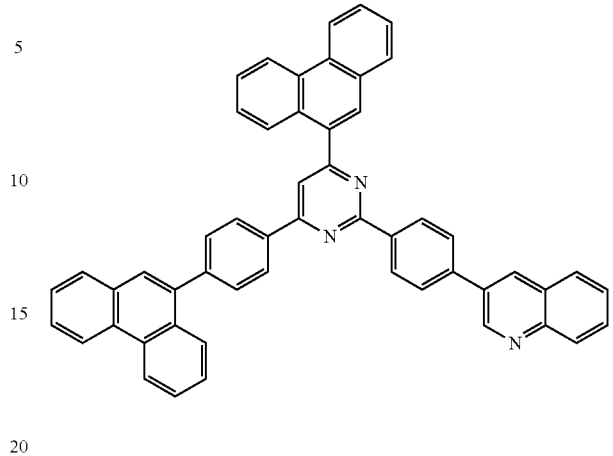
ET24
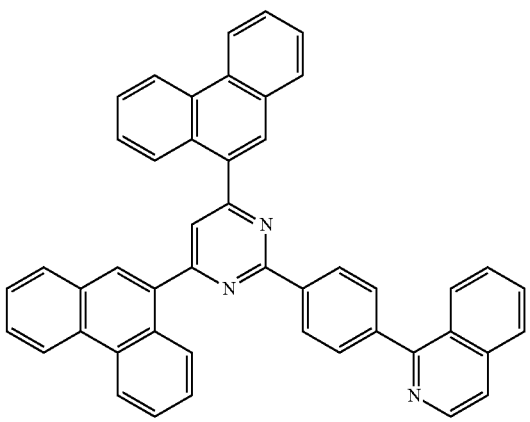
ET25
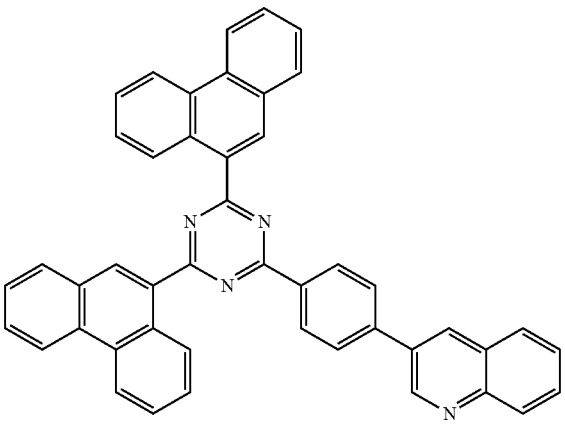

ET26
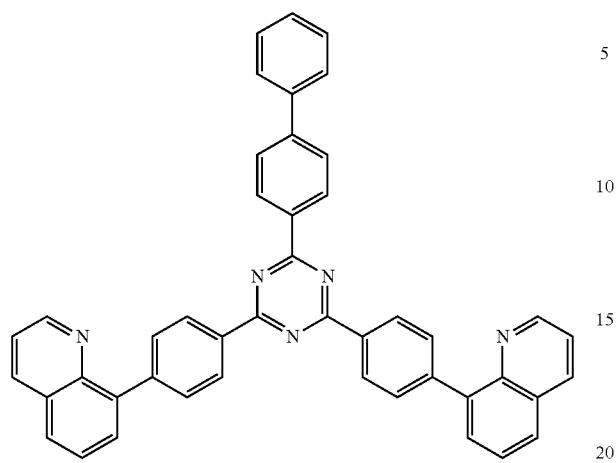
ET29
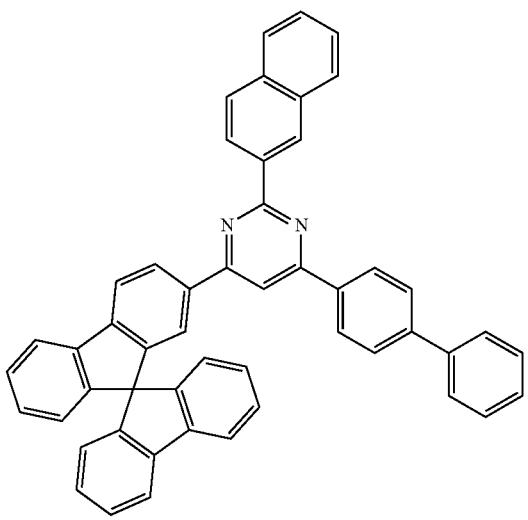
ET27
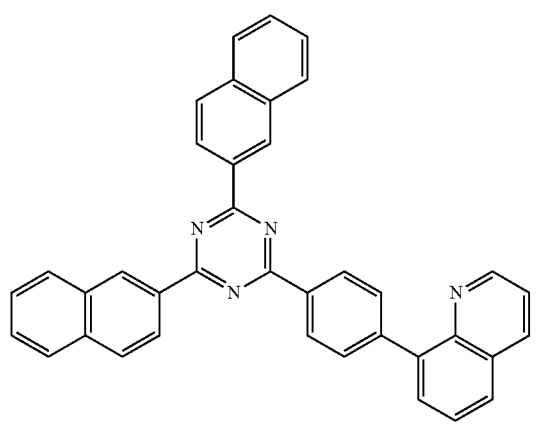
ET30
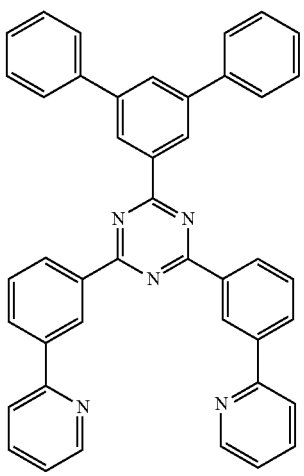
ET28
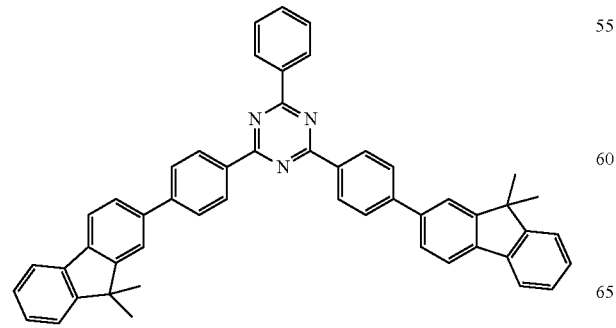
ET31
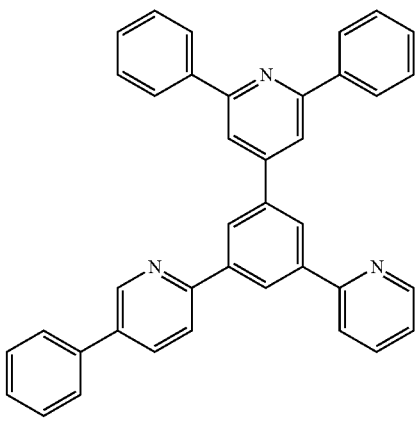

-continued
ET32
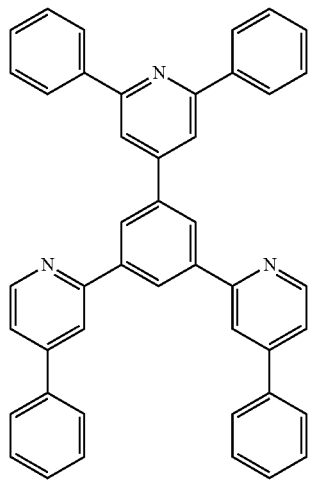
ET33
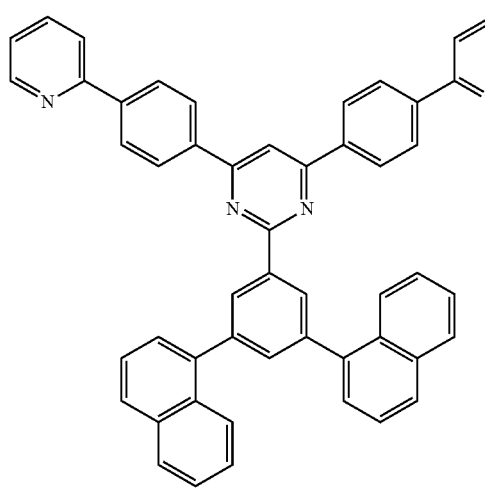
ET34
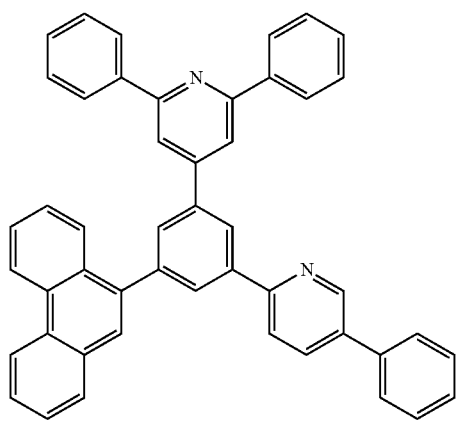
-continued
ET35
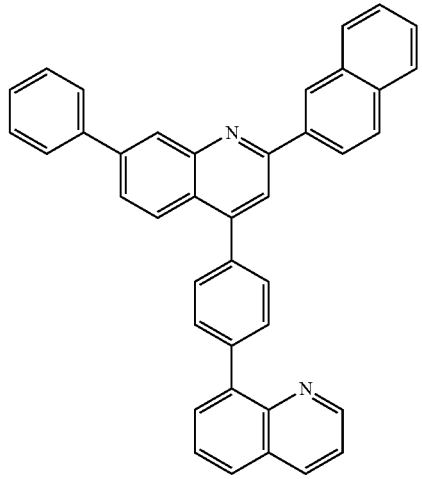
ET36
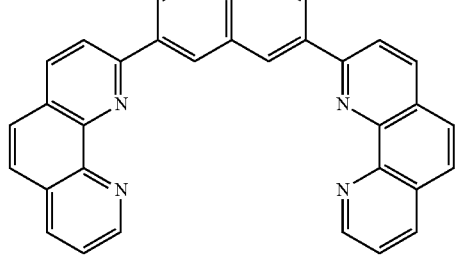
In one or more embodiments, the electron transport region may include at least one selected from 2,9-dimethyl-4,7-diphenyl-1,10-phenanthroline (BCP), 4,7-diphenyl-1,10-phenanthroline (Bphen), Alq$_3$, BAlq, 3-(biphenyl-4-yl)-5-(4-tert-butylphenyl)-4-phenyl-4H-1,2,4-triazole (TAZ), and NTAZ:
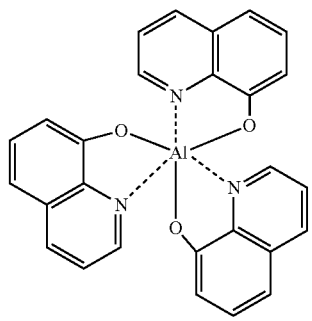
Alq$_3$
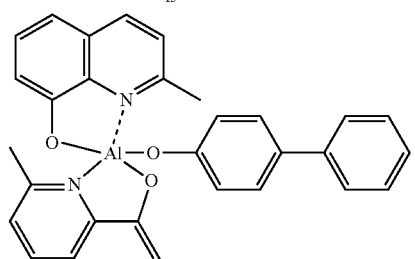
BAlq

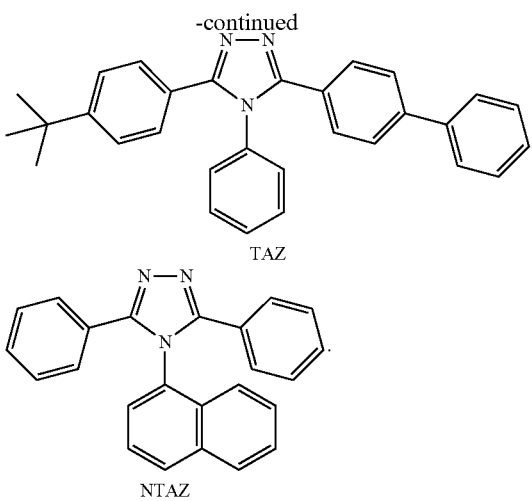

TAZ

NTAZ

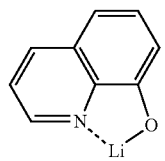

ET-D1

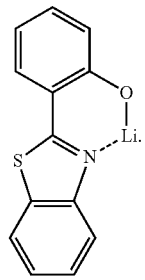

ET-D2

A thickness of the buffer layer, the hole blocking layer, or the electron control layer may each independently be in a range of about 20 Å to about 1,000 Å, for example, about 30 Å to about 300 Å. While not wishing to be bound by theory, it is understood that when the thicknesses of the buffer layer, the hole blocking layer, and the electron control layer are within these ranges, the electron blocking layer may have excellent electron blocking characteristics or electron control characteristics without a substantial increase in driving voltage.

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

The electron transport region 17 (for example, the electron transport layer in the electron transport region) may further include, in addition to the materials described above, a metal-containing material.

The metal-containing material may include at least one selected from alkali metal complex and alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium 8-hydroxyquinolate, LiQ) or ET-D2:

The electron transport region 17 may include an electron injection layer that facilitates injection of electrons from the second electrode 19. The electron injection layer may directly contact the second electrode 19.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may be selected from Li, Na, K, Rb, and Cs. In an embodiment, the alkali metal may be Li, Na, or Cs. In one or more embodiments, the alkali metal may be Li or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, or iodides) of the alkali metal, the alkaline earth-metal, and the rare earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, or KI. In an embodiment, the alkali metal compound may be selected from LiF, $Li_2O$, NaF, LiI, NaI, CsI, and KI, but embodiments of the present disclosure are not limited thereto.

The alkaline earth-metal compound may be selected from alkaline earth-metal oxides, such as BaO, SrO, CaO, $Ba_xSr_{1-x}O$ (0<x<1), or $Ba_xCa_{1-x}O$ (0<x<1). In an embodiment, the alkaline earth-metal compound may be selected from BaO, SrO, and CaO, but embodiments of the present disclosure are not limited thereto.

The rare earth metal compound may be selected from $YbF_3$, $ScF_3$, $ScO_3$, $Y_2O_3$, $Ce_2O_3$, $GdF_3$, and $TbF_3$. In an embodiment, the rare earth metal compound may be selected from YbF$_3$, ScF$_3$, TbF$_3$, YbI$_3$, ScI$_3$, and TbI$_3$, but embodiments of the present disclosure are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

Second Electrode 19

The second electrode 19 may be disposed on the organic layer 10A having such a structure. The second electrode 19 may be a cathode that is an electron injection electrode, and in this regard, a material for forming the second electrode 19 may be a material having a low work function, and such a material may be metal, alloy, an electrically conductive compound, or a combination thereof.

The second electrode 19 may include at least one selected from lithium (Li), silver (Si), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode 19 may be a transmissive electrode, a semi-transmissive electrode, or a reflective electrode.

The second electrode 19 may have a single-layered structure, or a multi-layered structure including two or more layers.

Figure 3:
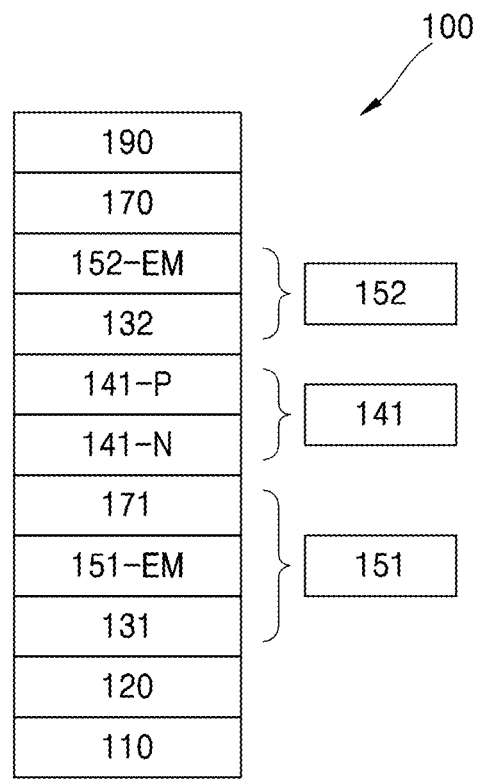
FIG. 3 is a schematic view of an organic light-emitting device according to an embodiment.

Description of FIG. 3

FIG. 3 is a schematic view of an organic light-emitting device 100 according to an embodiment.

The organic light-emitting device 100 of FIG. 3 includes a first electrode 110, a second electrode 190 facing the first electrode 110, and a first light-emitting unit 151 and a second light-emitting unit 152 disposed between the first electrode 100 and the second electrode 190. A charge-generation layer 141 may be disposed between the first light-emitting unit 151 and the second light-emitting unit 152, and the charge-generation layer 141 may include an n-type charge-generation layer 141-N and a p-type charge-generation layer 141-P. The charge-generation layer 141 is a layer serving to generate charges and supply the generated charges to the neighboring light-emitting unit, and may include a known material.

The first light-emitting unit 151 may include a first emission layer 151-EM, and the second light-emitting unit 152 may include a second emission layer 152-EM. A maximum emission wavelength of light emitted by the first light-emitting unit 151 may be different from a maximum emission wavelength of light emitted by the second light-emitting unit 152. For example, mixed light of the light emitted by the first light-emitting unit 151 and the light emitted by the second light-emitting unit 152 may be white light, but embodiments of the present disclosure are not limited thereto.

The first light-emitting unit 151 may include a first intermediate layer 131 that is disposed on a side closer to the first electrode 110, directly contacts the first emission layer 151-EM, and includes a first hole transport material, and the second light-emitting unit 152 may include a second intermediate layer 132 that is disposed on a side closer to the first electrode 110, directly contacts the second emission layer 152-EM, and includes a first hole transport material. The first hole transport material included in the first intermediate layer 131 and the first hole transport material included in the second intermediate layer 132 may be identical to or different from each other. The first light-emitting unit 151 may further include a first electron transport region 171 between the charge-generation layer 141 and the first emission layer 151-EM.

The first emission layer 151-EM and the second emission layer 152-EM may each include a host and a dopant. The dopant is an organometallic compound, provided that the dopant does not include iridium.

The first light-emitting unit 151 may satisfy a condition of HOMO(h1)−HOMO(host)<0 eV, wherein HOMO(h1) indicates a HOMO energy level (eV) of the first hole transport material included in the first intermediate layer 131, i) when the host of the first emission layer 151-EM consists of a single host, the HOMO(host) indicates a HOMO energy level (eV) of the single host and ii) when the host of the first emission layer 151-EM is a mixture of two or more different hosts, the HOMO(host) indicates the highest energy level among HOMO energy levels (eV) of the two or more different hosts. The HOMO(h1) and HOMO(host) are measured by using a photoelectron spectrometer in an ambient atmosphere.

Also, the second light-emitting unit 152 may satisfy a condition of HOMO(h1)−HOMO(host)<0 eV, wherein HOMO(h1) indicates a HOMO energy level (eV) of the first hole transport material included in the second intermediate layer 132, i) when the host of the second emission layer 152-EM consists of a single host, the HOMO(host) indicates a HOMO energy level (eV) of the single host and ii) when the host of the second emission layer 152-EM is a mixture of two or more different hosts, the HOMO(host) indicates the highest energy level among HOMO energy levels (eV) of the two or more different hosts. The HOMO(h1) and HOMO(host) are measured by using a photoelectron spectrometer in an ambient atmosphere.

As described above, since the organic light-emitting device 100 satisfies the condition of HOMO(h1)−HOMO(host)<0 eV, holes moved to the first emission layer 151-EM and the second emission layer 152-EM may be easily trapped into the first emission layer 151-EM and the second emission layer 152-EM. Therefore, since hole injection into the first emission layer 151-EM and the second emission layer 152-EM is facilitated, reduction of a driving voltage, prevention of interfacial degradation between the first intermediate layer 131 and the first emission layer 151-EM, prevention of interfacial degradation between the second intermediate layer 132 and the second emission layer 152-EM, prevention of luminance reduction according to a driving time (long lifespan), and a high external quantum efficiency, and the like for the organic light-emitting device 100 may be achieved.

The first electrode 110, the hole transport region 120, and the second electrode 190 in FIG. 3 may be understood by referring to the description provided in connection with the first electrode 11, the hole transport region 12, and the second electrode 19 in FIG. 1.

The first intermediate layer 131 and the second intermediate layer 132 in FIG. 3 may be understood by referring to the description provided in connection with the intermediate layer 13 in FIG. 1, and the first emission layer 151-EM and the second emission layer 152-EM may be understood by referring to the description provided in connection with the emission layer 15 in FIG. 1.

The electron transport region 170 and the first electron transport region 171 in FIG. 3 may be understood by referring to the description provided in connection with the electron transport region 17 in FIG. 1.

The organic light-emitting device in which the first light-emitting unit 151 and the second light-emitting unit 152 satisfy the condition of HOMO(h1)−HOMO(host)<0 eV and the iridium-free organometallic compound is included as the dopant has been described with reference to FIG. 3, but various modifications may be made thereto. For example, one of the first light-emitting unit 151 and the second light-emitting unit 152 of the organic light-emitting device in FIG. 3 may be replaced with a known light-emitting unit.

Figure 4:
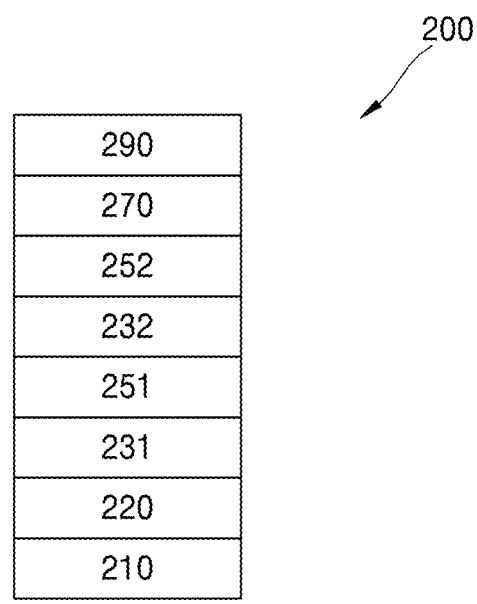
FIG. 4 is a schematic view of an organic light-emitting device according to an embodiment.

Description of FIG. 4

FIG. 4 is a schematic view of an organic light-emitting device 200 according to an embodiment.

The organic light-emitting device 200 includes a first electrode 210, a second electrode 290 facing the first electrode 210, and a first emission layer 251 and a second emission layer 252 stacked between the first electrode 210 and the second electrode 290.

A maximum emission wavelength of light emitted by the first emission layer 251 may be different from a maximum emission wavelength of light emitted by the second emission layer 252. For example, mixed light of the light emitted by the first emission layer 251 and the light emitted by the second emission layer 252 may be white light, but embodiments of the present disclosure are not limited thereto.

A first intermediate layer 231 that directly contacts the first emission layer 251 and includes a first hole transport material may be disposed between the first emission layer 251 and the first electrode 210, and a second intermediate layer 232 that directly contacts the second emission layer 252 and includes a first hole transport material may be disposed between the second emission layer 252 and the first electrode 210.

A hole transport region 220 may be disposed between the first intermediate layer 231 and the first electrode 210, and an electron transport region 270 may be disposed between the second emission layer 252 and the second electrode 290.

The first emission layer 251 and the second emission layer 252 may each include a host and a dopant. The dopant is an organometallic compound, provided that the dopant does not include iridium.

The organic light-emitting device 200 may satisfy a condition of HOMO(h1)−HOMO(host)<0 eV with respect to the first emission layer 251 and the first intermediate layer 231, wherein HOMO(h1) indicates a HOMO energy level (eV) of the first hole transport material included in the first intermediate layer 231, i) when the host included in the first emission layer 251 consists of a single host, the HOMO (host) indicates a HOMO energy level (eV) of the single host and ii) when the host included in the first emission layer 251 is a mixture of two or more different hosts, the HOMO(host) indicates the highest energy level among HOMO energy levels (eV) of the two or more different hosts. The HOMO (h1) and HOMO(host) are measured by using a photoelectron spectrometer in an ambient atmosphere.

Also, the organic light-emitting device 200 may satisfy a condition of HOMO(h1)−HOMO(host)<0 eV with respect to the second emission layer 252 and the second intermediate layer 232, wherein HOMO(h1) indicates a HOMO energy level (eV) of the first hole transport material included in the second intermediate layer 232, i) when the host included in the second emission layer 252 consists of a single host, the HOMO(host) indicates a HOMO energy level (eV) of the single host and ii) when the host included in the second emission layer 252 is a mixture of two or more different hosts, the HOMO(host) indicates the highest energy level among HOMO energy levels (eV) of the two or more different hosts. The HOMO(h1) and HOMO(host) are measured by using a photoelectron spectrometer in an ambient atmosphere.

As described above, since the organic light-emitting device 200 satisfies the condition of HOMO(h1)−HOMO (host)<0 eV, holes moved to the first emission layer 251 and the second emission layer 252 may be easily trapped into the first emission layer 251 and the second emission layer 252. Therefore, since hole injection into the first emission layer 251 and the second emission layer 252 is facilitated, reduction of a driving voltage, prevention of interfacial degradation between the first intermediate layer 231 and the first emission layer 251, prevention of interfacial degradation between the second intermediate layer 232 and the second emission layer 252, prevention of luminance reduction according to a driving time (long lifespan), and a high external quantum efficiency, and the like for the organic light-emitting device 200 may be achieved.

The first electrode 210, the hole transport region 220, and the second electrode 290 in FIG. 4 may be understood by referring to the description provided in connection with the first electrode 11, the hole transport region 12, and the second electrode 19 in FIG. 1.

The first intermediate layer 231 and the second intermediate layer 232 in FIG. 4 may be understood by referring to the description provided in connection with the intermediate layer 13 in FIG. 1, and the first emission layer 251 and the second emission layer 252 may be understood by referring to the description provided in connection with the emission layer 15 in FIG. 1.

The electron transport region 270 in FIG. 4 may be understood by referring to the description provided in connection with the electron transport region 17 in FIG. 1.

The organic light-emitting device in which a set of the first emission layer 251 and the first intermediate layer 231 and a set of the second emission layer 252 and the second intermediate layer 232 satisfy the condition of HOMO(h1)−

HOMO(host)<0 eV and the iridium-free organometallic compound is included as the dopant has been described with reference to FIG. 4, but various modifications may be made thereto.

For example, any three of the first emission layer 251, the first intermediate layer 231, the second emission layer 252, and the second intermediate layer 232 may be replaced with known layers.

Description of Terms

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms, at least one carbon-carbon double bond in the ring thereof, and which has no aromaticity. Non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having a heterocyclic aromatic system that has at least one heteroatom selected from N, O, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), a $C_6$-$C_{60}$ arylthio group as used herein indicates —$SA_{103}$ (wherein $A_{103}$ is the $C_6$-$C_{60}$ aryl group), and the term "$C_7$-$C_{60}$ arylalkyl group" as used herein indicates —$A_{104}A_{105}$ (wherein $A_{104}$ is the $C_6$-$C_{59}$ aryl group and $A_{105}$ is the $C_1$-$C_{53}$ alkyl group).

The term "$C_1$-$C_{60}$ heteroaryloxy group" as used herein refers to —$OA_{106}$ (wherein $A_{106}$ is the $C_1$-$C_{60}$ heteroaryl group), and the term "$C_1$-$C_{60}$ heteroarylthio group" as used herein indicates —$SA_{107}$ (wherein $A_{107}$ is the $C_1$-$C_{60}$ heteroaryl group).

The term "$C_2$-$C_{60}$ heteroarylalkyl group" as used herein refers to —$A_{108}A_{109}$ ($A_{109}$ is a $C_1$-$C_{59}$ heteroaryl group, and $A_{108}$ is a $C_1$-$C_{58}$ alkylene group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group," used herein, refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{60}$ carbocyclic group (or, $C_5$-$C_{30}$ carbocyclic group)" as used herein refers to a saturated or unsaturated cyclic group having, as a ring-forming atom, 5 to 60 carbon atoms (or, 5 to 30 carbon atoms) only. The $C_5$-$C_{60}$ carbocyclic group (or, $C_5$-$C_{30}$ carbocyclic group) may be a monocyclic group or a polycyclic group.

The term "$C_1$-$C_{60}$ heterocyclic group (or, $C_1$-$C_{30}$ heterocyclic group)" as used herein refers to a saturated or unsaturated cyclic group having, as a ring-forming atom, at least one heteroatom selected from N, O, Si, P, and S other than 1 to 60 carbon atoms (or, 1 to 30 carbon atoms). The $C_1$-$C_{60}$ heterocyclic group (or, $C_1$-$C_{30}$ heterocyclic group) may be a monocyclic group or a polycyclic group.

At least one substituent of the substituted $C_5$-$C_{60}$ carbocyclic group (or, $C_5$-$C_{30}$ carbocyclic group), the substituted $C_1$-$C_{60}$ heterocyclic group (or, $C_1$-$C_{30}$ heterocyclic group), the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{oo}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_{60}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —B(Q$_{16}$)(Q$_{17}$), and —P(=O)(Q$_{18}$)(Q$_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —B(Q$_{26}$)(Q$_{27}$), and —P(=O)(Q$_{28}$)(Q$_{29}$); and —N(Q$_{31}$)(Q$_{32}$), —Si(Q$_{33}$)(Q$_{34}$)(Q$_{35}$), —B(Q$_{36}$)(Q$_{37}$), and —P(=O)(Q$_{38}$)(Q$_{39}$), and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

The terms "a biphenyl group, a terphenyl group, and a tetraphenyl group (or, a quaterphenyl group)" as used herein each refer to a monovalent group having two, three, or four phenyl groups linked via a single bond.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1: Synthesis of Compound 3-170

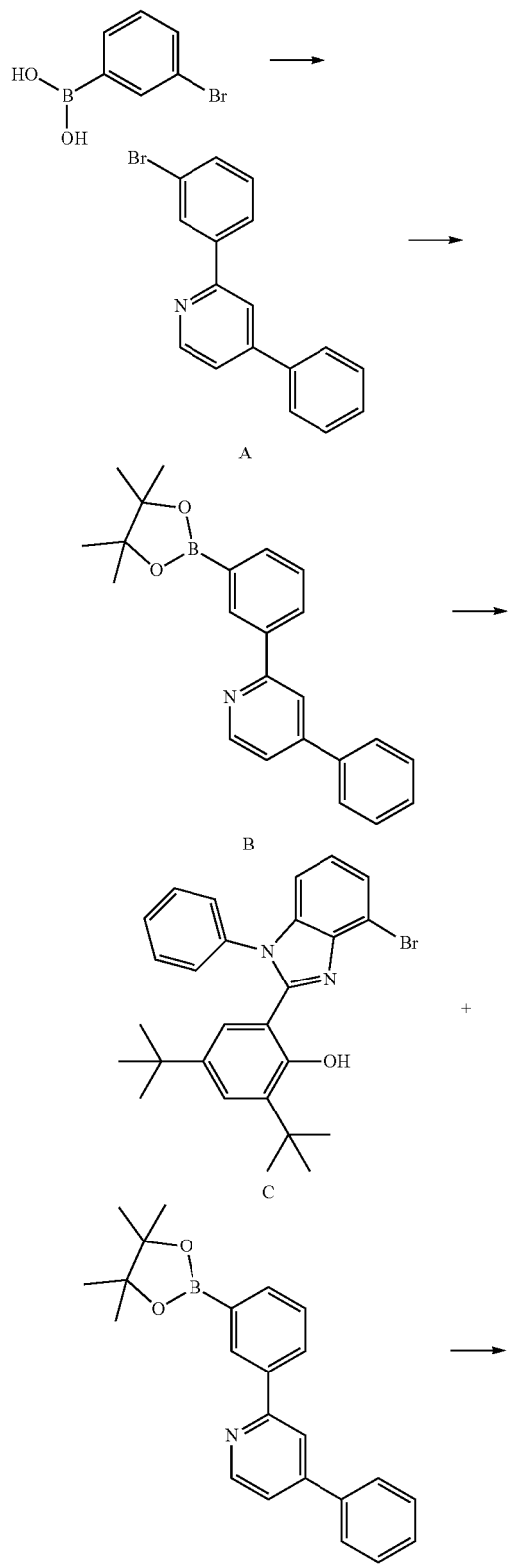

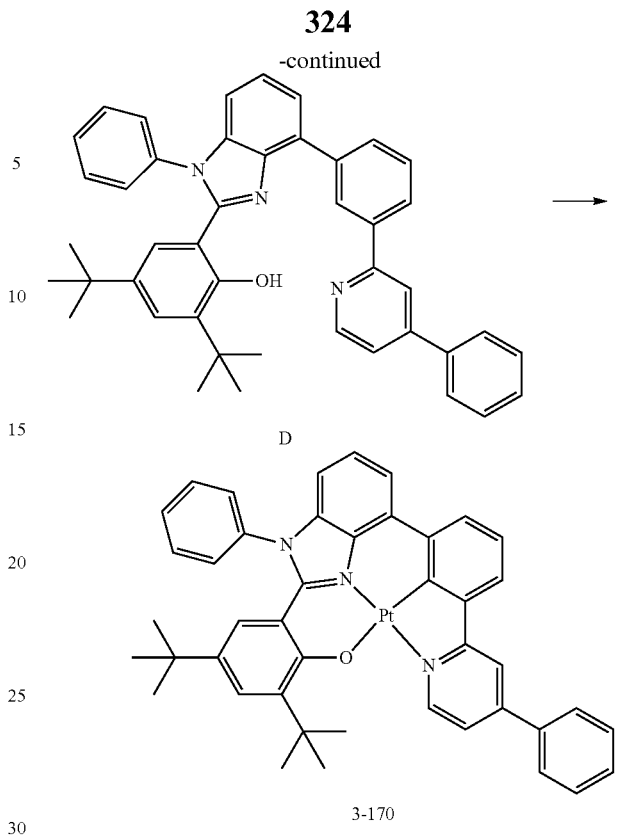

3-170

Synthesis of Intermediate A (2-(3-Bromophenyl)-4-Phenylpyridine)

3 grams (g) (13 millimoles, mmol) of 2-bromo-4-phenylpyridine, 3.1 g (1.2 equivalents, equiv.) of (3-bromophenyl)boronic acid, 1.1 g (0.9 mmol, 0.07 equiv.) of tetrakis(triphenylphosphine)palladium(0), and 3.4 g (32 mmol, 3 equiv.) of sodium carbonate were mixed with 49 milliliters (mL) of a solvent in which tetrahydrofuran (THF) and distilled water ($H_2O$) were mixed at a volume ratio of 3:1, and then refluxed for 12 hours. A reaction product obtained therefrom was cooled to room temperature, and a precipitate was filtered therefrom to obtain a filtrate. Then, the filtrate was washed by using ethyl acetate (EA)/$H_2O$, and purified by column chromatography (while increasing a rate of MC (methylene chloride)/Hex (hexane) to between 25% and 50%) to obtain 3.2 g (yield: 80%) of Intermediate A. The obtained compound was identified by mass spectrometry and HPLC analysis.

HRMS (MALDI) calcd for $C_{17}H_{12}BrN$: m/z 309.0153, Found: 309.0155.

Synthesis of Intermediate B (4-phenyl-2-(3-(4,4,5,5-tetramethyl-1,3,2-dioxaborolan-2-yl)phenyl)pyridine)

3.2 g (0.01 mmol) of Intermediate A and 3.9 g (0.015 mol, 1.5 equiv.) of bispinacolatodiboron were added to a flask. 2.0 g (0.021 mol, 2 equiv.) of potassium acetate and 0.42 g (0.05 equiv.) of $PdCl_2$(dppf) were added thereto, and 34 mL of toluene was added thereto. Then, the resultant mixture was refluxed at a temperature of 100° C. through the night. A reaction product obtained therefrom was cooled to room temperature, and a precipitate was filtered therefrom to obtain a filtrate. Then, the filtrate was washed by using EA/H$_2$O, and purified by column chromatography to obtain 2.4 g (yield: 65%) of Intermediate B. The obtained compound was identified by mass spectrometry and HPLC analysis.

HRMS (MALDI) calcd for C$_{23}$H$_{24}$BNO$_2$: m/z 357.1900, Found: 357.1902.

Synthesis of Intermediate D (2,4-di-tert-butyl-6-(1-phenyl-4-(3-(4-phenylpyridin-2-yl)phenyl)-1H-benzo[d]imidazol-2-yl)phenol)

2.7 g (0.006 mol, 1 equiv.) of Intermediate C (2-(4-bromo-1-phenyl-1H-benzo[d]imidazol-2-yl)-4,6-di-tert-butylphenol), 2.4 g (0.007 mol, 1.2 equiv.) of Intermediate B, 0.39 g (0.001 mol, 0.07 equiv.) of tetrakis(triphenylphosphine)palladium(0), and 2.0 g (0.017 mol, 3 equiv.) of potassium carbonate were mixed with 20 mL of a solvent in which THF and distilled water (H$_2$O) were mixed at a volume ratio of 3:1, and then refluxed for 12 hours. A reaction product obtained therefrom was cooled to room temperature, and a precipitate was filtered therefrom to obtain a filtrate. Then, the filtrate was washed by using EA/H$_2$O, and purified by column chromatography (while increasing a rate of EA/Hex to between 20% and 35%) to obtain 2.4 g (yield: 70%) of Intermediate D. The obtained compound was identified by mass spectrometry and HPLC analysis HRMS (MALDI) calcd for C$_{44}$H$_{41}$BN$_3$O: m/z 627.3250, Found: 627.3253.

Synthesis of Compound 3-170

2.4 g (3.82 mmol) of Intermediate D and 1.9 g (4.6 mmol, 1.2 equiv.) of K$_2$PtCl$_4$ were mixed with 55 mL of a solvent in which 50 mL of AcOH and 5 mL of H$_2$O were mixed, and then refluxed for 16 hours. A reaction product obtained therefrom was cooled to room temperature, and a precipitate was filtered therefrom. The precipitate was dissolved again in MC and washed by using H$_2$O. The precipitate then was purified by column chromatography (MC 40%, EA 1%, Hex 59%) to obtain 1.2 g (purity: 99% or more) of Compound 3-170 (actual synthesis yield: 70%). The obtained compound was identified by mass spectrometry and HPLC analysis.

HRMS (MALDI) calcd for C$_{44}$H$_{39}$N$_3$OPt: m/z 820.2741, Found: 820.2744.

Synthesis Example 2: Synthesis of Compound 1-8

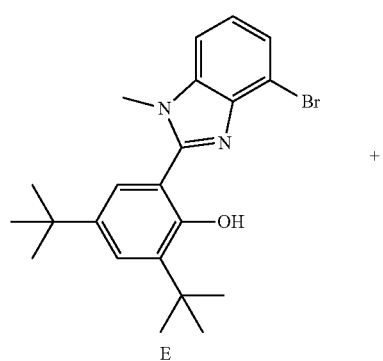

E

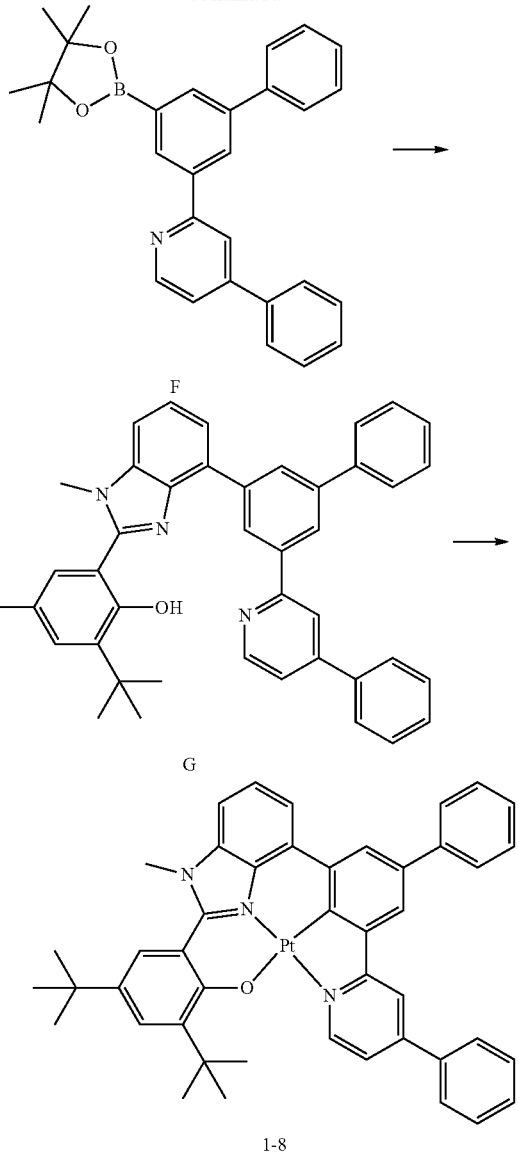

Synthesis of Intermediate G 2.6 g (68%) of Intermediate G was synthesized in the same manner as Intermediate D in Synthesis Example 1, except that 2.5 g (0.006 mol) of Compound E was used instead of Intermediate C, and 3.1 g (0.007 mol) of Compound F was used instead of Intermediate B.

HRMS (MALDI) calcd for C$_{45}$H$_{43}$N$_3$O: m/z 641.3406, Found: 641.3408.

Synthesis of Compound 1-8

2.4 g (yield: 71%) of Compound 1-8 was synthesized in the same manner as Compound 3-170 in Synthesis Example 1, except that 2.6 g (4.05 mmol) of Intermediate G was used instead of Intermediate D.

HRMS (MALDI) calcd for C$_{45}$H$_{41}$N$_3$OPt: m/z 834.2897, Found: 834.2896.

Evaluation Example 1
HOMO energy levels of the following Compounds were measured by using a photoelectron spectrometer (manufactured by RIKEN KEIKI Co., Ltd.: AC3) in an ambient atmosphere, and results thereof are shown in Table 1 below.
TABLE 1
| Compound | Actual measurement value of HOMO energy level (eV) |
| --- | --- |
| HT1 | −5.35 |
| HT3 | −5.58 |
| HT4 | −5.65 |
| HT5 | −5.68 |
| H-H1 | −5.57 |
| H-E1 | −6.07 |
| 3-170 | −5.43 |
| 1-8 | −5.36 |
| D-Ir | −5.15 |
HT1
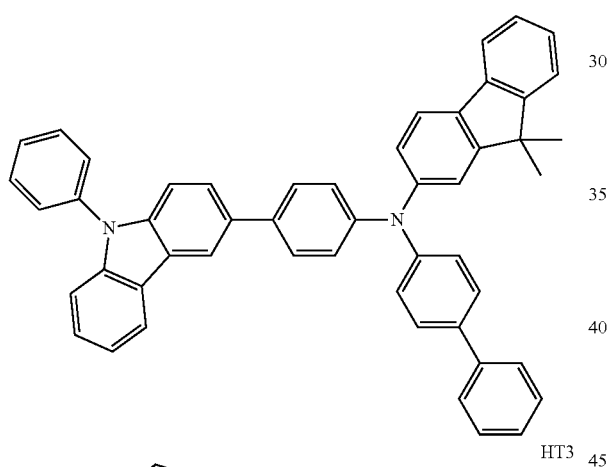
HT3
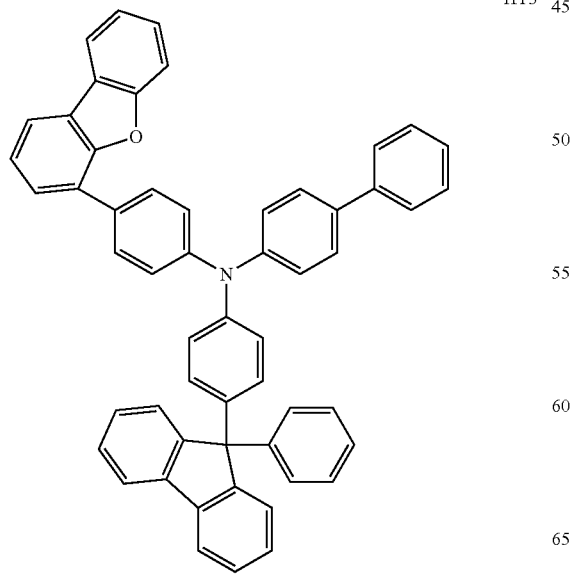
HT4
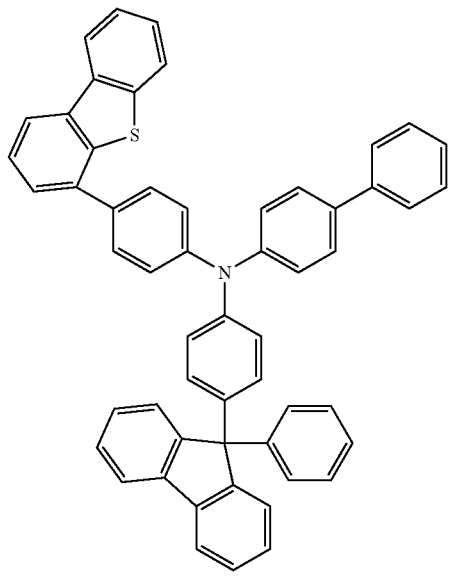
HT5
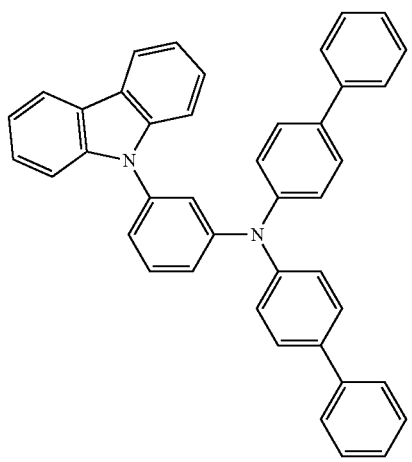

H-H1

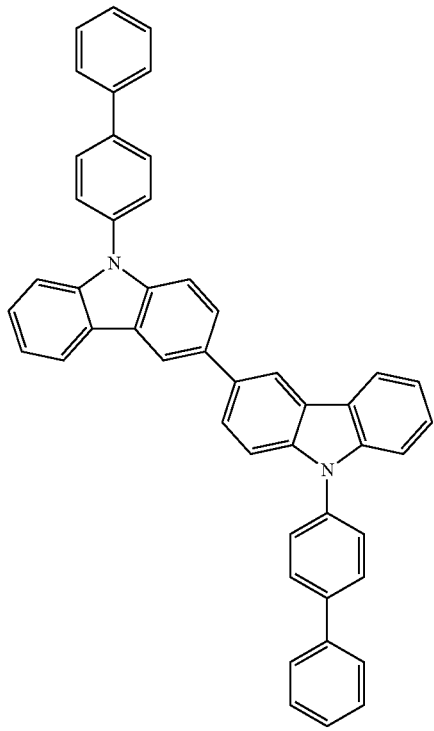

H-E1

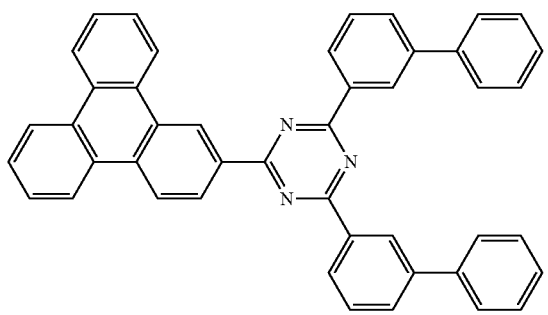

3-170

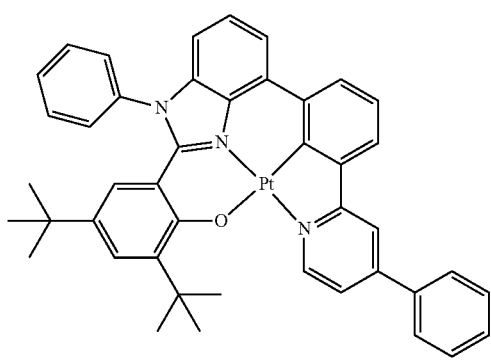

1-8

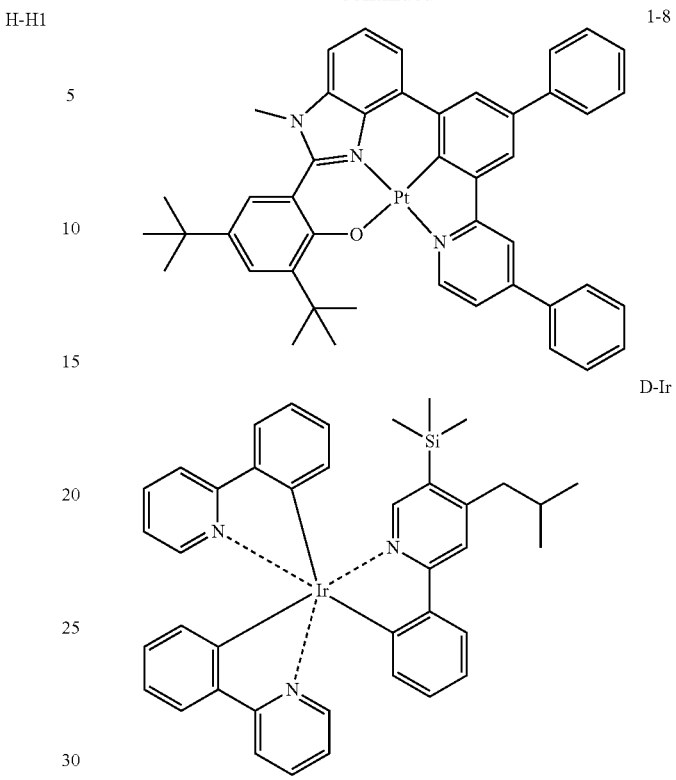

D-Ir

Comparative Example A

An ITO glass substrate was cut to a size of 50 mm×50 mm×0.5 mm (mm=millimeter), sonicated with acetone, isopropyl alcohol, and pure water, each for 15 minutes, and then cleaned by exposure to ultraviolet (UV) rays and ozone for 30 minutes.

Then, F6-TCNNQ was deposited on an ITO electrode (anode) of the ITO glass substrate to form a hole injection layer having a thickness of 100 Angstroms (Å), HT1 was deposited on the hole injection layer to form a first hole transport layer having a thickness of 1,260 Å, and F6-TCNNQ and HT1 were co-deposited on the first hole transport layer at a weight ratio of 5:95 to form a second hole transport layer having a thickness of 100 Å, thereby forming a hole transport region.

HT1 was deposited on the hole transport region to form an intermediate layer having a thickness of 300 Å.

Then, H-H1 (hole transport host) and H-E1 (electron transport host) (a weight ratio of the hole transport host to the electron transport host was 5:5) as a host and Compound 3-170 as a dopant were co-deposited on the intermediate layer (a weight ratio of the host to the dopant was 90:10) to form an emission layer having a thickness of 400 Å.

Then, Compound ET1 and LiQ were co-deposited on the emission layer at a weight ratio of 5:5 to form an electron transport layer having a thickness of 360 Å, LiF was deposited on the electron transport layer to form an electron injection layer having a thickness of 5 Å, and Al was vacuum-deposited on the electron injection layer to form a second electrode (cathode) having a thickness of 800 Å, thereby completing the manufacture of an organic light-emitting device having a structure of ITO/F6-TCNNQ (100 Å)/HT1 (1,260 Å)/HT1: F6-TCNNQ (5 wt %) (100 Å)/HT1

(300 Å)/(H-H1+H-E1): Compound 3-170 (10 wt %) (400 Å)/ET1: LiQ (50 wt %) (360 Å)/LiF (5 Å)/Al (800 Å).
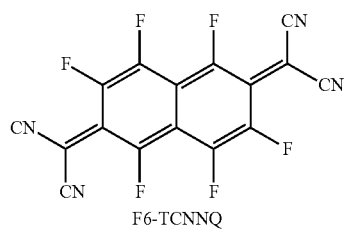
F6-TCNNQ
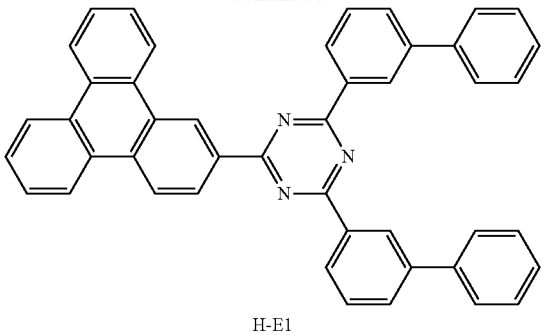
H-E1
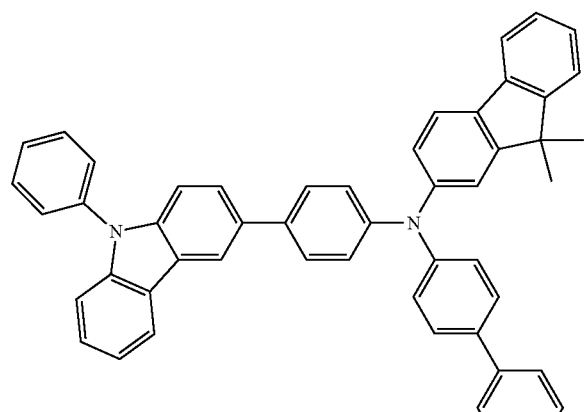
HT1
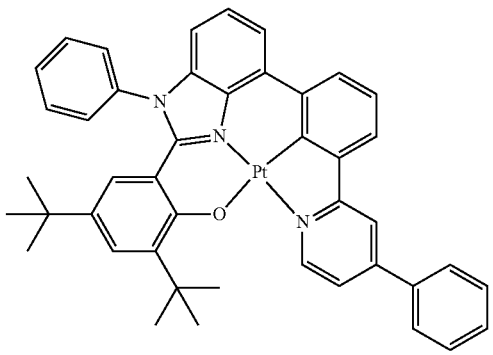
3-170
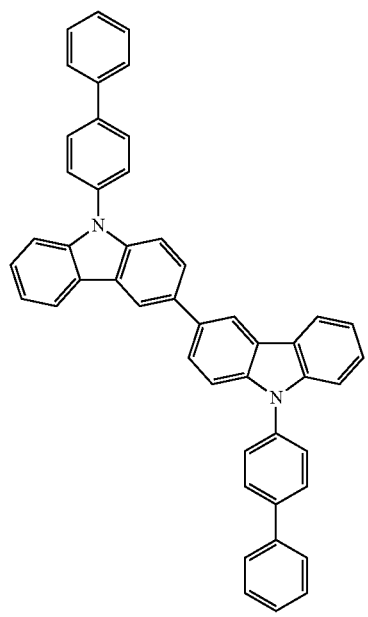
H-H1
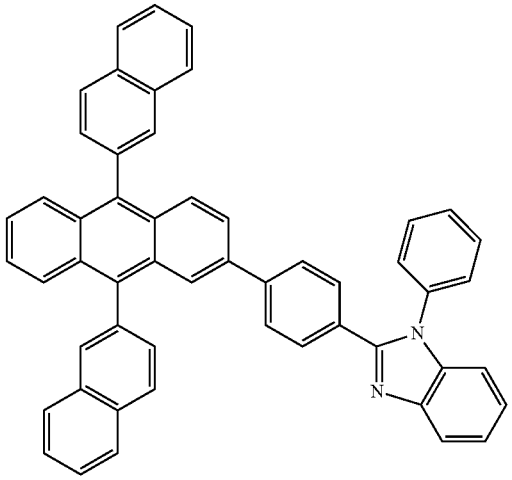
ET1
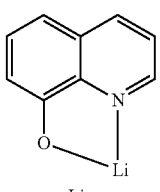
Liq

Comparative Example B and Examples 1 and 2

Organic light-emitting devices were manufactured in the same manner as in Comparative Example A, except that Compounds shown in Table 2 were each used instead of HT1 as the first hole transport material in forming an intermediate layer.

Evaluation Example 2

Figure 5:
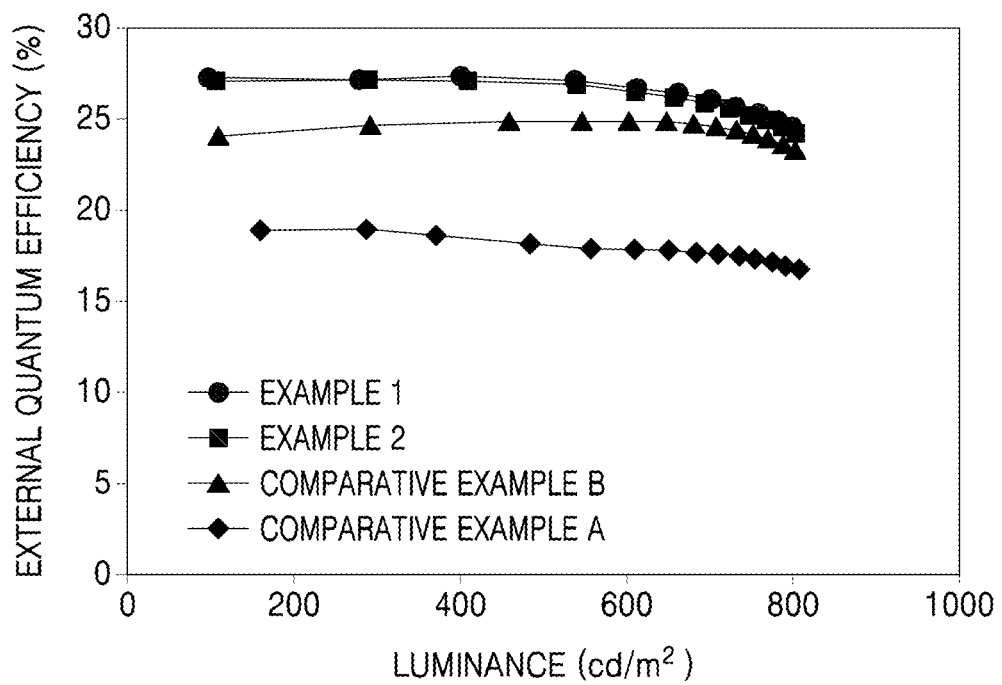
FIG. 5 is a graph of luminance (candelas per square meter, $cd/m^2$) versus external quantum efficiency (percent, %) of organic light-emitting devices manufactured according to Comparative Example A, Comparative Example B, Example 1, and Example 2.
Figure 6:
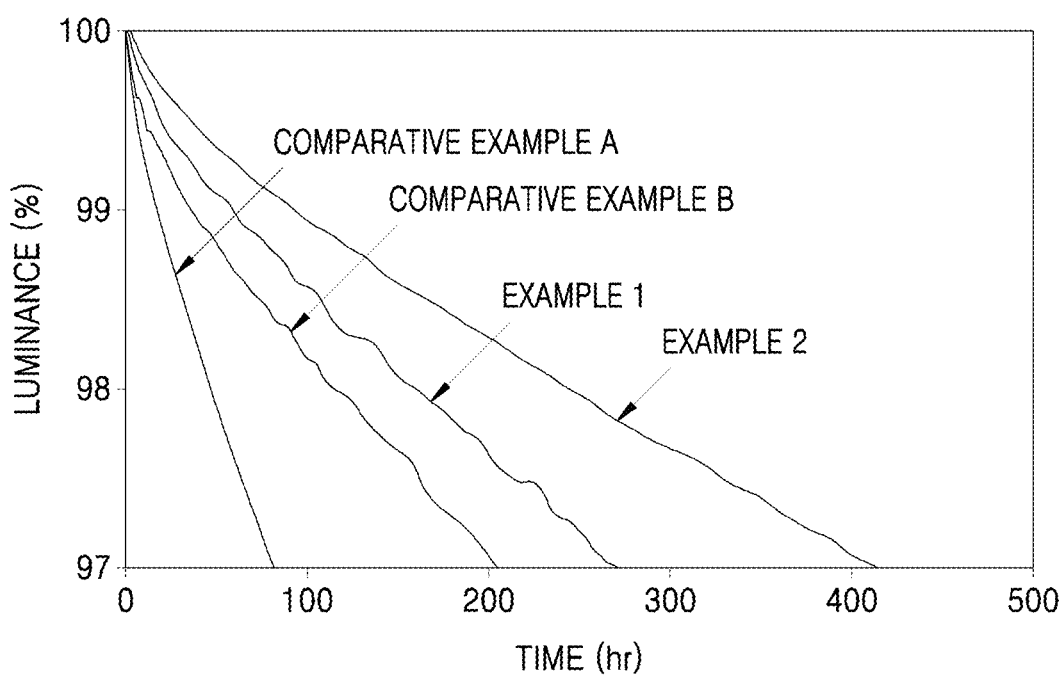
FIG. 6 is a graph of time (hours, hr) versus luminance (candelas per square meter, $cd/m^2$) of organic light-emitting devices manufactured according to Comparative Example A, Comparative Example B, Example 1, and Example 2.

External quantum efficiency and lifespan ($T_{95}$) of the organic light-emitting devices manufactured according to Comparative Examples A and B and Examples 1 and 2 were evaluated, and evaluation results thereof are shown in Table 2 below. Also, a luminance-external quantum efficiency graph and a time-luminance graph of Comparative Examples A and B and Examples 1 and 2 are shown in FIGS. 5 and 6, respectively. The evaluation was performed by using a current-voltage meter (Keithley 2400) and a luminance meter (Minolta Cs-1000A), and lifespan ($T_{95}$) (at 8000 nit) indicates an amount of time (hr) that lapsed when luminance was 95% of initial luminance (100%). The external quantum efficiency and the lifespan ($T_{95}$) were measured at a luminance of 8,000 candelas per square meter ($cd/m^2$).

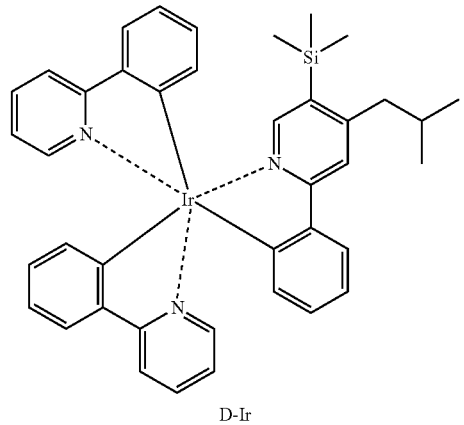

D-Ir

Comparative Example E and Example 3

Organic light-emitting devices were manufactured in the same manner as in Comparative Example A, except that Compounds shown in Table 3 were each used instead of HT1 as the first hole transport material in forming an intermediate layer, and Compound 1-8 was used instead of Compound 3-170 as a dopant in forming an emission layer.

TABLE 2

|  | First hole transport material (actual measurement value of HOMO) | Hole transport host (actual measurement value of HOMO) | Dopant (actual measurement value of HOMO) | HOMO of first hole transport material - HOMO of hole transport host | External quantum efficiency (%) | Lifespan (hr) ($T_{95}$) |
|---|---|---|---|---|---|---|
| Comparative Example A | HT1 (−5.35 eV) | H-H1 (−5.57 eV) | 3-170 (−5.43 eV) | 0.22 eV | 17.03 | 150 |
| Comparative Example B | H-H1 (−5.57 eV) | H-H1 (−5.57 eV) | 3-170 (−5.43 eV) | 0 eV | 23.67 | 400 |
| Example 1 | HT3 (−5.58 eV) | H-H1 (−5.57 eV) | 3-170 (−5.43 eV) | −0.01 eV | 24.80 | 500 |
| Example 2 | HT4 (−5.65 eV) | H-H1 (−5.57 eV) | 3-170 (−5.43 eV) | −0.08 eV | 24.57 | 750 |

Referring to Table 2, it is confirmed that the organic light-emitting devices of Examples 1 and 2 have excellent external quantum efficiency and lifespan characteristics, as compared with those of the organic light-emitting devices of Comparative Examples A and B.

Comparative Examples C and D

Organic light-emitting devices were manufactured in the same manner as in Comparative Example A, except that Compounds shown in Table 3 were each used instead of HT1 as the first hole transport material in forming an intermediate layer, and an Ir complex D-Ir was used instead of Compound 3-170 as a dopant in forming an emission layer.

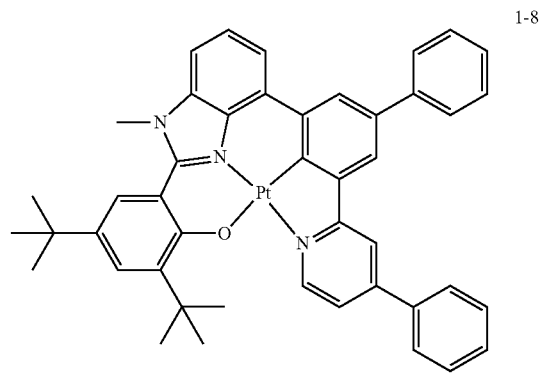

1-8

Evaluation Example 3

Figure 7:
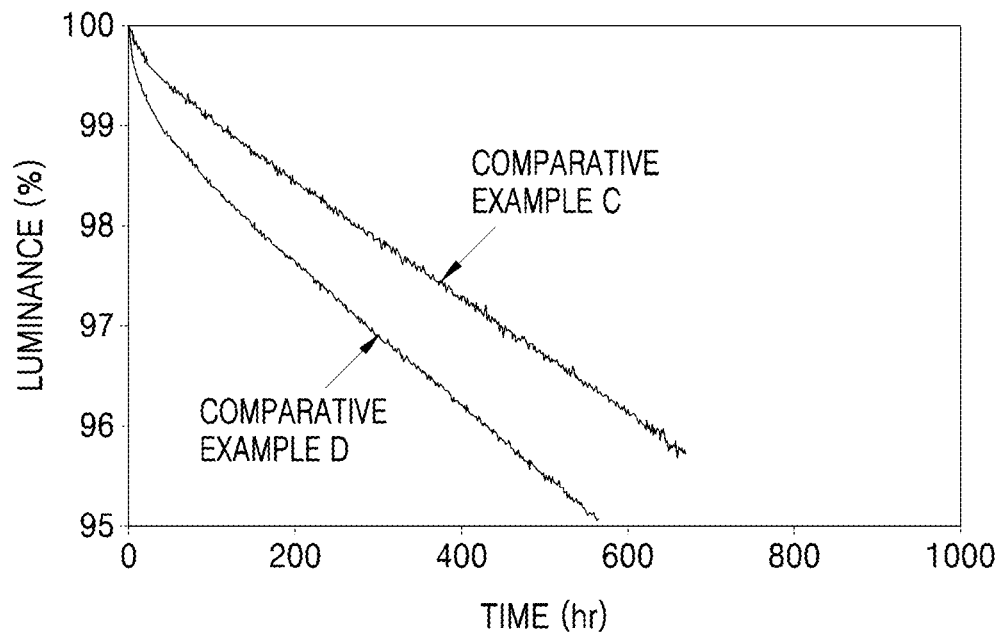
FIG. 7 is a graph of time (hours, hr) versus luminance (candelas per square meter, $cd/m^2$) of organic light-emitting devices manufactured according to Comparative Example C and Comparative Example D.
Figure 8:
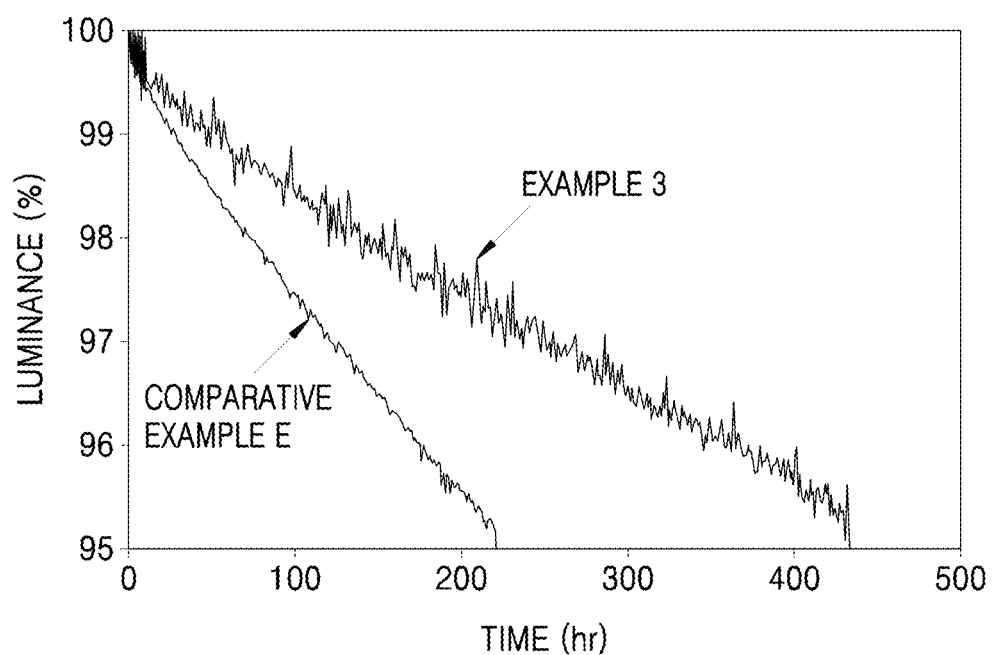
FIG. 8 is a graph of time (hours, hr) versus luminance (candelas per square meter, $cd/m^2$) of organic light-emitting devices manufactured according to Comparative Example E and Example 3.

The external quantum efficiency and lifespan ($T_{95}$) of the organic light-emitting devices manufactured according to Comparative Examples C, D, and E and Example 3 were evaluated, and evaluation results thereof are shown in Table 3 below. Also, a time-luminance graph of Comparative Examples C and D is shown in FIG. 7, and a time-luminance graph of Comparative Example E and Example 3 is shown in FIG. 8. The evaluation was performed by using a current-voltage meter (Keithley 2400) and a luminance meter (Minolta Cs-1000A), and the lifespan ($T_{95}$) (at 6000 nit) indicates an amount of time (hr) that lapsed when luminance was 95% of initial luminance (100%). The external quantum efficiency and the lifespan ($T_{95}$) were measured at a luminance of 6,000 cd/m$^2$.

TABLE 3

| | First hole transport material (actual measurement value of HOMO) | Hole transport host (actual measurement value of HOMO) | Dopant (actual measurement value of HOMO) | HOMO of first hole transport material - HOMO of hole transport host | External quantum efficiency (%) | Lifespan (hr) ($T_{95}$) |
|---|---|---|---|---|---|---|
| Comparative Example C | H-H1 (−5.57 eV) | H-H1 (−5.57 eV) | D-Ir (−5.15 eV) | 0 eV | 17.2 | 800 |
| Comparative Example D | HT5 (−5.68 eV) | H-H1 (−5.57 eV) | D-Ir (−5.15 eV) | −0.11 eV | 17.6 | 580 |
| Comparative Example E | H-H1 (−5.57 eV) | H-H1 (−5.57 eV) | 1-8 (−5.36 eV) | 0 eV | 22.9 | 320 |
| Example 3 | HT5 (−5.68 eV) | H-H1 (−5.57 eV) | 1-8 (−5.36 eV) | −0.11 eV | 23.33 | 400 |

Referring to Table 3, it is found that as to the cases where an Ir complex D-Ir was used as a dopant, the lifespan of Comparative Example D ("HOMO of the first hole transport material–HOMO of hole transport host" was less than 0) was inferior to the lifespane of Comparative Example C ("HOMO of the first hole transport material–HOMO of the hole transport host" was 0), but as to the cases where an iridium-free organometallic compound was used as a dopant, Example 3 ("HOMO of the first hole transport material–HOMO of hole transport host" was less than 0) has improved external quantum efficiency and lifespan at the same time, as compared with those of Comparative Example E ("HOMO of the first hole transport material–HOMO of the hole transport host" was 0).

The organic light-emitting device that satisfies certain parameters and including an iridium-free organometallic compound may have high external quantum efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. An organic light-emitting device comprising:
a first electrode;
a second electrode facing the first electrode; and
an organic layer disposed between the first electrode and the second electrode,
wherein
the organic layer comprises an emission layer, and an intermediate layer disposed between the first electrode and the emission layer,
the intermediate layer directly contacts the emission layer and comprises a first hole transport material,
the emission layer comprises a host and a dopant,
the dopant is an organometallic compound, provided that the dopant does not comprise iridium, and
the organic light-emitting device satisfies conditions of HOMO(h1)−HOMO(host)<0 electron volts and HOMO(host)<HOMO(dopant),
wherein HOMO(h1) indicates the highest occupied molecular orbital (HOMO) energy level (expressed in electron volts) of the first hole transport material,
i) when the host consists of a single host, the HOMO (host) indicates a HOMO energy level (expressed in electron volts) of the single host and ii) when the host is a mixture of two or more different hosts, the HOMO (host) indicates the highest energy level among HOMO energy levels (expressed in electron volts) of the two or more different hosts,
wherein HOMO(dopant) is a HOMO energy level (expressed in electron volts) of the dopant included in the emission layer, and
HOMO(h1), HOMO(host), and HOMO(dopant) are measured by using a photoelectron spectrometer in an ambient atmosphere,
wherein the dopant is represented by Formula 1A-1:

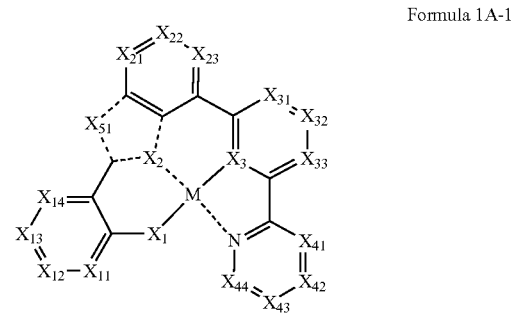

Formula 1A-1 wherein, in Formula 1A-1,
M is platinum,
$X_1$ is O or S, and a bond between $X_1$ and M is a covalent bond,
$X_2$ is N,
$X_3$ is C,
a bond between $X_2$ and M is a coordinate bond,
a bond between $X_3$ and M is a covalent bond,
$X_{11}$ is N or C-[($L_{11}$)$_{b11}$-($R_{11}$)$_{c11}$], $X_{12}$ is N or C-[($L_{12}$)$_{b12}$-($R_{12}$)$_{c12}$], $X_{13}$ is N or C-[($L_{13}$)$_{b13}$-($R_{13}$)$_{c13}$], and $X_{14}$ is N or C-[($L_{14}$)$_{b14}$-($R_{14}$)$_{c14}$], $X_{21}$ is N or C-$[(L_{21})_{b21}$-$(R_{21})_{c21}]$, $X_{22}$ is N or C-$[(L_{22})_{b22}$-$(R_{22})_{c22}]$, and $X_{23}$ is N or C-$[(L_{23})_{b23}$-$(R_{23})_{c23}]$, $X_{31}$ is N or C-$[(L_{31})_{b31}$-$(R_{31})_{c31}]$, $X_{32}$ is N or C-$[(L_{32})_{b32}$-$(R_{32})_{c32}]$, and $X_{33}$ is N or C-$[(L_{33})_{b33}$-$(R_{33})_{c33}]$, $X_{41}$ is N or C-$[(L_{41})_{b41}$-$(R_{41})_{c41}]$, $X_{42}$ is N or C-$[(L_{42})_{b42}$-$(R_{42})_{c42}]$, $X_{43}$ is N or C-$[(L_{43})_{b43}$-$(R_{43})_{c43}]$, and $X_{44}$ is N or C-$[(L_{44})_{b44}$-$(R_{44})_{c44}]$, $X_{51}$ is N-$[(L_7)_{b7}$-$(R_7)_{c7}]$, $C(R_7)(R_8)$, $Si(R_7)(R_8)$, $Ge(R_7)(R_8)$, $C(=O)$, N, $C(R_7)$, $Si(R_7)$, or $Ge(R_7)$, with the proviso that when $X_{51}$ is N-$[(L_7)_{b7}$-$(R_7)_{c7}]$, $L_7$ is a phenyl group, and b7 is 1, then c7 is two or more, at least one $R_7$ comprises an alkyl group, and one $R_7$ comprises an aryl group, $R_7$ and $R_8$ are optionally linked via a first linking group to form a substituted or unsubstituted $C_5$-$C_{30}$ carbocyclic group or a substituted or unsubstituted $C_1$-$C_{30}$ heterocyclic group, $L_7$, $L_{11}$ to $L_{14}$, $L_{21}$ to $L_{23}$, $L_{31}$ to $L_{33}$, and $L_{41}$ to $L_{44}$ are each independently a substituted or unsubstituted $C_5$-$C_{30}$ carbocyclic group or a substituted or unsubstituted $C_1$-$C_{30}$ heterocyclic group, 7 is an integer from 1 to 5, b11 to b14, b21 to b23, b31 to b33, and b41 to b44 are each independently an integer from 0 to 5, c7, c11 to c14, c21 to c23, c31 to c33, and c41 to c44 are each independently an integer from 1 to 5, $R_7$, $R_8$, $R_{11}$ to $R_{14}$, $R_{21}$ to $R_{23}$, $R_{31}$ to $R_{33}$, and $R_{41}$ to $R_{44}$ are each independently hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted C7-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —B(Q$_6$)(Q$_7$), and —P(=O)(Q$_8$)(Q$_9$), provided that $R_7$ is not hydrogen, two or more of $R_{11}$ to $R_{14}$ are optionally linked to form a substituted or unsubstituted $C_5$-$C_{30}$ carbocyclic group or a substituted or unsubstituted $C_1$-$C_{30}$ heterocyclic group, two or more of $R_{21}$ to $R_{23}$ are optionally linked to form a substituted or unsubstituted $C_5$-$C_{30}$ carbocyclic group or a substituted or unsubstituted $C_1$-$C_{30}$ heterocyclic group, two or more of $R_{31}$ to $R_{33}$ are optionally linked to form a substituted or unsubstituted $C_5$-$C_{30}$ carbocyclic group or a substituted or unsubstituted $C_1$-$C_{30}$ heterocyclic group, two or more of $R_{41}$ to $R_{44}$ are optionally linked to form a substituted or unsubstituted $C_5$-$C_{30}$ carbocyclic group or a substituted or unsubstituted $C_1$-$C_{30}$ heterocyclic group, and $Q_1$ to $Q_9$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

2. The organic light-emitting device of claim 1, wherein the organic light-emitting device satisfies a condition of −0.4 electron volts ≤HOMO(h1)−HOMO(host)<0 electron volts.

3. The organic light-emitting device of claim 1, wherein the organic light-emitting device satisfies a condition of HOMO(dopant)−HOMO(host)<0.40 electron volts.

4. The organic light-emitting device of claim 3, wherein the organic light-emitting device satisfies a condition of 0 electron volts <HOMO(dopant) −HOMO(host)≤0.25 electron volts.

5. The organic light-emitting device of claim 1, further comprising a hole transport region between the first electrode and the intermediate layer,
wherein the hole transport region comprises a second hole transport material, and
the organic light-emitting device satisfies a condition of HOMO(h1)−HOMO(h2)<0 electron volts,
wherein HOMO(h2) is a HOMO energy level of the second hole transport material, and HOMO(h2) is measured by using a photoelectron spectrometer.

6. The organic light-emitting device of claim 5, wherein the organic light-emitting device satisfies a condition of HOMO(h1)<HOMO(host)<HOMO(h2).

7. The organic light-emitting device of claim 5, wherein the organic light-emitting device satisfies a condition of HOMO(h1)<HOMO(host)<HOMO(dopant)<HOMO(h2).

8. The organic light-emitting device of claim 1, wherein the host comprises an electron transport host and a hole transport host, wherein the electron transport host comprises at least one electron transport moiety, and the hole transport host comprises no electron transport moiety, and HOMO(host) is the same as the HOMO energy level of the hole transport host.

9. The organic light-emitting device of claim 8, wherein the electron transport moiety is selected from a cyano group, a π electron-depleted nitrogen-containing cyclic group, and a group represented by one of the following formulae:

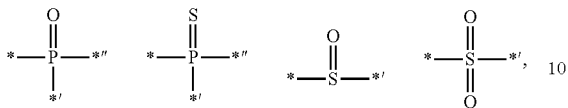

wherein *, *', and *" in the formulae each indicate a binding site to a neighboring atom.

10. The organic light-emitting device of claim 1, wherein the host comprises an electron transport host and a hole transport host,
the electron transport host comprises at least one π electron-depleted nitrogen-free cyclic group and at least one electron transport moiety, and
the hole transport host comprises at least one π electron-depleted nitrogen-free cyclic group, and does not comprise an electron transport moiety.

11. The organic light-emitting device of claim 1, wherein the host comprises an electron transport host and a hole transport host,
the electron transport host comprises a triphenylene group and a triazine group, and
the hole transport host comprises a carbazole group.

12. The organic light-emitting device of claim 5, wherein the first hole transport material and the second hole transport material are each independently selected from amine-based compounds.

13. The organic light-emitting device of claim 1, wherein the intermediate layer does not comprise a p-dopant.

14. The organic light-emitting device of claim 5, wherein the hole transport region further comprises a p-dopant.

15. An organic light-emitting device comprising:
a first electrode;
a second electrode facing the first electrode;
light-emitting units in the number of m, stacked between the first electrode and the second electrode and comprising at least one emission layer; and
charge-generation layers in the number of m-1, disposed between two neighboring light-emitting units selected from the light-emitting units in the number of m and comprising an n-type charge-generation layer and a p-type charge-generation layer,
wherein m is an integer greater than or equal to 2,
a maximum emission wavelength of light emitted by at least one of the light-emitting units in the number of m is different from a maximum emission wavelength of light emitted by at least one of the other light-emitting units,
at least one of the light-emitting units in the number of m comprises at least one intermediate layer that is located at a side closer to the first electrode, directly contacts the emission layer, and comprises a first hole transport material,
the emission layer comprises a host and a dopant,
the dopant is an organometallic compound, provided that the dopant does not comprise iridium, and
the organic light-emitting device satisfies conditions of HOMO(h1)−HOMO(host)<0 electron volts and HOMO(host)<HOMO(dopant), wherein HOMO(h1) indicates a HOMO energy level (expressed in electron volts) of the first hole transport material,
i) when the host consists of a single host, the HOMO (host) indicates a HOMO energy level (expressed in electron volts) of the single host and ii) when the host is a mixture of two or more different hosts, the HOMO (host) indicates the highest energy level among HOMO energy levels (expressed in electron volts) of the two or more different hosts,
wherein HOMO(dopant) is a HOMO energy level (expressed in electron volts) of the dopant included in the emission layer, and
HOMO(h1), HOMO(host), and HOMO(dopant) are measured by using a photoelectron spectrometer in an ambient atmosphere, wherein the dopant is represented by Formula 1A-1:

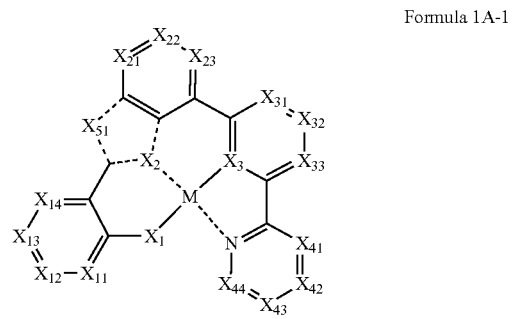

Formula 1A-1 wherein, in Formula 1A-1,
M is platinum,
$X_1$ is O or S, and a bond between $X_1$ and M is a covalent bond,
$X_2$ is N,
$X_3$ is C,
a bond between $X_2$ and M is a coordinate bond,
a bond between $X_3$ and M is a covalent bond,
$X_{11}$ is N or C-[$(L_{11})_{b11}$-$(R_{11})_{c11}$], $X_{12}$ is N or C-[$(L_{12})_{b12}$-$(R_{12})_{c12}$], $X_{13}$ is N or C-[$(L_{13})_{b13}$-$(R_{13})_{c13}$], and $X_{14}$ is N or C-[$(L_{14})_{b14}$-$(R_{14})_{c14}$],
$X_{21}$ is N or C-[$(L_{21})_{b21}$-$(R_{21})_{c21}$], $X_{22}$ is N or C-[$(L_{22})_{b22}$-$(R_{22})_{c22}$], and $X_{23}$ is N or C-[$(L_{23})_{b23}$-$(R_{23})_{c23}$],
$X_{31}$ is N or C-[$(L_{31})_{b31}$-$(R_{31})_{c31}$], $X_{32}$ is N or C-[$(L_{32})_{b32}$-$(R_{32})_{c32}$], and $X_{33}$ is N or C-[$(L_{33})_{b33}$-$(R_{33})_{c33}$],
$X_{41}$ is N or C-[$(L_{41})_{b41}$-$(R_{41})_{c41}$], $X_{42}$ is N or C-[$(L_{42})_{b42}$-$(R_{42})_{c42}$], $X_{43}$ is N or C-[$(L_{43})_{b43}$-$(R_{43})_{c43}$], and $X_{44}$ is N or C-[$(L_{44})_{b44}$-$(R_{44})_{c44}$],
$X_{51}$ is N-[$(L_7)_{b7}$-$(R_7)_{c7}$], C($R_7$)($R_8$), Si($R_7$)($R_8$), Ge($R_7$)($R_8$), C(=O), N, C($R_7$), Si($R_7$), or Ge($R_7$),
with the proviso that when $X_{51}$ is N-[$(L_7)_{b7}$-$(R_7)_{c7}$], $L_7$ s a phenyl group, and b7 is 1, then c7 is two or more, at least one $R_7$ comprises an alkyl group, and one $R_7$ comprises an aryl group,
$R_7$ and $R_8$ re optionally linked via a first linking group to form a substituted or unsubstituted $C_5$-$C_{30}$ carbocyclic group or a substituted or unsubstituted $C_1$-$C_{30}$ heterocyclic group,
$L_7$, $L_{11}$ to $L_{14}$, $L_{21}$ to $L_{23}$, $L_{31}$ to $L_{33}$, and $L_{41}$ to $L_{44}$ are each independently a substituted or unsubstituted $C_5$-$C_{30}$ carbocyclic group or a substituted or unsubstituted $C_1$-$C_{30}$ heterocyclic group,
b7 is an integer from 1 to 5, b11 to b14, b21 to b23, b31 to b33, and b41 to b44 are each independently an integer from 0 to 5, c7, c11 to c14, c21 to c23, c31 to c33, and c41 to c44 are each independently an integer from 1 to 5, $R_7$, $R_8$, $R_{11}$ to $R_{14}$, $R_{21}$ to $R_{23}$, $R_{31}$ to $R_{33}$, and $R_{41}$ to $R_{44}$ are each independently hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), provided that $R_7$ is not hydrogen, two or more of $R_{11}$ to $R_{14}$ are optionally linked to form a substituted or unsubstituted $C_5$-$C_{30}$ carbocyclic group or a substituted or unsubstituted $C_1$-$C_{30}$ heterocyclic group, two or more of $R_{21}$ to $R_{23}$ are optionally linked to form a substituted or unsubstituted $C_5$-$C_{30}$ carbocyclic group or a substituted or unsubstituted $C_1$-$C_{30}$ heterocyclic group, two or more of $R_{31}$ to $R_{33}$ are optionally linked to form a substituted or unsubstituted $C_5$-$C_{30}$ carbocyclic group or a substituted or unsubstituted $C_1$-$C_{30}$ heterocyclic group, two or more of $R_{41}$ to $R_{44}$ are optionally linked to form a substituted or unsubstituted $C_5$-$C_{30}$ carbocyclic group or a substituted or unsubstituted $C_1$-$C_{30}$ heterocyclic group, and $Q_1$ to $Q_9$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

16. An organic light-emitting device comprising:
a first electrode;
a second electrode facing the first electrode; and
emission layers in the number of m, stacked between the first electrode and the second electrode,
wherein m is an integer greater than or equal to 2,
a maximum emission wavelength of light emitted by at least one of the emission layers in the number of m is different from a maximum emission wavelength of light emitted by at least one of the other emission layers,
at least one intermediate layer that directly contacts at least one of the emission layers and comprises a first hole transport material is disposed between the emission layers in the number of m and the first electrode,
the emission layers each comprise a host and a dopant,
the dopant is an organometallic compound, provided that the dopant does not comprise iridium,
the organic light-emitting device satisfies conditions of HOMO(h1)−HOMO(host)<0 electron volts and HOMO(host)<HOMO(dopant),
wherein HOMO(h1) indicates a HOMO energy level (expressed in electron volts) of the first hole transport material,
i) when the host consists of a single host, the HOMO (host) indicates a HOMO energy level (expressed in electron volts) of the single host and ii) when the host is a mixture of two or more different hosts, the HOMO (host) indicates the highest energy level among HOMO energy levels (expressed in electron volts) of the two or more different hosts,
wherein HOMO(dopant) is a HOMO energy level (expressed in electron volts) of the dopant included in the emission layer, and
HOMO(h1), HOMO(host), and HOMO(dopant) are measured by using a photoelectron spectrometer in an ambient atmosphere, wherein the dopant is represented by Formula 1A-1:

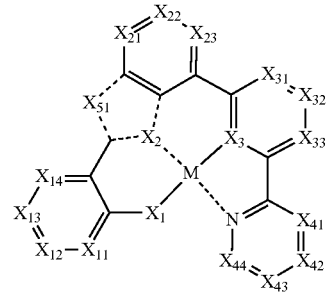

Formula 1A-1 wherein, in Formula 1A-1,
M is platinum,
$X_1$ is O or S, and a bond between $X_1$ and M is a covalent bond,
$X_2$ is N,
$X_3$ is C,
a bond between $X_2$ and M is a coordinate bond,
a bond between $X_3$ and M is a covalent bond,
$X_{11}$ is N or C-[$(L_{11})_{b11}$-$(R_{11})_{c11}$], $X_{12}$ is N or C-[$(L_{12})_{b12}$-$(R_{12})_{c12}$], $X_{13}$ is N or C-[$(L_{13})_{b13}$-$(R_{13})_{c13}$], and $X_{14}$ is N or C-[$(L_{14})_{b14}$-$(R_{14})_{c14}$], $X_{21}$ is N or C-[$(L_{21})_{b21}$-$(R_{21})_{c21}$], $X_{22}$ is N or C-[$(L_{22})_{b22}$-$(R_{22})_{c22}$], and $X_{23}$ is N or C-[$(L_{23})_{b23}$-$(R_{23})_{c23}$], $X_{31}$ is N or C-[$(L_{31})_{b31}$-$(R_{31})_{c31}$], $X_{32}$ is N or C-[$(L_{32})_{b32}$-$(R_{32})_{c32}$], and $X_{33}$ is N or C-[$(L_{33})_{b33}$-$(R_{33})_{c33}$], $X_{41}$ is N or C-[$(L_{41})_{b41}$-$(R_{41})_{c41}$], $X_{42}$ is N or C-[$(L_{42})_{b42}$-$(R_{42})_{c42}$], $X_{43}$ is N or C-[$(L_{43})_{b43}$-$(R_{43})_{c43}$], and $X_{44}$ is N or C-[$(L_{44})_{b44}$-$(R_{44})_{c44}$], $X_{51}$ is N-[$(L_7)_{b7}$-$(R_7)_{c7}$], $C(R_7)(R_8)$, $Si(R_7)(R_8)$, $Ge(R_7)(R_8)$, C(=O), N, $C(R_7)$, $Si(R_7)$, or $Ge(R_7)$, with the proviso that when $X_{51}$ is N-[$(L_7)_{b7}$-$(R_7)_{c7}$], $L_7$ s a phenyl group, and $b_7$ is 1, then $c_7$ is two or more, at least one $R_7$ comprises an alkyl group, and one $R_7$ comprises an aryl group, $R_7$ and $R_8$ re optionally linked via a first linking group to form a substituted or unsubstituted $C_5$-$C_{30}$ carbocyclic group or a substituted or unsubstituted $C_1$-$C_{30}$ heterocyclic group, $L_7$, $L_{11}$ to $L_{14}$, $L_{21}$ to $L_{23}$, $L_{31}$ to $L_{33}$, and $L_{41}$ to $L_{44}$ are each independently a substituted or unsubstituted $C_5$-$C_{30}$ carbocyclic group or a substituted or unsubstituted $C_1$-$C_{30}$ heterocyclic group, $b_7$ is an integer from 1 to 5, b11 to b14, b21 to b23, b31 to b33, and b41 to b44 are each independently an integer from 0 to 5, c7, c11 to c14, c21 to c23, c31 to c33, and c41 to c44 are each independently an integer from 1 to 5, $R_7$, $R_8$, $R_{11}$ to $R_{14}$, $R_{21}$ to $R_{23}$, $R_{31}$ to $R_{33}$, and $R_{41}$ to $R_{44}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, provided that $R_7$ is not hydrogen, two or more of $R_{11}$ to $R_{14}$ are optionally linked to form a substituted or unsubstituted $C_5$-$C_{30}$ carbocyclic group or a substituted or unsubstituted $C_1$-$C_{30}$ heterocyclic group, two or more of $R_{21}$ to $R_{23}$ are optionally linked to form a substituted or unsubstituted $C_5$-$C_{30}$ carbocyclic group or a substituted or unsubstituted $C_1$-$C_{30}$ heterocyclic group, two or more of $R_{31}$ to $R_{33}$ are optionally linked to form a substituted or unsubstituted $C_5$-$C_{30}$ carbocyclic group or a substituted or unsubstituted $C_1$-$C_{30}$ heterocyclic group, two or more of $R_{41}$ to $R_{44}$ are optionally linked to form a substituted or unsubstituted $C_5$-$C_{30}$ carbocyclic group or a substituted or unsubstituted $C_1$-$C_{30}$ heterocyclic group, and $Q_1$ to $Q_9$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

* * * * *